(12) United States Patent
Or-Bach et al.

(10) Patent No.: US 11,276,687 B2
(45) Date of Patent: Mar. 15, 2022

(54) 3D SEMICONDUCTOR DEVICE AND STRUCTURE

(71) Applicant: Monolithic 3D Inc., Klamath Falls, OR (US)

(72) Inventors: Zvi Or-Bach, Haifa (IL); Brian Cronquist, Klamath Falls, OR (US)

(73) Assignee: MONOLITHIC 3D Inc., Klamath Falls, OR (US)

( * ) Notice: Subject to any disclaimer, the term of this patent is extended or adjusted under 35 U.S.C. 154(b) by 0 days.

(21) Appl. No.: 17/472,667

(22) Filed: Sep. 12, 2021

(65) Prior Publication Data

US 2021/0407991 A1 Dec. 30, 2021

Related U.S. Application Data

(63) Continuation-in-part of application No. 17/367,386, filed on Jul. 4, 2021, now Pat. No. 11,145,657, which
(Continued)

(51) Int. Cl.
*H01L 27/06* (2006.01)
*H01L 23/36* (2006.01)
(Continued)

(52) U.S. Cl.
CPC ........ *H01L 27/0688* (2013.01); *H01L 21/324* (2013.01); *H01L 23/36* (2013.01); *H01L 23/50* (2013.01); *H01L 23/5225* (2013.01); *H01L 23/5226* (2013.01); *H01L 23/5283* (2013.01); *H01L 23/5286* (2013.01); *H01L 23/60* (2013.01); *H01L 24/30* (2013.01); *H01L 29/785* (2013.01); *H01L 2224/30505* (2013.01); *H01L 2224/30517* (2013.01); *H01L 2224/30519* (2013.01)

(58) Field of Classification Search
None
See application file for complete search history.

(56) References Cited

U.S. PATENT DOCUMENTS 7,541,644 B2 * 6/2009 Hirano ................ H01L 21/8221
257/347
7,897,428 B2 * 3/2011 Assefa ................ H01L 27/0688
438/98
(Continued)

*Primary Examiner* — Nilufa Rahim
(74) *Attorney, Agent, or Firm* — Patent PC; Bao Tran

(57) ABSTRACT

A 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; a plurality of connection paths, where the plurality of connection paths provide first connections from a plurality of the first transistors to a plurality of the second transistors, where the second level is bonded to the first level, where the bonded includes oxide to oxide bond regions, where the bonded includes metal to metal bond regions, and where the third layer includes crystalline silicon; and at least one temperature sensor.

20 Claims, 65 Drawing Sheets

Related U.S. Application Data is a continuation-in-part of application No. 17/169,432, filed on Feb. 6, 2021, now Pat. No. 11,088,130, which is a continuation-in-part of application No. 17/065,424, filed on Oct. 7, 2020, now Pat. No. 10,950,581, which is a continuation-in-part of application No. 15/482,787, filed on Apr. 9, 2017, now Pat. No. 10,840,239, which is a continuation-in-part of application No. 14/607,077, filed on Jan. 28, 2015, now Pat. No. 9,640,531, which is a continuation-in-part of application No. 13/796,930, filed on Mar. 12, 2013, now Pat. No. 8,994,404.

(60) Provisional application No. 62/042,229, filed on Aug. 26, 2014, provisional application No. 62/022,498, filed on Jul. 9, 2014, provisional application No. 61/932,617, filed on Jan. 28, 2014, provisional application No. 62/035,565, filed on Aug. 11, 2014.

(51) Int. Cl.
*H01L 23/50* (2006.01)
*H01L 23/60* (2006.01)
*H01L 21/324* (2006.01)
*H01L 23/522* (2006.01)
*H01L 23/528* (2006.01)
*H01L 23/00* (2006.01)
*H01L 29/78* (2006.01)

(56) References Cited

U.S. PATENT DOCUMENTS

| | | | | |
|---|---|---|---|---|
| 10,090,349 | B2* | 10/2018 | Wan | H01L 27/1464 |
| 2005/0110159 | A1* | 5/2005 | Oh | H01L 21/76251 |
| | | | | 257/777 |
| 2009/0026524 | A1* | 1/2009 | Kreupl | H01L 25/0657 |
| | | | | 257/316 |
| 2010/0190334 | A1* | 7/2010 | Lee | H01L 24/24 |
| | | | | 438/637 |
| 2010/0193964 | A1* | 8/2010 | Farooq | H01L 25/50 |
| | | | | 257/774 |
| 2013/0084689 | A1* | 4/2013 | Arriagada | H01L 21/76243 |
| | | | | 438/478 |
| 2013/0122672 | A1* | 5/2013 | Or-Bach | H01L 21/845 |
| | | | | 438/199 |

\* cited by examiner

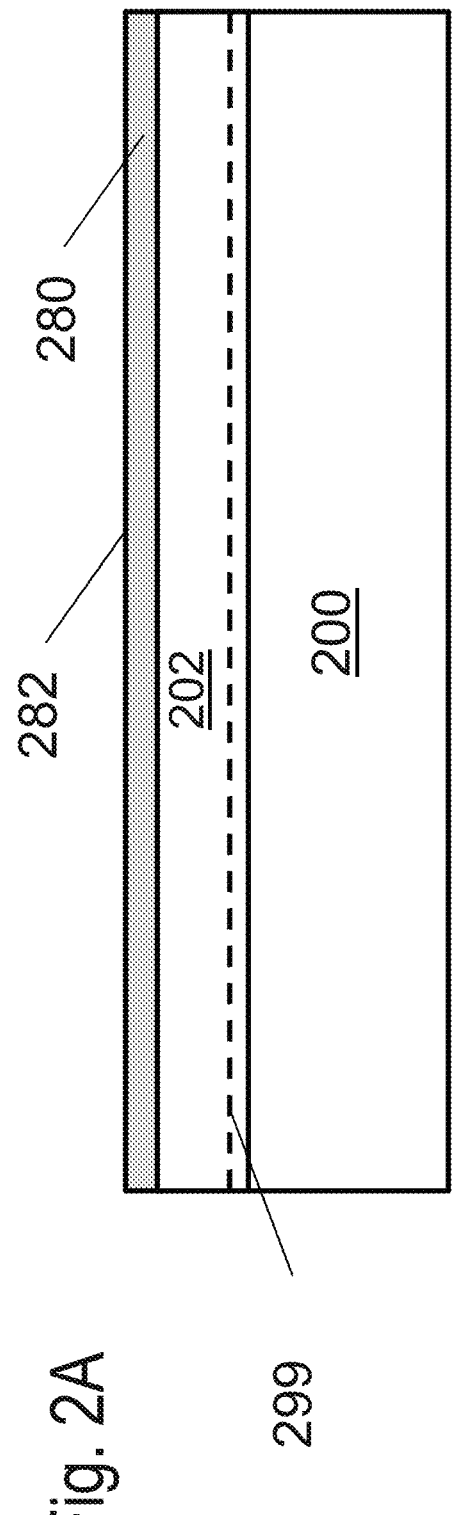

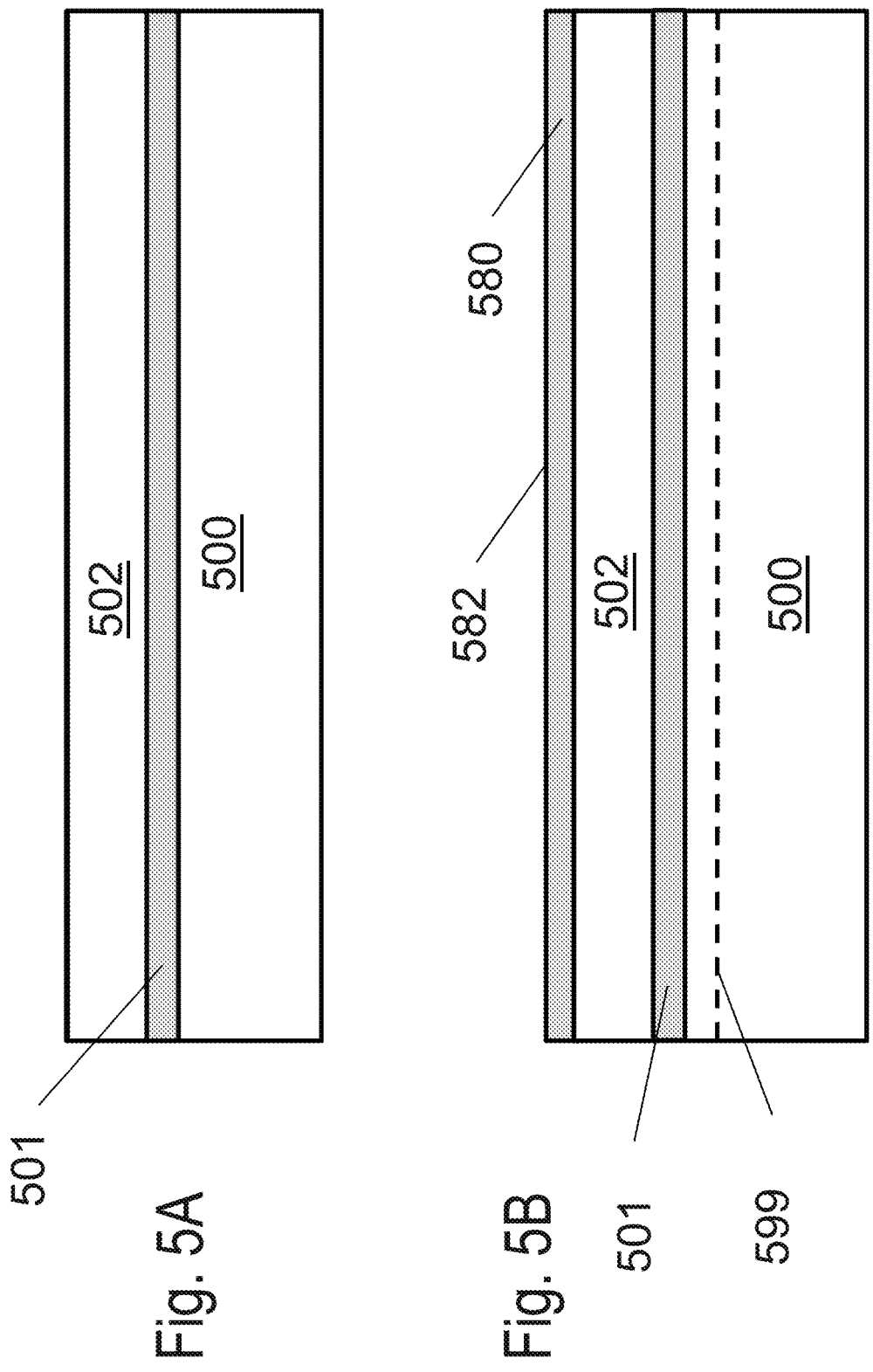

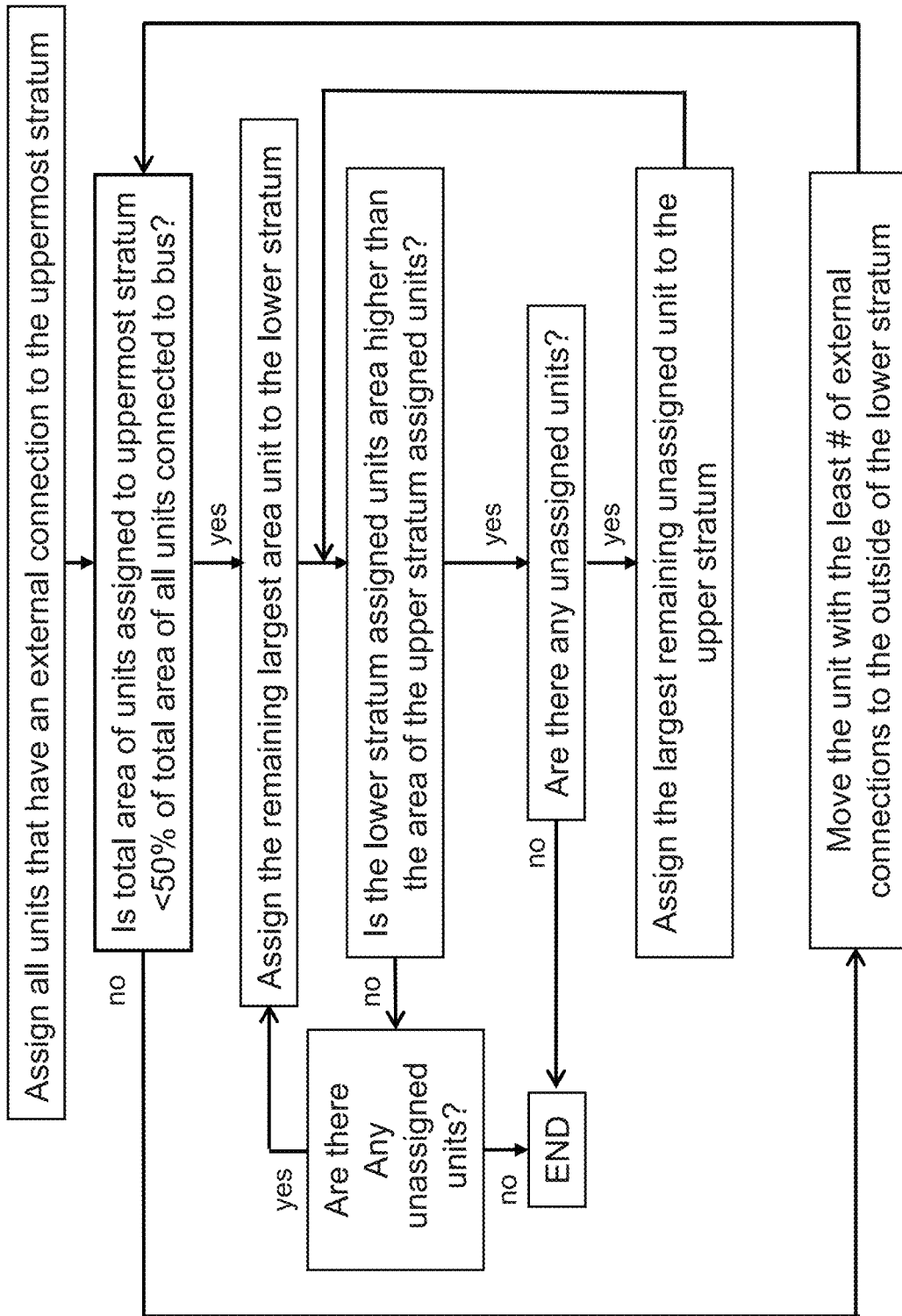

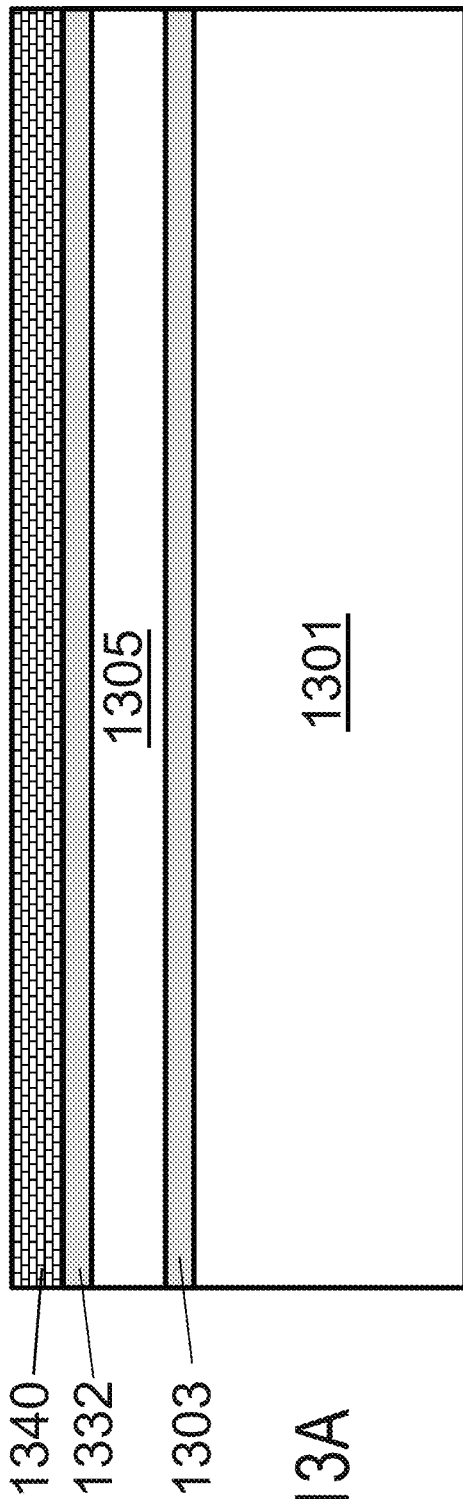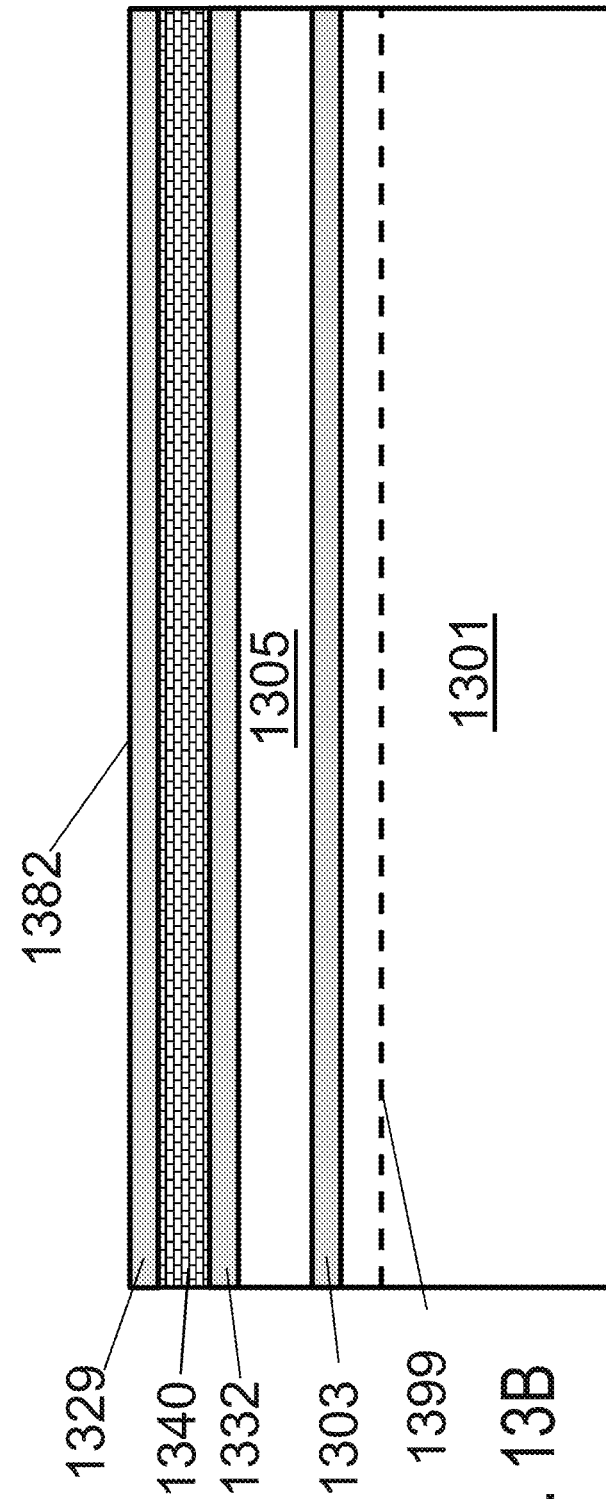

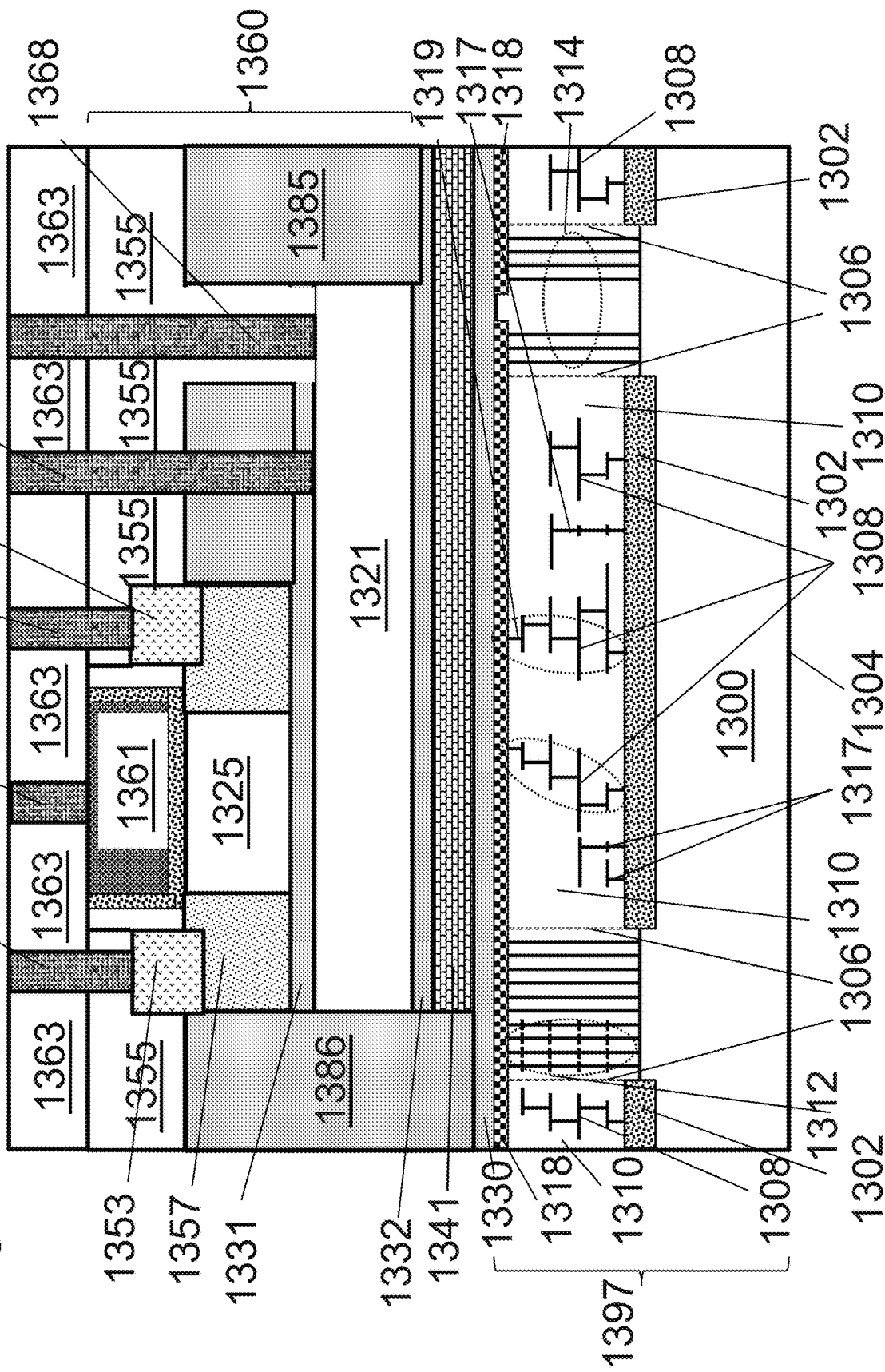

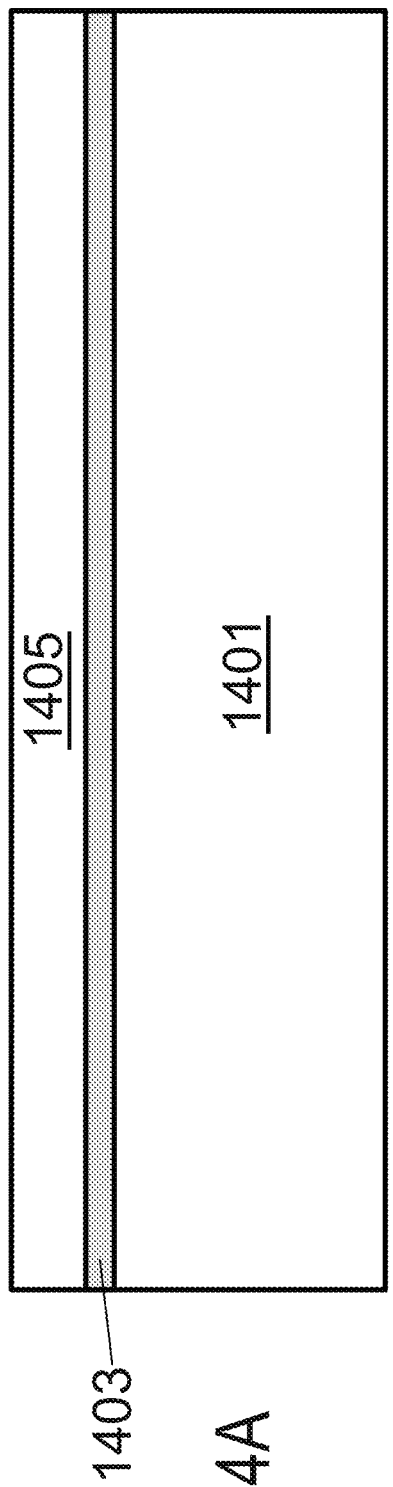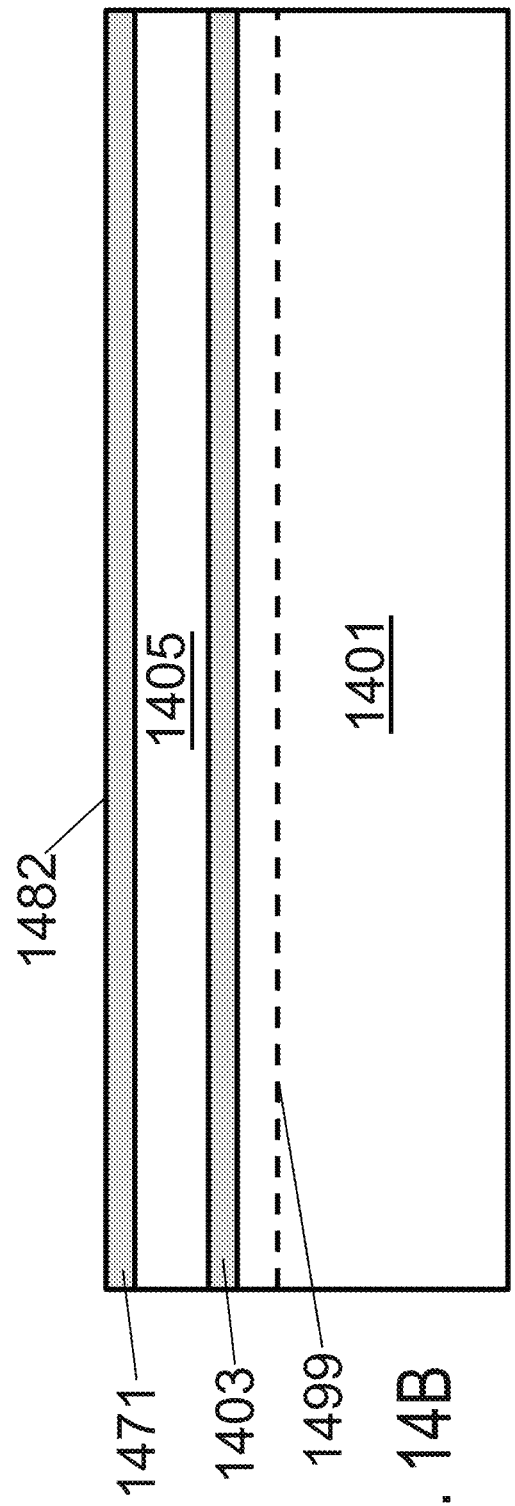

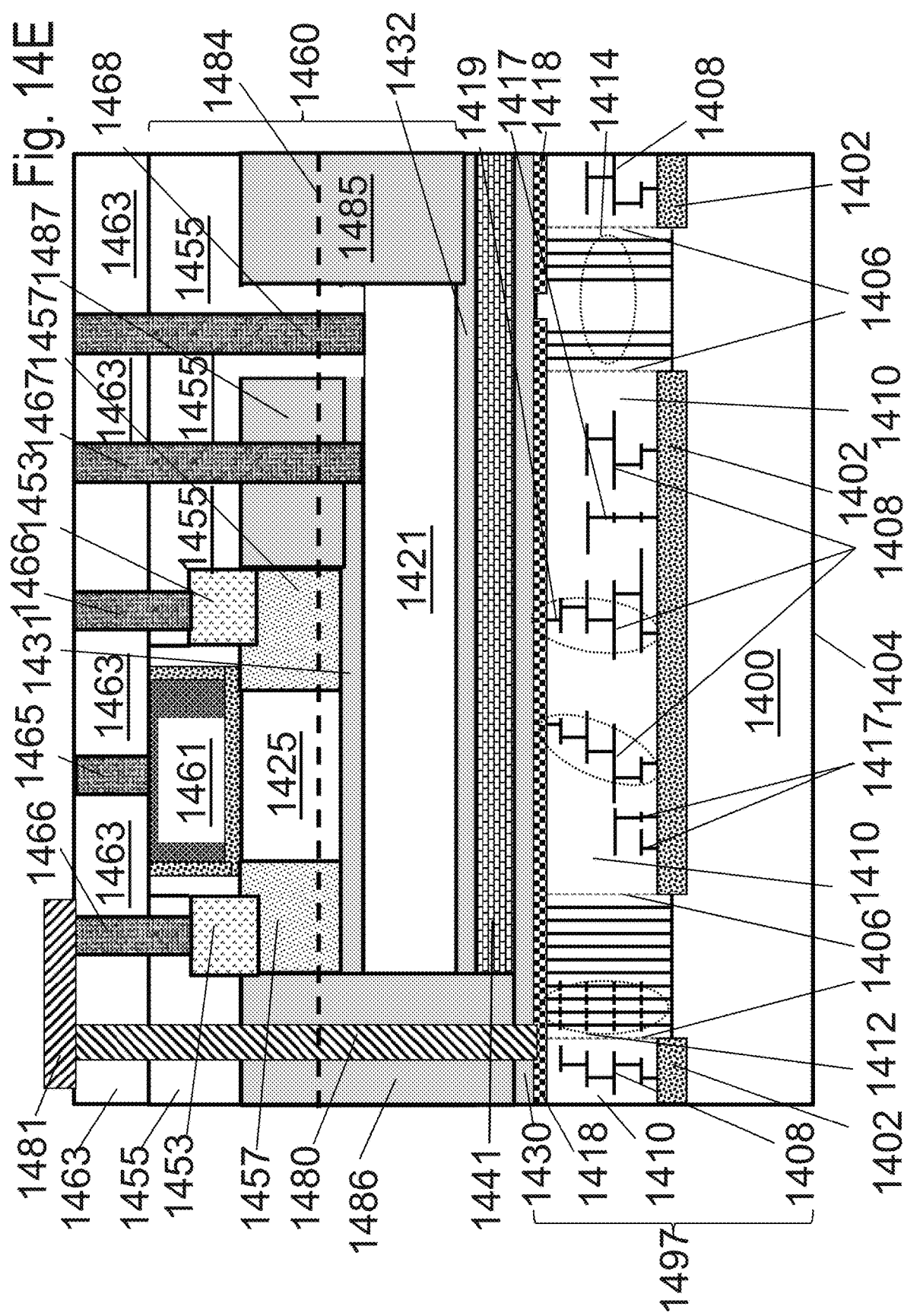

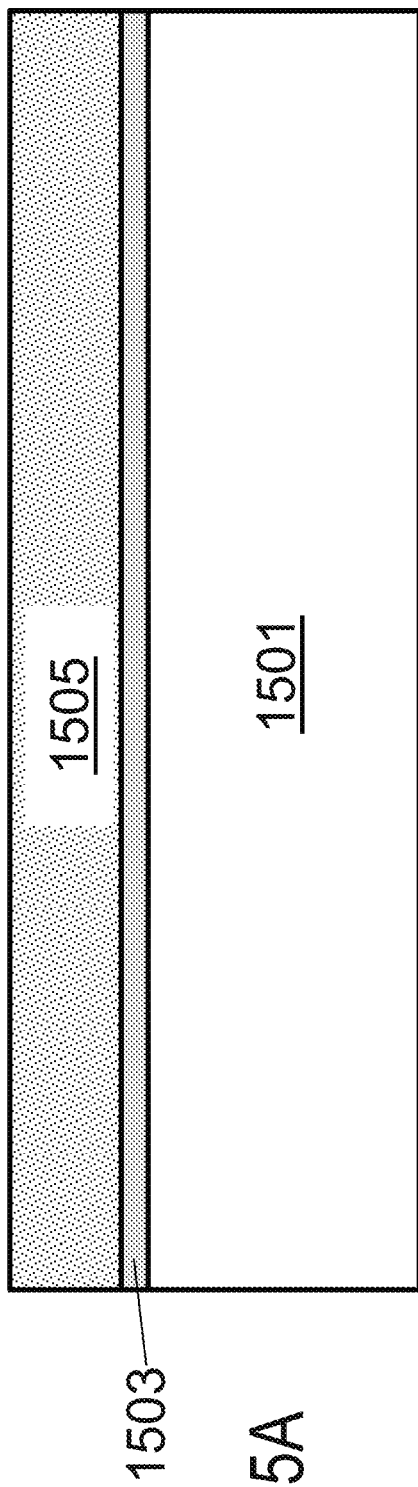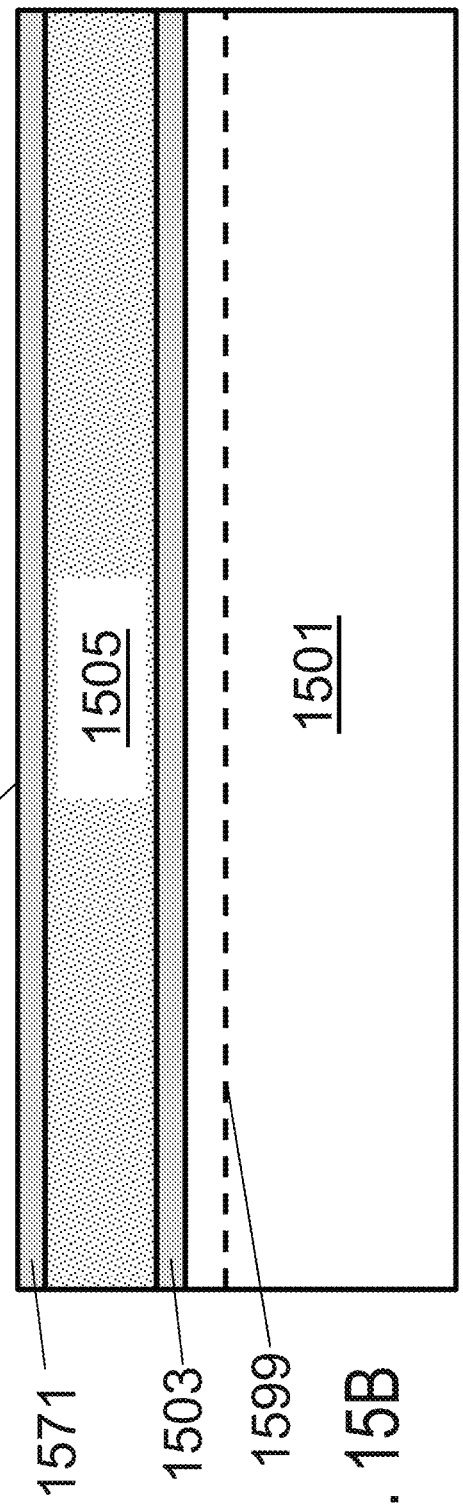
Fig. 15A
Fig. 15B

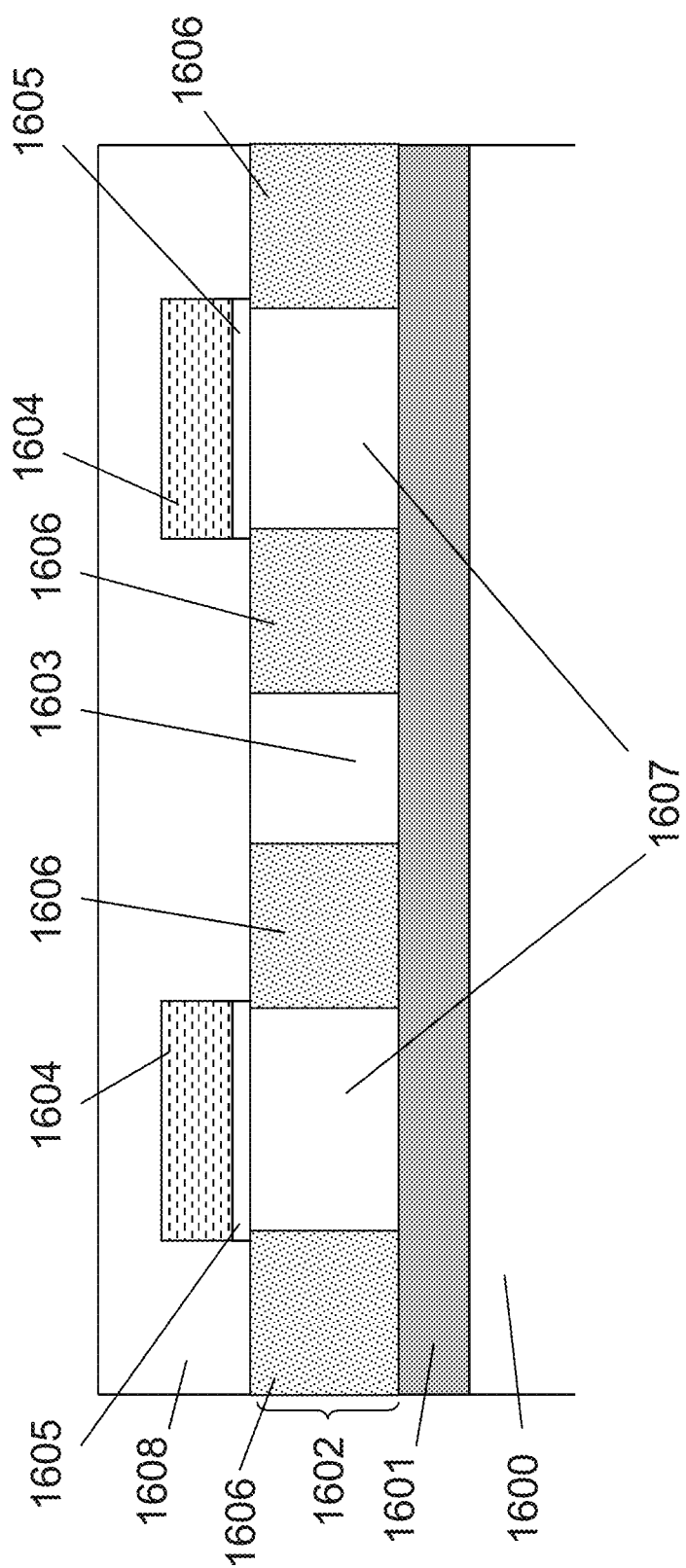

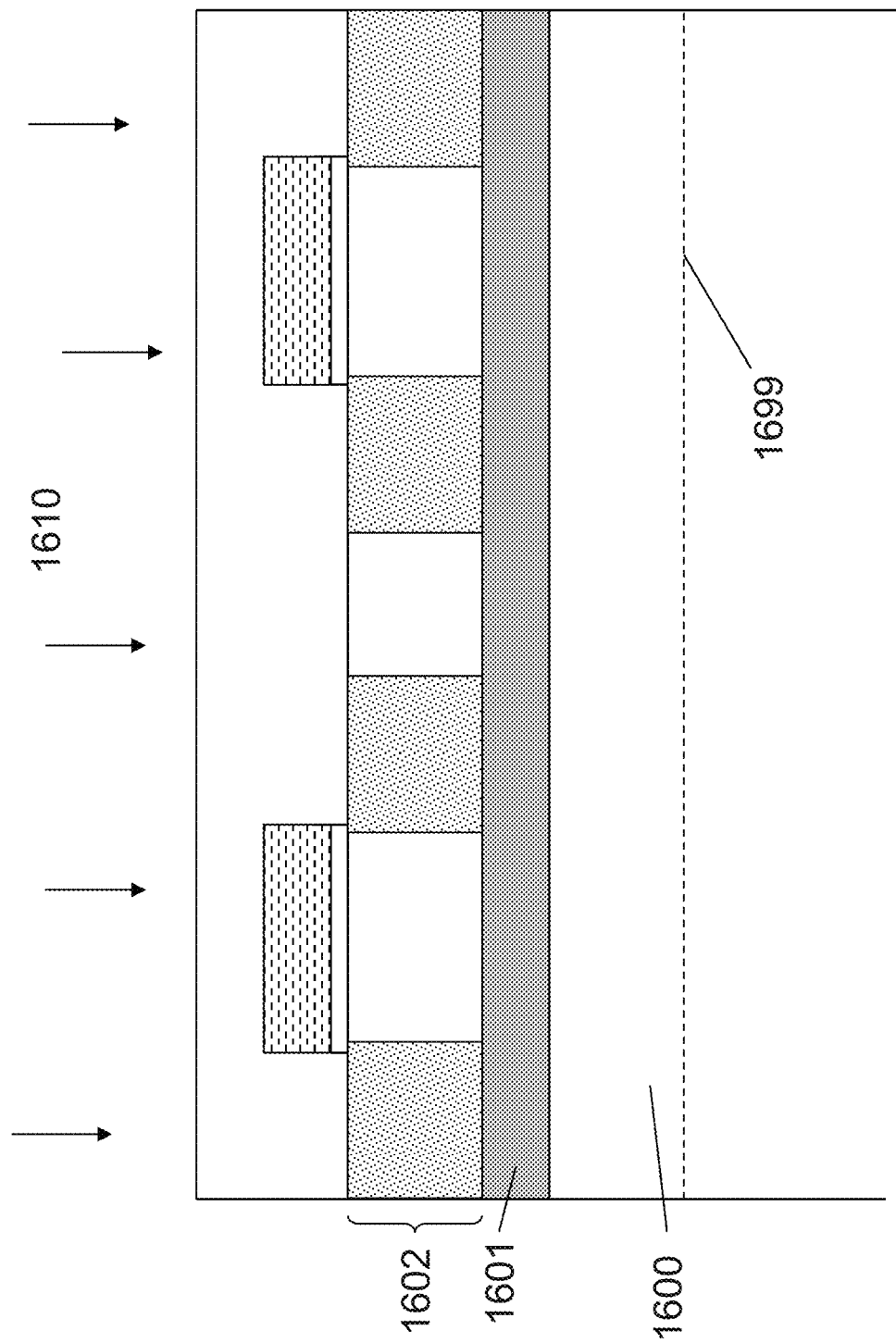

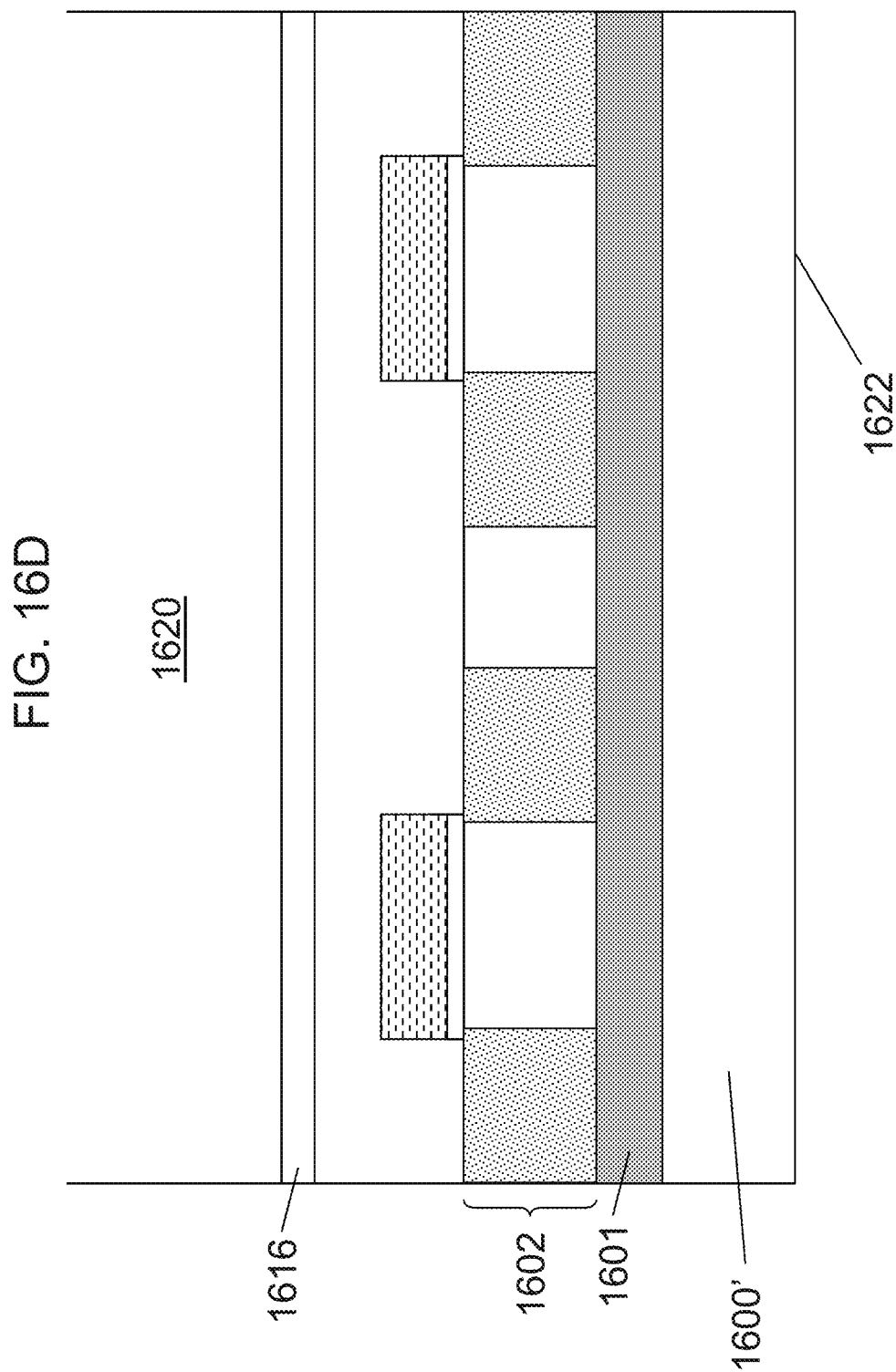

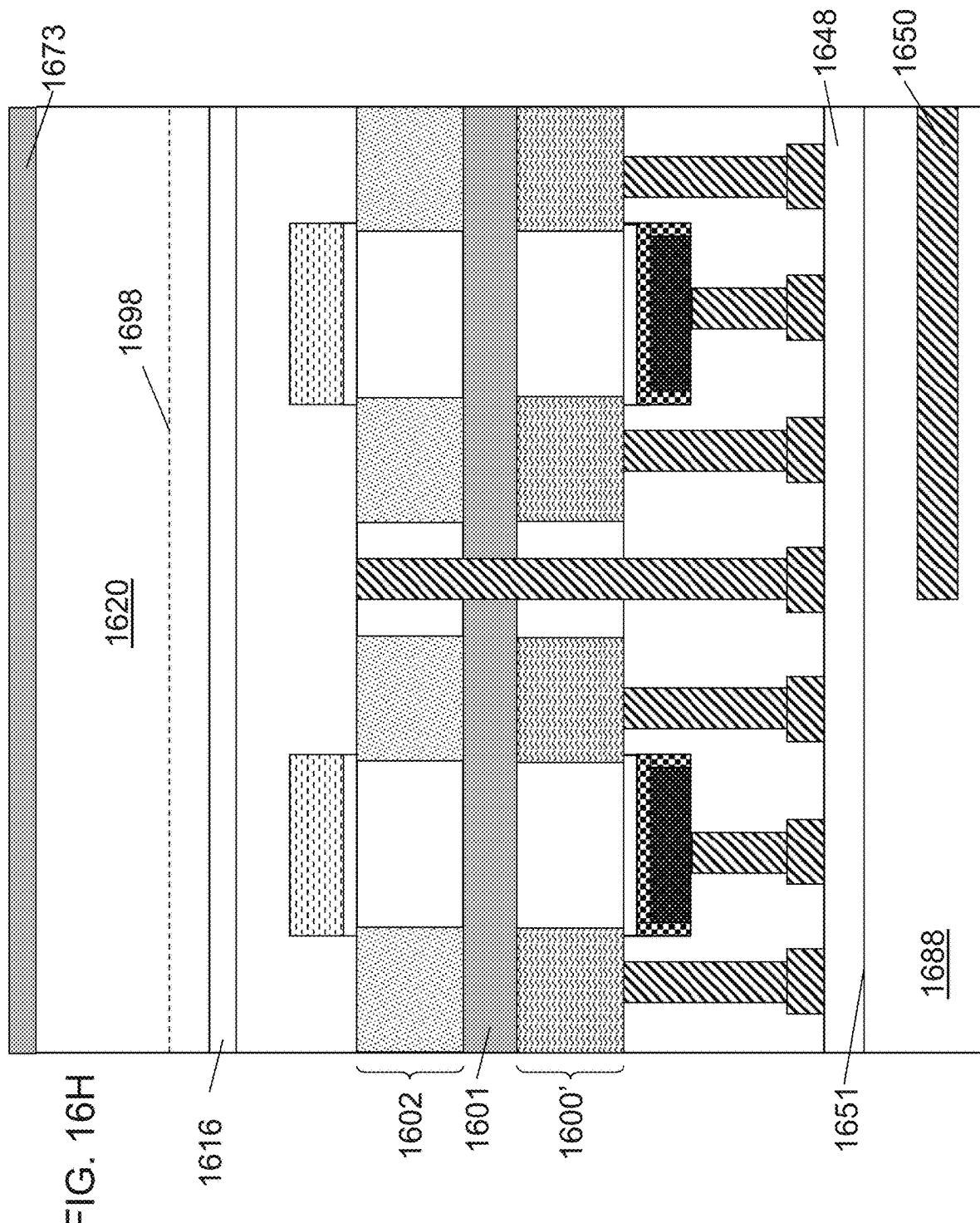

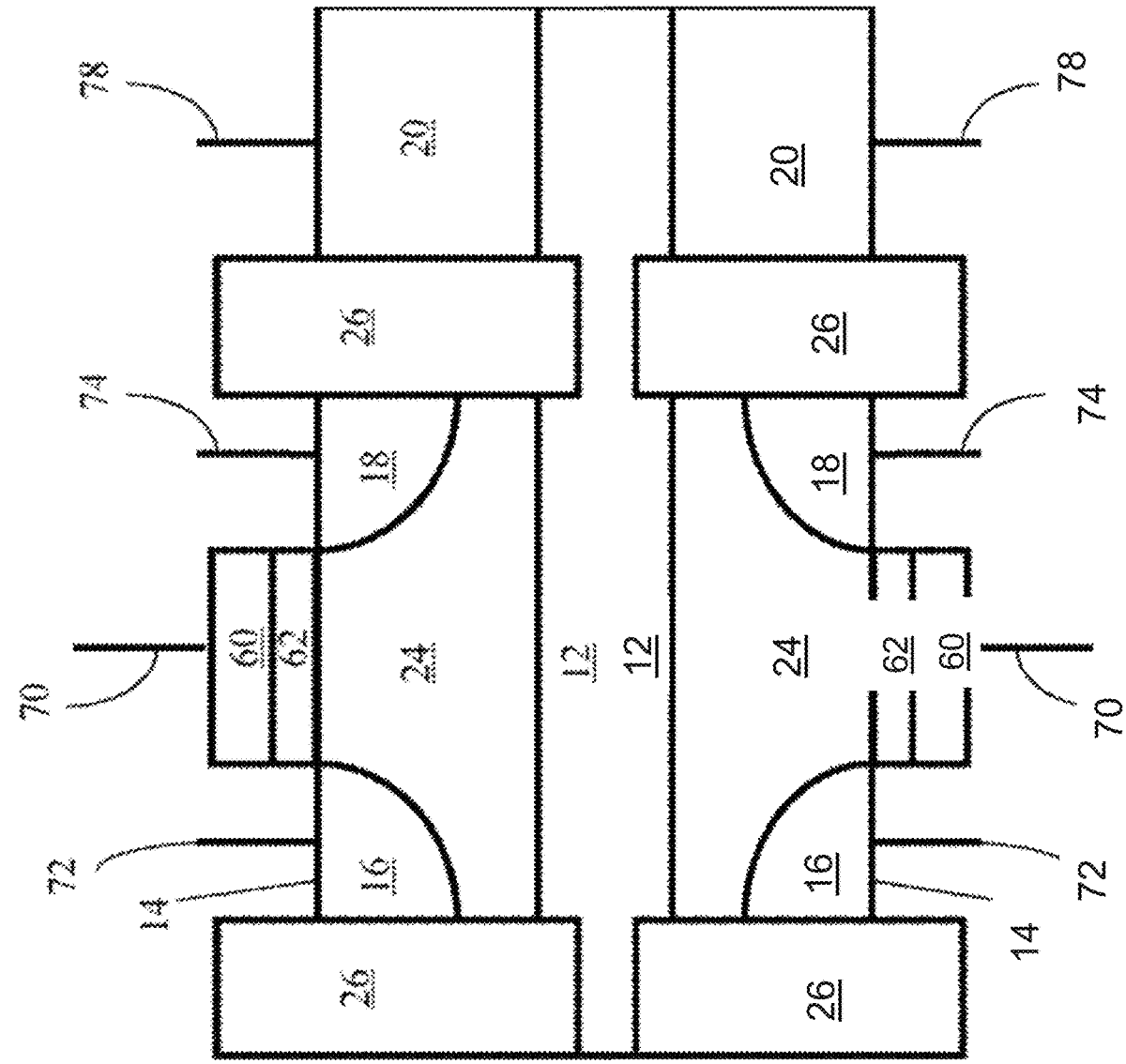

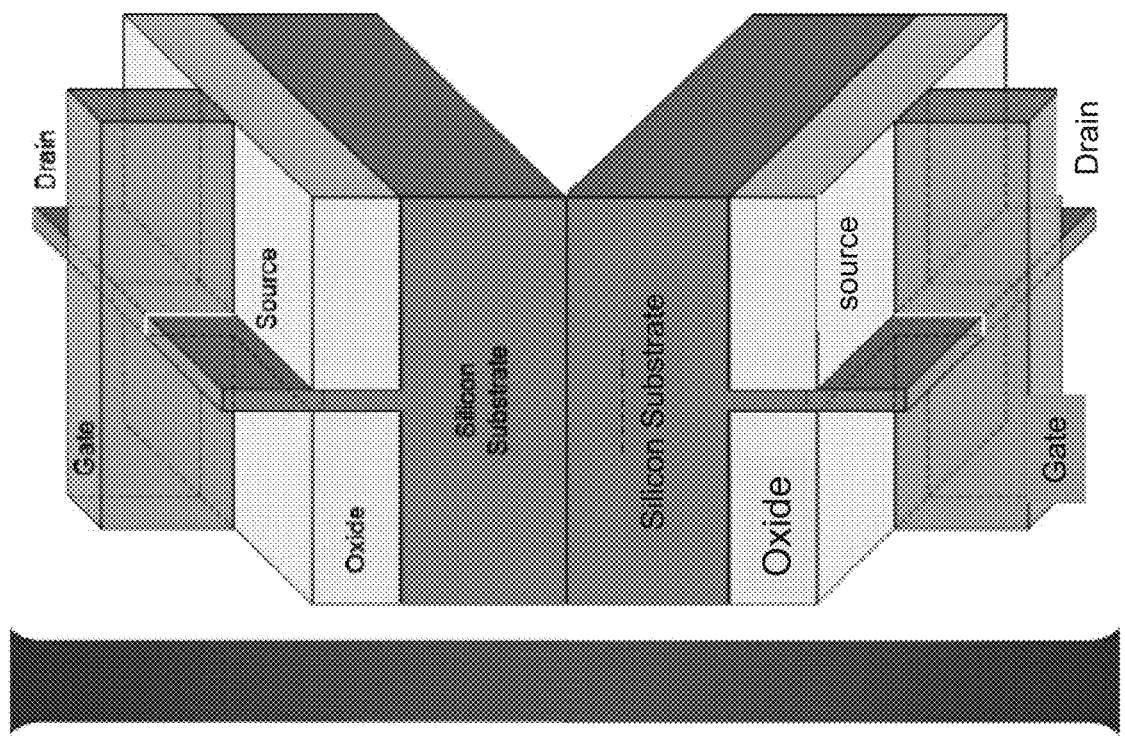
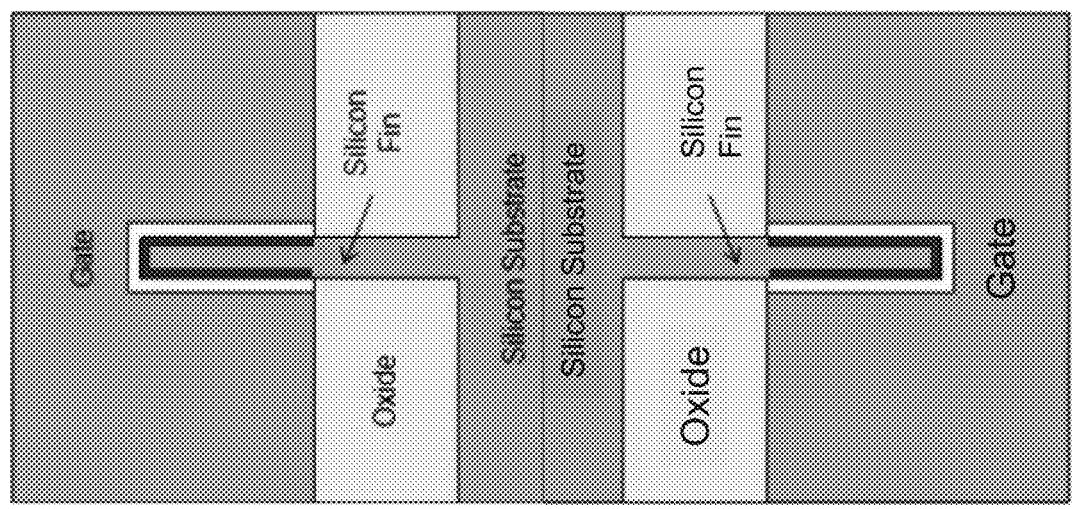
Fig. 18C

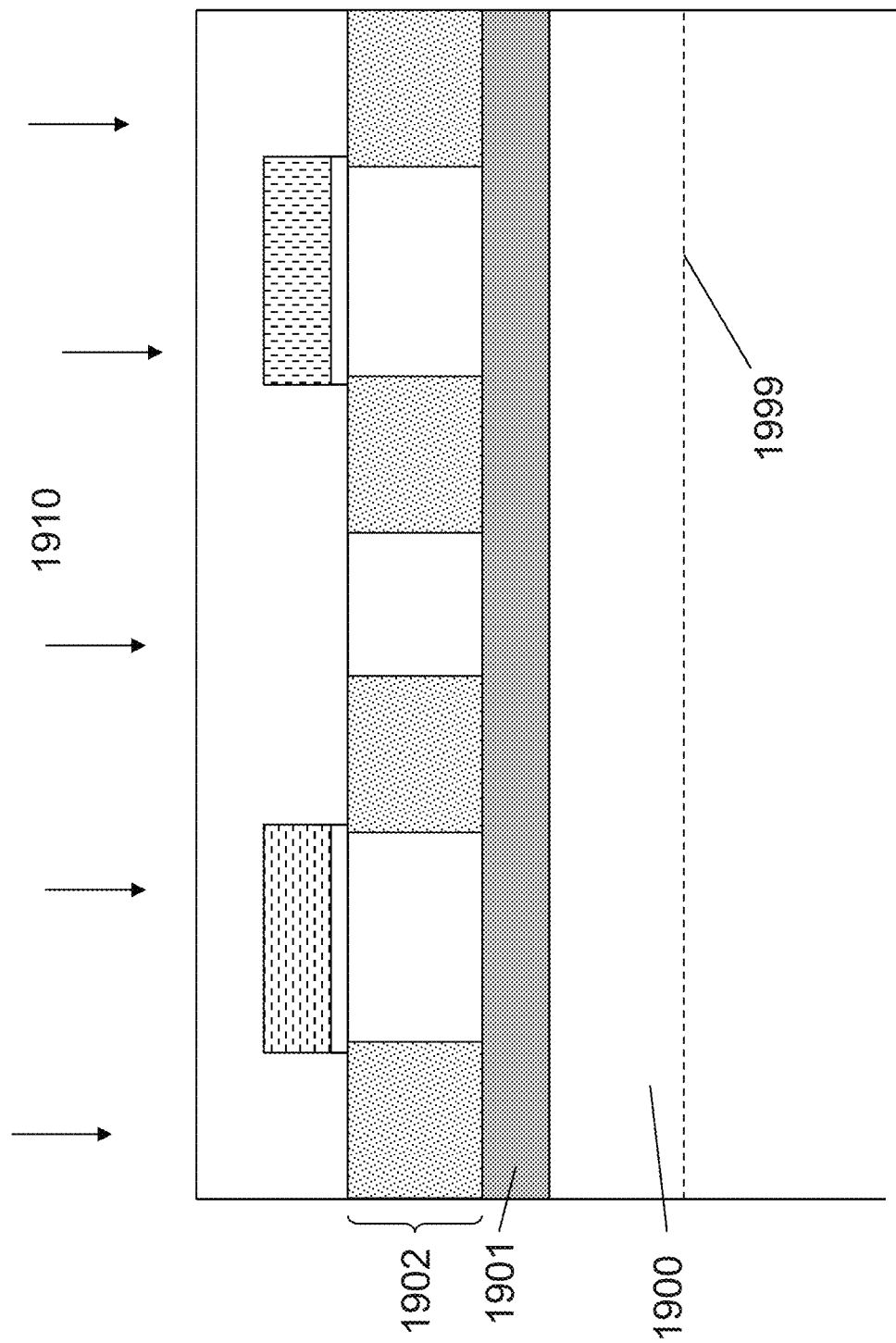

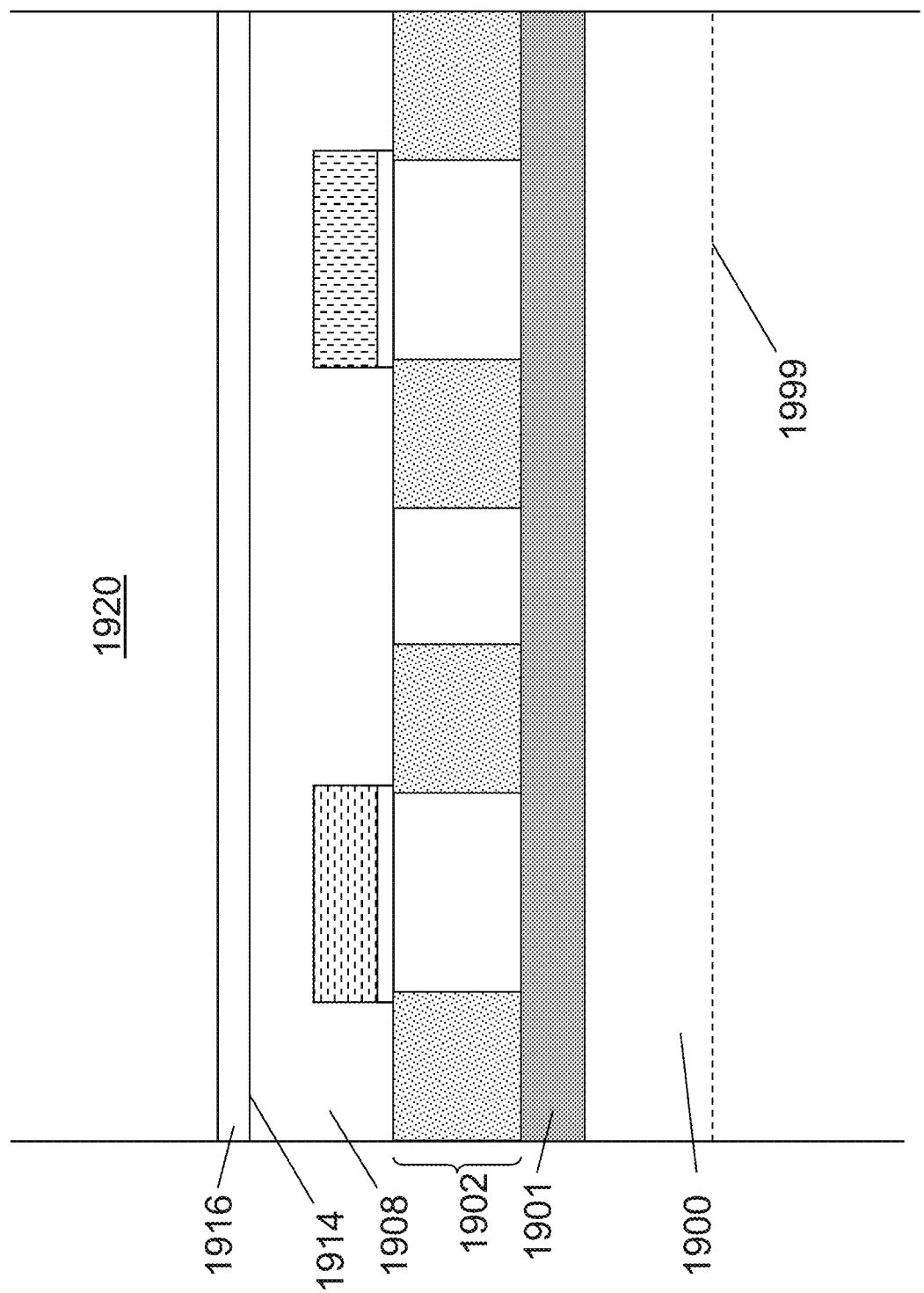

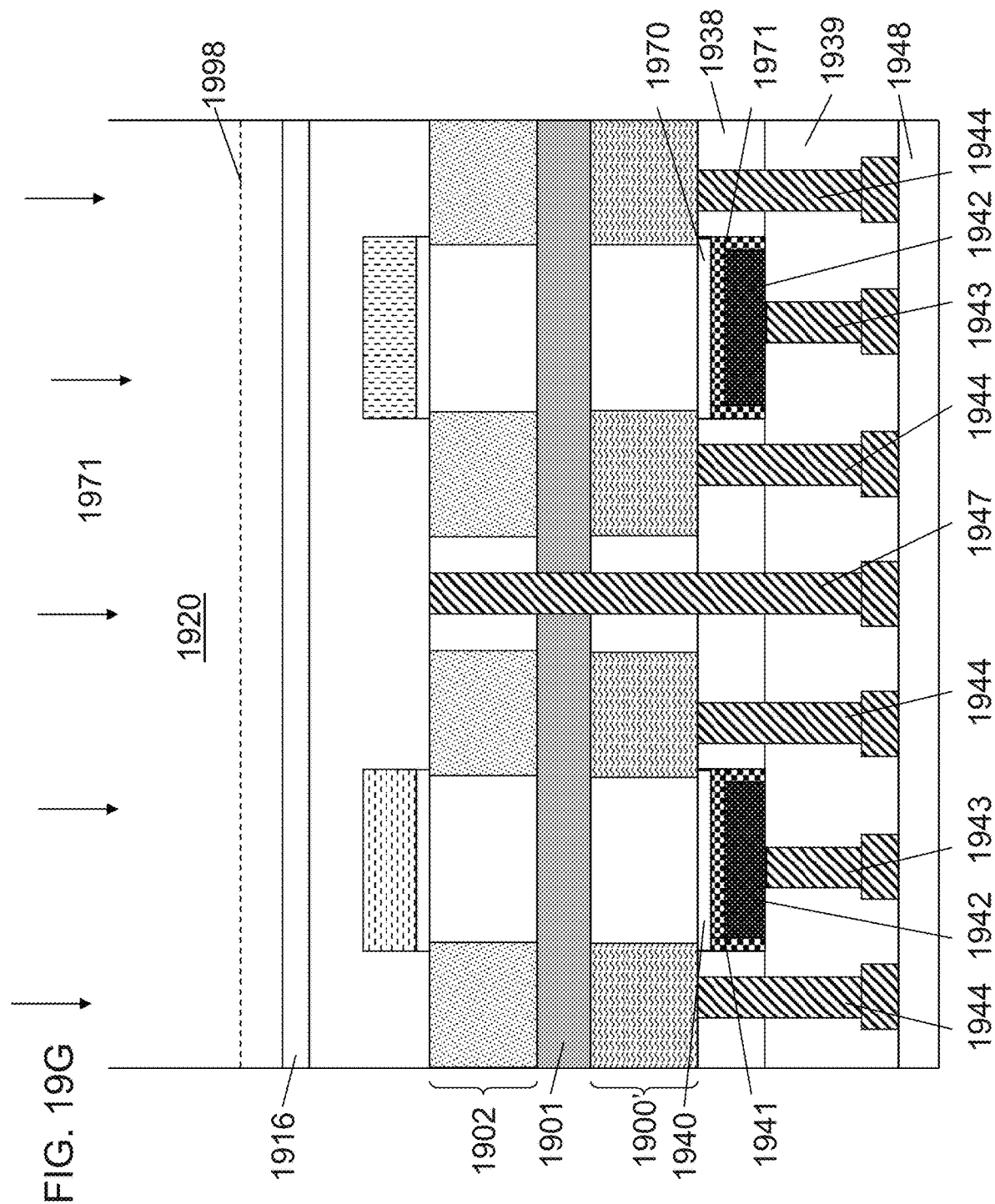

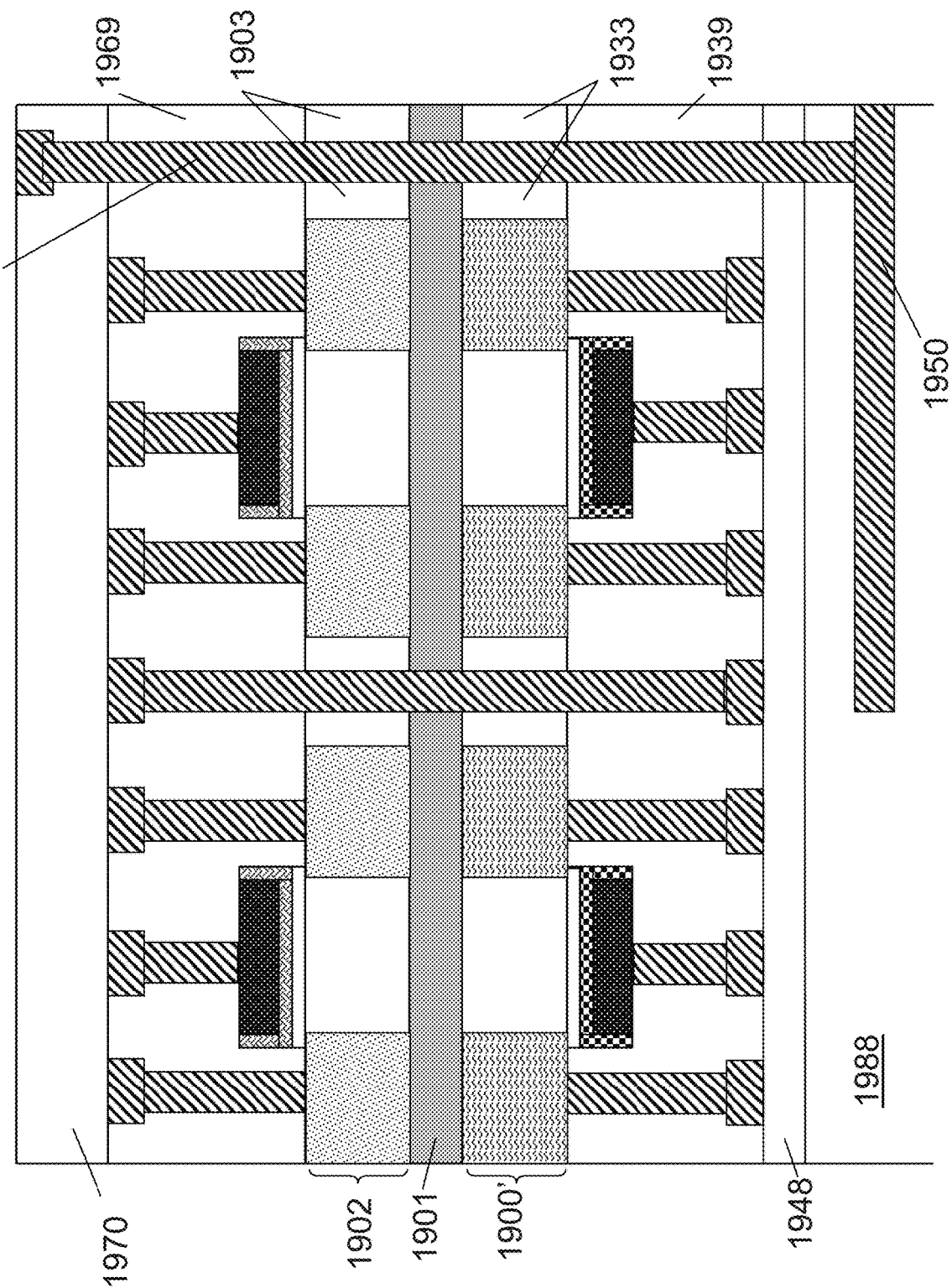

3D SEMICONDUCTOR DEVICE AND STRUCTURE

This application is a continuation-in-part of U.S. patent application Ser. No. 17/367,386 filed on Jul. 4, 2021; which is a continuation-in-part of U.S. patent application Ser. No. 17/169,432 filed on Feb. 6, 2021 (now U.S. Pat. No. 11,088,130, issued on Aug. 10, 2021); which is a continuation-in-part of U.S. patent application Ser. No. 17/065,424 filed on Oct. 7, 2020 (now U.S. Pat. No. 10,950,581, issued on Mar. 16, 2021); which is a continuation-in-part of U.S. patent application Ser. No. 15/482,787 filed on Apr. 9, 2017 (now U.S. Pat. No. 10,840,239, issued on Nov. 17, 2020); which is a continuation-in-part of U.S. patent application Ser. No. 14/607,077 filed on Jan. 28, 2015 (now U.S. Pat. No. 9,640,531, issued on May 2, 2017); which claims benefit of provisional U.S. Patent Application No. 62/042,229, filed on Aug. 26, 2014, provisional U.S. Patent Application No. 62/035,565, filed on Aug. 11, 2014, provisional U.S. Patent Application No. 62/022,498, filed on Jul. 9, 2014, and provisional U.S. Patent Application No. 61/932,617, filed on Jan. 28, 2014. U.S. patent application Ser. No. 14/607,077 is also a continuation-in-part of U.S. patent application Ser. No. 14/628,231 filed on Feb. 21, 2015 (now U.S. Pat. No. 9,142,553, issued on Sep. 22, 2015). The entire contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016; and pending U.S. Patent Application Publications and applications, Ser. Nos. 14/642,724, 15/150,395, 15/173,686, 16/337,665, 16/558,304, 16/649,660, 16/836,659, 17/151,867, 62/651,722; 62/681,249, 62/713,345, 62/770,751, 62/952,222, 62/824,288, 63/075,067, 63/091,307, 63/115,000, 2020/0013791, Ser. No. 16/558,304; and PCT Applications (and Publications): PCT/US2010/ 052093, PCT/US2011/042071 (WO2012/015550), PCT/US2016/52726 (WO2017053329), PCT/US2017/ 052359 (WO2018/071143), PCT/US2018/016759 (WO2018144957), and PCT/US2018/52332 (WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, and 10,943, 934. The entire contents of the foregoing patents, publications, and applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: [0034] among the technologies to form the detaching layer, one of the well-known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions." Furthermore, in U.S. application Ser. No. 13/175, 652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and longtime should be performed, and this can strongly damage the cell devices underneath." In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons .... The dose of hydrogen is too high and, therefore, semiconductor crystalline lattices are demolished by the hydrogen ion bombardment during the hydrogen ion implantation. Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . ."

In at least one embodiment presented herein, at least one innovative method and device structure to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

In addition, thermal limitations during IC fabrication have been a big obstacle on the road to monolithic three-dimensional ICs. The semiconductor and microelectronic processing techniques to form transistors, circuits, and devices, for example to form some silicon oxides or nitrides, repair damages from processes such as etching and ion-implantation, annealing and activation of ion implanted species, and epitaxial regrow techniques, have processing temperatures (for example, greater than 400° C.) and times at temperature that would damage and harm the underlying metallization and/or device layers and structures. These processes may involve transient (short timescales, such as less than 500 ns short wavelength laser pulses) heat exposures to the wafer being processed, or steady state applications (such as RTA, RTO, spike, flash, CVD, ALD) of heat and/or heated material or gases that may have processing times of seconds, minutes, or hours.

Techniques to remove heat from 3D Integrated Circuits and Chips and protect sensitive metallization and circuit elements from either the heat of processing of the 3D layers or the operationally generated heat from an active circuit, will be beneficial.

Additionally the 3D technology according to some embodiments of the invention may enable some very innovative IC devices alternatives with reduced development costs, novel and simpler process flows, increased yield, and other illustrative benefits.

SUMMARY

The invention may be directed to multilayer or Three Dimensional Integrated Circuit (3D IC) devices and fabrication methods.

In one aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; a plurality of connection paths, where the plurality of connection paths provide first connections from a plurality of the first transistors to a plurality of the second transistors, where the second level is bonded to the first level, where the bonded includes oxide to oxide bond regions, where the bonded includes metal to metal bond regions, and where the third layer includes crystalline silicon; and at least one temperature sensor.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; a plurality of connection paths, where the plurality of connection paths provide first connections from a plurality of the first transistors to a plurality of the second transistors, where the second level is bonded to the first level, where the bonded includes oxide to oxide bond regions, where the bonded includes metal to metal bond regions, where the third layer includes crystalline silicon, where the second level includes guard-rings, and where at least one of the guard-rings surrounds the second transistors and the second interconnections.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provide first connections from a plurality of the first transistors to a plurality of the second transistors, where the second level is bonded to the first level, where the bonded includes oxide to oxide bond regions, where the bonded includes metal to metal bond regions, where the second level includes at least one memory array, where the third layer includes crystalline silicon, where the first level includes a first computer bus, where the second level includes a second computer bus, and where the at least one of the plurality of connection paths provides connection between the first bus and the second bus.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the third layer includes crystalline silicon, and where the second level includes at least one phase-lock-loop ("PLL") circuit.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the third layer includes crystalline silicon, where the first level includes a first data bus, where the second level includes a second data bus, where the metal to metal bond regions include connections between the first data bus and the second data bus, where the first level includes a first die area, where the second level includes a second die area, and where the first die area is at least 10% greater than the second die area.

In another aspect, a 3D semiconductor device, the device including: a first level, where the first level includes a first layer, the first layer including first transistors, and where the first level includes a second layer, the second layer including first interconnections; a second level overlaying the first level, where the second level includes a third layer, the third layer including second transistors, and where the second level includes a fourth layer, the fourth layer including second interconnections; and a plurality of connection paths, where the plurality of connection paths provides connections from a plurality of the first transistors to a plurality of the second transistors, where the second level is bonded to the first level, where the bonded includes oxide to oxide bond regions, where the bonded includes metal to metal bond regions, where the second level includes at least one memory array, where the third layer includes crystalline silicon, where the first layer includes a first atom type, where the third layer includes a second atom type, and where the first atom type is different from the second atom type.

BRIEF DESCRIPTION OF THE DRAWINGS

Various embodiments of the invention will be understood and appreciated more fully from the following detailed description, taken in conjunction with the drawings in which:

FIGS. 2A-2B are exemplary drawing illustrations of a process flow for manufacturing a crystallized layer suitable for forming transistors;

FIGS. 5A-5F are exemplary drawing illustrations of an additional process flow for manufacturing fully depleted MOSFET (FD-MOSFET) with an integrated shield/heat sink layer;

FIG. 11B is an exemplary illustration of a flowchart of partitioning logic units onto at least two stratums;

FIGS. 13A-13G are exemplary illustrations of an n-channel FD-MOSFET with integrated TRL (Trap Rich Layer) device and process flow;

FIGS. 14A-14E are exemplary illustrations of an additional n-channel FD-MOSFET with integrated TRL (Trap Rich Layer) device and process flow;

FIGS. 15A-15G are exemplary illustrations of a MEMS oscillator integrated in a 3DIC stack system and process flow;

FIGS. 16A-16K are exemplary illustrations of 3DIC process flow with carrier wafer;

FIG. 18A is an exemplary illustration of back to back memory cells in a stratum-3 and a stratum-2 in a dual strata configuration utilizing a unified back-bias;

FIG. 18C is an exemplary illustration of Finfet transistors each in a stratum-3 and a stratum-2 in a dual strata configuration;

FIGS. 19A-19K are exemplary illustrations of a process flow for the formation of stratum-2 and stratum-3 devices (thus forming a dual strata), which may be layer transferred and connected to a target wafer/substrate;

DETAILED DESCRIPTION

Figure 1:
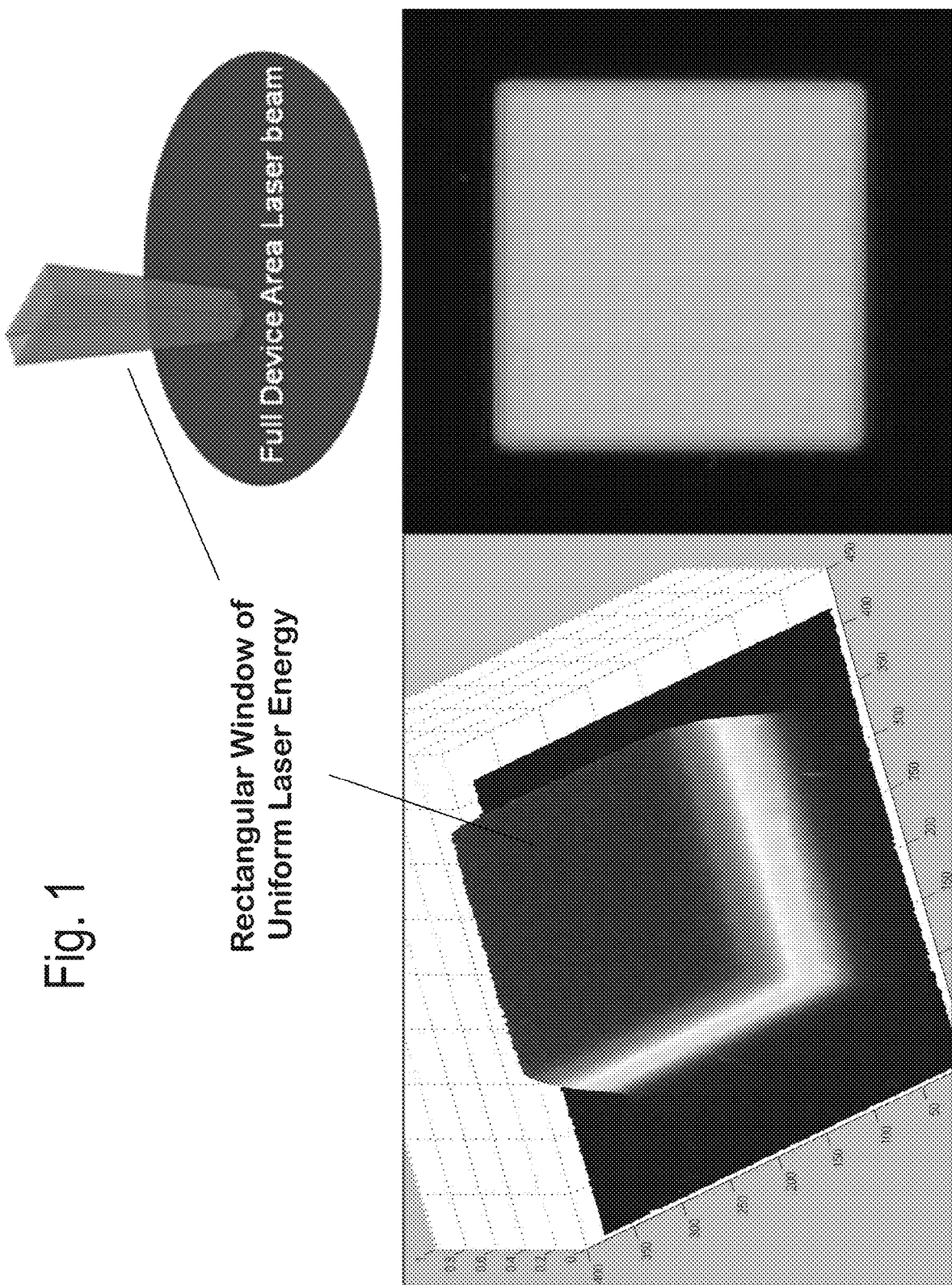
FIG. 1 is an exemplary illustration of a laser annealing machine's output that may form a large rectangular window of uniform laser energy.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

Some monolithic 3D approaches are described in U.S. Pat. Nos. 8,273,610, 8,557,632, 8,298,875, 8,557,632, 8,163,581, 8,378,715, 8,379,458, 8,450,804, 8,574,929, 8,581,349, 8,687,399, 8,742,476, 8,674,470, 8,994,404, 9,023,688, 9,219,005, 9,385,058. The contents of the foregoing patents, publications, and applications are incorporated herein by reference.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 33A-F of incorporated patent reference U.S. Pat. No. 8,574,929. An exemplary process flow for an FD-RCAT with an optional integrated heat shield/spreader is shown in FIGS. 34A-G of incorporated patent reference U.S. Pat. No. 8,574,929. An exemplary process flow for a FD-MOSFET with an optional integrated heat shield/spreader is shown in FIGS. 45A-G of incorporated patent reference U.S. Pat. No. 8,574,929. An exemplary process flow for a planar fully depleted n-channel MOSFET (FD-MOSFET) with an optional integrated heat shield/spreader and back planes and body bias taps is shown in FIGS. 46A-G of incorporated patent reference U.S. Pat. No. 8,574,929. An exemplary process flow for a horizontally oriented JFET or JLT with an optional integrated heat shield/spreader is shown in FIGS. 47A-G of incorporated patent reference U.S. Pat. No. 8,574,929. An alternate method to construct a planar fully depleted undoped channel MOSFET (FD-MOSFET) with an optional integrated heat shield/spreader and back planes and body bias taps suitable for a monolithic 3D IC is shown in FIGS. 5A-5F herein. The 3D-ICs may be constructed in a 3D stacked layer using procedures outlined herein and such as, for example, FIGS. 39, 40, 41 of incorporated patent reference U.S. Pat. No. 8,574,929 and in other incorporated references. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength), or a short pulse laser (such as 160 ns), with 308 nm wavelength, and large area (die or step-field sized, including 1 cm$^2$) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64), Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or neutral/reducing atmospheres (such as nitrogen or argon or hydrogen). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanoseconds to milliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline. The transistors in a first layer of transistors may include a substantially different channel and/or source/drain material than the second layer of transistors. For example, the first layer of transistors may include silicon-based transistor channels and the second layer of transistors may include a germanium based transistor channels.

One compelling advantage of the Excico's laser annealing machine is its output optical system. This optical system forms a large rectangular window of uniform laser energy with less than 10% variation over the surface to be annealed, and with sharp edges of less than 100 micron between the uniform energy and almost no energy as illustrated in FIG. 1. Accordingly a whole die or even reticle could be exposed in one shot. By setting the window size and aligning the laser to the wafer properly, it could allow the laser annealing process to have the stitching of optical energy, such as pulsed laser exposures, at a desired area, such as the scribe street, such as for example lines 104, potential dicing line 104-1, potential dicing lines 104-2, in FIG. 10 of incorporated patent reference U.S. Pat. No. 8,273,610 to Or-Bach, et al. Thus, the laser stich may be placed between dies, thereby reducing the risk from uneven exposure at the stitching area affecting any of the desired circuit transistors or elements. Additionally, the window size may be set to cover a multiplicity of dice or tiles, such as end-device 3611 of FIG. 36 of incorporated patent reference U.S. Pat. No. 8,273,610 to Or-Bach, et al., which may also have potential dice lines, such as potential dice lines 3602 and/or actual dice lines, such as actual dice lines 3612. The optical annealing could be done sequentially across the wafer or in steppings that substantially cover the entire wafer area but spread the heat generation/absorption to allow better heat dissipation and removal. Such spreading of heat generation could be done, for example, by scanning the wafer surface like a checkerboard, first exposing rectangles or areas such as the 'blacks' of the checkerboard, and then the 'white' locations.

Various methods and procedures to form Finfet transistors and thin-side-up transistors, many as part of a 3D stacked layer formation, are outlined herein and in at least U.S. Pat. No. 8,273,610 (at least in FIGS. 58, 146, 220 and associated specification paragraphs), U.S. Pat. Nos. 8,557,632 and 8,581,349, and US Patent Application Publication 2013/0020707, and U.S. Patent Applications such as 62/042,229 of the incorporated references.

While concepts in this document have been described with respect to 3D-ICs with two stacked device layers, those of ordinary skill in the art will appreciate that it can be valid for 3D-ICs with more than two stacked device layers. Additionally, some of the concepts may be applied to 2D ICs.

The damage of the to be transferred crystalline layer caused by the ion-cut implantation traversing the layer may be thermally annealed, as described in at least FIG. 44 and associated specification of incorporated patent reference U.S. Pat. No. 8,574,929, or may be optically annealed, as described in at least FIGS. 33, 34, 45, 46 and 47 and associated specification of incorporated patent reference U.S. Pat. No. 8,574,929, or may be annealed by other methods such as ultrasonic or megasonic energy, as described in incorporated patent references U.S. Pat. Nos. 8,574,929, 8,273,610 and 8,557,632. These techniques repair the ion-implantation and layer transfer damage that is within the transferred crystalline layer or layers. An embodiment of the invention is to perform the layer transfer of the ion-cut crystalline silicon layer, clean the surface of the transferred crystalline layer, then deposit a thin layer of amorphous silicon, and utilize optical annealing to form a layer or layer of substantially monocrystalline silicon in which the devices may be made with high quality, or the crystalized a-Si layer may be utilized as a raised source drain of high dopant concentration. The use of layer transfer techniques that do not use an ion-cut, and hence avoid the damage issues, are disclosed later herein.

As illustrated in FIG. 2A, an doped or undoped substrate donor wafer 200 may be processed to in preparation for layer transfer by ion-cut of a layer of monocrystalline silicon. The structure may include a wafer sized layer of doping across the wafer, N– doped layer 202. The N– doped layer 202 may be formed by ion implantation and thermal anneal as described elsewhere in the incorporated references and may include a crystalline material, for example, mono-crystalline (single crystal) silicon. N– doped layer 202 may be very lightly doped (less than 1e15 atoms/cm$^3$) or lightly doped (less than 1e16 atoms/cm$^3$) or nominally un-doped (less than 1e14 atoms/cm$^3$). N– doped layer 202 may have additional ion implantation and anneal processing to provide a different dopant level than N– substrate donor wafer 200 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The top surface of N– substrate donor wafer 200 layer stack may be prepared for oxide wafer bonding with a deposition of an oxide or by thermal oxidation of N– doped layer 202 to form oxide layer 280. A layer transfer demarcation plane (shown as dashed line) 299 may be formed by hydrogen implantation or other methods as described in the incorporated references. The N– substrate donor wafer 200, such as surface 282, and acceptor wafer 210 may be prepared for wafer bonding as previously described and low temperature (less than approximately 400° C.) bonded. Acceptor wafer 210, as described herein and in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 210 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 210 may include transistors such as, for example, MOSFETS, FD-MOSFETS, FinFets, FD-RCATs, BJTs, HEMTs, and/or HBTs. The portion of the N– doped layer 202 and the N– substrate donor wafer 200 that may be above (when the layer stack is flipped over and bonded to the acceptor wafer 210) the layer transfer demarcation plane 299 may be removed by cleaving or other low temperature processes as described in the incorporated references, such as, for example, ion-cut with mechanical or thermal cleave, thus forming remaining N− layer 203.

Figure 2B:
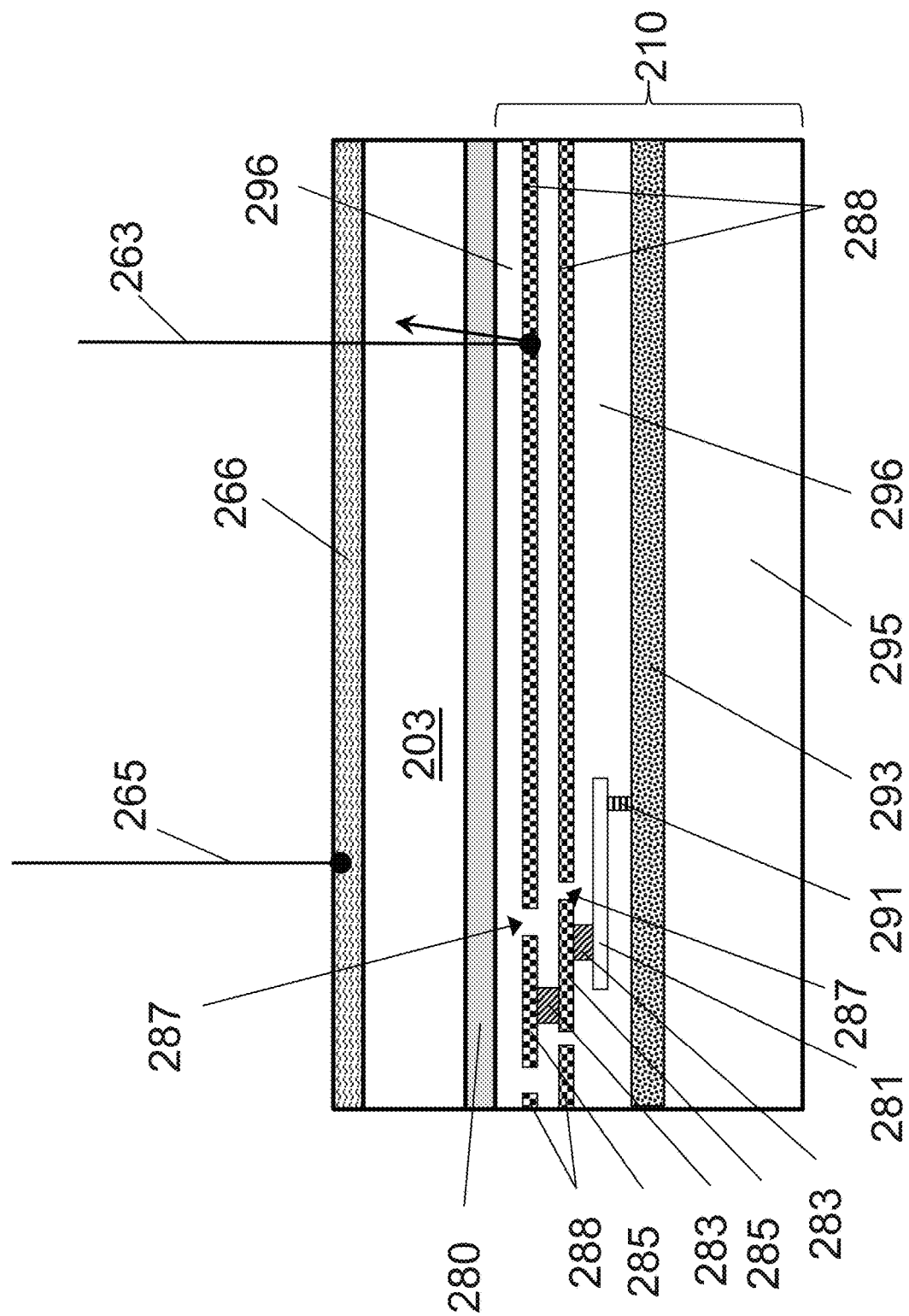

As illustrated in FIG. 2B, oxide layer 280 and remaining N− layer 203 have been layer transferred to acceptor wafer 210. The top surface of remaining N− layer 203 may be chemically or mechanically polished, and/or may be thinned by low temperature oxidation and strip processes, such as the TEL SPA tool radical oxidation and $HF:H_2O$ solutions as described herein and in referenced patents and patent applications. Thru the processing, the wafer sized layer remaining N− layer 203 could be thinned from its original total thickness, and its final total thickness could be in the range of about 3 nm to about 30 nm, for example, about 3 nm, about 5 nm, about 7 nm, about 10 nm, about 15 nm, about 20 nm, or about 30 nm. Remaining N− layer 203 may have a thickness that may allow full gate control of channel operation when the transistor, for example a JFET (or JLT) or FD-MOSFET, is substantially completely formed. Acceptor wafer 210 may include one or more (two are shown in this example) shield/heat sink layers 288, which may include materials such as, for example, Aluminum, Tungsten (a refractory metal), Copper, silicon or cobalt based silicides, or forms of carbon such as carbon nanotubes, and may be layered itself as described herein FIG. 3. Each shield/heat sink layer 288 may have a thickness range of about 50 nm to about 1 mm, for example, about 50 nm, about 100 nm, about 200 nm, about 300 nm, about 500 nm, about 0.1 um, about 1 um, about 2 um, and about 10 um. Shield/heat sink layer 288 may include isolation openings 287, and alignment mark openings (not shown), which may be utilized for short wavelength alignment of top layer (donor) processing to the acceptor wafer alignment marks (not shown). Shield/heat sink layer 288 may include one or more shield path connects 285 and shield path vias 283. Shield path via 283 may thermally and/or electrically couple and connect shield path connect 285 to acceptor wafer 210 interconnect metallization layers such as, for example, exemplary acceptor metal interconnect 281 (shown). Shield path connect 285 may also thermally and/or electrically couple and connect each shield/heat sink layer 288 to the other and to acceptor wafer 210 interconnect metallization layers such as, for example, acceptor metal interconnect 281, thereby creating a heat conduction path from the shield/heat sink layer 288 to the acceptor substrate 295, and a heat sink (not shown, see incorp. Refs.). Isolation openings 287 may include dielectric materials, similar to those of BEOL isolation 296. Acceptor wafer 210 may include first (acceptor) layer metal interconnect 291, acceptor wafer transistors and devices 293, and acceptor substrate 295. After cleaning the top surface of remaining N− layer 203, a layer of amorphous silicon 266 may be deposited. Amorphous silicon layer 266 may have a thickness that could be in the range of about 3 nm to about 300 nm, for example, about 3 nm, about 5 nm, about 7 nm, about 10 nm, about 15 nm, about 20 nm, about 30 nm, about 50 nm, about 100 nm, about 200 nm or about 300 nm. Using the single crystal nature of remaining N− layer 203, amorphous silicon layer 266 may be crystallized in an epitaxial fashion by exposure to an optical beam, for example, to short wavelength pulse lasers as described elsewhere herein and in incorporated references. Amorphous silicon layer 266 may be doped in-situ during deposition, or may be ion-implanted after deposition and dopants activated during the optical exposure. Further, amorphous silicon layer 266 may be first crystalized and then ion-implanted with dopants, and then those dopants may be activated with an additional anneal, for example, an optical beam anneal. Optical anneal beams, such as exemplary crystallization/annealing ray 265, may be optimized to focus light absorption and heat generation within or at the surface of amorphous silicon layer 266 to promote the epitaxial regrow into a layer of doped single crystal silicon. The laser assisted crystallization/annealing with the absorbed heat generated by exemplary crystallization/annealing ray 265 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 263 may be reflected and/or absorbed by shield/heat sink layer 288 regions thus blocking the optical absorption of ray blocked metal interconnect 281. Heat generated by absorbed photons from, for example, crystallization/annealing ray 265 may also be absorbed by shield/heat sink layer 288 regions and dissipated laterally and may keep the temperature of underlying metal layers, such as metal interconnect 281, and other metal layers below it, cooler and prevent damage. Shield/heat sink layer 288 and associated dielectrics may laterally spread and conduct the heat generated by the topside defect anneal, and in conjunction with the dielectric materials (low heat conductivity) above and below shield/heat sink layer 288, keep the interconnect metals and low-k dielectrics of the acceptor wafer interconnect layers cooler than a damage temperature, such as, for example, 400° C. or 370° C., or 300° C. A second layer of shield/heat sink layer 288 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 288 may act as a heat spreader and/or absorber. Electrically conductive materials may be used for the two layers of shield/heat sink layer 288 and thus may provide, for example, a Vss and a Vdd plane and/or grid that may be connected to the donor layer transistors above, as well may be connected to the acceptor wafer transistors below, and/or may provide below transferred layer device interconnection. Shield/heat sink layer 288 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 288 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 288 and under & overlying dielectric layers, absorbs and/or spreads the localized heat/light energy of the topside anneal laterally and protects the underlying layers of interconnect metallization & dielectrics, such as in the acceptor wafer 210, from harmful temperatures or damage. When there may be more than one shield/heat sink layer 288 in the device, the heat conducting layer closest to the second crystalline layer or oxide layer 280 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 210 sensitive layers, such as interconnect and device layers) processing, and may be aligned to the acceptor wafer alignment marks (not shown) as described in the incorporated references. This may include further optical defect annealing or dopant activation steps. The N− donor wafer 200 may now also be processed, such as smoothing and annealing, and reused for additional layer transfers. The insulator layer, such as deposited bonding oxides (for example oxide layer 280) and/or before bonding preparation existing oxides (for example the BEOL isolation 296 on top of the topmost metal layer of shield/heat sink layer 288), between the donor wafer transferred monocrystalline layer and the acceptor wafer topmost metal layer, may include thicknesses of less than about 1 um, less than about 500 nm, less than about 400 nm, less than about 300 nm, less than about 200 nm, or less than about 100 nm. Transistors and other devices, such as those described herein and in incorporated referenced patents and patent applications, may be constructed utilizing regions of the crystallized amorphous silicon layer 266 as a portions of the transistor or device; for example, as a transistor channel for an FD-MOSFET or JFET, or as raised source and drain for an FDMOSFET or JLT.

The shield layer, for example, shield/heat sink layer 288 described herein, could be constructed so it may have a substantially larger or better heat conductivity to the sides of the device in the horizontal orientation than the heat conductivity of the shield layer in the vertical direction toward the underlying layers or back to the top surface of the device. Such shield layer, wherein the horizontal heat conductivity or heat spreading capability is substantially greater in the horizontal direction than in the vertical direction, could include a 'sandwich' of heat conductive thin layer, such as a metal (for example copper), overlaid by a thin lower-thermally-conducting layer, for example SiO2, and may repeat the two layer stack multiple times. Vertical electrical continuity may be maintained by etching vertical vias and filling the vias with an electrically conductive material. Overlapping shorting vias or lines may also perform the same function. Such a shield layer could be designed to support various types of optical annealing. Such shielding can block even non laser optical annealing or a $CO_2$ laser that tends to penetrate very deeply. In some cases it might be desired to have the top layer of the shielding layer as non-reflective or as a defusing reflector to reduce damage to the laser annealing machine from the reflected light.

Figure 3:
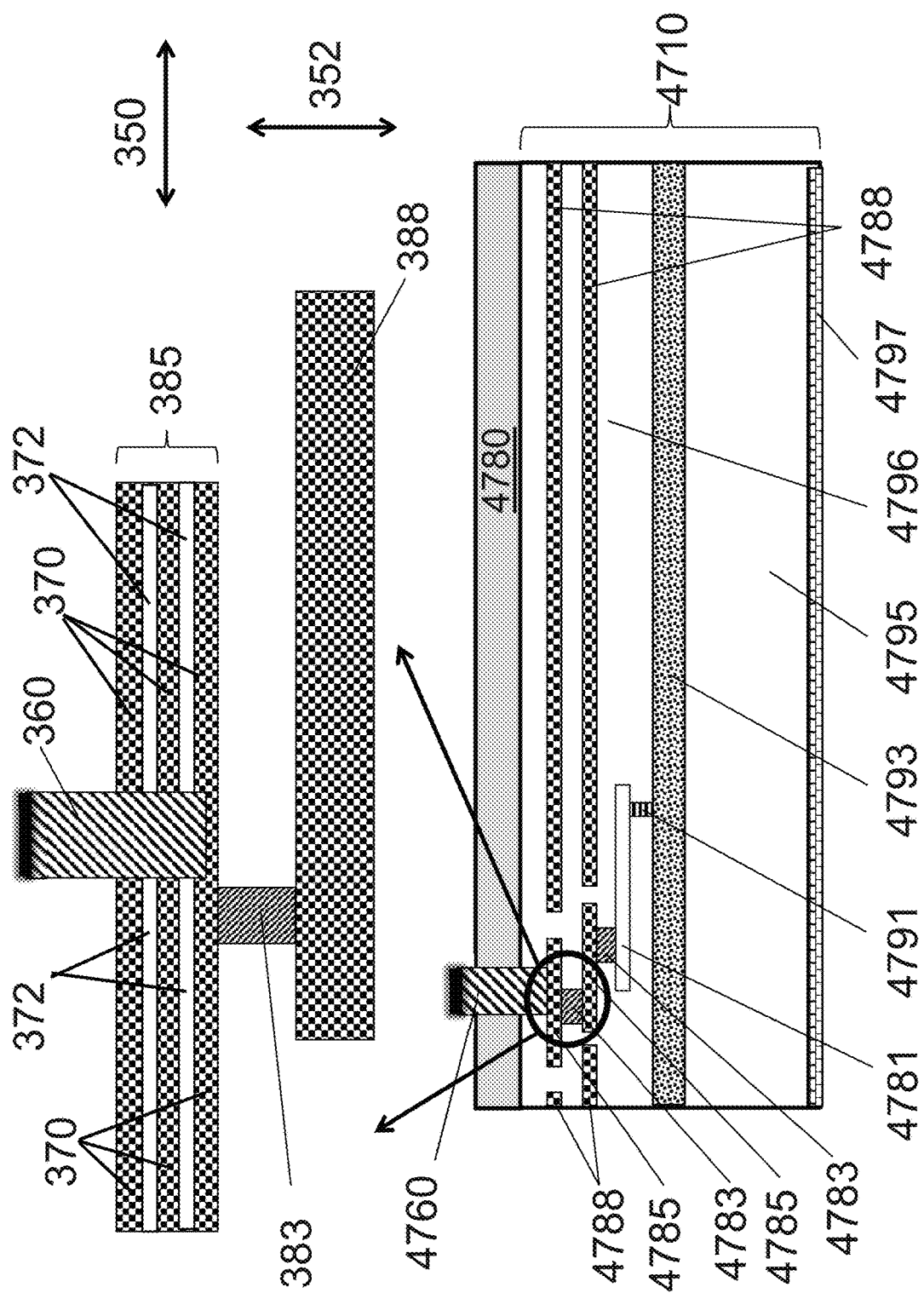
FIG. 3 is an exemplary illustration of a layered shield/heat sink layer that may be constructed wherein the horizontal heat conductivity or heat spreading capability may be substantially greater in the horizontal direction than in the vertical direction.

As illustrated in FIG. 3, a layered shield/heat sink layer may be constructed wherein the horizontal heat conductivity or heat spreading capability may be substantially greater in the horizontal direction than in the vertical direction. The horizontal direction is indicated by horizontal arrow 350 and the vertical direction is indicated by vertical arrow 352. A portion of FIG. 47G of incorporated reference U.S. Pat. No. 8,574,929 is repeated in FIG. 3, showing the portion of a 3D device with shield/heat sink & spreading structure below the second crystalline device layer, which may include oxide layer 4780, a portion of thru layer vias (TLVs) 4760, shield path connects 4785, shield path via 4783, BEOL isolation 4796, shield path via 4783, acceptor metal interconnect 4781, first (acceptor) layer metal interconnect 4791, acceptor wafer transistors and devices 4793, acceptor substrate 4795, and acceptor wafer heat sink 4797 (which may have an external surface or connection to one as described earlier herein), of acceptor wafer 4710. The external surface may be at the top, bottom or sides of the finished device. The device may include an external surface from which heat transfer may take place by methods such as air cooling, liquid cooling, or attachment to another heat sink or heat spreader structure. As indicated in FIG. 3, the area within the circle is blown up to enable clarity of detail for the illustration. Layered shield/heat sink region 385 may include layers or regions of heat conductive material and heat isolative material, for example heat conducting regions 370 and heat isolative regions 372. Heat conducting regions 370 may include materials with a high thermal conductivity greater than 10 W/m-K, such as, for example, (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K), barrier metals such as TiN and TaN, and may be deposited in layers interspersed with heat isolative layers. Heat isolative regions 372 may include materials with a low thermal conductivity (less than 10 W/m-K), or substantially less thermally conductive than the material included in heat conducting regions 370, materials such as, for example, silicon oxide (about 1.4 W/m-K), aerogels, carbon doped oxides. Accordingly, depending on material choices and construction (such as number of cond/iso layers and their thickness), layered shield/heat sink region 385 may have a heat conductivity in the horizontal direction that is 2 times, or 4 times, or ten times greater than the heat conductivity in the vertical direction. Either or both of heat conducting regions 370 and heat isolative regions 372 may be electrically conductive. Heat conducting regions 370 and heat isolative regions 372 may be formed by lithographically defining and then etching the conductive and isolative layer stack using subtractive formation techniques known by those skilled in the art, and may also be formed in a damascene method. Electrical connection between the various heat conducting regions 370 may be made by forming the deep TLV 360, patterned after thru layer vias (TLVs) 4760, to short the various heat conduction regions 370. Deep TLV 360 may be formed by etching substantially to, within, or thru the bottom heat conducting region 370 of layered shield/heat sink region 385. Thus layered shield/heat sink region 385 may be formed wherein the horizontal heat conductivity or heat spreading capability may be substantially greater in the horizontal direction (indicated by horizontal arrow 350) than in the vertical direction (indicated by vertical arrow 352). Shield path connect 383 may be similar to shield path connects 4785 and additional shield/heat sink region 388 may be layered such as, for example, layered shield/heat sink region 385 or shield/heat sink layers 4788 of FIG. 47G of incorporated reference U.S. Pat. No. 8,574,929. Layered shield/heat sink region 385 may be utilized as part of a thermal conduction path, emf shield, back-bias circuits for second layer transistors, and other uses as described herein in relation to FIG. 47 of incorporated reference U.S. Pat. No. 8,574,929, and any other descriptions employing a shield/heat sink layer or region.

Persons of ordinary skill in the art will appreciate that the illustrations in FIG. 3 are exemplary and are not drawn to scale. Such skilled persons will further appreciate that many variations may be possible such as, for example, subtractive region formation techniques may be preferred over damascene for forming layered shield/heat sink region 385 as the shield regions may comprise the majority of the device area at that formation step, and CMP processes within the damascene techniques may be difficult without breaking the shield into small regions, which may affect the heat shielding capability. Two or more layered shield/heat sink layers, properly designed and layed out with overlapping regions, may be useful for the damascene technique. Moreover, when the layered shield/heat sink region 385 is formed by a damascene process flow, then electrical connection between the various heat conducting regions 370 may be made at the top surface of the damascene 'metal' line trench by just a slight over-etch (CMP smearing may not be enough to couple the conductive regions) during deep TLV 360 formation, as many of the various heat conducting regions 370 and heat isolative regions 372 may truncate at the top surface of the trench that is forming layered shield/heat sink region 385. Furthermore, deep TLV 360 may be formed to be fully or partially on the outside edge of the layered shield/heat sink region 385 in order to couple the various heat conducting regions 370. Many other modifications within the scope of the illustrated embodiments of the invention will suggest themselves to such skilled persons after reading this specification. Thus the invention is to be limited only by the appended claims.

Figure 4:
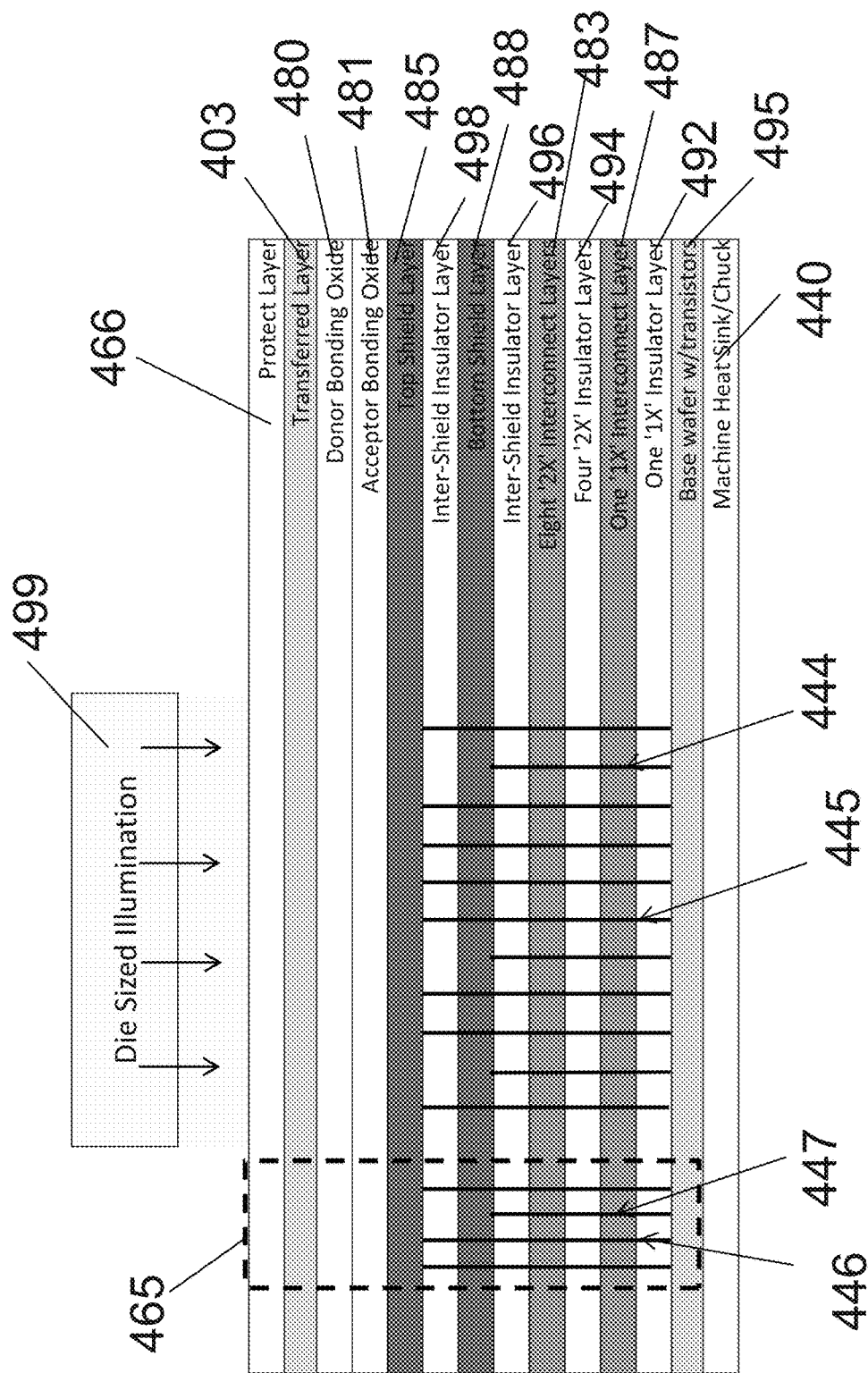
FIG. 4 is an exemplary illustration of a partially processed 3D device with substrate being processed with topside illumination and including thermally conductive paths.

An embodiment of the invention may include an exemplary partially processed 3D device with substrate being processed with topside illumination as illustrated in FIG. 4. The topside illumination 499 may be an optical anneal for purposes, such as, for example, dopant annealing, STI densification and annealing, silicidation, and/or ion-cut damage repair, which have been described herein and in incorporated patents and patent publications and applications. Furthermore, topside illumination 499 may be an optical anneal that is die sized, or reticle sized, or other size and shape as has been described herein and in incorporated patents and patent publications and applications. A transferred layer 403, which may be a transferred layer or layers as described herein and in incorporated patents and patent publications and applications, may have been transferred and bonded to an acceptor wafer or substrate, and may include bonding at the interface between donor bonding oxide 480 and acceptor bonding oxide 481. Transferred layer 403 may have a protect layer 466 (or region) atop it, which may function as a optical absorber, reflector, or energy spreader as described in herein and in incorporated patents and patent publications and applications, and may remain a part of the device at the end of device processing or be sacrificial (removed). Transferred layer 403 may include its entirety or portions, isotopically enriched silicon (such as, for example, >99% $^{28}$Si) or germanium to enable a greater heat conductivity. The relatively higher cost of the isotopically enriched layer or regions can be mitigated by the reuse of a donor wafer comprised wholly or partially with the material. The acceptor wafer at the time of bonding to the donor wafer and at exposure to topside illumination 499 may include acceptor bonding oxide 481, top shield layer 485, inter-shield insulator layer 498, bottom shield layer 488, second inter-shield insulator layer 496, eight '2X' interconnect layers 483 that may be interspersed with four '2X' insulator layers 494, a '1X' interconnect layer 487, a '1X' insulator layer 492, device die thermal conduction paths 445, device scribe-lane thermal conduction paths 446, second device die thermal conduction paths 444, second device scribe-lane thermal conduction paths 447, and a base wafer with transistors and circuits 495. The acceptor wafer may have another combination of these layers and regions as would be clear to one skilled in the art. The elements of the exemplary acceptor wafer may include the materials, process flows, construction, use, etc. as has been described herein and in incorporated patents and patent publications and applications, for example, transferred layer 403 may be doped or undoped silicon, and may have regions of STI or other transistor elements within it or on it, and may include multiple layers or regions of doping. Moreover, transferred layer 403 may include layers or regions that have materials with melting points higher than 900° C. (for example doped mono-crystalline silicon or polysilicon or amorphous silicon, tungsten, tantalum nitride) that may be used, for example, as a back-bias or body bias region or layer, as has been described herein and in incorporated patents and patent publications and applications. Top shield layer 485 may have layered shield regions wherein the horizontal thermal conduction is substantially greater than the vertical heat conduction. The bonded stack of the acceptor wafer and transferred layers may include scribe regions 465; either preformed and/or predetermined scribelanes and/or dicelines, or may include custom function definition and etching, or a combination of both. Scribe regions 465 may be constructed with device scribe-lane thermal conduction paths 446 that may provide a thermal conduction path from the top shield layer 485 to the base wafer with transistors and circuits 495, which could then conduct heat that may be generated from topside illumination 499 to the illumination machine heat sink/chuck 440 and thus help prevent damage from the topside illumination 499 of the acceptor interconnect layers, such as, for example, the eight '2X' interconnect layers 483, four '2X' insulator layers 494, 1X' interconnect layer 487, '1X' insulator layer 492, and the transistors and circuits of base wafer with transistors and circuits 495. Second device scribe-lane thermal conduction paths 447 may thermally conduct from bottom shield layer 488 to the base wafer with transistors and circuits 495 and the illumination machine heat sink/chuck 440. Device die thermal conduction paths 445 within the device die, may provide a thermal conduction path from the top shield layer 485 to the base wafer with transistors and circuits 495, which could then conduct heat that may be generated from topside illumination 499 to the illumination machine heat sink/chuck 440 and thus help prevent damage from the topside illumination 499 of the acceptor interconnect layers, such as, for example, the eight '2X' interconnect layers 483, four '2X' insulator layers 494, 1X' interconnect layer 487, '1X' insulator layer 492, and the transistors and circuits of base wafer with transistors and circuits 495, and has been described herein and in incorporated patents and patent publications. Second device die thermal conduction paths 444 may thermally conduct from bottom shield layer 488 to the base wafer with transistors and circuits 495 and the illumination machine heat sink/chuck 440. Device scribe-lane thermal conduction paths 446 may be removed in the later dice singulation processes whereas the device die thermal conduction paths 445 may remain in the finished device and provide cooling of the second layer and above transistor and circuit layers when the device is in operation and generating heat from the device operation. The density of device die thermal conduction paths 445, device scribe-lane thermal conduction paths 446, second device die thermal conduction paths 444, and second device scribe-lane thermal conduction paths 447 is a device design and thermal architecture calculation, but may be on the order of 1 every 100 um$^2$ (Wei H., et al., "Cooling Three-Dimensional Integrated Circuits Using Power Delivery Networks", IEDM 2012, 14.2, December 2012. incorporated by reference in entirety). Scribelanes (or dicelanes), such as scribe regions 465, may be about 10 um wide, about 20 um wide, about 50 um wide, about 100 um wide, or greater than about 100 um wide depending on design choice and die singulation process capability.

Persons of ordinary skill in the art will appreciate that the illustrations in FIG. 4 are exemplary and are not drawn to scale. Such skilled persons will further appreciate that many variations may be possible such as, for example, bottom shield layer 488 may also be formed as a layered shield/heat sink layer or region. Moreover, although many of the elements in the FIG. 4 may be called layers, they main include within them regions. Furthermore, device scribe-lane thermal conduction paths 446 and device die thermal conduction paths 445 may be formed so that there is no electrical connection to bottom shield layer 488, unless they are designed to do so as the same circuit node. Further, the choice of eight '2X' interconnect layers 483 that may be interspersed with four '2X' insulator layers 494, a '1X' interconnect layer 487, a '1X' insulator layer 492 is a design choice and may be different according to the design considerations, both device functionally and thermally. Moreover, the various semiconductor layers within the 3D device may have various circuitry, functions and connection, for example, as described herein (such as FIG. 6) or in incorporated patent references. Thus the invention is to be limited only by the appended claims.

An alternate method to construct a planar fully depleted undoped channel MOSFET (FD-MOSFET) with an optional integrated heat shield/spreader and back planes and body bias taps suitable for a monolithic 3D IC as presented in FIG. 46A-46G of incorporated reference U.S. Pat. No. 8,574,929 may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. In this embodiment, a ground plane is constructed that may provide improved electrostatics and/or Vt adjustment and/or back-bias of the FD-MOSFET. In addition, selective regions may be constructed to provide body bias and/or partially depleted/bulk-like transistors. Moreover, a heat spreading, heat conducting and/or optically reflecting material layer or layers may be incorporated between the sensitive metal interconnect layers below and the layer or regions being optically irradiated and annealed to repair defects in the crystalline 3D-IC layers and regions, crystallize an undoped transistor channel, and to activate semiconductor dopants in the crystalline layers or regions of a 3D-IC without harm to the sensitive metal interconnect and associated dielectrics. FIGS. 5A-F illustrate an exemplary undoped-channel FD-MOSFET which may be constructed in a 3D stacked layer using procedures outlined below and in the incorporated references.

As illustrated in FIG. 5A, SOI donor wafer substrate 500 may include back channel layer 502 above Buried Oxide BOX layer 501. Back channel layer 502 may be doped by ion implantation and thermal anneal, may include a crystalline material, for example, mono-crystalline (single crystal) silicon and may be heavily doped (greater than 1e16 atoms/cm$^3$), lightly doped (less than 1e16 atoms/cm$^3$) or nominally un-doped (less than 1e14 atoms/cm$^3$). SOI donor wafer substrate 500 may include a crystalline material, for example, mono-crystalline (single crystal) silicon and at least the upper layer near BOX layer 501 may be very heavily doped (greater than 1e20 atoms/cm$^3$). Back channel layer 502 may have additional ion implantation and anneal processing to provide a different dopant level than SOI donor wafer substrate 500 and may have graded and/or various layers of doping concentration. SOI donor wafer substrate 500 may have additional ion implantation and anneal processing to provide a different dopant level than back channel layer 502 and may have graded and/or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). SOI donor wafer may be constructed by layer transfer techniques described herein or elsewhere as known in the art, or by laser annealed SIMOX at a post donor layer transfer to acceptor wafer step. BOX layer 501 may be thin enough to provide for effective back and/or body bias, for example, about 25 nm, or about 20 nm, or about 10 nm, or about 35 nm.

As illustrated in FIG. 5B, the top surface of the SOI donor wafer substrate 500 layer stack may be prepared for oxide wafer bonding with a deposition of an oxide or by thermal oxidation of back channel layer 502 to form oxide layer 580. A layer transfer demarcation plane (shown as dashed line) 599 may be formed by hydrogen implantation or other methods as described in the incorporated references, and may reside within the SOI donor wafer substrate 500. The SOI donor wafer substrate 500 stack, such as surface 582, and acceptor wafer 510 may be prepared for wafer bonding as previously described and low temperature (less than approximately 400° C.) bonded. Acceptor wafer 510, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 510 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 510 may include transistors such as, for example, MOSFETS, FD-MOSFETS, FinFets, FD-RCATs, BJTs, HEMTs, and/or HBTs. The portion of the SOI donor wafer substrate 500 that may be above (when the layer stack is flipped over and bonded to the acceptor wafer 510) the layer transfer demarcation plane 599 may be removed by cleaving or other low temperature processes as described in the incorporated references, such as, for example, ion-cut with mechanical or thermal cleave or other layer transfer methods, thus forming remaining S/D layer 503. Damage/defects to crystalline structure of back channel layer 502 may be annealed by some of the annealing methods described, for example the short wavelength pulsed laser techniques, wherein the back channel layer 502 and/or portions of the SOI donor wafer substrate 500 may be heated to defect annealing temperatures, but the layer transfer demarcation plane 599 may be kept below the temperature for cleaving and/or significant hydrogen diffusion. The optical energy may be deposited in the upper layer of the stack, for example near surface 582, and annealing of back channel layer 502 and/or portions of the SOI donor wafer substrate 500 may take place via heat diffusion. Moreover, multiple pulses of the laser may be utilized to improve the anneal, activation, and yield of the process and/or to control the maximum temperature of various structures in the stack.

Figure 5C:
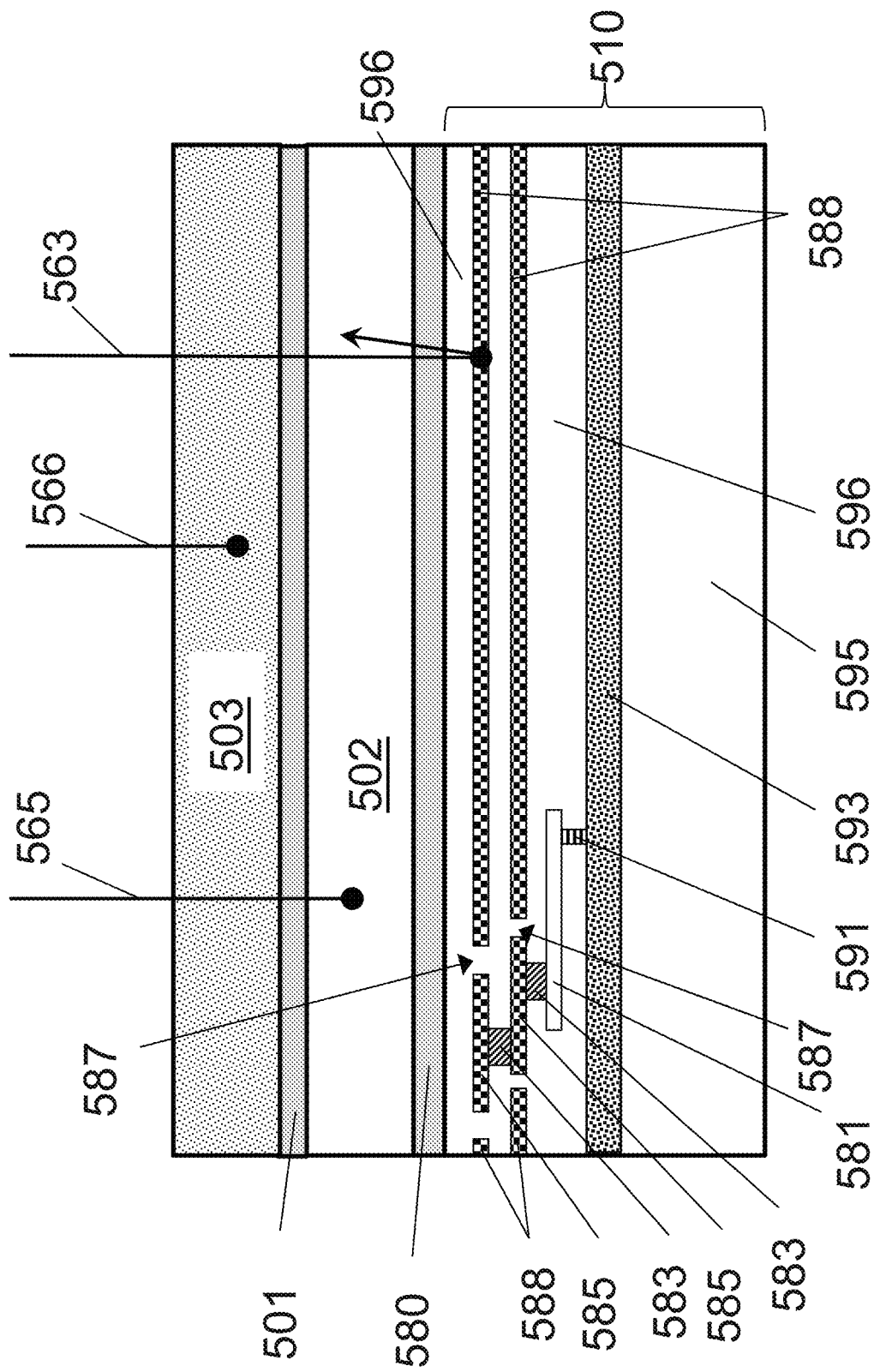

As illustrated in FIG. 5C, oxide layer 580, back channel layer 502, BOX layer 501 and S/D layer 503 may be layer transferred to acceptor wafer 510. The top surface of S/D layer 503 may be chemically or mechanically polished, and/or may be thinned by low temperature oxidation and strip processes, such as the TEL SPA tool radical oxidation and HF:H$_2$O solutions as described in referenced patents and patent applications. Thru the processing, the wafer sized layer S/D layer 503 could be thinned from its original total thickness, and its final total thickness could be in the range of about 5 nm to about 20 nm, for example, about 5 nm, about 7 nm, about 10 nm, about 12 nm, about 15 nm, or about 20 nm. S/D layer 503 may have a thickness and/or doping that may allow a minimum Rext and maximum electron injection velocities when the FD-MOSFET transistor is substantially completely formed. Acceptor wafer 510 may include one or more (two are shown in this example) shield/heat sink layers 588, which may include materials such as, for example, Aluminum, Tungsten (a refractory metal), Copper, silicon or cobalt based silicides, or forms of carbon such as carbon nanotubes, and may be layered itself as described herein FIG. 3. Each shield/heat sink layer 588 may have a thickness range of about 50 nm to about 1 mm, for example, about 50 nm, about 100 nm, about 200 nm, about 300 nm, about 500 nm, about 0.1 um, about 1 um, about 2 um, and about 10 um. Shield/heat sink layer 588 may include isolation openings 587, and alignment mark openings (not shown), which may be utilized for short wavelength alignment of top layer (donor) processing to the acceptor wafer alignment marks (not shown). Shield/heat sink layer 588 may include one or more shield path connects 585 and shield path vias 583. Shield path via 583 may thermally and/or electrically couple and connect shield path connect 585 to acceptor wafer 510 interconnect metallization layers such as, for example, exemplary acceptor metal interconnect 581 (shown). Shield path connect 585 may also thermally and/or electrically couple and connect each shield/heat sink layer 588 to the other and to acceptor wafer 510 interconnect metallization layers such as, for example, acceptor metal interconnect 581, thereby creating a heat conduction path from the shield/heat sink layer 588 to the acceptor substrate 595, and a heat sink (not shown). Isolation openings 587 may include dielectric materials, similar to those of BEOL isolation 596. Acceptor wafer 510 may include first (acceptor) layer metal interconnect 591, acceptor wafer transistors and devices 593, and acceptor substrate 595. Various topside defect anneals may be utilized. For this illustration, an optical beam such as the laser annealing previously described is used. Optical anneal beams may be optimized to focus light absorption and heat generation within or at the surface of S/D layer 503 and provide surface smoothing and/or defect annealing (defects may be from the cleave and/or the ion-cut implantation) with exemplary smoothing/annealing ray 566. The laser assisted smoothing/annealing with the absorbed heat generated by exemplary smoothing/annealing ray 566 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawiyluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 563 may be reflected and/or absorbed by shield/heat sink layer 588 regions thus blocking the optical absorption of ray blocked metal interconnect 581. Annealing of dopants or annealing of damage in back channel layer 502 and/or BOX 510 and/or S/D layer 503, such as from the H cleave implant damage, may be also accomplished by a set of rays such as repair ray 565, illustrated is focused on back channel layer 502. Heat generated by absorbed photons from, for example, smoothing/annealing ray 566, reflected ray 563, and/or repair ray 565 may also be absorbed by shield/heat sink layer 588 regions and dissipated laterally and may keep the temperature of underlying metal layers, such as metal interconnect 581, and other metal layers below it, cooler and prevent damage. Shield/heat sink layer 588 and associated dielectrics may laterally spread and conduct the heat generated by the topside defect anneal, and in conjunction with the dielectric materials (low heat conductivity) above and below shield/heat sink layer 588, keep the interconnect metals and low-k dielectrics of the acceptor wafer interconnect layers cooler than a damage temperature, such as, for example, about 400° C. A second layer of shield/heat sink layer 588 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 588 may act as a heat spreader. Electrically conductive materials may be used for the two layers of shield/heat sink layer 588 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 593), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 588 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 588 may be sandwiched and/or substantially enclosed by materials with a low thermal conductivity (less than about 10 W/m-K), for example, silicon dioxide (about 1.4 W/m-K). The sandwiching of high and low thermal conductivity materials in layers, such as shield/heat sink layer 588 and under & overlying dielectric layers, spreads the localized heat/light energy of the topside anneal laterally and protects the underlying layers of interconnect metallization & dielectrics, such as in the acceptor wafer 510, from harmful temperatures or damage. When there may be more than one shield/heat sink layer 588 in the device, the heat conducting layer closest to the second crystalline layer or oxide layer 580 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 510 sensitive layers, such as interconnect and device layers) processing, and may be aligned to the acceptor wafer alignment marks (not shown) as described in the incorporated references. This may include further optical defect annealing or dopant activation steps. The remaining SOI donor wafer substrate 500 may now also be processed, such as smoothing and annealing, and reused for additional layer transfers. The insulator layer, such as deposited bonding oxides (for example oxide layer 580) and/or before bonding preparation existing oxides (for example the BEOL isolation 596 on top of the topmost metal layer of shield/heat sink layer 588), between the donor wafer transferred monocrystalline layer and the acceptor wafer topmost metal layer, may include thicknesses of less than about 1 um, less than about 500 nm, less than about 400 nm, less than about 300 nm, less than about 200 nm, or less than about 100 nm.

Figure 5D:
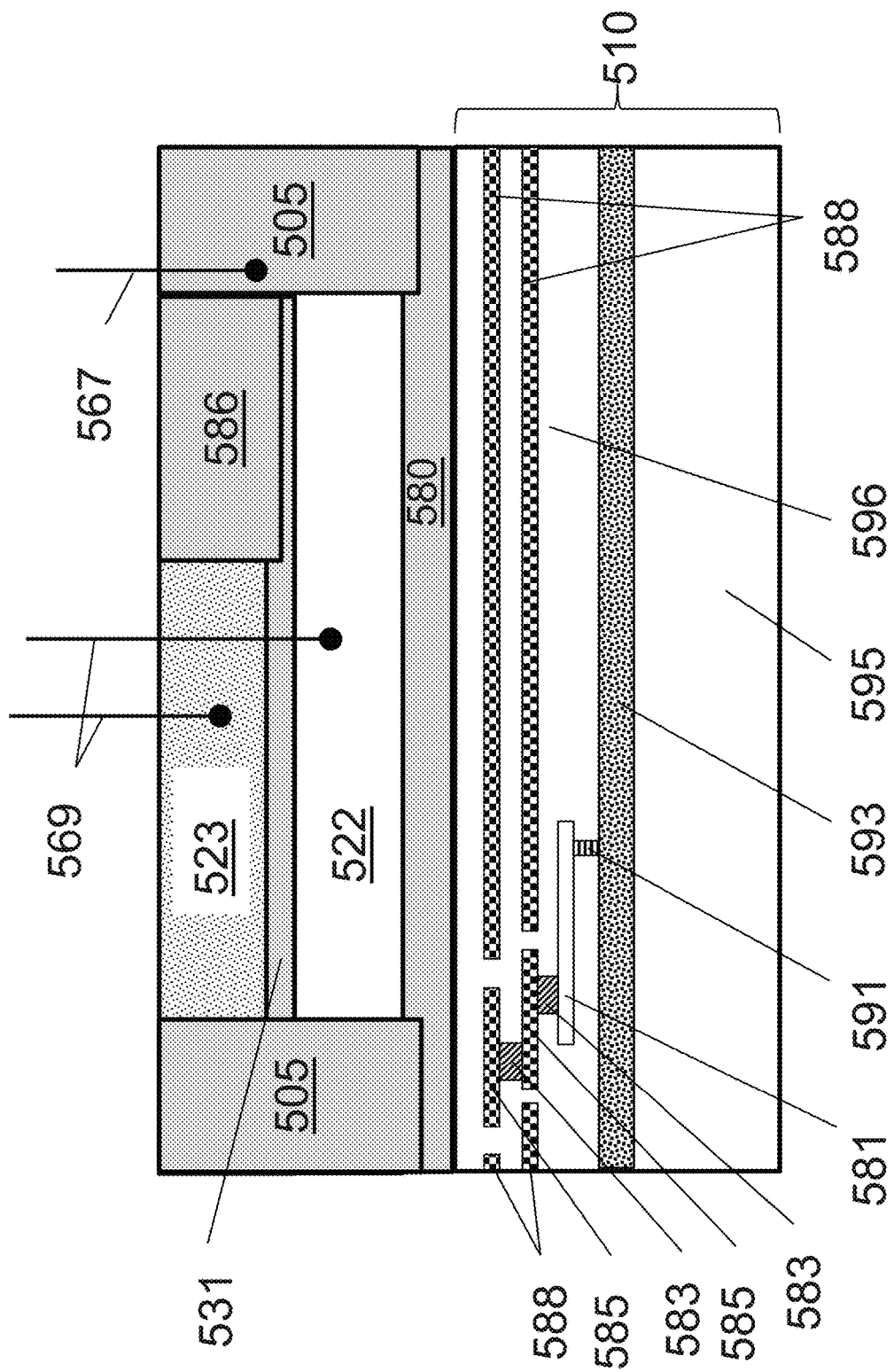

As illustrated in FIG. 5D, transistor and back channel isolation regions 505 and/or transistor isolation regions 586 may be formed. Transistor isolation region 586 may be formed by mask defining and plasma/RIE etching S/D layer 503, substantially to the top of BOX layer 501 (not shown), substantially into BOX layer 501, or back channel layer 502 (not shown). Transistor and back channel isolation regions 505 may be formed by mask defining and plasma/RIE etching channel layer 503, BOX layer 501 and back channel layer 502, substantially to the top of oxide layer 580 (not shown), substantially into oxide layer 580, or further into the top BEOL dielectric layer in acceptor wafer 510 (not shown). Thus intermediate S/D region 523 may be formed, which may substantially form the transistor body, back-channel region 522 may be formed, which may provide a back bias and/or Vt of the eventual transistor channel. Back-channel region 522 may be ion implanted for Vt control and/or body bias efficiency. A low-temperature gap fill dielectric, such as SACVD oxide, may be deposited and chemically mechanically polished, the oxide remaining in transistor and back channel isolation regions 505 and transistor isolation regions 586. An optical step, such as illustrated by exemplary STI ray 567, may be performed to anneal etch damage and densify the STI oxide in transistor and back channel isolation regions 505. The doping concentration of intermediate SID region 523 may include vertical or horizontal gradients of concentration or layers of differing doping concentrations. The doping concentration of back-channel region 522 may include vertical or horizontal gradients of concentration or layers of differing doping concentrations. The optical anneal, such as exemplary STI ray 567, and/or exemplary implant ray 569 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process. BOX region 531 may be a relatively thin dielectric, including the thickness range of about 5 nm to about 100 nm, at least a portion of which being between the back-channel region 522 and intermediate S/D region 523. Back-channel region 522 could be constructed from a material that would not be damaged by the optical anneal process. Such could be a refractory metal or doped silicon in crystallized form, poly or amorphous, or other conductive material that are acceptable for semiconductor processing and can withstand high temperature of about 700° C. or higher.

Figure 5E:
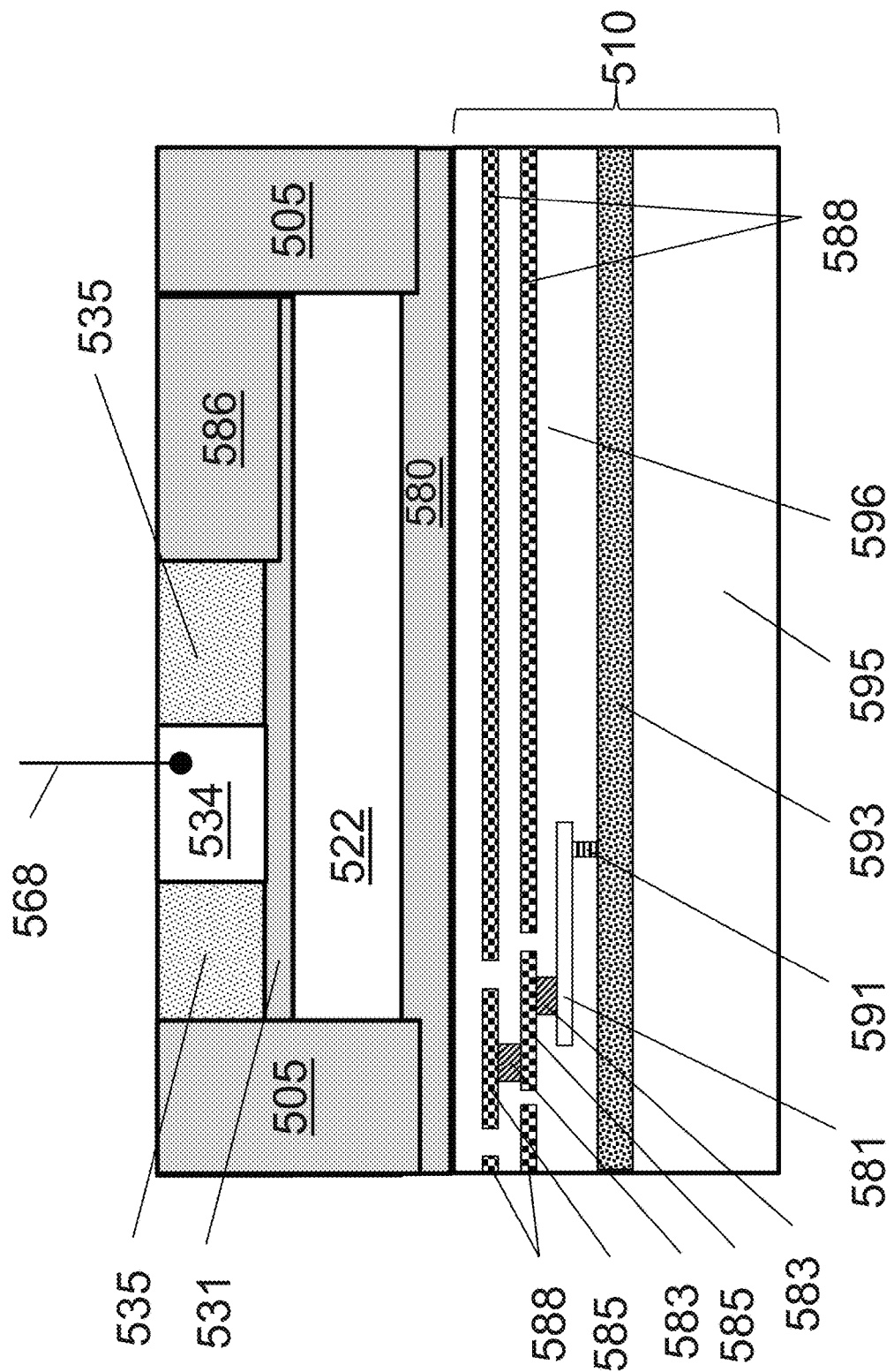

As illustrated in FIG. 5E, an undoped transistor channel may be formed within the intermediate S/D region 523. Regions of intermediate S/D region 523 may be lithographically defined and etched away, clearing the eventual channel region of substantially any silicon material and may etch slightly into BOX region 531. Undoped amorphous silicon or poly silicon may be deposited to fill the eventual channel region. A CMP process may be utilized to remove substantially all of the deposited amorphous silicon or polysilicon not in the etched regions, thus forming undoped channel region 534 and S/D & LDD regions 535. The CMP process may be performed to overpolish and remove a small portion of the tops of S/D & LDD regions 535, back channel isolation regions 505, and transistor isolation regions 586, and any smeared doping material from the S/D & LDD regions 535 may be removed by <400 C oxidation and strip utilizing a process such as the TEL SPA tool described herein and in incorporated patent references. The amorphous silicon or polysilicon in undoped channel region 534 may be crystallized to a near mono-crystalline state by optical annealing such as illustrated by exemplary channel smoothing ray 568, by nano epitaxial ordering from the sidewalls of the mono-crystalline S/D & LDD regions 535. Remaining damages and surface roughness may also be repaired and smoothed respectively by optical annealing, such as illustrated by exemplary channel smoothing ray 568.

Figure 5F:
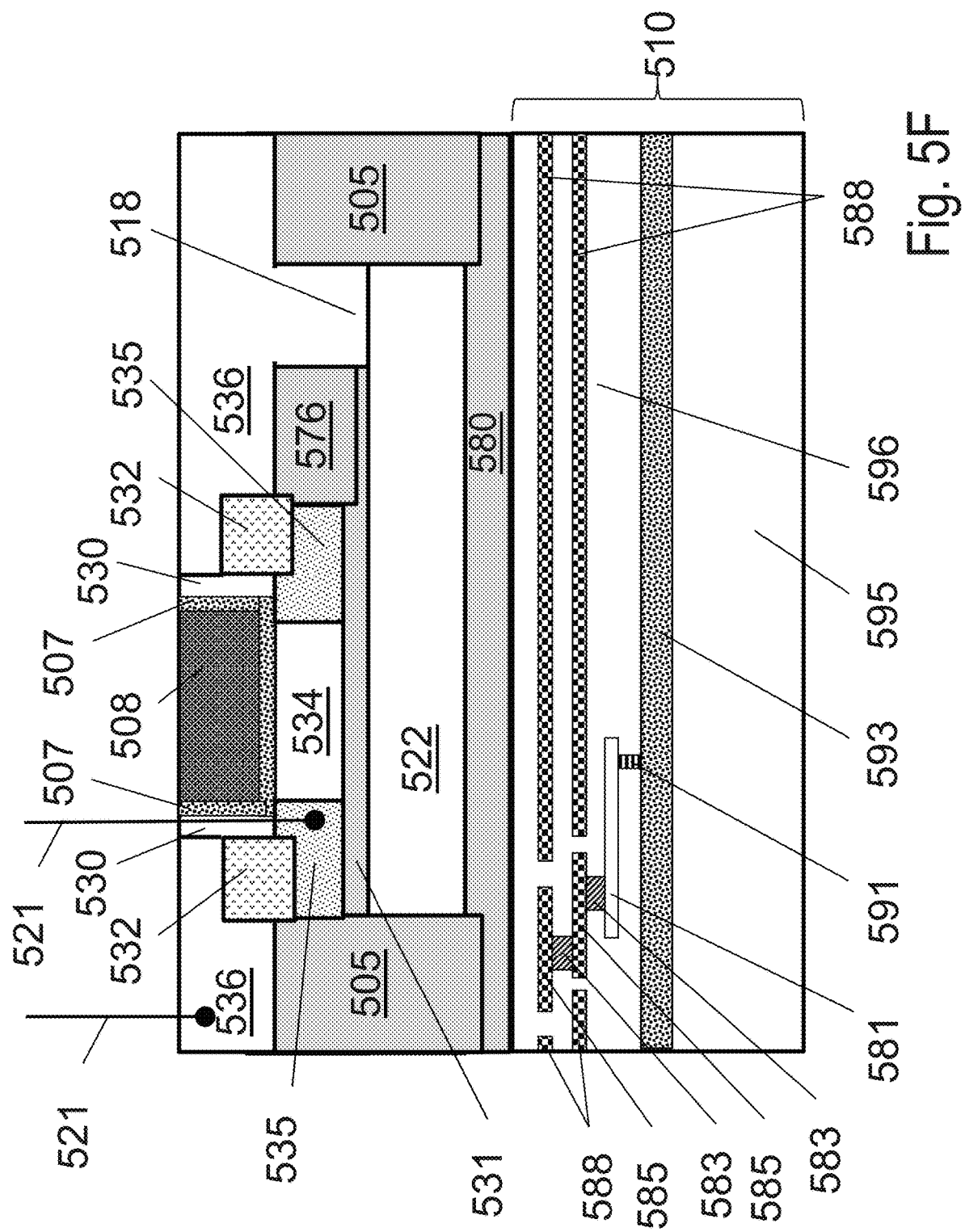

As illustrated in FIG. 5F, a transistor forming process, such as a conventional HKMG with raised source and drains (SID), may be performed. For example, a dummy gate stack (not shown), utilizing oxide and polysilicon, may be formed, gate spacers 530 may be formed, raised S/D regions 532 and channel stressors may be formed by etch and epitaxial deposition, for example, of SiGe and/or SiC depending on P or N channel (and may be doped in-situ or ion-implantation and optical anneal activation), LDD, halo, and S/D ion-implantations may be performed, and first ILD 536 may be deposited and CMP'd to expose the tops of the dummy gates. Thus transistor channel region 534 and S/D & LDD regions 535 may be formed. The dummy gate stack may be removed and a gate dielectric 507 may be formed and a gate metal material gate electrode 508, including a layer of proper work function metal ($Ti_xAl_yN_z$ for example) and a conductive fill, such as aluminum, and may be deposited and CMP'd. The gate dielectric 507 may be an atomic layer deposited (ALD) gate dielectric that may be paired with a work function specific gate metal in the industry standard high k metal gate process schemes, for example, as described in the incorporated references. Alternatively, the gate dielectric 507 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-5, 25-27 Apr. 2005) and a gate material with proper work function and less than approximately 400° C. deposition temperature such as, for example, tungsten or aluminum may be deposited. Furthermore, the gate dielectric on transistors may have different dielectric permittivities than silicon dioxide. The gate dielectric permittivity of the second layer transistors may be different than the gate dielectric permittivity of the first layer transistors. An optical step, such as represented by exemplary anneal ray 521, may be performed to densify and/or remove defects from gate dielectric 507, anneal defects and activate dopants such as LDD and S/D implants, densify the first ILD 536, form DSS junctions (Dopant Segregated Schottky such as NiSi$_2$), and/or form contact and S/D silicides (not shown). The optical anneal may be performed at each sub-step as desired, or may be done at prior to the HKMG deposition (such as after the dummy gate but before the HKMG formation), or various combinations. Optionally, portions of transistor isolation region 586 and BOX region 531 may be lithographically defined and etched away, thus forming second transistor isolation regions 576 and PD transistor area 518. Partially depleted transistors (not shown) may be constructed in a similar manner as the FD-MOSFETs constructed on transistor channel region 534 herein, but now with the thicker back-channel region 522 silicon as its channel body. PD transistor area 518 may also be utilized to later form a direct connection thru a contact to the back-channel region 522 for back bias and Vt control of the transistor with transistor channel region 534. If no PD devices are desired, then it may be more efficient to later form a direct connection thru a contact to the back-channel region 522 for back bias and Vt control of the transistor with transistor channel region 534 by etching a contact thru transistor isolation region 586. Raised S/D regions 532 may be formed by low temperature (less than about 400° C.) deposition of in-situ doped polysilicon or amorphous silicon into the S/D openings, an optical anneal to further crystallize and dopant activate the raised S/D material, and removal of excess raised S/D material. Further processing to connect the transistors and make vertical connections may follow the processing described in at least FIGS. 46F and 46G of incorporated reference U.S. Pat. No. 8,574,929.

Figure 6:
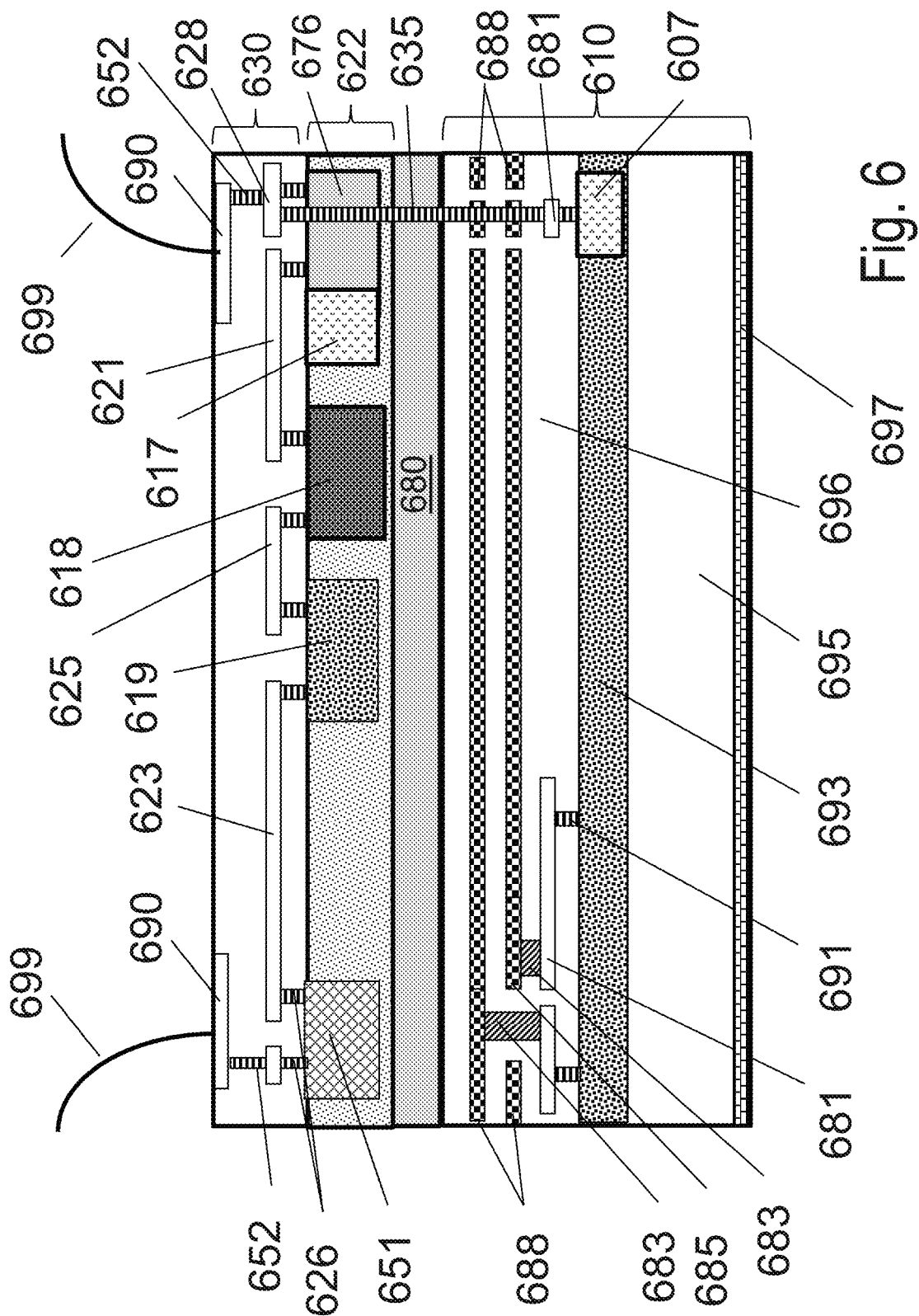
FIG. 6 is an exemplary illustration of some additional embodiments and combinations of devices, circuits, paths, and connections of a 3D device.

The various layers of a 3D device may include many types of circuitry, which may be formed by regions of transistors and other semiconductor device elements within that layer or in combination with other layers of the 3D device, and connections between the transistors within the same region, region to region and vertically (layer to layer. stratum to stratum) may be provided by layers of interconnect metallization and vertical connections such as TLVs and TSVs. In addition, power routing within the 3D device may utilize thicker and/or wider (more conductive) interconnect metallization than another layer, especially if the layer is closest to the source of external power and/or has a greater current load/supply requirement. Many individual device and interconnect embodiments for 3D devices have been described herein and in the incorporated patent references. As illustrated in FIG. 6 herein, some additional embodiments and combinations of devices, circuits, paths, and connections are described and may utilize similar materials, constructions and methods as the incorporated references or discussed herein. With reference to embodiments described, for example, herein and, with respect to FIG. 46 of incorporated reference U.S. Pat. No. 8,574,929, and in the disclosures of many of the other incorporated patent references, a substrate layer, which may have a thicker body than other semiconductor layers above or within the 3D device, such as acceptor 610, may be formed and may include heat sink 697, acceptor substrate 695, acceptor wafer transistors and circuits 693, first (acceptor) layer metal interconnect 681 which may include first layer contacts 691, first layer vias 683, at least one shield layer/region 688 (two layers and many regions, such as lower level shield layer region 685, shown), interconnect insulator regions 696 and ESD diode structures 607. A second semiconductor layer may be transferred and constructed on top of the first layer with isolation layer 680 in-between and vertical layer to layer interconnections may be provided by TLV/TSV 635, only one is shown. A layer of transistors and circuits 622 may include second layer input device structures 676, FD ESD structures 617, Phase Lock Loop circuits PLL 618, SERDES circuitry 619, and output device structure 651. Second interconnections layer 630 may include at least one layer/regions of metallization and associated contacts and via, for example, second layer metallization M1 segments 628, 621, 623, 625, second layer contacts 626, second layer vias 652, and conductive pads 690. The 3D device may be connected to external devices utilizing many structures known to those of ordinary skill in the art, for example, bond wires 699. Input device structures 676 and output device structure 651 may be connected to external devices through, for example, second layer contacts 626, second layer metallization M1 segments 628, second layer vias 652, conductive pads 690, and bond wires 699. A portion of the transistors within input device structures 676 and output device structure 651 may be larger in either or both width and length than most transistors within acceptor wafer transistors and circuits 693, and may have a different gate oxide, in thickness and/or composition. Input device structures 676 (and output device structure 651) may be subjected to voltage and/or current transients from external devices or generated externally and traveling to the 3D device along bond wires 699. Input device structures 676 (and output device structure 651) may be protected by dissipating the transient energy in diode structures, such as ESD diode structures 607 on the relatively thicker (than for example, the second semiconductor layer) acceptor substrate 695, which may be connected by a multiplicity of connection stacks such as first (acceptor) layer metal interconnect 681 which may include first layer contacts 691, first layer vias 683, at least one shield layer/region 688, TLV/TSV 635, and second layer metallization M1 segments 628. Input device structures 676 (and output device structure 651) may be protected by dissipating the transient energy in a transient filtering circuitry such as for example, FD ESD structures 617, which may reside on a relatively thin semiconductor layer in the 3D device and may effectively utilize fully depleted transistors in the filter circuitry. FD ESD structures 617 may be coupled to input device structures 676 (and output device structure 651) by second layer interconnections (not shown). Input device structures 676 may be connected to PLL 618, for example, thru second layer metallization M1 segment 621 and second layer contacts 626. Input device structures 676 may be connected to SERDES circuitry 619, for example, thru second layer metallization (not shown). A monolithic 3D stack, wherein at least one of the layers in the stack is very thin (less than about 200 nm), may provide an unexpected benefit. The thicker substrate may be used for energy dissipating diodes to handle large energy transients and the thin ('second' or 'third' etc.) layer may be used for a high frequency switching capability to protect against a high frequency transient on the input lines. This may be done simultaneously on an I/O. Furthermore, one style could be chosen for specific I/Os as well. The monolithic 3D structure (thin/thick) also provides a low capacitance drive output and very fast input device structure ('fully depleted' transistors), yet still be protected from high energy transients that could be dissipated in the bulk (first layer). This 'two-tier' ESD structure invention could also provide cost effective I/Os anywhere throughout the area of the device, as the larger sized (area-wise) diodes could be placed underneath the second layer input transistors. This would also provide a closer than 2D layout coupling of the I/O to the other chip circuitry, as the large energy dissipating diodes are not on the same level as the circuitry proper, and would not interfere with the data circuitry operation (noise). Output device structures 651 may be connected to SERDES circuitry 619, for example, thru second layer metallization M1 segment 623 and second layer contacts 626. Output device structures 651 may drive signals thru the connection to conductive pads 690 and then out to external devices thru bond wires 699. Transistors within a lower layer, for example within acceptor wafer transistors and circuits 693, may be connected (not shown) to the output device structure 651 and drive a signal to the output device structure 651, and a portion of the transistors of output device structure 651 may have a larger width and/or length than the transistors within acceptor wafer transistors and circuits 693. Power from external sources may be routed thru bond wires 699 to conductive pads 690 to the 3D device, wherein at least a portion of the second interconnections layer 630 may be constructed with thicker and/or wider metallization wiring (for example 4X wiring as described in incorporated patent references) so to provide the higher current carrying capability required for the second layer power distribution grid/network than that of the lower layer, in this example, first layer metallization wiring (for example 1X or 2X wiring as described in incorporated patent references). The width and/or length of the transistors of the second layer of transistors and circuits 622, for example a portion of those in second layer input device structures 676 and/or FD ESD structures 617 and/or output device structures 651, may be substantially larger than the width and/or length of transistors in acceptor wafer transistors and circuits 693. Local ESD clamps or triggering elements may be constructed with the bulk or FD devices, and the FD (UTBB) devices may be band-modulation devices such as the FED (Field Effect Diode), $Z^2$-FET (Zero impact ionization and Zero sub-threshold swing) or BBCT (SOI-BackBiasControlled-Thyristor). One example in 2D may be found in Y. Solaro, et al., "Innovative ESD protections for UTBB FD-SOI Technology," IEEE IEDM 2013, paper 7.3, the contents fully incorporated herein by reference. The back-gate/bias plane may be accomplished with an integrated device, for example, a back-channel region 522 or by a base layer (or layer below) top metal plate/line (for example, such as the topmost shield layer/region 688) in a monolithic 3D configuration. In a monolithic 3D configuration as disclosed herein and in the incorporated references, the layers above the base/substrate layer are naturally constructed SOI, wherein the above techniques to create the back gate controlled ESD structures may be accomplished without the complexity of 2D processing of the buried layers and connections. Design of the ESD protection for, for example, a single-pole multiple throw (SPMT) Tx/Rx switch for multi-mode smart phones, may include a series shunt topology where each path has a series branch to the antenna and a shunt branch to ground (one example in 2D may be found in X. S. Wang, et al. IEEE S3S Conference 2013 paper "Concurrent Design Analysis of A 8500V ESD protected SP10T Switch in SOI CMOS," the contents fully incorporated herein by reference. Feed-forward capacitors (FFCs) may be used to keep an even distribution of AC voltage drops across the shunt branches. The FFCs may be constructed in the same layer as the shunts (preferably an RF optimized layer), the layer below or the layer above. This allows flexibility in type, value, and/or the ability to adjust (hard wired, electrically programmable, or top-layer laser/e-fuse programmable) each of the shunts effective FFC value.

Conductive pads 690 and associated I/O circuits and any redistribution layers may be arranged and lay-ed out in many configurations. For example, conductive pads 690 may be designed and lay-ed out as a perimeter bond pad grouping or as an array I/O wherein the conductive bond pads may be arrayed throughout the area of the die when viewed from above or below. Conductive pads 690, whether arrayed in area or perimeter, may include the associated I/O and/or ESD circuitry positioned vertically below (or above for 'backside pads') the conductive pads and on the same layer/stratum, vertically below (or above for 'backside pads') on a layer/stratum not the same as the conductive pad layer/stratum, or not vertically below (or above for 'backside pads') the conductive pad, yet on the same layer/stratum as the conductive pads 690 or on a layer/stratum not the same layer/stratum. Array packages may include the PGA, BGA, FBGA, Fan-in QFN, and Fan-out WLPs and may utilize attachments such as solder balls or columns.

Stress relief from wire bonding, ball bonding, column attaching may be mitigated in the 3DIC stack. For example, conductive bond pad 690 may be replicated in full or in part down one or more layers/stratum directly below, and this 'stack of bond pads' may extend to the substrate 695. Bonding stresses may be mitigated by forming a relatively soft layer or region underneath conductive bond pads 690, for example a low-k dielectric and/or an aero-gel. In addition, a region or layer of a conductive aerogel may be formed underneath conductive pad 690 that would allow at least a one-time crush and still maintain conductivity and reliability. A combination of a hard layer and then a soft layer may also be employed below conductive pads 690. Young's modulus may be a measure of soft and hard. A MEMS structure, for example a torsion spring assembly, may be formed directly underneath the bonding area of conductive pad 690.

Persons of ordinary skill in the art will appreciate that the illustrations in FIG. 6 are exemplary and are not drawn to scale. Such skilled persons will further appreciate that many variations may be possible such as, for example, a thick enough semiconductor layer to enable ESD diode style protection circuitry to be constructed need not only be on the base or substrate layer, but may reside elsewhere in the 3D device stack. Moreover, the output circuitry including output device structures 651 may wholly or partially reside on a semiconductor transistor layer that is not on top, and vertical connections including TLVs/TSV may be utilized to connect the output device structures 651 to conductive pads 690. Furthermore, the input circuitry including input device structures 676 may wholly or partially reside on a semiconductor transistor layer that is not on top, and vertical connections including TLVs/TSV may be utilized to connect the input device structures 676 to conductive pads 690. Similarly, SERDES circuitry and 619 PLL 618 may wholly or partially reside on a semiconductor transistor layer that is not on top, these choices being one of design choice and device characteristics driven. Furthermore, connection to external devices (signal and/or power supply) may be made on the backside of acceptor substrate 695. Moreover, connection to external devices form the 3D device may utilize many types of structures other than bond wires 699 shown in the illustration, for example, flipchip and bumps, and/or wireless circuitry. Thus the invention is to be limited only by the appended claims.

Figure 11A:
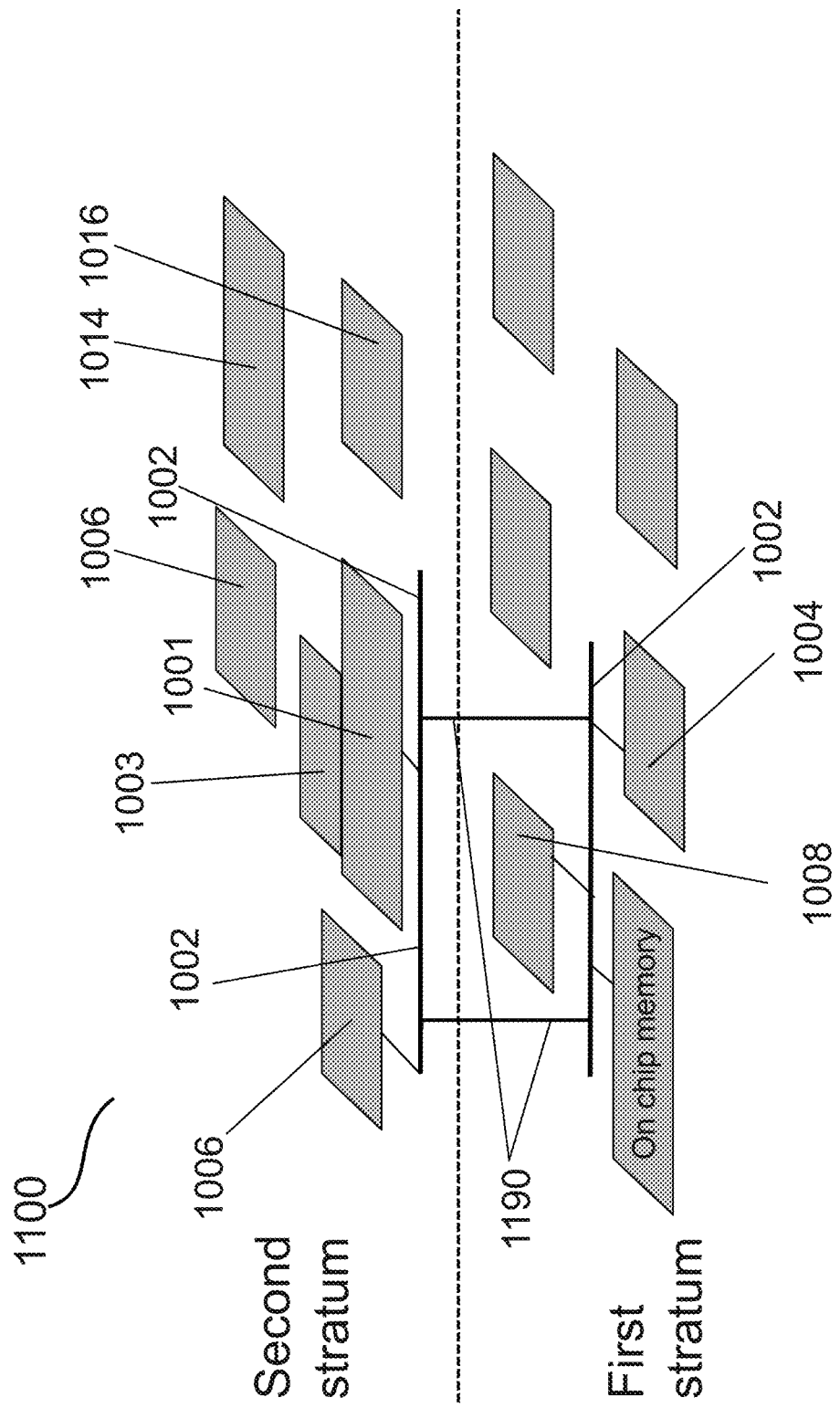
FIG. 11A illustrates an exemplary partitioned 3D system/device.

A 3D system, such as has been described herein and in relation to at least FIG. 11 and FIG. 12 of incorporated reference U.S. Pat. No. 8,378,715, is not limited to a configurable system and could be used in other types of platform configurations. The strata of such a 3D system could be connected by TSV and might use an interposer or be directly placed one on top of the other. Also the strata might be connected by what has been called in this application and the patents, publications, and applications that are incorporated by reference, through layer via ("TLV") where the layer carrying the transistor may be thin (below about 2 micron or below about 100 nm in thickness or below about 30 nm in thickness).

Figure 7:
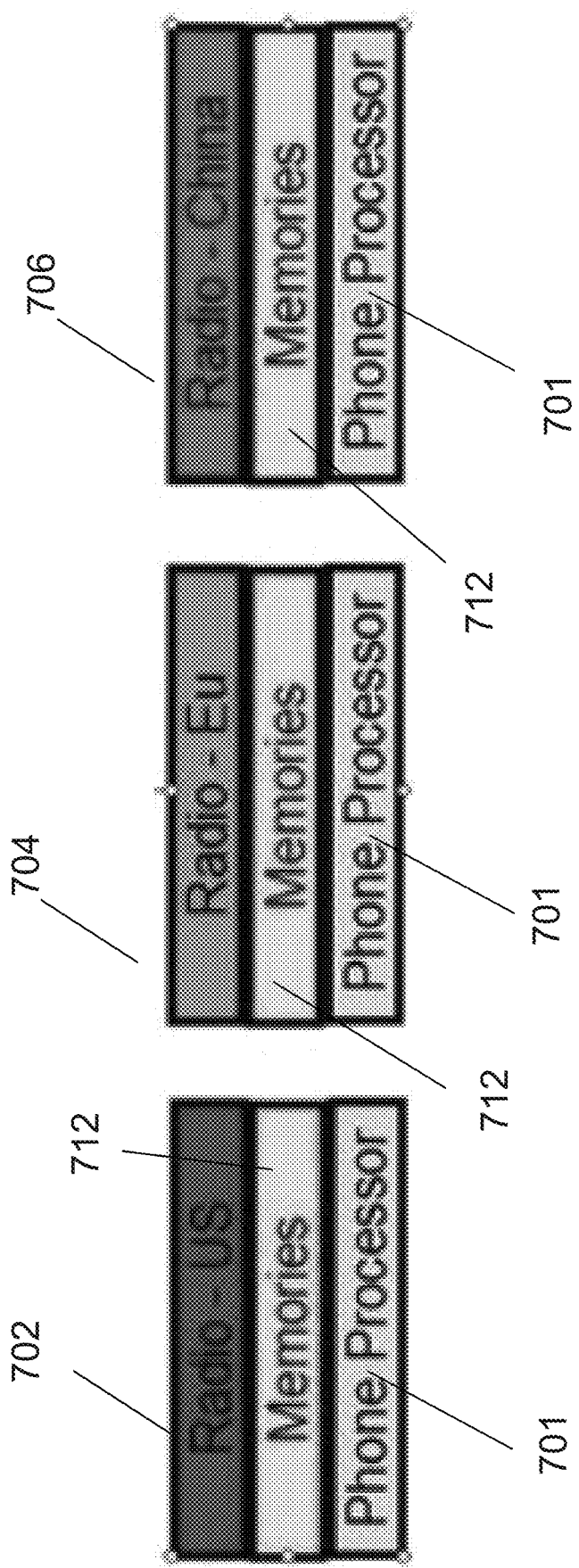
FIG. 7 is an exemplary illustration of a 3D platform.

FIG. 7 illustrates a 3D platform constructed accordingly. Platform base 701 could be the same type of stratum, for example, a Phone Processor, which may be overlaid by and connected to a second stratum 712, for example, a memory stratum. This platform could be produced in high volume and could be stocked in wafer form or die form. A market specific 3D system could be constructed by overlaying and connecting to the platform (formed by platform base 701 and second stratum 712), a third stratum which maybe designed and manufactured for a specific market, for example, a Radio for US 702, a Radio for Europe 704 or a Radio for China 706. The system could be constructed of stratum on top of a stratum interconnected by TSV or TLV or side by side wiring using, what is now called by the industry, interposers. There are many advantages for such a 3D platform, including reduced cost of the common element design, reduced cost of volume manufacturing, and shorter time to market and to volume for any new specific market that need only few, and ideally only one, customized stratum and the remainder of the system a similar set of stratums.

Additional embodiment for a 3D platform is to use a variation of strata which might include in some platforms a single stratum of memory and in another platform two strata of memory offering a larger memory. Another variation could use a different amount of programmable logic ranging from no programmable logic to multiple strata of programmable logic. Another variation could add special system input/output resources ranging from no SERDES to one or more strata of I/O (Input Output) that may include various amounts of SERDES enabled I/O.

Figure 8:
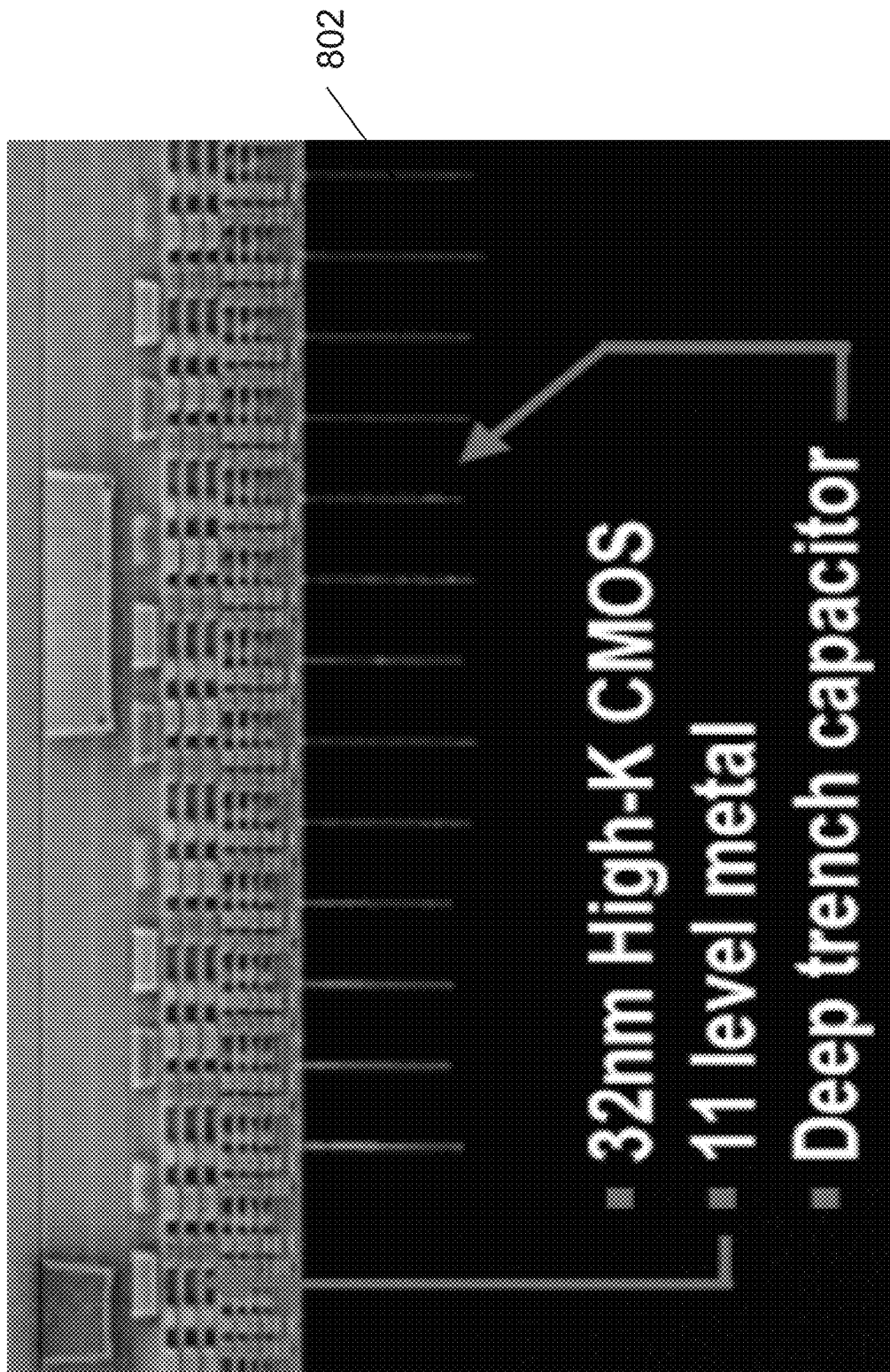
FIG. 8 is an exemplary illustration of a cross-section picture of a device that includes trench capacitors.

Additional advantage for having the memory layer first and the logic on top of it is for using the bulk silicon for the memory layer. FIG. 8 illustrates a cross-section picture of a device that includes trench capacitor 802. The trench capacitor is a known technique for constructing DRAM (Dynamic Random Access Memory) or embedded DRAM memory. The trench might be few tenths of a micron deep to a couple of microns, and forming the trench on the bottom most layer can be very effective. Another type of memory that could benefit from being formed on the bulk silicon or substrate are two-state stable floating body memory as described in U.S. Pat. No. 8,206,302 which is incorporated herein by reference. In the two-stable states floating body memory, a deep implant of n+ layer in the bulk may be used to provide a back bias to the floating body, so to form a two-state stable memory. A similar structure could be formed on layers other than the bottom-most layer, yet it might be preferred to use the bulk of the bottom layer for such a memory layer.

Another alternative is to use the trench capacitor 802 to help stabilize the power lines. It is well known technique in the art to use capacitors to stabilize power lines in electronic circuits. In a 3D system a trench capacitors in the bulk could help stabilize power lines and not just for the bottom-most layer but also for the upper layers of circuits.

Figure 9:
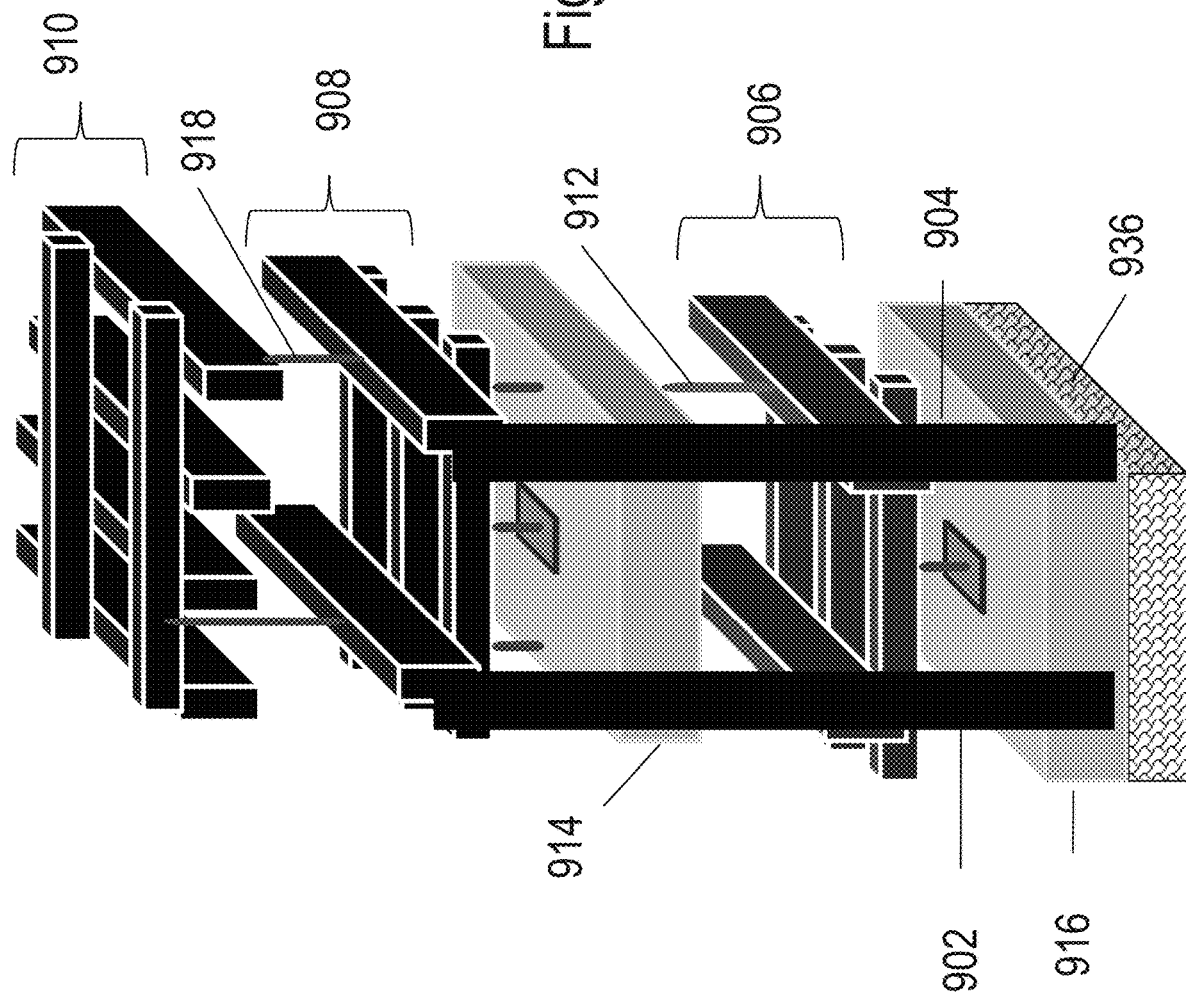
FIG. 9 is an exemplary illustration of a 3D device power distribution structure.

In many 3D systems it is useful to construct the power delivery buses to all circuit layers in a substantially uniform or a substantially periodic structure. FIG. 9 is a drawing illustration of a 3D device power distribution or power delivery structure. The bottom-most transistor layer 916 may include the bulk silicon which sometimes might be called the base layer. The upper most transistor layer 914 may be the second layer, as shown (there may be more than two layers or stratum). The main system power distribution sub-structures 910 may be connected to the external source of power and provide the first horizontal power distributions. The per-layer power distribution is illustrated by second layer power distribution 908 and first layer power distribution 906. In FIG. 9 the power distribution may include the two main power sources often called Vss and Vdd, or power and ground. In many 3D systems the power distribution may include additional power lines for voltages other than Vss and Vdd as sometime might be required. In some 3D systems at least one layer/stratum may use a different voltage than the other layers or stratum, as often will be the case when Flash types of memory or some analog circuitry is used. It might be preferred to place the special voltages on dedicated layers and form most layers with just one power and one ground. It might be preferred to keep the multiple voltages layer as the upper-most layer, and drive power to lower layers having a lower number of different power types/voltages. The 3D integrated circuit could have a similarly designed and laid-out distribution networks, such as for ground and other supply voltages, as well. The power grid may be designed and constructed such that each layer or strata of transistors and devices may be supplied with a different value Vdd. For example, bottom-most transistor layer 916 may be supplied by its power grid to have a Vdd value of 1.0 volts and upper most transistor layer 914 a Vdd value of 0.8 volts (or, for example, about 10 v to program a NV memory). Furthermore, the global power grid 0910 wires may be constructed with substantially higher current conduction, for example 30% higher, 50% higher, 2X higher, than local power grids, for example, such as first local power grid 0906 wires and second local power grid 0908 wires. The thickness, linewidth, and material composition for the global power grid 0910 wires may provide for the higher current conduction, for example, the thickness of the global power grid 0910 wires may be twice that of the local power grid wires and/or the linewidth of the global power grid 0910 wires may be 2X that of the local power grid wires. Moreover, the global power grid 0910 may be optimally located in the top strata or layer of transistors and devices. Noise on the power grids, such as the Vss and/or Vdd supply grids, may be mitigated by attaching/connecting decoupling capacitors onto the power conducting lines of the grid(s), such as global power grid 0910, first local power grid 0906 wires and second local power grid 0908 wires. The decoupling caps may include, for example, trench capacitors such as described by Pei, C., et at, "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). FIG. 9 illustrates the connection of the power between layers (such as upper most transistor layer 914 and bottom-most transistor layer 916) utilizing first vertical connection 902 and second vertical connection 904. It may be advantageous to design the power connection, such as for example TLVs or TSV, or a multiplicity of TLVs or TSVs, between layers aligned one on top of the other as illustrated in FIG. 9 by first vertical connection 902 and second vertical connection 904. Such aligned power connection could be connected to trench capacitors, such as for example trench capacitors 802, which may reside in the bulk silicon of bottom-most transistor layer 916. Second layer vias 0918 and first layer vias 0912, such as the TSV or TLV, could be used to transfer the supply voltage from the global power grid 0910 to second local power grid 0908 and first local power grid 0906. Additionally such aligned power distribution structures between layers could efficiently channel the heat generated at the various layers down to the bulk silicon and from there to the device heat-sink 936 and/or to an external surface of the device (not shown).

While the previous discussion described how an existing power distribution network or structure could be designed/formed and they can transfer heat efficiently from logic/memory cells or gates in 3D-ICs to their heat sink, many techniques to enhance this heat transfer capability will be described herein and in at least incorporate reference U.S. Pat. No. 8,803,206. Many embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. The heat transfer capability enhancement techniques may be useful and applied to different methodologies and implementations of 3D-ICs, including monolithic 3D-ICs and TSV-based 3D-ICs. The heat removal apparatus employed, which may include heat sinks and heat spreaders, may include an external surface from which heat transfer may take place by methods such as air cooling, liquid cooling, or attachment to another heat sink or heat spreader structure In 3D systems, a portion of the layers/strata might be dedicated to memory and a portion to logic. The memory layer could include various type of memory such SRAM, DRAM, Floating Body RAM, R-RAM and Flash types. The memory layer might include the memory control circuits and memory peripheral circuits or those could be in a layer above or below the memory layer. The memory could be constructed on a single layer or might include two or more layers. An effective option could be to use two or more layers of memories utilizing an architecture such as have been presented in the incorporated by reference patents, publications, and applications, wherein a lithography step may be used to pattern two or more layers together, thus reducing the overall cost by sharing the costly step of lithography across two or more layers. Some memory layers could be dedicated to a single type of memory or to mix of various types of memory. For example, a compute layer may be supported by multiple layers of memory processed with lithography that is shared across these multiple layers, and where these layers may include non-volatile memory to hold the program and volatile memory to hold data.

An attractive advantage of having the memory decoders and logic above the memory layer wherein the memory layer may be an array of bit cells, relates to an option of pre-patterning the transferred layer prior to the layer transfer. In such a case many high temperature steps could be performed on that layer before the layer transfer, such as forming trench isolation or even full transistors as has been presented in at least U.S. Pat. No. 8,273,610 and before in relation to FIG. 19 of incorporated reference U.S. Pat. No. 8,378,715. Accordingly a transferred layer misalignment could be reduced when the transfer layer is patterned with a repeating pattern. The same concept could be inverted, with a non-repeating layer transferred on top of a repeating one. Accordingly, the alignment error could be reduced to about the size of the repeating element, the bit cell. This approach is similar to the method presented in relation to FIG. 19 of incorporated reference U.S. Pat. No. 8,378,715, except that in this case the shift to compensate for the misalignment may be done in respect to the bit-cell array. This approach will require a relatively larger window to be etched so the required memory could be sized through the overlaying transferred layer and then a connection to the bit lines and word lines could be made by including large enough landing zones/strips to connect to them.

In such way a single expensive mask set can be used to build many wafers for different memory sizes and finished through another mask set that is used to build many logic wafers that can be customized by few metal layers.

Figure 10:
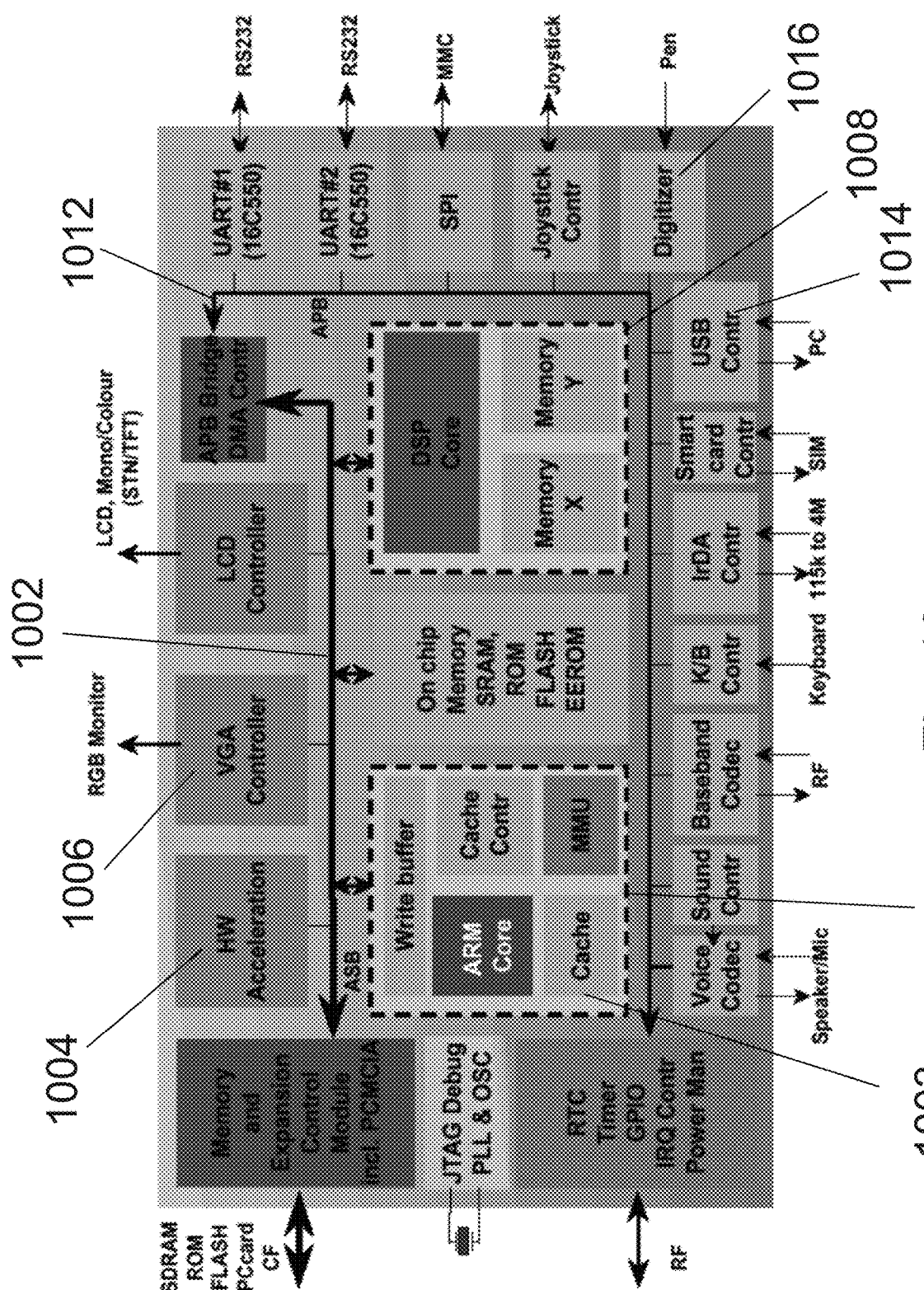
FIG. 10 is an exemplary illustration of a flowchart of a system that uses a processor and at least one bus.

Many devices may have at least one processor on chip and often more than one. In most cases these processors use at least one bus to commonly communicate with multiple sub systems such as memory and peripherals. FIG. 10 is a drawing illustration of an exemplary system that uses a processor such as, for example, ARM processor 1001 that is connected directly with cache memory 1003 and using a bus 1002 to connect to at least two sub-systems, such as, for example, Hardware Acceleration 1004 and graphic controller 1006. Bus 1002 could be used by a second processing unit such as DSP 1008 to connect to other elements in the overall system. Such a system could also include additional secondary bus 1012 to manage the connection of peripheral units such as, for example, USB Controller 1014 and Digitizer 1016. In many cases a design objective may be to achieve a higher speed of processor operation or to reduce power by making the lines constructing the bus shorter. In a 3D system such objective might be achieved, for example, by properly splitting/partitioning the subsystems connecting to the bus 1002 between the stratum the processor 1001 is on and another stratum that is either above it or below it. (See, for example, FIG. 11A, an exemplary 3D system/device 1100 with exemplary elements, such as, a processor such as, for example, ARM processor 1001, cache memory 1003, a portion of bus 1002 located on the first stratum, Hardware Acceleration 1004, DSP 1008, on-chip memory, graphic controller 1006, and a portion of bus 1002 located on the second stratum which may be connected to the portion of bus 1002 located on the first stratum utilizing TLVs 1190). Another objective related to such splitting/partitioning relates to the fact that some of the units, for example, graphic controller 1006, USB Controller 1014 and Digitizer 1016, have at least one (typically many) connection to external devices, and it may be desired to place those particular logic units on the strata closer to the connection to the external devices, which in some cases might be the top-most stratum. Many types of buses may be utilized in a 3D system, such as, for example, an Advanced Microcontroller Bus Architecture (AMBA) bus, a CoreConnect bus, a STBus, a Wishbone bus, an Open Core Protocol (OCP) bus, or a Virtual Component Interface (VCI) bus.

As illustrated in FIG. 11B, one such splitting/partitioning approach could suggest first placing the logic units that are connected to the bus and have an external connection on the upper stratum. Then, if the total area of these units is less than half of the total area of all the units connected to that bus, start assigning units to the lower stratum from the bigger units to the smaller until the area of those assigned to the lower stratum just exceeds the area of those logic units assigned to the upper stratum. Then assign the biggest un-assigned unit to the upper tier and repeat. If the total area of these units (those units first assigned to the upper stratum) is greater than half of the total area of all the units connected to that bus, then move the unit with the least number of external connections may be moved to the lower stratum (outside if possible for potentially better connectivity), and repeat if necessary to bring the upper stratum assigned area to just below 50% of the total area of all the units connected to that specific bus.

Figure 12A:
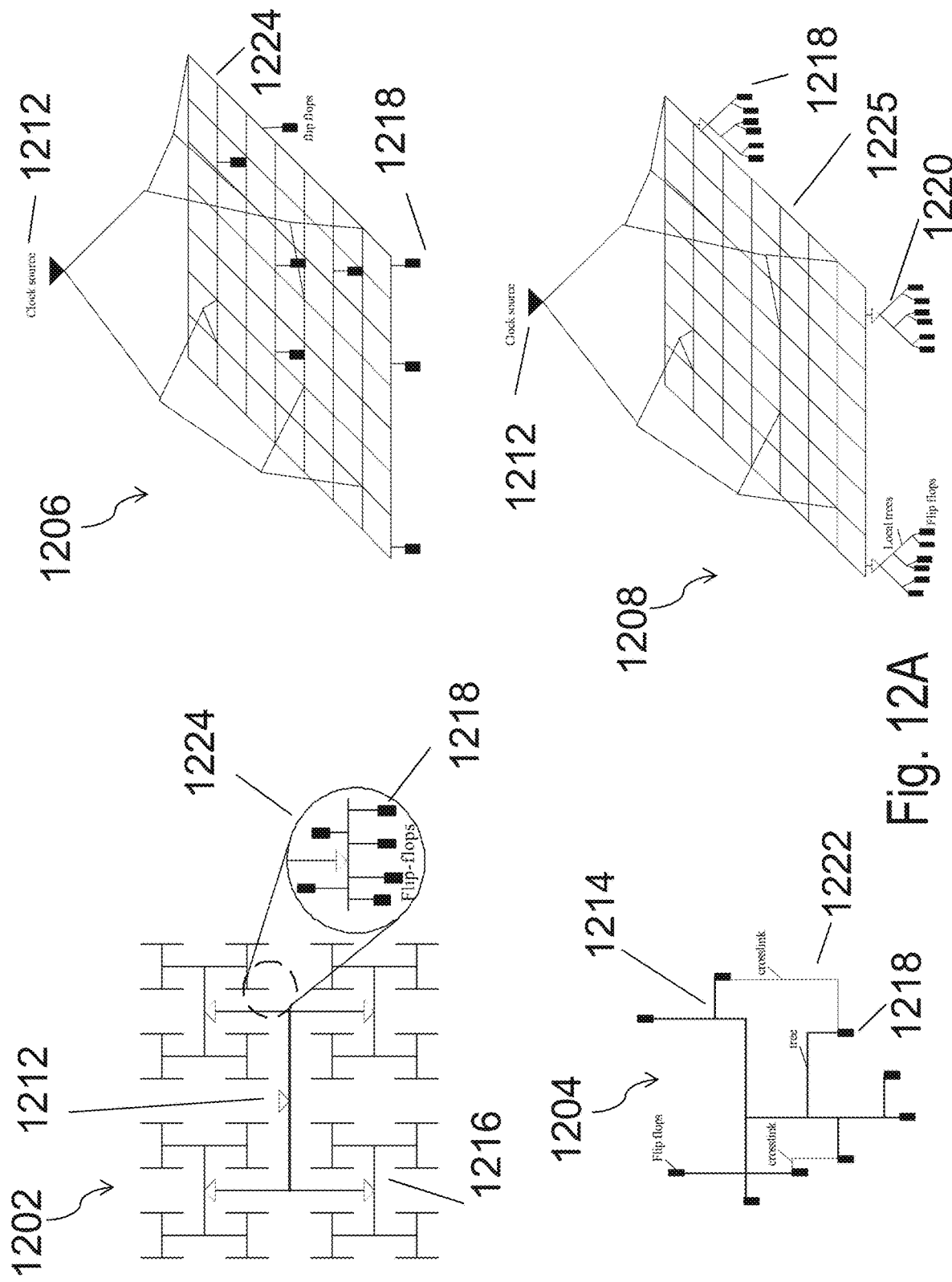
FIG. 12A is an exemplary illustration of different Clock distribution network styles.
Figure 12B:
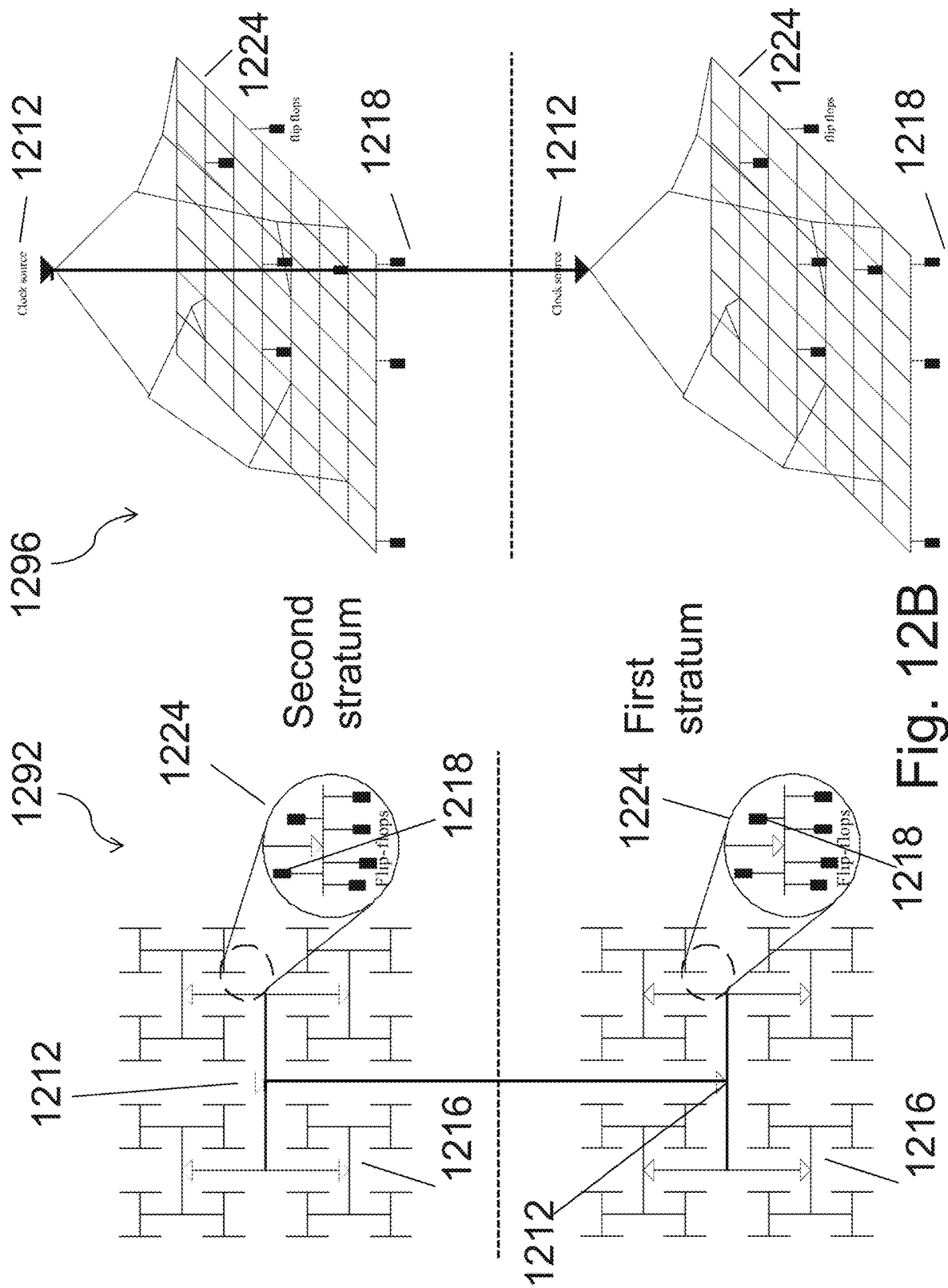
FIGS. 12B and 12C illustrate exemplary 3D system/device clock distribution networks.
Figure 12C:
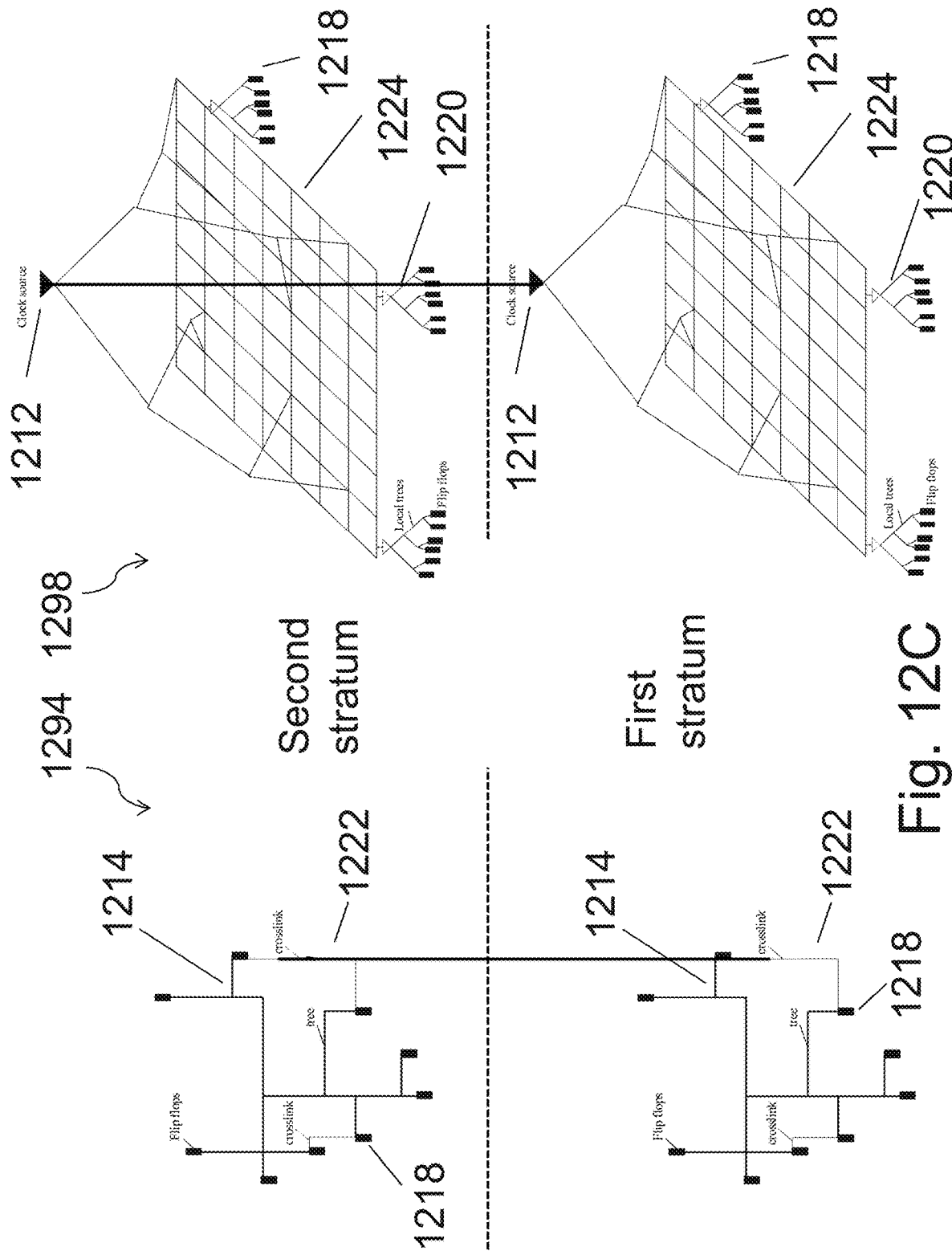

FIG. 12A is a drawing illustration of different Clock distribution network styles. Many logic circuits or logic units may use a clock tree to distribute a clock signal to the Flip-Flops. A common style of clock tree is the H-Clock Tree 1202. The origin point of the clock signal 1212 is driving a first H-Tree from the center of the H. Subsequently, each end-point of the H is an origin of the next H 1216, and so forth. The final edge 1224 drives the individual Flip-Flop cluster 1218.

In some cases it may be desired to reduce the skew between edges as illustrated in the branch tree 1204 wherein clock tree branches 1214 are shorted by cross-link 1222. Another style of clock distribution is called Mesh 1206 where a grid of connection is used to distribute the clock signal. These schemes may be combined to form a hybrid 1208 where a tree 1220 may be added to a grid 1225. In a 3D device it might be desired to split logic circuits between at least two strata including circuits that share the same clock domain In such case it might be desired to first connect the clock origin to each strata that has circuits that use that clock domain, then to construct within each stratum a clock distribution structure that might include a clock tree such as, for example, H tree, or grid and tree combination or other clock distribution scheme used in the art. (See, for example, FIGS. 12B and 12C, for exemplary 3D system/device clock distribution networks H-Clock 1292, Mesh 1296, branch tree 1294, hybrid 1298). Some circuits could have an interaction between strata wherein a signal may be generated in one stratum and that signal is used and latched on another stratum, and accordingly the skew between Flip-Flop on one stratum and the other would be reduced. A cross-link 1222 could be used between stratum, such as, for example, a TLV or TSV. Alternatively a grid 1224 could be constructed spanning multiple stratum reducing the clock skew between them. In some cases the origin of the clock may be either driven by a signal coming from outside of the 3D device or generated by a circuit on the 3D device such as for example, a Phase-Lock-Loop, which may be synchronized to a signal from outside of the 3D device (a clock source may rather be provide on-chip in the 3DIC stack as suggested later herein). Accordingly it might be desired to first process the clock signal at the upper-most stratum and then drive it down to the origins of the clock distribution structures at the desired stratum or stratums. The clock origin of the clock distribution structure and circuits on one stratum may be connected to the origin of the clock distribution structure and circuits of a second stratum, with one feeding the other.

Distribution of a clock signal from one stratum to the next may be accomplished with electrically conductive vertical connections, for example, TLVs, or may be accomplished by an RF/capacitive or optical device and connection between stratums. For example, a clock signal generated in a device layer above the substrate layer may be electrically coupled to various points on the substrate layer below (supplying a second layer generated clock signal to a portion or substantially all of the substrate based transistors) utilizing a TLV connection or connections, or an RF/capacitive or optical connection or connections. Utilizing an only RF/capacitive or optical connection or connections between stratums may be advantageous when it is desirable to isolate a noisy device type to a single layer, yet bring out the intended signals and not the noise. For example, and analog or RF device layer in a 3DIC stack could be emf shielded top and bottom (and sides if necessary), with only openings for a vertical RF/capacitive or optical connection where desired, thus minimizing the disturb effects of the analog or RF device layer on any of the other device layers in the 3DIC stack.

Scaling advanced CMOS field effect transistors face at least two problems that result in high power consumption: the increasing difficulty of reducing the supply voltage and stopping the rise of leakage currents. One device that may replace the CMOS FET is the tunnel FET (TFET). The primary injection mechanism in a TFET is interband tunneling whereby charge carriers transfer from one energy band into another at a heavily doped p+-n+ junction. (In contrast, for MOSFETs the charge carriers are thermally injected over a barrier). Ioff, the off current of the TFET, is quite low due to this injection barrier and an inherently very steep subthreshold slope. However, obtaining good Ion is difficult. High barrier transparency is vital and strong modulation by the gate of the channel bands is critical. Thus, high permittivity gate dielectrics with as low an equivalent oxide thickness as possible are desirable, as well as providing as thin of a channel body as possible for best case electron transport, plus an abrupt doping profile at the tunnel junction to maximize injection efficiency. Maximizing the gate modulation of the tunneling barrier width can be accomplished by overlapping the gate with the tunneling region, or designing a source region covered with an intrinsic channel layer under the top gate. TFETs can be formed with a horizontally oriented channel or a vertically oriented channel. Many types of TFETs have been developed for 2D applications, for example, double gate heterojunction TFET, nanowire TFET, Resonant TFET, synthetic electric field TFET, III-V based TFETs, and carbon based TFETs. Many of these can be advantageously formed in a monolithic 3D process flow. Furthermore, the gate dielectric on transistors may have different dielectric permittivities than silicon dioxide. The gate dielectric permittivity of the second layer transistors may be different than the gate dielectric permittivity of the first layer transistors.

For example, the 2D strained Si nanowire (SiNW) TFETs of L. Knoll, et al., "Demonstration of Improved Transient Response of Inverters with Steep Slope Strained Si NW TFETs by Reduction of TAT with Pulsed I-V and NW Scaling," IEEE IEDM 2013, paper 4.4, the contents incorporated herein by reference, may be constructed utilizing the monolithic 3D techniques and methods disclosed in the incorporated references. For example, nanowires may be formed by patterning and etching either an amorphous-Si or a layer transferred monocrystalline silicon (may be strained Si as well) thin layer on top of metallization layers that are on top of a substrate of devices and circuits. HKMG gate stacks may be formed and then very thin Ni and Al layers may be deposited to form self-aligned source/drain silicides into which angled implants are shadow implanted to form p+ and n+ pockets on opposite sides of the gates and steep sloped abrupt junctions can be formed with dopant segregation techniques. RTP and/or pulsed laser techniques with or without shielding may be employed for the thermal steps. GAA (Gate All Around) or frigate structures may be formed as disclosed in the incorporated references. Back gates may be formed in-situ above the bonding oxides or may be from topmost metal layers of the layer below's shields and/or interconnect layers, as disclosed in the incorporated references and herein (the back-gate/bias plane may be accomplished with an integrated device, for example, a back-channel region 522 or by a base layer (or layer below) top metal plate/line (for example, such as the topmost shield layer/region 688) in a monolithic 3D configuration).

For example, the synthetic electric field tunnel FETs (SE-TFET) of Y. Morita, et al., "Synthetic electric filed tunnel FETs: drain current multiplication demonstrated by wrapped gate electrode around thin epitaxial channel," IEEE VLSI Symposium 2013, paper 16.1, T236, the contents incorporated herein by reference, may be constructed utilizing the monolithic 3D techniques and methods disclosed in the incorporated references. For example, highly doped source and drains may be formed on a substantially undoped monocrystalline donor substrate with ion-implantation and activated as strips and then layer transferred as a monocrystalline silicon thin layer on top of metallization layers that are on top of a substrate of devices and circuits. The source and drains may also be formed directly on a layer transferred substantially undoped monocrystalline thin layer with masking and ion-implantation/PLAD techniques, and then activated with the optical and/or thermal annealing with or without shields as disclosed in the incorporated references. A thin (about 5 nm to about 20 nm) undoped channel layer may be formed with low temperature, for example, such as MOCVD or SP-ALD techniques, to preserve the abrupt vertical junction profile. A HKMG gate stack may be formed, for example, an about 5 nm $HfO_2$ insulator and an about 40 nm TiN gate electrode deposition, and subsequent patterning and etching. Interconnect formation may then ensue. Narrow channel widths and thicknesses increase electric field effects and thus may substantially improve the Ion. Backgates, for example, as described herein and in the incorporate references, may also be utilized to increase Ion and decrease Ioff. Layer transfer of the source, channel and drain provide a monolithic 3D formation advantage to TFETs: for example, not just the addition of a natural integrated backgate, but also the ability to use a higher carrier mobility transferred layer such as, for example, $Si_{1-x}Ge_x$ or Ge, and InGaAs.

For example, the complementary hetero junction vertical TFETs (VTFET) of R. Rooyackers, et al., "A New Complementary Hetero-Junction Vertical Tunnel-FET Integration Scheme," IEEE IEDM 2013, paper 4.21, pp. 92-94, the contents incorporated herein by reference, may be constructed utilizing the monolithic 3D techniques and methods disclosed in the incorporated references. For example, and N+Si/intrinsic Si stack may be formed on a donor wafer, flipped, bonded and layer transferred to a pre-processed acceptor substrate (of completed transistors, etc.). The vertical nanowires may be masked and etch utilizing a hard mask, the drain and gate isolated, gate stacks (may be complementary) formed, and the gates and dummy source may be isolated. The source can then be selectively etched out and replaced by a low-band-gap material to form the hetero junction on top of a silicon channel enable a sharp junction.

ALD (Atomic Layer Deposition) and Spatial ALD (Spatial separation of the half-reactions) techniques may be utilized to form thin nearly monocrystalline layers in a monolithic 3D fashion and for many of the various monolithic 3D structures disclosed herein and in the incorporated references. [S-ALD ref J. Vac. Sci. Technol. A 30(1), January/February 2012, Roll to Roll techniques form USA, Finland; and Poodt, P., et al., Advanced Materials 22 (2010) p. 3564]. These are low temperature processes that may be compatible with copper or aluminum metallization and/or low-k dielectrics on the layers below the ALD/S-ALD layer being formed.

For example, the stacking of layers to eventually form a memory stack, may be formed by ALD/S-ALD exclusively or in combination with other deposition techniques such as low temp CVD. ALD/S-ALD may be utilized, for example, as described in at least incorporated reference U.S. Pat. No. 8,273,610 to form the p-Si 9906/oxide layers in FIG. 99C for FB-DRAM formation and devices, the RRAM stack of FIGS. 101D, 102D, 103F, 109D, 110D, 192D, charge trap stacks such as FIG. 106F, and FIGS. 100D and 200D for DRAM.

ALD layers may be doped in-situ with no need for thermal activation to form doped layers (and ultimately regions with masking and etch processing), and may be used to form both or one of the layers of semiconductor/dielectric stacks or semiconductor/semiconductor stacks, for example, Si & $SiO_2$, Ge & GeO, Si & Si of differing vertical dopant concentrations and/or dopant types, etc. The ALD/S-ALD formed layers may also be conventionally doped with ion-implantation and activated with techniques such as described in the incorporated references, for example, with an optical anneal.

ALD/S-ALD may be utilized, for example, as described in at least incorporated reference U.S. Pat. No. 8,273,610 to form an N+/N−/P+ stack such as shown in FIG. 26A to ultimately form horizontal transistors; may be utilized top form the N+/P−/N+ layer stack of FIG. 39C to ultimately form vertical transistors; and may be utilized to form the layers 6802 and 6803 of FIG. 68C to ultimately form RCAT transistors.

ALD/S-ALD may be utilized, for example, as described in at least incorporated reference U.S. Pat. No. 8,273,610 to form the N+/P− stack of FIG. 137C to ultimately form an NVM FPGA configuration cell.

Also meta-material layers for thermal isolation layers, such as disclosed in incorporated reference U.S. Patent Application 61/889,500 may be formed with ALD/S-ALD techniques; disordered nanostructured materials such as WSe2 and the nanoscale layered oxides such as $SiO_2/Y_2O_3$, $SiO_2/Cr_2O_3$, and $SiO_2/Al_2O_3$ for TIL 140.

ALD/S-ALD may be utilized, for example, for low temperature formation of oxide layers, such as $SiO_2$, nearly crystalline silicon layers, and silicon nitride layers such as $Si_3N_4$ and SiN. The formation of these layers would not damage the underlying temperature sensitive layers and regions, for example, including copper, aluminum, low-k dielectrics.

Layer transfer a mono-crystalline layer of silicon on top of an underlying layer or layers of interconnect metallization/dielectrics and transistors/circuits allowing a relatively easy process to seed and crystallize, such as by nanographioepitaxy, an overlying germanium layer was disclosed in at least paragraph 134 of incorporated reference U.S. Pat. No. 8,273,610. This allows formation of the two types of transistors with direct alignment to the underlying device layer. P-channel Ge transistors, such as, for example, an RCAT or MOSFET, may be formed utilizing the technique in certain regions of the transferred layer, and n-channel Si transistors, such as, for example, an RCAT or MOSFET, may be formed in the monocrystalline silicon of other regions of the layer transferred silicon layer. By utilizing the technique of doping and activating the layer to be transferred on the donor wafer prior to transfer, a transistor such as, for example, an RCAT, may be formed on the transferred layer utilizing the methods of at least FIGS. 66-68 and associated specification sections of incorporated reference U.S. Pat. No. 8,273,610. The Ge regions may be crystallized prior to the formation of the silicon transistors and some common formation steps may be taken advantage of, or the silicon based and Ge based transistors may be formed in separate steps of the process flow. Si based MOSFETs may be formed, for example, by the gate replacement methods of at least FIGS. 70, 81, 82 and associated specification sections of incorporated reference U.S. Pat. No. 8,273,610. Regions of the silicon may be etched out (leaving appropriate crystallized silicon edges, regions, spaces for the graphioepitaxy and/or seeding) and crystallized Ge regions may be formed, and Ge based transistors made. Si based MOSFETs may be formed, for example, by the implant and optical anneal methods of at least FIGS. 45, 46, 47 and associated specification sections of incorporated reference U.S. Pat. No. 8,574,929. One of ordinary skill in the art would recognize that there are many devices which may be formed above an underlying layer or layers of interconnect metallization/dielectrics and transistors/circuits wherein a portion of the transistors (such as but not limited to the channel or portions of the transistor channel) may be monocrystalline silicon based and a portion of the transistors (such as but not limited to the channel or portions of the transistor channel) may be crystallized Ge based using a method or combination of methods disclosed herein and/or in the incorporated references. The Ge (or GaAs, InP, etc.) formed by LPE into subcritical vias of the transferred silicon layer with engineered layer such as Ge—see at least FIGS. 27-28 and associated specification sections of incorporated reference U.S. Pat. No. 8,574,929) transistor may be utilized for optical I/Os on the top layer (or lower layers with optical passthrus above or below) of the monolithic 3D stack.

FIGS. 13A-13G illustrate an exemplary n-channel FD-MOSFET with integrated TRL (Trap Rich Layer) and an exemplary process flow. Integrated TPS (Thermal Protective Structure), TIL (Thermal Isolation Layer), and/or TES (Thermally Enhanced Substrate) may be utilized to thermally protect the metallization, isolation layers, device electrical characteristics and reliability of devices that may reside in or on the substrate or a previously constructed layer in the 3D stack from damaging processes and processing temperatures. TPS, TIL and TES formation and composition details may be found in some of the incorporated references, for example, at least U.S. Patent Applications 61/889,500 and Ser. No. 14/298,917. An exemplary n-channel FD-MOSFET with integrated TRL may be constructed in a 3D stacked layer utilizing procedures outlined herein and in incorporated references. Forming the TRL on a donor wafer as part of the transferred layer may provide a greater process window for TRL formation, especially for temperature exposures, than forming the TRL on the acceptor wafer, which may be limited to temperatures less than about 400° C. due to the presence of copper or aluminum metallization and low k IMDs on the layer or layers below the layer being processed.

Reasons for forming and utilizing a TRL layer and/or regions may include RF applications, for example horizontal and/or vertical emf shielding. For example, RF transistor and circuit performance on any layer of a 3DIC, such as a strata layer or base substrate, may be limited in terms of transmission line losses by the presence of parasitic surface conduction (PSC). A TRL layer would be considered effective if the presence of the TRL provides an effective resistivity, the true electrical resistivity sensed by a co-planar waveguide (CPW) line, higher than about 1 kohm-cm, or higher than about 3 k-ohm-cm. This may result in a CPW attenuation versus frequency response that is substantially similar to the response of a CPW on a quartz substrate. A TRL may accomplish this thru material or materials and processing that creates and/or incorporates defects in the material. A TRL may be formed with temperature exposures and processes above about 400° C. when formed on a donor substrate prior to layer transfer, and may be formed by temperature exposures and process of less than about 400° C. when formed on the acceptor wafer that may include copper or aluminum metallization and/or low-k dielectrics, for example, prior to a monolithic 3D layer transfer or a TSV stack bonding step. An integrated TRL may provide a higher performance for transistors and circuits built on the layers/strata of a 3DIC system stack; for example, a radio frequency (RF) receiver/transmitter circuit may operate at greater than about 1 gigahertz, a phase lock loop (PLL) circuit may operate at greater than about 1 megahertz, a Serializer/Deserializer (SerDes) circuit may operate at greater than about 1 gigahertz, an oscillator may have a frequency stability of better than 100 ppm/° C., an RF circuit may exhibit 'substrate' losses when placed in a second (or third, etc.) layer/stratum of a monolithic 3DIC device which are, for example, less than 0.15 dB/mm at 2 GHz, less than 0.20 dB/mm at 4 GHz. The integrated TRL may provide a shielding effectiveness of vertically adjacent layers/strata devices of, for example, more than 60 dB, more than 50 dB, or more than 70 dB.

As illustrated in FIG. 13A, SOI donor wafer substrate 1301 may include back channel layer 1305 above Buried Oxide BOX layer 1303. Back channel layer 1305 may be doped by ion implantation and thermal anneal, may include a crystalline material, for example, mono-crystalline (single crystal) silicon and may be heavily doped (greater than about 1e16 atoms/cm$^3$), lightly doped (less than about 1e16 atoms/cm$^3$) or nominally un-doped (less than about 1e14 atoms/cm$^3$). SOI donor wafer substrate 1301 may include a crystalline material, for example, mono-crystalline (single crystal) silicon and at least the upper layer near BOX layer 1303 may be very lightly doped (less than about 1e15 atoms/cm$^3$) or nominally un-doped (less than about 1e14 atoms/cm$^3$). Back channel layer 1305 may have additional ion implantation and anneal processing to provide a different dopant level than SOI donor wafer substrate 1301 and may have graded or various layers of doping concentration. SOI donor wafer substrate 1301 may have additional ion implantation and anneal processing to provide a different dopant level than back channel layer 1305 and may have graded or various layers of doping concentration. The donor wafer layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 1301 doping will be undoped to eventually create an FD-MOSFET transistor with an undoped conduction channel. SOI donor wafer may be constructed by layer transfer techniques described herein and/or incorporated references or elsewhere as known in the art, or by laser annealed SIMOX at a post donor layer transfer to acceptor wafer step. BOX layer 1303 may be thin enough to provide for effective DC or RF back and/or device/transistor body bias, for example, about 25 nm, or about 20 nm, or about 10 nm, or about 5 nm thick. Upper isolation layer 1332 may be formed by deposition of a dielectric such as, for example, silicon oxide, and/or by thermal/RTO oxidation of back channel layer 1305. Upper isolation layer 1332 may include, or may have below it, a layer (not shown) that may serve as a heat shield and/or conductive back plane, for example, a layer of tungsten (similar to the description in FIGS. 39, 40, 41, 42, 43 of U.S. Pat. No. 8,574,929 and U.S. patent application Ser. No. 13/803,437). The thin layer of refractory metal with a high melting point may be formed on top of the isolation layer and then patterned after layer transfer, thus forming metalized back-bias regions for the second layer of transistors, the back-bias region will not be harmed by the thermal cycles of the processing on the layer being processed. Furthermore, back channel layer 1305 and Buried Oxide BOX layer 1303 may be not formed and the transistor formation may proceed from a bulk donor substrate rather than an SOI based substrate.

Continuing with the FIG. 13A illustration, TRL 1340 may be formed on top of upper isolation layer 1332. Upper isolation layer 1332 may be etched (partially or fully) to form TRL regions (not shown).

TRL 1340 formation may include deposition of an amorphous silicon or a polysilicon film, or a combination of the two. The deposition may utilize an LPCVD technique wherein the polycrystalline film may be deposited at about 625° C. and the amorphous silicon film may be deposited at about 525° C. Other techniques, such as sputtering, PECVD, etc., may be utilized. The deposited film may be partially crystallized with a rapid thermal anneal (RTA) exposure, for example about 100 seconds at about 900° C. TRL 1340 may have a thickness that would accomplish the effective resistivity metric at the frequency(ies) of interest for the circuit design discussed previously herein, and may be, for example, about 5 nm, about 10 nm, about 20 nm, about 30 nm, about 50 nm about 100 nm, about 200 nm, or about 500 nm thick.

TRL 1340 formation may include damaging the surface and/or a top layer of, for example, back channel layer 1305 (or of the substrate in the case of a bulk donor layer transfer method), thus creating a damage layer (or regions if masked or etched). Damage may be caused by ion implantation, for example, such as an Argon ion-implant of about $10^{15}$ atoms/cm$^2$. Plasma sheath, or plasma source ion implantation may be utilized. Preferably the implantation is configured to damage and not dope the layer, the objective being to provide as high an effective resistivity as possible. The dose and energy may be set to bring the damaged layer close to or completely amorphize the crystalline structure of the damaged layer or region.

TRL 1340 formation may include deposition of a silicon rich silicon oxide, a silicon rich silicon nitride, and may include deposition of a siliconoxynitride film. TRL 1340 formation may include deposition of a carbon or carbon rich film, for example, amorphous carbon, disordered grapheme, DLC (Diamond Like Carbon), disordered carbon nanotube mats, or SiCO. TRL 1340 formation may include some of the materials formed in creation of the TIL layer of incorporated U.S. Patent Application 61/889,500 that have a high trap density, for example, forming nanoscale layered oxides or layers of disordered nanostructured materials.

Some references concerning trap layer mjateuails may be found in at least these references: Frohman-Bentchkowsky, D. (1969). An integrated metal-nitride-oxide-silicon (MNOS) memory. Proceedings of the IEEE, 57(6), 1190-1192; and Frohman-Bentchkowsky, D., & Lenzlinger, M. (1969). Charge Transport and Storage in Metal-Nitride-Oxide-Silicon (MNOS) Structures. Journal of Applied Physics, 40(8), 3307-3319; and White, M. H., & Cricchi, J. R. (1972). Characterization of thin-oxide MNOS memory transistors. Electron Devices, IEEE Transactions on, 19(12), 1280-1288; and Thermal and plasma nitridation of silicon and silicon dioxide for ultrathin gate insulators of MOS VLSI. Ph.D. dissertation by Moslehi, Mehrdad Mahmud, Stanford University, 1986; Roda Neve, C., and Raskin, J. P. (2012). RF harmonic distortion of CPW lines on HR-Si and trap-rich HR-Si substrates. Electron Devices, IEEE Transactions on, 59(4), 924-932; and Sarafis, P., Hourdakis, E., Nassiopoulou, A. G., Roda Neve, C., Ben Ali, K., & Raskin, J. P. (2013). Advanced Si-based substrates for RF passive integration: Comparison between local porous Si layer technology and trap-rich high resistivity Si. Solid-State Electronics, 87, 27-33; the following in their entirety are incorporated by reference. These references, esp. Moslehi's thesis, discuss various processes, outside of ion implantation, which may be used to create an embedded layer of trapped charge, and characterize the trapped charge per unit area as a function of various processing conditions.

TRL 1340 may be formed thicker than the desired end thickness, and then thinned by, for example, CMP processing or etching, to the desired end thickness, or for the purposes of smoothing the surface to enable improved bonding.

A pre-layer-transfer anneal may be performed as part of the TRL 1340 formation process or after the formation of TRL 1340, and may include a thermal anneal equal to or greater than the maximum temperature that the TRL 1340 would see during subsequent processing, for example, during the 3D IC stack processing, including layer transfer/bonding, transistor/device formation, activation anneals, and so on. The pre-layer-transfer anneal temperature may be about 10° C. greater than the process exposure maximum, or about 20° C. greater than the process exposure maximum, or about 30° C. greater than the process exposure maximum, or about 40° C. greater than the process exposure maximum. The pre-layer-transfer anneal temperature may be limited by the effect/damage it may have on the doping gradients elsewhere in the donor stack, or the damage repair/stress/outgassing effects on TRL 1340, as examples. The time of the pre-layer-transfer anneal at maximum temperature (the process exposure maximum) may be less than about 130 minutes, or less than about 1 hour, or less than about 2 hours. The formation of TRL 1340 and/or the anneal of TRL 1340 and the donor stack may be at a temperature and time greater than allowed by a metallized acceptor structure, for example, above about 400° C., above about 600° C., above about 800° C., above about 1000° C.

As illustrated in FIG. 13B, the top surface of the donor wafer stack that may include SOI donor wafer substrate 1301, may be prepared for oxide wafer bonding with a deposition of an oxide to form capping layer 1329.

A layer transfer demarcation plane (shown as dashed line) 1399 may be formed by hydrogen implantation or other methods (such as a preformed SiGe layer) as described in the incorporated references, and may reside within the SOI donor wafer substrate 1301. The SOI donor wafer substrate 1301 stack surface 1382, and acceptor wafer 1397 (first shown in FIG. 13C) may be prepared for wafer bonding as previously described in the incorporated references and may be low temperature (less than approximately 400° C.) bonded.

Figure 13C:
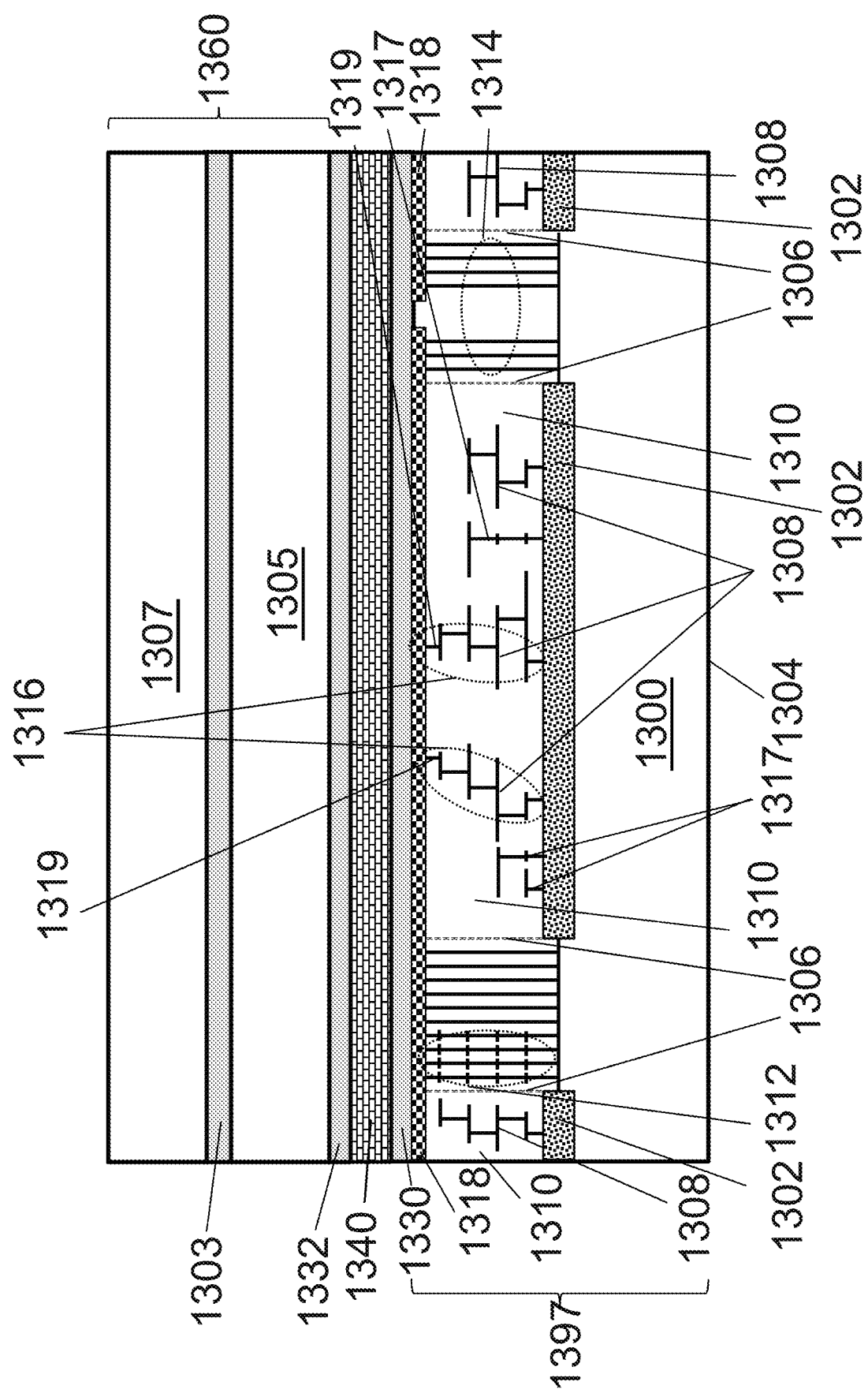

As illustrated in FIG. 13C, capping layer 1329, back channel layer 1305, BOX layer 1303 and remaining channel layer 1307 may be layer transferred to acceptor wafer 1397. Capping layer 1329 and acceptor wafer 1397 top bonding oxide (not shown) may be oxide to oxide bonded, thus forming lower isolation layer 1330. Acceptor wafer 1397, as described in the incorporated references and herein, may include, for example, transistors, circuitry, and metal, such as, for example, aluminum or copper, interconnect wiring, a metal shield/heat sink layer or layers, and thru layer via metal interconnect strips or pads. Acceptor wafer 1397 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1397 may include transistors such as, for example, MOSFETS, FD-MOSFETS, Fin-Fets, FD-RCATs, BJTs, HEMTs, and/or HBTs. The portion of the SOI donor wafer substrate 1301 that may be above (when the layer stack is flipped over and bonded to the acceptor wafer 1397) the layer transfer demarcation plane 1399 may be removed by cleaving or other low temperature processes as described in the incorporated references, such as, for example, ion-cut with mechanical or thermal cleave or other layer transfer methods, thus forming remaining channel layer 1307.

Formation of transistors and devices on the layer being processed 1360 without harming the underlying structures of acceptor wafer 1397 may proceed with a variety of methods. For example, as disclosed in at least FIGS. 33 and 46 and related specification sections of incorporated by reference U.S. Pat. No. 8,574,929, transistors may be formed with an integrated heat shields and optical annealing. For example, formation of CMOS in one transferred layer and the orthogonal connect strip methodology may be found as illustrated in at least FIGS. 30-33, 73-80, and 94 and related specification sections of U.S. Pat. No. 8,273,610, and may be applied. Low temperature and/or heat shielded 3D stacking transistor formation techniques may help preserve the effectiveness of the trap rich layer by not significantly annealing the defects and traps.

The exemplary flow herein FIG. 13 is utilizing a similar transistor formation technique as described in incorporated U.S. Patent Application 61/889,500, and may utilize a TIL, which may be integrated with TRL 1340, on the top or bottom face of the TRL 1340, or both. Or may be one in the same—the TIL may also have trap properties of a TRL. Many conventional semiconductor processing steps may now be utilized to form transistors and devices on the layer being processed 1360 without harming the underlying structures of acceptor wafer 1397, for example, a deposition or anneal may be performed at 800° C. on layer being processed 1360. Heat removal from the substrate, for example, such as via a cooled chuck, is described in incorporated U.S. Patent Application 61/889,500.

Damage/defects to a crystalline structure of back channel layer 1305 and remaining channel layer 1307 may be annealed by conventional thermal anneals with appropriate cold chuck equipment and/or some of the annealing methods as described in the incorporated references, for example the short wavelength pulsed laser techniques, wherein the layer being processed 1360 (which may include back channel layer 1305, BOX layer 1303 and remaining channel layer 1307) may be heated to defect annealing temperatures, but the underlying structures of acceptor wafer 1397 may be kept below the damage temperature of acceptor wafer 1397, for example, less than about 400° C.

The top surface of remaining channel layer 1307 may be chemically mechanically polished, and/or heat treated, to bring the surface quality to conventional defect levels and/or may be thinned by low temperature oxidation and strip processes, such as the TEL SPA tool radical oxidation and HF:H$_2$O solutions as described in referenced patents and patent applications. Thru the processing, the wafer sized layer channel layer 1307 could be thinned from its original total thickness, and its final total thickness could be in the range of about 5 nm to about 20 nm, for example, 5 nm, 7 nm, 10 nm, 12 nm, 15 nm, or 20 nm. Channel layer 1307 may have a thickness and/or doping that may allow fully-depleted channel operation when the FD-MOSFET transistor is substantially completely formed. Acceptor wafer 1397 may include one or more shield/heat sink layers 1318, which may include materials such as, for example, Aluminum, Tungsten (a refractory metal), copper, silicon or cobalt based silicides, or forms of carbon such as carbon nanotubes or graphene, and may be layered itself as described herein FIG. 3 and in at least incorporated U.S. Patent Application 61/889,500. Each shield/heat sink layer 1318 may have a thickness range of about 50 nm to about 1 mm, for example, 50 nm, 100 nm, 200 nm, 1300 nm, 500 nm, 0.1 um, 1 um, 2 um, and 10 um. Shield/heat sink layer 1318 may include isolation openings alignment mark openings (not shown), which may be utilized for short wavelength alignment of top layer (donor) processing to the acceptor wafer alignment marks (not shown). Shield/heat sink layer 1318 may act as a heat spreader. Electrically conductive materials may be used for the two layers of shield/heat sink layer 1318 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 1302), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 1318 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 1318 may be sandwiched and/or substantially enclosed by materials with a low thermal conductivity (less than 10 W/m-K), for example, silicon dioxide (about 1.4 W/m-K). When there may be more than one shield/heat sink layer 1318 in the device, the heat conducting layer closest to the TRL 1340 may be constructed with a different material, for example a high melting point material, for example a refractory metal such as tungsten, than the other heat conducting layer or layers, which may be constructed with, for example, a lower melting point material, for example such as aluminum or copper. The remaining SOI donor wafer substrate 1301 may now also be processed, such as smoothing and annealing, and reused for additional layer transfers. Upper isolation layer 1332 and/or lower isolation layer 1330 may include thicknesses of less than about 1 um, less than about 500 nm, less than about 400 nm, less than about 300 nm, less than about 200 nm, or less than about 100 nm.

Figure 13D:
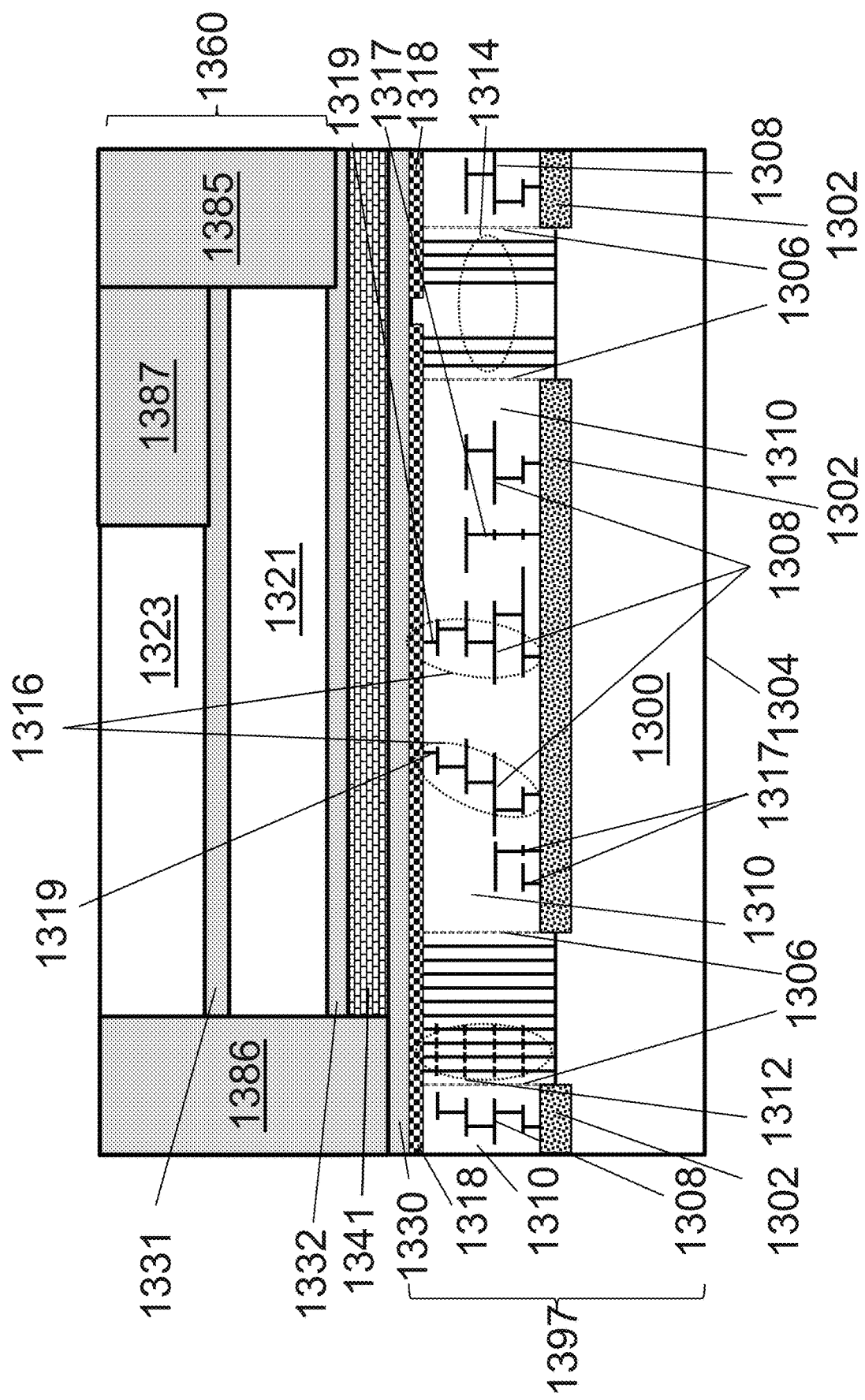

As illustrated in FIG. 13D, transistor and back channel isolation regions 1385 and/or transistor isolation regions 1387 may be formed. Transistor isolation region 1387 may be formed by mask defining and plasma/RIE etching channel layer 1307, substantially to the top of BOX layer 1303 (not shown), substantially into BOX layer 1303, or back channel layer 1305 (not shown). Transistor and back channel isolation regions 1385 and transistor-backchannel-TRL isolation regions 1386 may be formed by mask defining and plasma/RIE etching channel layer 1307, BOX layer 1303 and back channel layer 1305, substantially to the top of upper isolation layer 1332 (not shown) or substantially into upper isolation layer 1332 for transistor and back channel isolation regions 1385 and substantially to lower isolation layer 1330 for transistor-backchannel-TRL isolation regions 1386. Note: transistor-backchannel-TRL isolation regions 1386 are utilized when the electrical conductivity of the TRL 1340 is undesirably high and may cause undesired leakage paths between the eventual TLVs. Thus channel region 1323 may be formed, which may substantially form the transistor body, back-channel region 1321 may be formed, which may provide a back bias and/or Vt control by doping or bias to one or more channel regions 1323, and BOX region 1331. (TRL regions 1341 may also be thusly formed.) Back-channel region 1321 may be ion implanted for Vt control and/or body bias efficiency. A conventional or low-temperature gap fill dielectric, such as SACVD oxide, may be deposited and chemically mechanically polished, the oxide remaining in transistor and back channel isolation regions 1385 and transistor isolation regions 1387. An optical or a conventional thermal and/or oxidizing anneal may be performed to anneal etch damage in back-channel region 1321 and channel region 1323, and densify the STI oxide in transistor and back channel isolation regions 1385 and transistor isolation regions 1387. The doping concentration of channel region 1323 may include vertical or horizontal gradients of concentration or layers of differing doping concentrations. The doping concentration of back-channel region 1321 may include vertical or horizontal gradients of concentration or layers of differing doping concentrations. Any additional doping, such as ion-implanted channel implants, may be activated and annealed with optical annealing, or conventionally. BOX region 1331 may be a relatively thin dielectric, including the thickness range of about 5 nm to about 100 nm, at least a portion of which being between the back-channel region 1321 and channel region 1323. Back-channel region 1321 could be constructed from a material other than crystalline silicon, for example, a refractory metal or doped silicon in crystallized form, poly or amorphous, or other conductive materials that are acceptable for semiconductor processing and can withstand high temperatures.

Figure 13E:
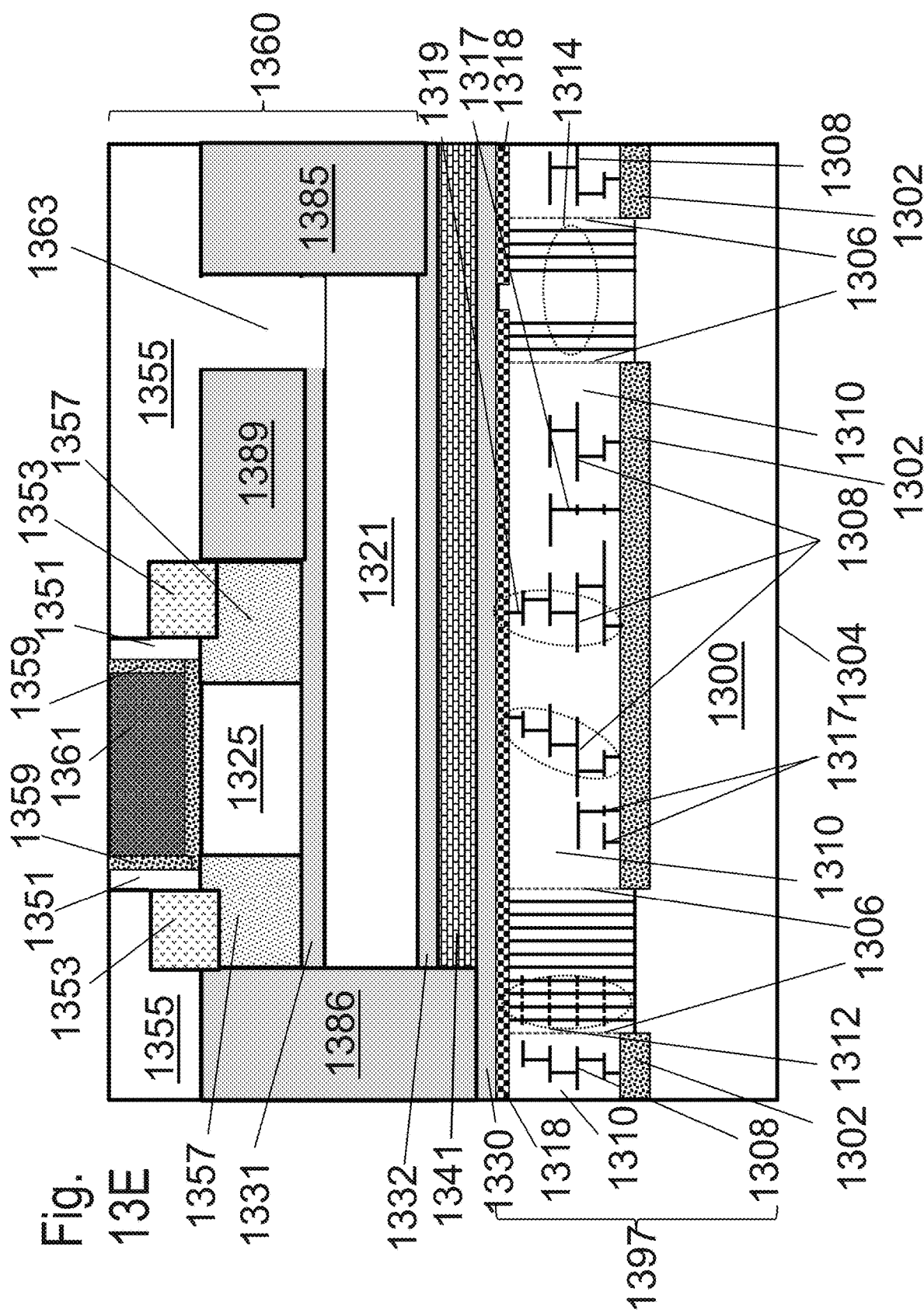

As illustrated in FIG. 13E, a transistor forming process, such as a conventional HKMG with raised source and drains (S/D), may be performed. For example, a dummy gate stack (not shown), utilizing oxide and polysilicon, may be formed, gate spacers 1351 may be formed, raised S/D regions 1353 and channel stressors may be formed by etch and epitaxial deposition, for example, of SiGe and/or SiC/P depending on P or N channel (and may be doped in-situ or ion-implantation and anneal activation), LDD and S/D ion-implantations may be performed, and first ILD 1355 may be deposited and CMP'd to expose the tops of the dummy gates. Thus transistor channel region 1325 and S/D & LDD regions 1357 may be formed. The dummy gate stack may be removed and a gate dielectric 1359 may be formed and a gate metal material gate electrode 1361, including a layer of proper work function metal ($Ti_xAl_yN_z$ for example) and a conductive fill, such as aluminum, and may be deposited and CMP'd. The gate dielectric 1359 may be an atomic layer deposited (ALD) gate dielectric that may be paired with a work function specific gate metal in the industry standard high k metal gate process schemes, for example, as described in the incorporated references. Furthermore, the gate dielectric on transistors may have different dielectric permittivities than silicon dioxide. The gate dielectric permittivity of the second layer transistors may be different than the gate dielectric permittivity of the first layer transistors. An optical anneal may be performed to densify and/or remove defects from gate dielectric 1359, anneal defects and activate dopants such as LDD and S/D implants, densify the first ILD 1355, form DSS junctions (Dopant Segregated Schottky such as $NiSi_2$), and/or form contact and S/D silicides (not shown). Optionally, portions of transistor isolation region 1387 and BOX region 1331 may be lithographically defined and etched away, thus forming second transistor isolation regions 1389 and PD transistor area 1363. Partially depleted transistors (not shown) may be constructed in a similar manner as the FD-MOSFETs constructed on transistor channel region 1325 herein, but now with the thicker back-channel region 1321 silicon as its channel body. PD transistor area 1363 may also be utilized to later form a direct connection thru a contact to the back-channel region 1321 for back bias and Vt control of the transistor with transistor channel region 1325. This may also be utilized for RF transistors. If no PD devices are desired, then it may be more efficient to later form a direct connection thru a contact to the back-channel region 1321 for back bias and Vt control of the transistor with transistor channel region 1325 by etching a contact thru transistor isolation region 1387.

As illustrated in FIG. 13F, a thick oxide 1363 may be deposited and planarized. Source, gate, drain, two types of back contact openings may be masked, etched, and filled with electrically conductive materials preparing the transistors to be connected via metallization. Thus gate contact 1365 connects to gate electrode 1361, source & drain contacts 1366 connect to raised S/D regions 1353, back channel contact 1368 may connect to back-channel region 1321, and direct back contact 1367 may connect to back-channel region 1321. Back channel contact 1368 and direct back contact 1367 may be formed to connect to shield/heat sink layer 1318 by further etching, and may be useful for hard wiring a back bias that may be controlled by, for example, the second layer or first layer transistors and circuitry into the FD MOSFET.

Figure 13G:
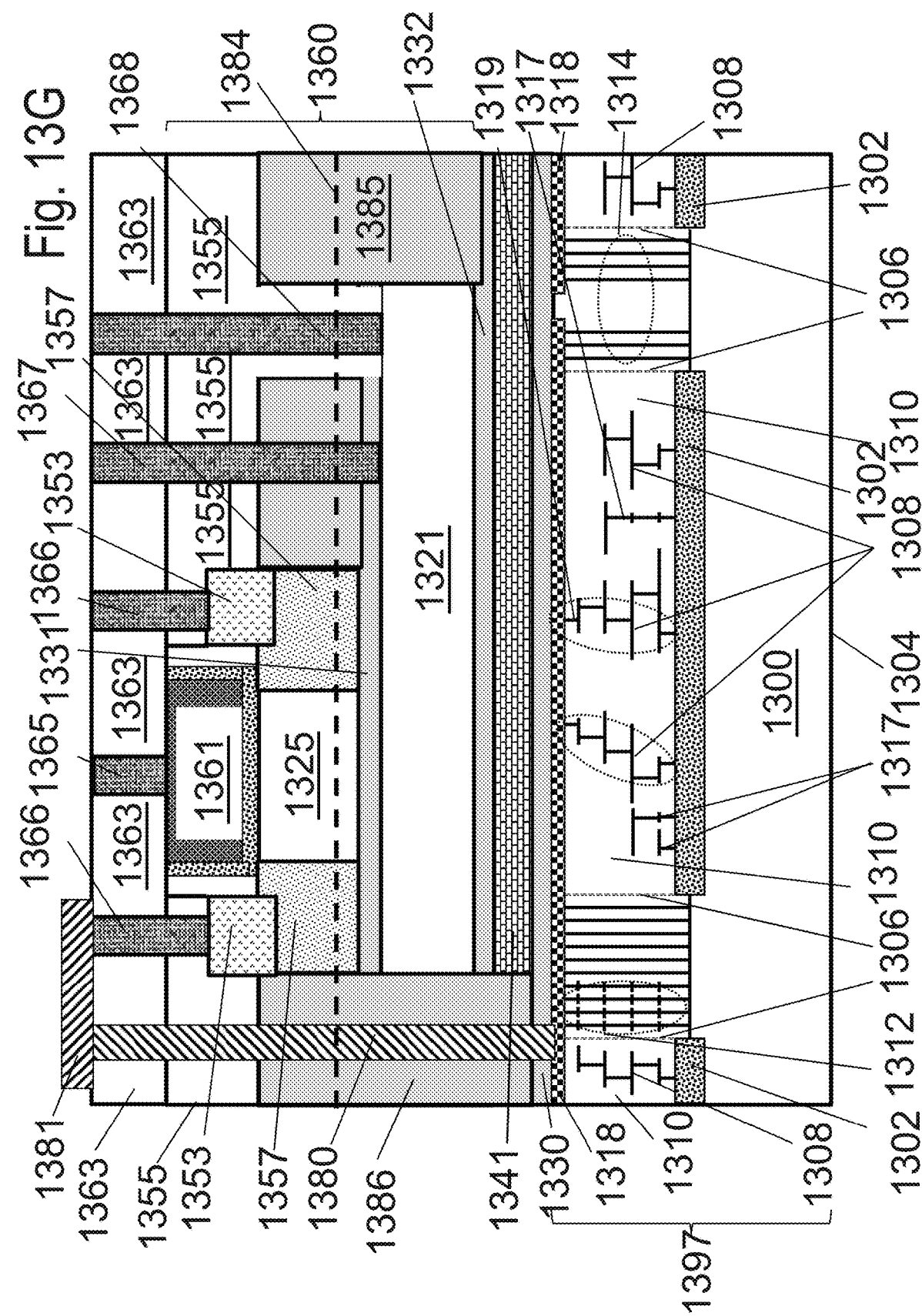

As illustrated in FIG. 13G, thru layer vias (TLVs) 1380 may be formed by etching thick oxide 1363, first ILD 1355, transistor-backchannel-TRL isolation regions 1386, upper isolation layer 1332, lower isolation layer 1330, and filling with an electrically and thermally conducting material (such as tungsten or cooper) or an electrically non-conducting but thermally conducting material (such as described herein and in the incorporated references). Second device layer metal interconnect 1381 may be formed by conventional processing. TLVs 1380 may be constructed of thermally conductive but not electrically conductive materials, for example, DLC (Diamond Like Carbon), and may connect the FD-MOSFET transistor device and other devices on the top (second) crystalline layer thermally to shield/heat sink layer 1318. TLVs 1380 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 1318, which may be a ground or Vdd plane in the design/layout. TLVs 1380 may be also constructed in the device scribelanes (pre-designed in base layers or potential dicelines) to provide thermal conduction to the heat sink, and may be sawed/diced off when the wafer is diced for packaging, not shown). Shield/heat sink layer 1318 may be configured to act (or adapted to act) as an emf (electromotive force) shield to prevent direct layer to layer crosstalk between transistors in the donor wafer layer and transistors in the acceptor wafer. In addition to static ground or Vdd biasing, shield/heat sink layer 1318 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 1384, may have regions, for example, transistor channel region 1325 and S/D & LDD regions 1357, that differ substantially in dopant concentration, for example, a 10 times greater doping concentration in S/D & LDD regions 1357 than in transistor channel region 1325, and/or may have a different dopant type, such as, for example p-type or n-type dopant, and/or may be doped and substantially undoped in the neighboring regions. For example, transistor channel region 1325 may be very lightly doped (less than about 1e15 atoms/cm$^3$) or nominally un-doped (less than about 1e14 atoms/cm$^3$) and S/D & LDD regions 1357 may be doped at greater than about 1e15 atoms/cm$^3$ or greater than about 1e16 atoms/cm$^3$. For example, transistor channel region 1325 may be doped with p-type dopant and S/D & LDD regions 1357 may be doped with n-type dopant.

An operations thermal conduction path may be constructed from the devices in the upper layer, the transferred donor layer and formed transistors, to the acceptor wafer substrate and an associated heat sink. The thermal conduction path from the FD-MOSFET transistor device and other devices on the top (second) crystalline layer, for example, raised S/D regions 1353, to the acceptor wafer heat sink (not shown, but may be placed on the backside of substrate 1300, may include source & drain contacts 1366, second device layer metal interconnect 1381, TLV 1380, a portion of heat sink/shield 1318, 1308, 1312, 1314, and acceptor substrate 1300. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 1300. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 1310, which may be a dielectric such as, for example, carbon doped silicon oxides. The heat removal apparatus, which may include acceptor wafer heat sink (not shown), may include an external surface from which heat transfer may take place by methods such as air cooling, liquid cooling, or attachment to another heat sink or heat spreader structure.

Figure 17:
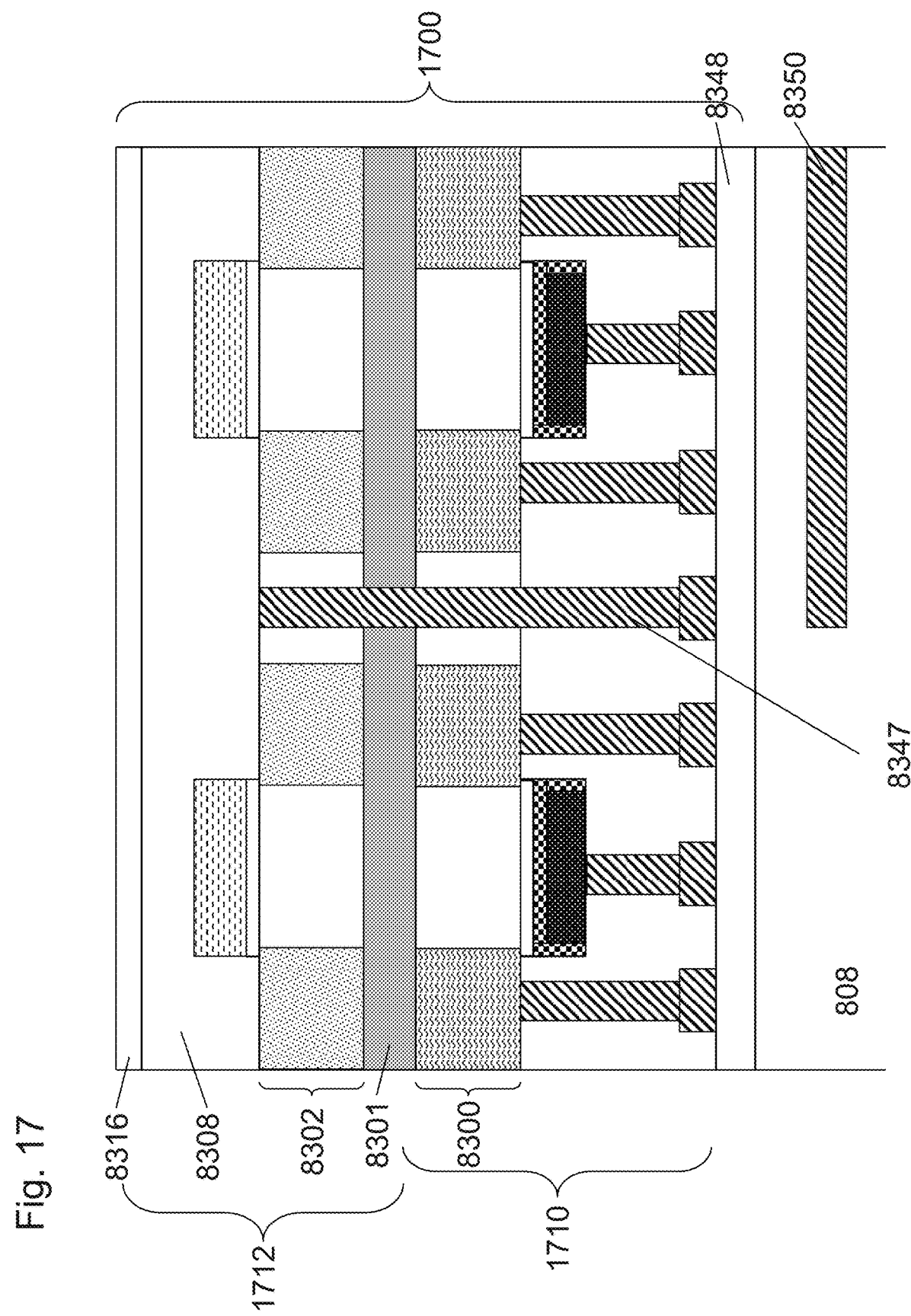
FIG. 17 is an exemplary illustration of a stratum-3 and a stratum-2 in a dual strata configuration overlaying a target/base wafer or device.

Furthermore, some or all of the layers utilized as shield/heat sink layer 1318, which may include shapes of material such as the strips or fingers as illustrated in at least FIG. 33B and related specification sections of U.S. Pat. No. 8,450,804, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 1318 layer or layers. Moreover, some or all of the layers utilized as shield/heat sink layer 1318, which may include strips or fingers as illustrated in FIG. 33B and related specification of U.S. Pat. No. 8,450,804, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 1318 layer or layers. The Vsupply on line 17C12 and the control signals on control line 17C16 may be controlled by and/or generated in the second layer transistors (for example donor wafer device structures such as the FD-MOSFETs formed as described in relation to FIG. 13) or first layer transistors (acceptor, for example acceptor wafer transistors and devices 1302), or off chip circuits. Furthermore, some or all of the layers utilized as shield/heat sink layer 1318, which may include strips or fingers as illustrated in FIG. 33B and related specification of U.S. Pat. No. 8,450,804 or other shapes such as those in FIG. 33B, may be utilized to distribute independent power supplies to various portions of the second layer transistors or first layer transistors (acceptor, for example acceptor wafer transistors and devices 1302) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 1318 or layers can impact their heat-shielding capacity. This impact may be mitigated, for example, by enhancing the top shield/heat sink layer 1318 areal density, creating more of the secondary shield/heat sink layers 1318, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, for example donor wafer device structures such as the FD-MOSFETs formed as described in relation to FIG. 13, may include I/O logic devices, such as SerDes (Serialiser/Deserialiser), and conductive bond pads (not shown). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 1318. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 13, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the TRL 1340 and/or shield/heat sink layer 1318.

TLVs 1380 may be formed through the transferred layers. As the transferred layers may be thin, on the order of about 1 um or less in thickness, the TLVs may be easily manufactured as a typical metal to metal via may be, and said TLV may have state of the art diameters such as nanometers or tens to a few hundreds of nanometers, such as, for example about 250 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Design choices may determine if TLVs are formed thru transistor and back channel isolation regions 1385 and/or thru transistor-back-channel-TRL isolation regions 1386.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 13 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 13A through 13G are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 1301 may be n type or un-doped. Furthermore, transistor and back channel isolation regions 1385 and transistor isolation region 1387 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Strain on a transistor channel to enhance carrier mobility may be accomplished by a stressor layer or layers as well. Moreover, a process could be done on bulk donor wafer rather than an SOI wafer as well to form other types of transistors without integrated body/back-channel layer/regions. Additionally, the layer transfer process may utilize a method other than ion-cut, for example, a porous layer or selectively etchable layer, detach layer method. Furthermore, a process could be done to form other types of transistors on the layer to be processed 1360, for example, FinFets or TFETs. Many other modifications within the scope of the invention will suggest themselves to such skilled persons after reading this specification. Thus the invention is to be limited only by the appended claims.

A donor wafer that may include a pre-made TRL and other layers, for example, the structure as illustrated in FIG. 13B, may be manufactured for/by and supplied by a wafer vendor such as MEMC/SunEdison, SEH, Soitec, etc.

A donor wafer that may include a pre-made TRL and other layers, for example, the structure as illustrated in FIG. 13B, may be layer transferred utilized the perforated carrier wafer methods as described in at least FIGS. 184, 185, 186, and 187 and related specification sections of U.S. Pat. No. 8,273,610. A debond/release etchant protect layer may be included in the transfer layer stack to protect the TRL 1340 and other layers from the debond/release etchant utilized in the perforated carrier wafer methodology.

Figure 14C:
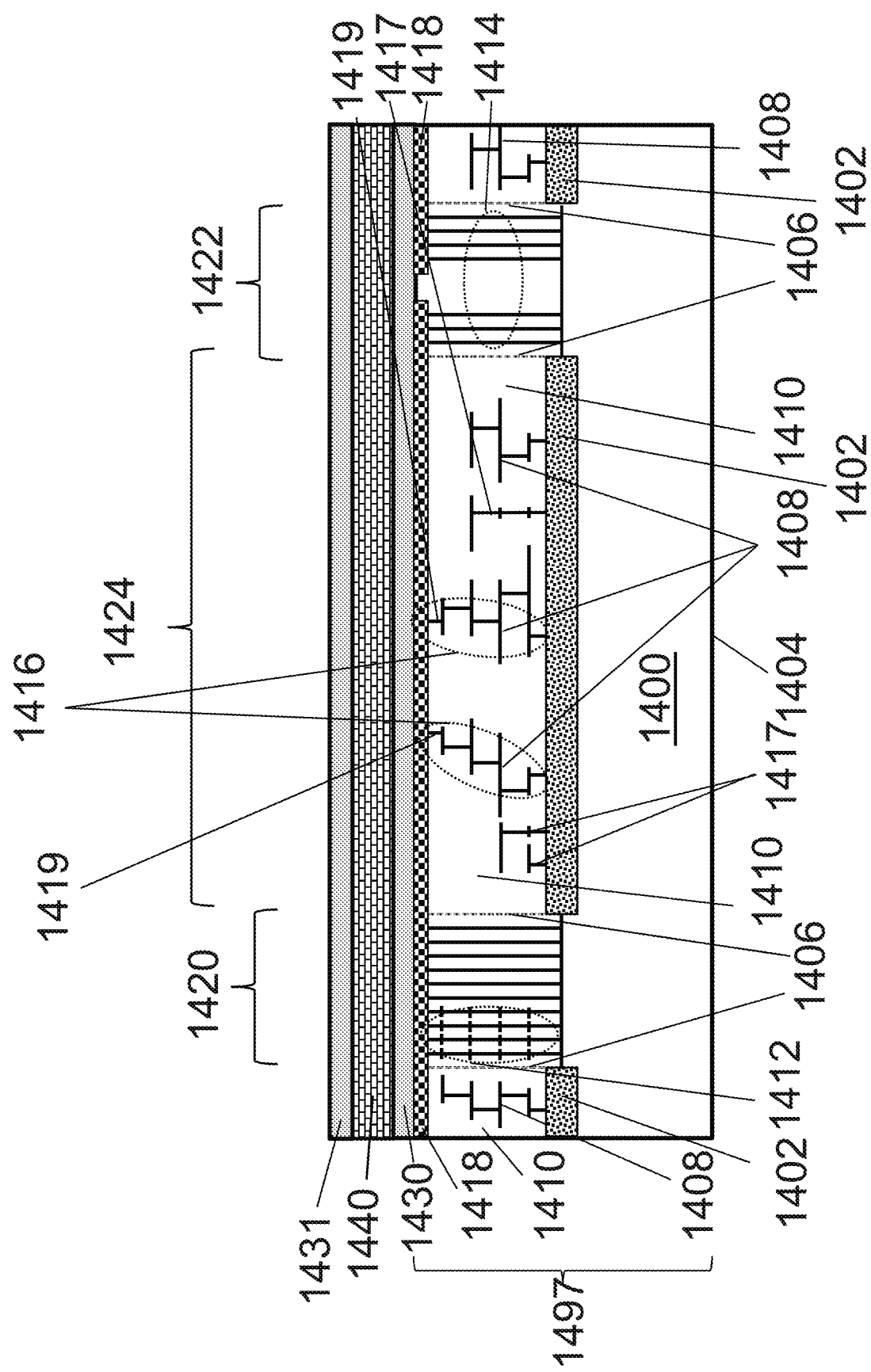

A TRL may be formed directly on the acceptor wafer prior to a layer transfer of the material to form the next layer of devices and circuits. Structures and devices similar to those described and illustrated with respect to at least FIG. 13 may be formed, but the TRL formation may be limited to temperatures less than about 400° C. due to the presence of copper or aluminum metallization and low k IMDs on the layer or layers below the layer being processed. An exemplary process flow is described with respect to FIGS. 14A-14E. FIG. 14E illustrates an exemplary n-channel FD-MOSFET with integrated TRL (Trap Rich Layer). Integrated TPS (Thermal Protective Structure), TIL (Thermal Isolation Layer), and/or TES (Thermally Enhanced Substrate) may be utilized to thermally protect the metallization, isolation layers, device electrical characteristics and reliability of devices that may reside in or on the substrate or a previously constructed layer in the 3D stack from damaging processes and processing temperatures. Formation and composition details may be found in at least some of the incorporated references, for example, U.S. Patent Applications 61/889,500 and Ser. No. 14/298,917. An exemplary n-channel FD-MOSFET with integrated TRL may be constructed in a 3D stacked layer utilizing procedures outlined herein and in incorporated references.

As illustrated in FIG. 14A, SOI donor wafer substrate 1401 may include back channel layer 1405 above Buried Oxide BOX layer 1403. Back channel layer 1405 may be doped by ion implantation and thermal anneal, may include a crystalline material, for example, mono-crystalline (single crystal) silicon and may be heavily doped (greater than about 1e16 atoms/cm$^3$), lightly doped (less than about 1e16 atoms/cm$^3$) or nominally un-doped (less than about 1e14 atoms/cm$^3$). SOI donor wafer substrate 1401 may include a crystalline material, for example, mono-crystalline (single crystal) silicon and at least the upper layer near BOX layer 1403 may be very lightly doped (less than about 1e15 atoms/cm$^3$) or nominally un-doped (less than about 1e14 atoms/cm$^3$). Back channel layer 1405 may have additional ion implantation and anneal processing to provide a different dopant level than SOI donor wafer substrate 1401 and may have graded or various layers of doping concentration. SOI donor wafer substrate 1401 may have additional ion implantation and anneal processing to provide a different dopant level than back channel layer 1405 and may have graded or various layers of doping concentration. The donor wafer layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 1401 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 1403 may be thin enough to provide for effective DC or RF back and/or device/transistor body bias, for example, about 25 nm, or about 20 nm, or about 10 nm, or about 5 nm thick. Furthermore, back channel layer 1405 and Buried Oxide BOX layer 1403 may be not formed and the transistor formation may proceed from a bulk donor substrate rather than an SOI based substrate.

As illustrated in FIG. 14B, the top surface of the donor wafer stack that may include SOI donor wafer substrate 1401, may be prepared for wafer bonding with a deposition of an oxide on or by thermal/RTO oxidation of back channel layer 1405 to form bonding oxide layer 1471. Bonding oxide layer 1471 may include, or may have below it, a layer (not shown) that may serve as a heat shield and/or conductive back plane, for example, a layer of tungsten (a layer of tungsten (similar to the description in FIGS. 39, 40, 41, 42, 43 of U.S. Pat. No. 8,574,929 and U.S. patent application Ser. No. 13/803,437). The thin layer of refractory metal with a high melting point may be formed on top of the isolation layer and then patterned after layer transfer, thus forming metalized back-bias regions for the second layer of transistors, the back-bias region will not be harmed by the thermal cycles of the processing on the layer being processed.

A layer transfer demarcation plane (shown as dashed line) 1499 may be formed by hydrogen implantation or other methods as described in the incorporated references, and may reside within the SOI donor wafer substrate 1401.

As illustrated in FIG. 14C, acceptor substrate 1497 may be prepared and a TRL 1440 may be formed including a capping/bonding layer 1431. Acceptor substrate 1497 may be prepared in a similar manner as at least as the structures and devices described in FIGS. 1A-1E of incorporated U.S. Patent Application 61/889,500, up to and including lower isolation layer 1300 (lower isolation layer 1430 in FIG. 14C), and using known in the art techniques. Acceptor wafer 1497, as described in the incorporated references and herein, may include, for example, transistors, circuitry, and metal, such as, for example, aluminum or copper, interconnect wiring, a metal shield/heat sink layer or layers, and thru layer via metal interconnect strips or pads. Acceptor wafer 1497 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1497 may include transistors such as, for example, MOSFETS, FD-MOSFETS, FinFets, FD-RCATs, BJTs, HEMTs, and/or HBTs.

TPS protective structures to protect the desired regions of substrate devices may be constructed. These protective structures may be constructed using conventional and known in the art processing techniques. A substrate 1400, for example, a monocrystalline silicon wafer which may be thermally enhanced (a Thermally Enhanced Substrate—TES—as described in incorporated U.S. Patent Application 61/889,500), of which a portion is shown in FIG. 14, may have substrate device regions 1402 including devices, such as, for example, transistors, capacitors, and resistors. These substrate device regions 1402 could be formed as eventual product dice with surrounding scribelanes and die edge seals. The devices within the regions of substrate devices could be wholly or partially within the substrate 1400 material. The scribelanes may also be called dicing streets or scribelines.

The substrate 1400 may also have a backside surface 1404 that may be utilized to conduct processing heat (the heat source may be the layer being processed 1460 during device formation steps or portions of the equipment performing the processing such as IR lamps) from the substrate 1400 to a processing equipment cooling chuck or other thermal conduction/heat removal device, generally within the processing equipment.

The substrate device regions 1402 may have corresponding regions of substrate metallization 1408 and BEOL isolation 1410 interconnect layers, which may include copper or aluminum metallization materials and low-k dielectric inter-metal dielectrics (IMD) respectively. These may be constructed with known in the art BEOL processing.

As part of the construction of or separately from the formation of regions of substrate metallization 1408 and BEOL isolation 1410 interconnect layers, one or more shield layer or regions 1418 of metallization and isolation may be constructed. Details are in referenced applications. For example, the shield layer or regions 1418 metallization may include materials such as tungsten, copper, aluminum, grapheme, diamond, carbon, materials with a high thermal conductivity (>10 W/m-K) and an appropriate melting/softening point. The shield layer or regions 1418 may be constructed as a continuous slab across substantially the entire extant of the substrate area, or may be formed as regions.

The shield layer or regions 1418 may have terminations within the device die scribelanes. The shield layer or regions 1418 may include TLV landing pads wherein signals from the second layer of devices may connect either to a lower shield layer (for example shield layer or regions 1418) or to the interconnect layers or regions of substrate metallization 1408 and BEOL isolation 1410 interconnect or lower layer devices and circuits. The shield layer or regions 1418 may be thermally but not electrically connected or may be thermally and electrically connected to the substrate 1400 in a variety of ways.

The scribelanes, for example, scribelane with thermal via stacks and continuous shield 1420 and/or scribelane with thermal via stacks and cut shield layer 1422, may be substantially populated with thermal via stacks, which may be formed as thermal via stacks with via landing pads 1412 as each metallization and via layer of the regions of substrate metallization 1408 and BEOL isolation 1410 interconnect layers are formed, or the thermal vias in the scribelane 1414 may be formed as an etched and filled deep-via prior to the formation of the shield layer or regions 1418. Forming the thermal via stack after the regions of substrate metallization 1408 and BEOL isolation 1410 interconnect layers are formed may provide the use of a different BEOL isolation material, material that may be more thermally isolative and/or thermally stable, for the thermal via stacks than for the devices. The thermal vias in the scribelane 1414 may also be formed as one or a few to substantially fill (with appropriate stress relief structures) the scribelane with metal (thermally conductive) material (as much as practical given CMP dishing design rules) that may be part of the shield layer formation, or may be formed in a separate metal deposition and planarization step and may provide use of a more thermally conductive material than copper or aluminum to form the thermal vias in the scribelane 1414, for example, carbon nanotubes, Plasma Enhanced Chemical Vapor Deposited Diamond Like Carbon-PECVD DLC (about 1000 W/m-K), and Chemical Vapor Deposited (CVD) graphene (about 5000 W/m-K).

As dictated by design choices, the thermal vias (such as, for example, substantially all or a portion of thermal via stacks with via landing pads 1412 and/or thermal vias in the scribelane 1414, and/or in-die thermal via stacks 1416 and/or fill-in thermal paths 1417) may truncate in a dielectrically isolated or reverse biased junction electrically isolated connection to the substrate, or the thermal vias may truncate as a conventional forward biased junction or no junction substrate contact that may be thermally and electrical connected to the substrate. Processing, structure, and operational details are in referenced applications.

In-die thermal via stacks 1416 (may also be called in-die thermal via paths) may also be constructed over the regions of substrate devices 1402 (within die extant 1424) by forming a via stack that utilizes the interconnect structures of the regions of substrate metallization 1408 and BEOL isolation 1410 interconnect layers, with a via connection 1419 from the shield layer to a metallization layer/segment within the regions of substrate metallization 1408 and BEOL isolation 1410 interconnect layers. Via connection 1419 may be connected at a later step to electrically couple to the second layer devices (such as a TLV), or may primarily enable (as part of a thermal path) a thermal connection from substrate 1400 to shield layer or regions 1418. Details of this formation have been described in referenced applications.

Additionally, as a matter of design choice and may be controlled by an EDA design and placement algorithm, fill-in thermal paths 1417 may be added to a chip die design/layout to maximize local and die average thermal conductivity. The fill-in thermal paths 1417 may be formed anywhere on the die and from any level of the regions of substrate metallization 1408 and BEOL isolation 1410 interconnect layers to the substrate 1400, for example, metal 4 to substrate, metal 3 to substrate, and so on). Fill-in thermal paths 1417 may be added to a power or ground line as extra thermal connections to the substrate 1400, which may be electrically conductive or non-conductive due to design constraints. Fill-in thermal paths 1417 may be additional connections beyond what a conventional design or EDA tool may provide/construct. Fill-in thermal paths 1417 may be added to/formed in so called 'white space' within the device die, where there may be a path vertically and horizontally thru the regions of substrate metallization 1408 and BEOL isolation 1410 interconnect layers to the substrate 1400. Moreover, fill-in thermal paths 1417 may be formed from the CMP fill structures of one or more of the regions of substrate metallization 1408 and BEOL isolation 1410 interconnect layers.

As a matter of design choice, die seal 1406 (or die seal-ring) may be utilized as a thermal connection from either interconnect metal layers of the ring itself or the shield layer or regions 1418 to the substrate 1400.

Lower isolation layer 1430 may be deposited on top of shield layer or regions 1418 to protect and electrically and partially thermally isolate above and below and may include the bonding oxides for an ion-cut layer transfer process (for the case wherein TRL 1440 is formed on a donor wafer or substrate). Lower isolation layer 1430 may include designed-in voids (not shown), for example, by etch removal of portions of lower isolation layer 1430, thus forming regions of vacuum and/or gas and regions of the remaining material (for example, silicon oxide) of lower isolation layer 1430. The voids may be formed such that they extend fully or partially thru the entire thickness lower isolation layer 1430. The presence of the voids may reduce the average thermal conductivity of lower isolation layer 1430. The voids may include greater than about 5%, greater than about 10%, greater than about 20%, or greater than about 50% of the area and/or volume of lower isolation layer 1430, thus affecting the total average lower isolation layer 1430 thermal conductivity by greater than about 5%, or greater than about 50%.

Continuing with the FIG. 14C illustration, TRL 1440 may be formed on top of lower isolation layer 1430. TRL 1440 may be etched (partially or fully) to form TRL regions (not shown).

TRL 1440 formation may include deposition of an amorphous silicon or a polysilicon film, or a combination of the two. The deposition may utilize deposition techniques and processes that will not thermally harm the underlying metallization and/or dielectric BEOL isolation materials and structure, which for copper and/or aluminum metallization and low-k dielectrics are generally less than 400° C. temperature exposures. Techniques, such as sputtering, PECVD, etc., may be utilized. TRL 1440 may have a thickness that would accomplish the effective resistivity metric at the frequency(ies) of interest for the circuit design as discussed previously herein, and may be, for example, about 5 nm, about 10 nm, about 20 nm, about 30 nm, about 50 nm about 100 nm, about 200 nm, or about 500 nm thick.

TRL 1440 formation may include damaging the surface and a top layer of, for example, a deposited layer of silicon or a layer transferred silicon layer, or of lower isolation layer 1430, thus creating a damage layer (or regions if masked or etched) Damage may be caused by ion implantation, for example, such as an Argon ion-implant of about $10^{15}$ atoms/cm$^2$. Plasma sheath, or plasma source ion implantation may be utilized. Preferably the implantation is configured to damage and not dope the layer, the objective being to provide as high an effective resistivity as possible. The dose and energy may be set to bring the damaged layer close to or completely amorphize the crystalline structure of the damaged layer or region.

TRL 1440 formation may include deposition of a silicon rich silicon oxide, a silicon rich silicon nitride, and may include deposition of a siliconoxynitride film. TRL 1440 formation may include deposition of a carbon or carbon rich film, for example, amorphous carbon, disordered grapheme, DLC (Diamond Like Carbon), disordered carbon nanotube mats, or SiCO. TRL 1440 formation may include some of the materials formed in creation of the TIL layer of incorporated U.S. Patent Application 61/889,500 that have a high trap density, for example, forming nanoscale layered oxides or layers of disordered nanostructured materials.

TRL 1440 may be formed thicker than the desired end thickness, and then thinned by, for example, CMP processing or etching, to the desired end thickness, or for the purposes of smoothing the surface to enable improved bonding.

A pre-layer-transfer anneal may be performed as part of the TRL 1440 formation process or after the formation of TRL 1440, and may include a thermal anneal equal to or greater than the maximum temperature that the TRL 1440 would see during subsequent processing, for example, during the 3D IC stack processing, including layer transfer/bonding, transistor/device formation, activation anneals, and so on as long as the TRL formation temperature does not exceed the damage temperature of underlying structures, which may be less than about 400° C., or less than about 350° C., for copper and low-k BEOL materials and structures. If higher temperature metals and dielectrics are utilized in the construction of the acceptor substrate 1497, for example, tungsten and silicon dioxide, greater temperatures to form the TRL 1440 may be available. The ramp up and cool down rates may be carefully controlled depending on the type and condition of material in TRL 1440 to minimize cracking, outgassing effects, and other stress effects on the stack. The time of the pre-layer-transfer anneal at maximum temperature (the process exposure maximum) may be less than about 30 minutes, or less than about 1 hour, or less than about 2 hours.

Continuing as illustrated in FIG. 14C, the top surface of the donor wafer stack that may include acceptor substrate 1497, may be prepared for oxide wafer bonding with a deposition of a low temperature oxide to form capping/bonding layer 1431.

The SOI donor wafer substrate 1401 stack, such as surface 1482 (shown in FIG. 14B), and acceptor wafer 1497 (first shown in FIG. 14C) may be prepared for wafer bonding as previously described in the incorporated references and low temperature (less than about 400° C.) bonded.

Figure 14D:
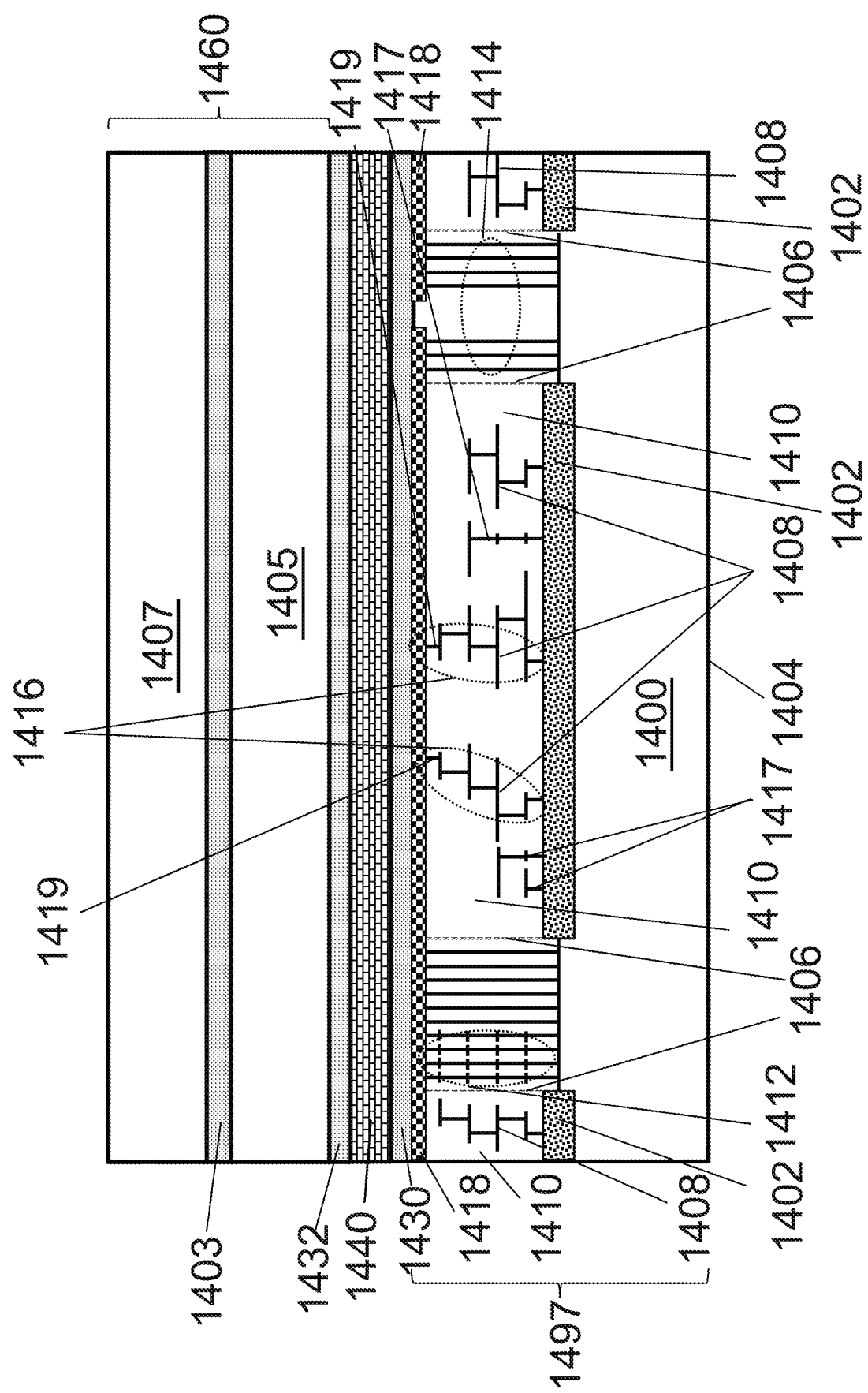

As illustrated in FIG. 14D, bonding oxide layer 1471, back channel layer 1405, BOX layer 1403 and remaining channel layer 1407 may be layer transferred to acceptor wafer 1497. Donor wafer bonding oxide layer 1471 and acceptor wafer 1497 capping/bonding layer 1431 may be oxide to oxide bonded, thus forming upper isolation layer 1432. The portion of the SOI donor wafer substrate 1401 that may be above (when the layer stack is flipped over and bonded to the acceptor wafer 1497) the layer transfer demarcation plane 1499 may be removed by cleaving or other low temperature processes as described in the incorporated references, such as, for example, ion-cut with mechanical or thermal cleave or other layer transfer methods, thus forming remaining channel layer 1407.

Formation of transistors and devices on the layer being processed 1460 without harming the underlying structures of acceptor wafer 1497 may proceed with a variety of methods. For example, as disclosed in at least FIGS. 33 and 46 and related specification sections of incorporated by reference U.S. Pat. No. 8,574,929, transistors may be formed with an integrated heat shields and optical annealing. For example, formation of CMOS in one transferred layer and the orthogonal connect strip methodology may be found as illustrated in at least FIGS. 30-33, 73-80, and 94 and related specification sections of U.S. Pat. No. 8,273,610, and may be applied. Low temperature and/or heat shielded 3D stacking transistor formation techniques may help preserve the effectiveness of the trap rich layer by not significantly annealing the defects and traps.

The exemplary flow herein FIG. 14 is utilizing a similar transistor formation technique as described in incorporated U.S. Patent Applications 61/889,500 and Ser. No. 14/298,917, by utilizing a TIL, which may be integrated with TRL 1440/TRL regions 1441, on the top or bottom face, or both. Or may be one in the same (shown). Many conventional semiconductor processing steps may now be utilized to form transistors and devices on the layer being processed 1460 without harming the underlying structures of acceptor wafer 1497, for example, a deposition or anneal may be performed at 800° C. on layer being processed 1460. Heat removal from the substrate, for example, such as via a cooled chuck, is described in incorporated U.S. Patent Application 61/889,500.

Processing similar to the processing and transistor/device formation such as, for example, illustrated in FIGS. 13D to 13G and described in related specification sections herein, or many other semiconductor processes and steps, may be performed. For example, as illustrated in FIG. 14E, an exemplary FD-MOSFET structure may be formed. The structures, numerals and labels may be common between FIGS. 13A-13G and FIGS. 14A-14E with just the first number adjusted to match the present figure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 14 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 14A through 14E are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 1401 may be n type or un-doped. Furthermore, transistor and back channel isolation regions 1485 and transistor isolation region 1487 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Moreover, a process could be done on bulk donor wafer rather than an SOI wafer as well to form other types of transistors without integrated body/back-channel layer/regions. Additionally, the layer transfer process may utilize a method other than ion-cut, for example, a porous layer or selectively etchable layer, detach layer method. Furthermore, a process could be done to form other types of transistors on the layer to be processed 1460, for example, FinFets or TFETs. Many other modifications within the scope of the invention will suggest themselves to such skilled persons after reading this specification. Thus the invention is to be limited only by the appended claims.

The acceptor wafer herein or in the incorporated references may include a top or near top low-k dielectric layer or layers, as part of the BEOL processing and formation. The low-k dielectrics utilized may have a lower physical strength, for example as represented by its Young's Modulus, than desired to enable a defect free bond and/or cleave of a transferred layer. Use of a TRL and/or a TIL may also provide a weaker structure than desired. Preparation for bonding and/or cleaving may include structures and/or materials which include the purpose of enhancing the physical strength and/or cracking resistance of the stack structure, especially the bond plane and the acceptor wafer BEOL layers. The top BEOL layer or layers dielectrics may utilize a stronger dielectric material, for example fluorinated oxides or undoped oxides. Furthermore, strengthening regions may be placed within the BEOL, TIL, TRL and/or acceptor wafer to stiffen and/or mechanically strengthen the 3DIC structure. Strengthening regions may provide smaller regions of the softer and weaker low-dielectrics and may mitigate cracking and fracture initiation and/or propagation. Strengthening regions may include materials that have a higher Young's modulus than the majority of the material within acceptor wafer BEOL, or any TIL or TRL. For example, strengthening regions may include, for example, silicon oxide, which has a higher mechanical strength than, for example, most low-k dielectrics, such as SiCO, aerogels and silsesquioxanes. Strengthening regions may include less than about 0.5%, less than about 1%, less than about 2%, less than about 5% or less than about 10% of the area and/or volume of BEOL, or any TIL or TRL. Strengthening regions may include the scribelanes of the wafer, the scribelanes may be processed with stiffer material during its formation as part of the process flow, or the material within the scribelane may be removed and replaced with a stiffer material before layer transfer of a layer above. Moreover strengthening regions may be designed to be aligned to the scribelanes and may underlap the full extent of the scribelanes by an underlap, which may be the layout distance between the acceptor die seal and the edge of the closest strengthening regions. For example, the underlap may have the dimension of 0 or at least about 1 um, at least about 5 um, at least about 10 um, at least about 20 um, at least about 50 um. A similar strengthening strategy may be employed on a second layer of device and circuits when bonding and cleaving a 'third' layer on top of the second layer. A portion of the strengthening regions may be replaced after the layer transfer. More teaching on strengthening regions may be found in at least incorporated reference U.S. patent application Ser. No. 14/298,917.

Oscillators formed from resonant structures may be integrated as a layer of layers into a 3DIC system or device. The resonant structure may include a silicon based MEMS device and structure, or a piezoelectric formed oscillator, or a hybrid of silicon and piezo material. The MEMS oscillator structure may be integrated in the 3DIC system or device on the substrate layer, or on a layer/stratum above or below the substrate layer. Other layers or stratum in the 3DIC system stack may provide the control/conditioning circuitry for the MEMS oscillator, for example, circuits such as a PLL, temperature compensation, test and calibration circuits, signal conditioning, and/or programmable circuits. The MEMS oscillator may supply at least one clock for a portion or substantially all of the 3DIC system or stack device, and may include more than one MEMS oscillator within a layer/stratum, and may include multiple layers/stratum of MEMS oscillators. MEMS-based circuits, such as switches, filters, resonators, oscillators, microphones, loudspeakers, and/or VCOs, for mobile handsets, for example, may be integrated into a 3DIC system utilizing techniques described herein and in incorporated references. For example, FIGS. 15A-15G illustrate an integrated MEMS oscillator as a layer within a 3DIC system stack, and an exemplary process flow.

As illustrated in FIG. 15A, a donor wafer substrate 1501 may include etchstop layer 1505 above buried oxide layer 1503. Etchstop layer 1505 may include materials that have substantially zero etchrate or very slow etchrate in an oxide removal etchant, for example, vapor hydrofluoric acid (HF). Etchstop layer 1505 may include, for example, amorphous silicon, polycrystalline silicon, mono-crystalline (single crystal) silicon, amorphous carbon, silicon nitride. Etchstop layer 1505 may provide for an effective etchstop during the eventual resonator body release step and may have a thickness of, for example, about 25 nm, or about 20 nm, or about 10 nm, or about 35 nm. Etchstop layer 1505 may be an electrically insulating material (preferred for a simpler process flow) or a conductive one.

As illustrated in FIG. 15B, the top surface of the donor wafer substrate 1501 layer stack may be prepared for oxide wafer bonding with a deposition of an oxide or, if of the proper material for oxidation, by thermal oxidation of etchstop layer 1505 to form oxide layer 1571. A layer transfer demarcation plane (shown as dashed line) 1599 may be formed by hydrogen implantation or other methods as described in the incorporated references, and may reside within the donor wafer substrate 1501. The depth of the layer transfer demarcation plane 1599 may be set to provide the desired thickness of the eventual resonator body, which may be a thickness of about 20 nm, about 50 nm about 100 nm, about 500 nm, about 1000 nm, about 1 um, or about 10 um. The donor wafer substrate 1501 stack, such as surface 1582, and acceptor wafer 1510 may be prepared for wafer bonding as previously described and may be low temperature (less than approximately 400° C.) bonded. Acceptor wafer 1510, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 1510 substrate may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1510 may include transistors such as, for example, MOSFETS, FD-MOSFETS, FinFets, FD-RCATs, BJTs, HEMTs, and/or HBTs. The portion of the donor wafer substrate 1501 that may be above (when the layer stack is flipped over and bonded to the acceptor wafer 1510) the layer transfer demarcation plane 1599 may be removed above the layer transfer demarcation plane 1599 by cleaving or other low temperature processes as described in the incorporated references, such as, for example, ion-cut with mechanical or thermal cleave or other layer transfer methods, thus forming remaining resonator layer 1507.

Figure 15C:
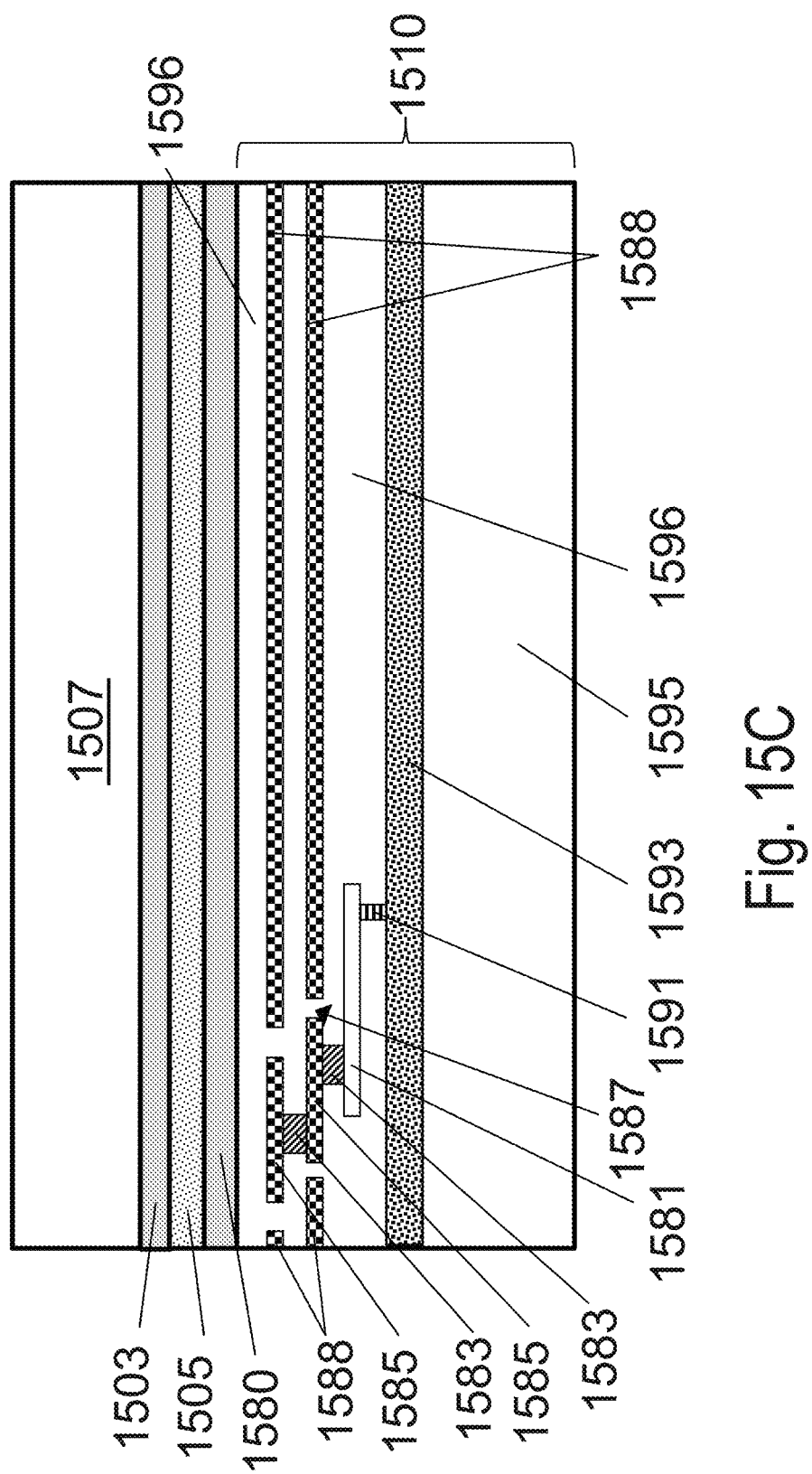

As illustrated in FIG. 15C, oxide layer 1571, etchstop layer 1505, buried oxide layer 1503 and remaining resonator layer 1507 may be layer transferred to acceptor wafer 1510. Oxide layer 1571 and any bonding oxides on acceptor wafer 1510 are now illustrated as bottom oxide layer 1580. The top surface of remaining resonator layer 1507 may be chemically or mechanically polished, and/or may be thinned by low temperature oxidation and strip processes, such as the TEL SPA tool radical oxidation and $HF:H_2O$ solutions as described in referenced patents and patent applications. Thru the processing, the wafer sized layer remaining resonator layer 1507 could be thinned from its original total thickness, and its final total thickness could be in the range of about 15 nm to about 10 um. Acceptor wafer 1510 may include one or more (two are shown in this example) shield/heat sink layers 1588, which may include materials such as, for example, Aluminum, Tungsten (a refractory metal), copper, silicon or cobalt based silicides, or forms of carbon such as carbon nanotubes, and may be layered itself, for example, as described herein FIG. 3. Each shield/heat sink layer 1588 may have a thickness range of about 150 nm to about 1 mm, for example, about 150 nm, about 100 nm, about 200 nm, about 300 nm, about 1500 nm, about 0.1 um, about 1 um, about 2 um, and about 10 um. Shield/heat sink layer 1588 may include isolation openings 1587, and alignment mark openings (not shown), which may be utilized for short wavelength alignment of top layer (donor) processing to the acceptor wafer alignment marks (not shown). Shield/heat sink layer 1588 may include one or more shield path connects 1585 and shield path vias 1583. Shield path via 1583 may thermally and/or electrically couple and connect shield path connect 1585 to acceptor wafer 1510 interconnect metallization layers such as, for example, exemplary acceptor metal interconnect 1581 (shown). Shield path connect 1585 may also thermally and/or electrically couple and connect each shield/heat sink layer 1588 to the other and to acceptor wafer 1510 interconnect metallization layers such as, for example, acceptor metal interconnect 1581, thereby creating a heat conduction path from the shield/heat sink layer 1588 to the acceptor substrate 1595, and a heat sink (not shown). Isolation openings 1587 may include dielectric materials, similar to those of BEOL isolation 1596. Acceptor wafer 1510 may include first (acceptor) layer metal interconnect 1591, acceptor wafer transistors and devices 1593, and acceptor substrate 1595. Various topside defect anneals may be utilized at this step or later in the process flow, for example, during the resonator body evacuation and seal step. For example, an optical beam such as the laser annealing previously described may be utilized, as described elsewhere herein and in incorporated references. Heat generated by the optical anneal may be absorbed by shield/heat sink layer 1588 regions and dissipated internally and/or laterally and may keep the temperature of underlying metal layers, such as metal interconnect 1581, and other metal layers and BEOL dielectrics below it, cooler and prevent damage. Shield/heat sink layer 1588 and associated dielectrics may laterally spread and conduct the heat generated by the topside defect anneal, and in conjunction with the dielectric materials (low heat conductivity) above and below shield/heat sink layer 1588, keep the interconnect metals and low-k dielectrics of the acceptor wafer interconnect layers cooler than a damage temperature, such as, for example, about 400° C. A second layer of shield/heat sink layer 1588 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 1588 may act as a heat spreader. Electrically conductive materials may be used for the two layers of shield/heat sink layer 1588 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 1593), may include, for example, trench capacitors such as described by Pei, C., et al., "A novel, low-cost deep trench decoupling capacitor for high-performance, low-power bulk CMOS applications," ICSICT ($9^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 1588 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 15000 W/m-K). Shield/heat sink layer 1588 may be sandwiched and/or substantially enclosed by materials with a low thermal conductivity (less than about 10 W/m-K), for example, silicon dioxide (about 1.4 W/m-K). The sandwiching of high and low thermal conductivity materials in layers, such as shield/heat sink layer 1588 and under & overlying dielectric layers, may spread and/or absorb the localized heat/light energy of the topside anneal laterally and protects the underlying layers of interconnect metallization & dielectrics, such as in the acceptor wafer 1510, from harmful temperatures or damage. When there may be more than one shield/heat sink layer 1588 in the device, the heat conducting layer closest to the second crystalline layer or bottom oxide layer 1580 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 1510 sensitive layers, such as interconnect and device layers) processing, and may be aligned, for example to a less than about 40 nm alignment tolerance, to the acceptor wafer alignment marks (not shown) as described in the incorporated references. This may include further optical defect annealing or dopant activation steps. The remaining donor wafer substrate 1501 may now be processed, such as smoothing and annealing, and reused for additional layer transfers.

Alternatively, etchstop layer 1505 may be deposited directly onto acceptor wafer 1510 (bottom oxide layer 1580 may or may not be necessary), and then remaining resonator layer 1507 may be transferred to acceptor wafer 1510 with etchstop layer 1505 (and any bonding oxide if wafer bonding is utilized) thus forming the structure in FIG. 15C.

Figure 15D:
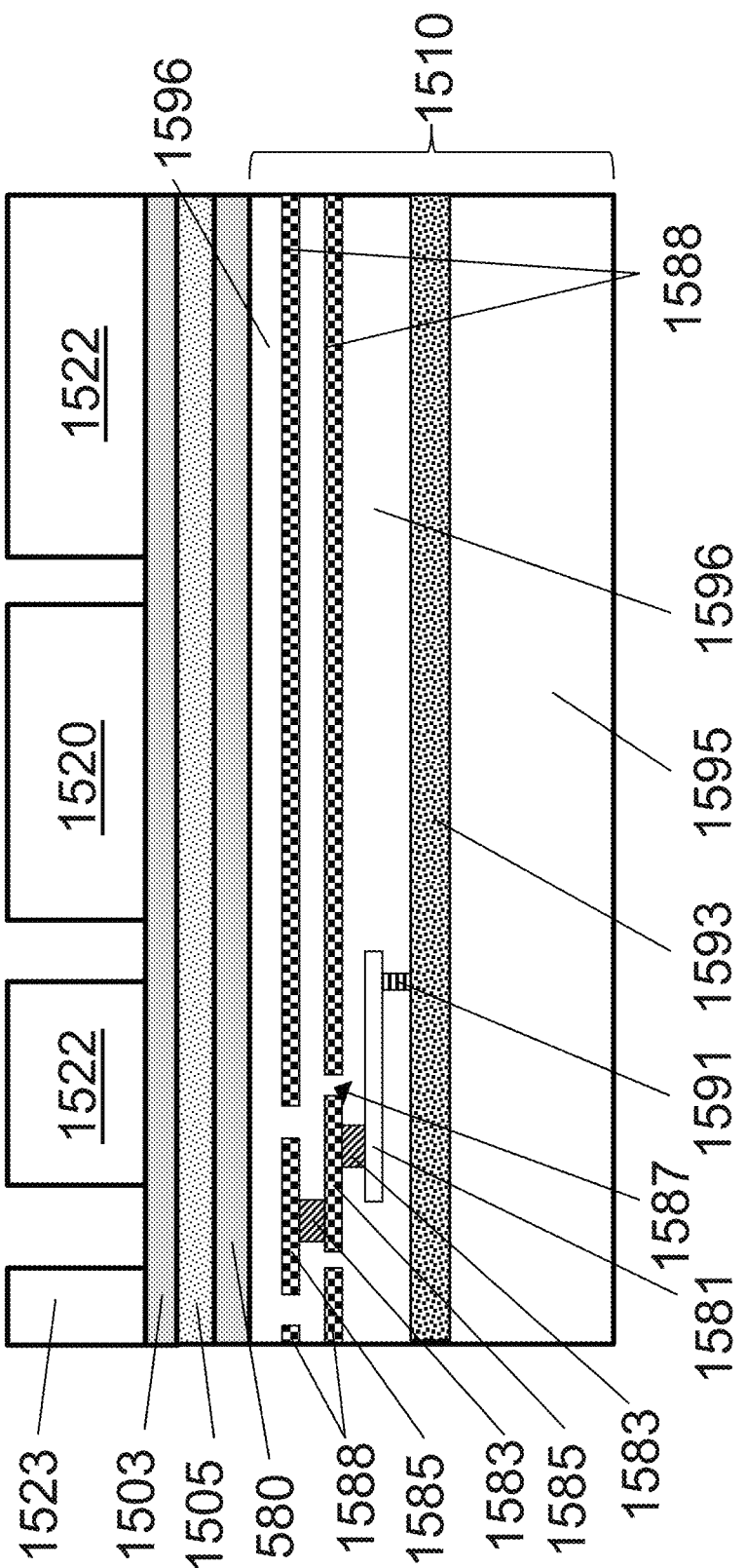

As illustrated in FIG. 15D, portions of remaining resonator layer 1507 may be removed from various regions utilizing photolithography and etch techniques, which may include a hard mask, thus forming resonator body 1520, resonator drive/sense electrodes 1522 and dummy regions 1523. The etching of remaining resonator layer 1507 may include overetching into a portion of buried oxide layer 1503, to ensure a full release of resonator body 1520 at a later step. Optionally, a deeper etch in only the regions where a stratum to stratum connection is to eventually be made, for example, between dummy region 1523 and resonator body 1520 in the illustration, may be performed, wherein the etch may extend substantially thru the etchstop layer 1505. This optional mask and etch may be done before or after the mask and etch of the resonator body 1520, and may lower the TLV to TLV leakage depending on the conductivity of the material used for etchstop layer 1505 and may provide preparation for a liner-less vertical conductive connection.

Figure 15E:
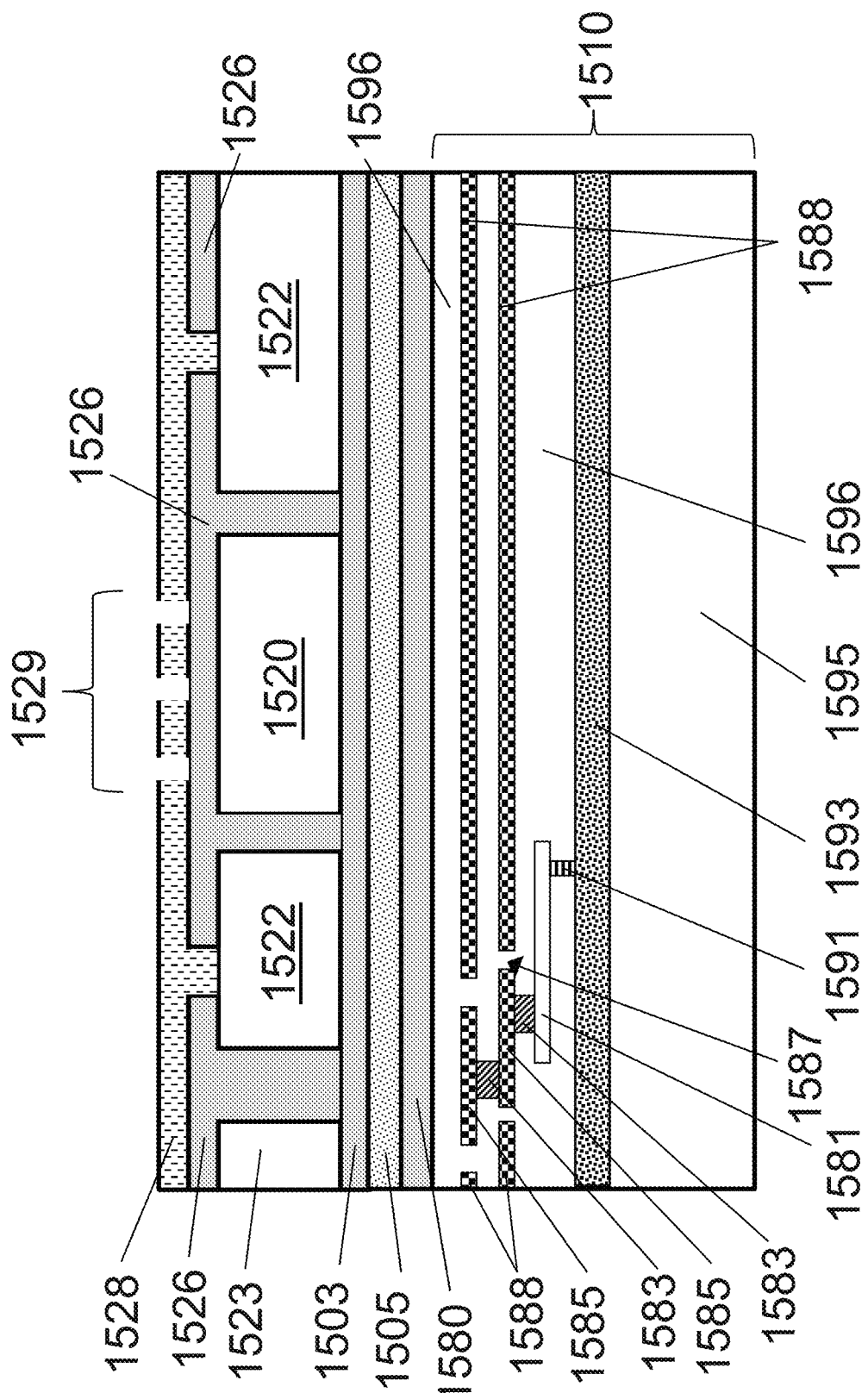

As illustrated in FIG. 15E, an oxide may be deposited and patterned to cover selected parts of the resonator while providing openings for electrical contact to the drive/sense electrodes 1522. Thus, resonator oxide regions 1526 may be formed. Resonator etchcap 1528 may be deposited, which may be preceded by a surface clean to provide good connection to the open topside contact regions of the drive/sense electrodes 1522. Resonator etchcap 1528 may include a material that is substantially impervious to the eventual oxide etch resonator release chemistry, for example, amorphous silicon or poly silicon layer may be deposited, and may provide electrical contact/connection to the drive/sense electrodes 1522. Vent openings 1529 may then be formed to access the resonator oxide regions 1526, and may include a mask and etch of regions of resonator etchcap 1528.

Resonator body 1520 may include complex shapes, for example, combs, beam webs, discs, and may be surrounded by driving and sensing electrodes, such as drive/sense electrodes 1522, with transducer gaps. Generally the bulk of the resonator body motion may be induced by electrostatic dynamics. A hybrid resonator body may include a piezoelectric material deposited onto the silicon resonator body, for example, AlN or ZnO, and the hybrid resonator body motion may be induced by piezoelectric excitation.

Figure 15F:
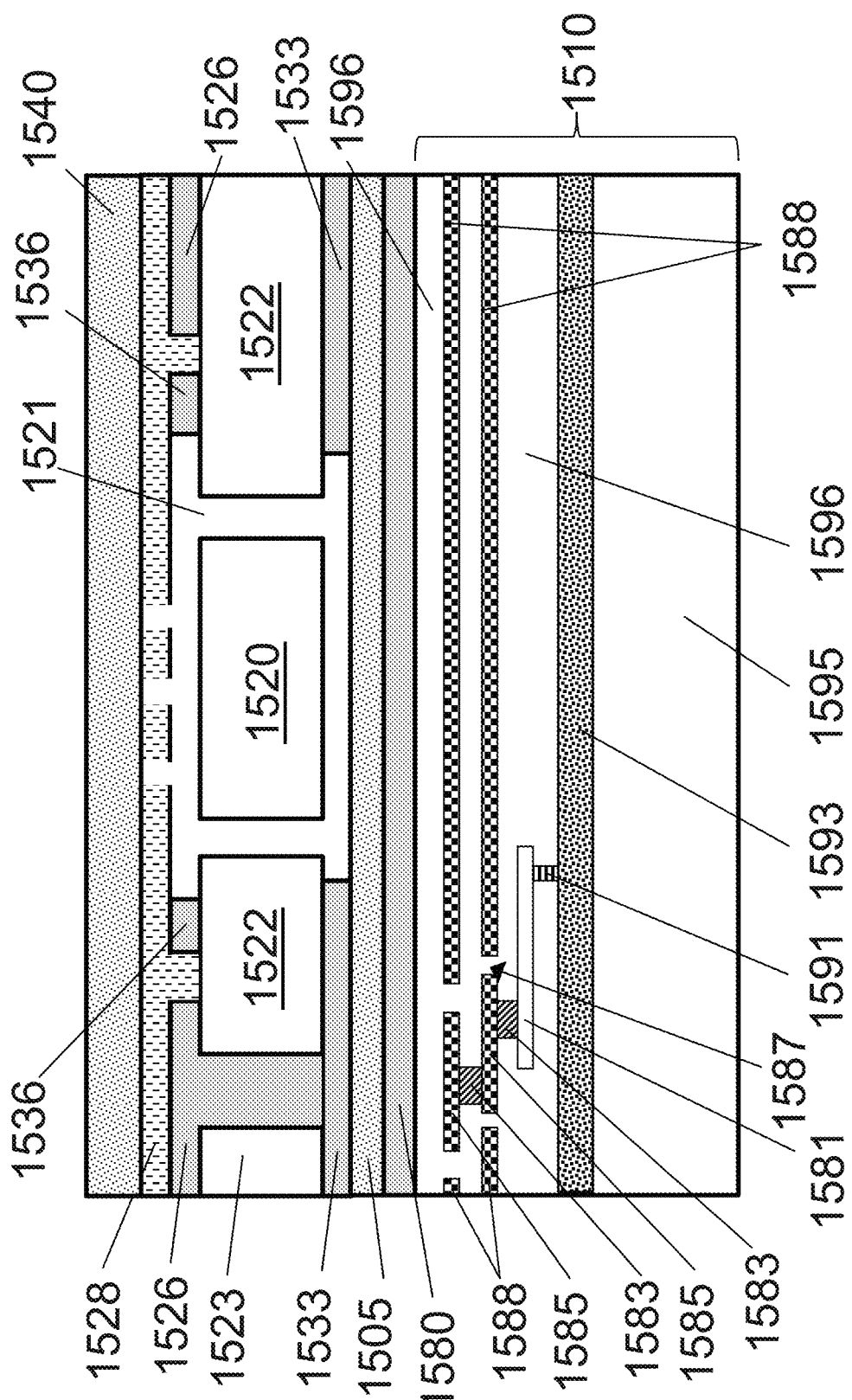

As illustrated in FIG. 15F, portions of resonator oxide regions 1526 and oxide layer 1503 may be removed to release resonator body 1520. The removal may utilize a vapor phase etchant, for example, vapor hydrofluoric acid (HF), to remove substantially all the oxide surrounding resonator body 1520, thus forming resonator chamber 1521. A plasma based etch process may be utilized, especially as the gaps and dimensions become very small and surface effects dominate. Thus, upper oxide regions 1526, upper interior oxide regions 1536, and lower oxide regions 1533 may be formed and remain, providing strength and electrical isolation to various structures within the resonator layer. The resonator body 1520 may now be cleaned and then contemporaneously sealed in a vacuum to minimize water and other contaminates on or close to resonator body 1520 which may cause frequency drift due to mass loading of resonator body 1520. Depending on the thermal isolation strategy utilized in forming the 3DIC system stack, various methods of cleaning may be utilized. As illustrated herein FIG. 15 with a shield, an optical heating of the resonator layer silicon in the presence of gases such as HCl or $H_2+Cl_2$, and/or $O_2$, may clean up residues on resonator body 1520 and in resonator chamber 1521. The spaces may be evacuated to about 10 mT and the vent openings 1529 may be sealed whilst under vacuum with seal layer 1540. Seal layer 1540 may include, for example, polycrystalline silicon, amorphous silicon.

Figure 15G:
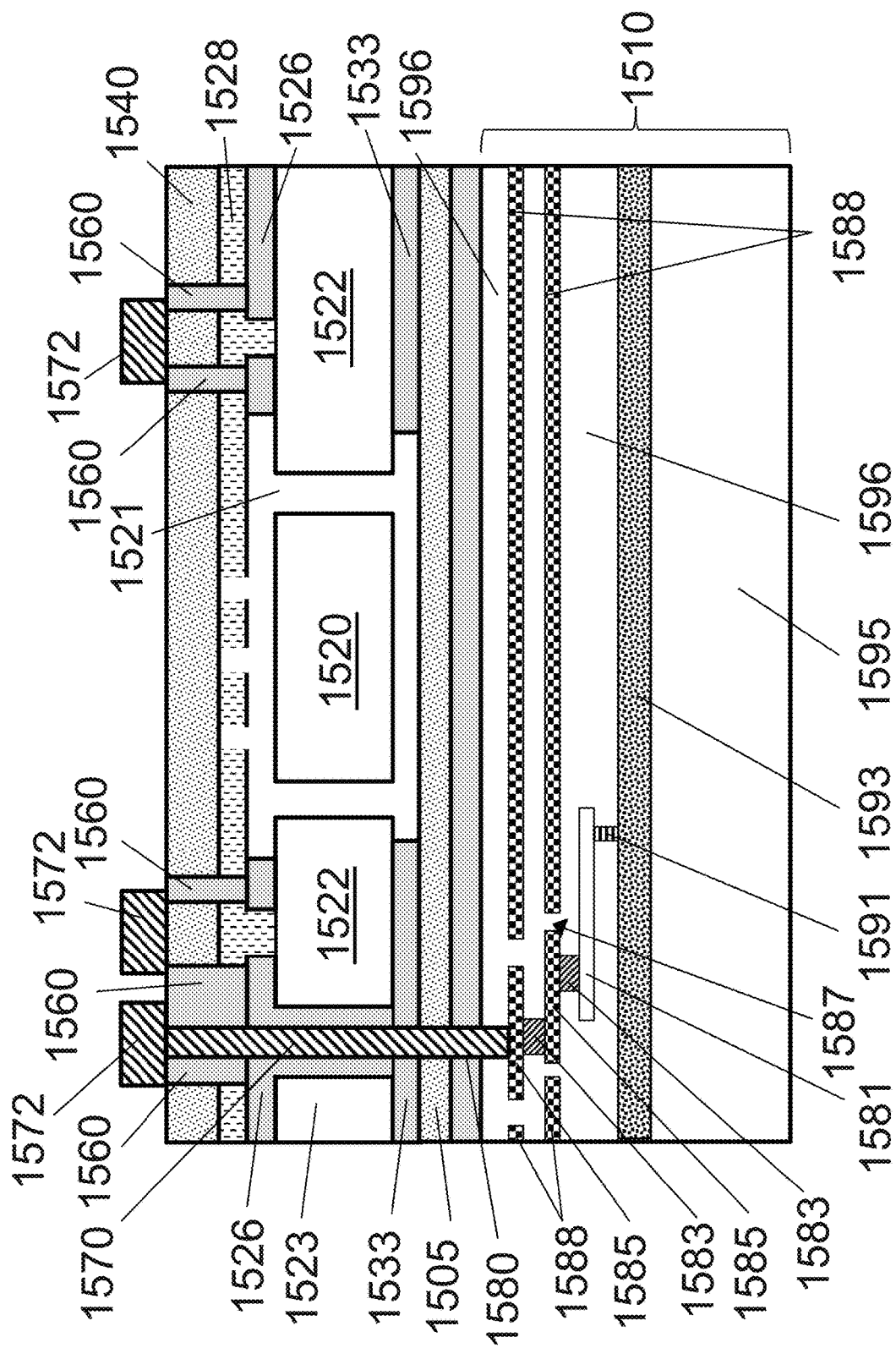

As illustrated in FIG. 15G, seal layer 1540 may be CMP'd flat and trench isolation regions 1560 may be formed by conventional 3DIC stack (effective low temperature exposure of underlying BEOL materials) etch and fill techniques. TLVs 1570 and resonator layer interconnect metallization 1572 may be formed to electrically and/or thermally connect the resonator layer/stratum with the underlying (or overlying if required) acceptor substrate 1510 interconnect, transistors and circuits, as well as providing heat conduction paths to heat sinks as described herein and incorporated references.

Alternatively or in addition, one or more MEMS oscillators may be formed on the substrate, such as acceptor wafer 1510, and then CMOS transistors and circuits may be formed on top utilizing many of the stacking and 3DIC device formation techniques herein and incorporated references.

Temperature limitations may be imposed on processing steps above acceptor wafer 1510 depending on the mitigation techniques utilized, such as TIL, TES, etc. Even shield/heat sink layers 1588 may not be necessary depending on the topside optical heat treatment chosen as part of the detailed process flow design choices.

The MEMS oscillator taught in at least FIG. 15 herein may be combined with an RF coil having an air- or vacuum-isolated character, which is afforded by the same processing which leads to the MEMS oscillator.

References related to MEMS devices, particularly encapsulated oscillators (for use in clocks), accelerometers, and pressure sensors may include Partridge, Aaron, Markus Lutz, Bongsang Kim, Matthew Hopcroft, Rob N. Candler, Thomas W. Kenny, Kurt Petersen, and Masayoshi Esashi. "MEMS resonators: getting the packaging right." Semicon Japan (2005); Candler, Rob N., Matthew A. Hopcroft, Bongsang Kim, Woo-Tae Park, Renata Melamud, Manu Agarwal, Gary Yama, Aaron Partridge, Markus Lutz, and Thomas W. Kenny. "Long-term and accelerated life testing of a novel single-wafer vacuum encapsulation for MEMS resonators." Microelectromechanical Systems, Journal of 15, no. 6 (2006): 1446-1456; and Flannery, Anthony Francis, and Steven S. Nasiri. "Vertically integrated MEMS structure with electronics in a hermetically sealed cavity." U.S. Pat. No. 7,104,129, issued Sep. 12, 2006; the contents of the foregoing incorporated by reference.

Persons of ordinary skill in the art will appreciate that the illustrations in FIGS. 15A through 15G are exemplary only and are not drawn to scale. Such skilled persons will further appreciate that many variations are possible such as, for example, barrier metals may be chosen to facilitate good electrical contact between resonator layer interconnect metallization 1572 and drive/sense electrodes 1522. Moreover, trench isolation regions 1560 formation may include the areas for resonator drive/sense electrode connections, etching out seal layer 1540 and may etch out resonator etchcap 1528, to provide an improved connection to drive/sense electrodes 1522. Furthermore, additional layer or layers of transistors and other devices may be formed on top of the resonator layer as part of the 3DIC system stack. Moreover, etchstop layer 1505 may be formed thicker than about 35 nm and may affect the density of vertical interconnects and TLV to TLV leakage. Many other modifications within the scope of the invention will suggest themselves to such skilled persons after reading this specification. Thus the invention is to be limited only by the appended claims.

FIGS. 16A to 16K describe an exemplary process flow utilizing a carrier wafer or a holder wafer or substrate wherein CMOS transistors may be processed on two sides of a donor wafer. PMOS and NMOS transistors may be formed on each of the two sides or NMOS on one side and PMOS on the other, and then the two sided structure (NMOS on top of PMOS or CMOS on top of CMOS, or a combination thereof) donor wafer may be transferred to an target or acceptor substrate with pre-processed circuitry. State of the art CMOS transistors and compact 3D library cells may be constructed with methods that may be suitable for 3D IC manufacturing. The exemplary process flow of FIGS. 16A to 16J describe NMOS on one side and PMOS on the other for simplicity, however, CMOS on one side or both sides of the donor wafer may employ the techniques in referenced and incorporated documents; for example, in at least FIGS. 70-80 and associated specification of U.S. Pat. No. 8,273, 610.

As illustrated in FIG. 16A, a Silicon On Oxide (SOI) donor wafer substrate 1600 may be processed in the typical state of the art HKMG gate-last manner up to the step prior to where CMP exposure of the poly-crystalline silicon dummy gates takes place, but forming only NMOS transistors (in this exemplary case). SOI donor wafer substrate 1600, the buried oxide (i.e., BOX) 1601, the thin silicon layer 1602 of the SOI wafer, the shallow trench isolation (STI) 1603 among NMOS transistors, the 'dummy' poly-crystalline silicon 1604 and gate dielectric 1605 of the NMOS dummy gates, NMOS source and drains 1606, NMOS transistor channel 1607, and NMOS interlayer dielectric (ILD) 1608 are shown in the cross-section illustration. These structures of FIG. 16A illustrate the substantial completion of the first phase of NMOS transistor formation. The thermal cycles of the NMOS HKMG process up to this point in the flow may be adjusted to compensate for later thermal processing.

As illustrated in FIG. 16B, a layer transfer demarcation plane (shown as dashed line) 1699 may be formed in SOI donor wafer substrate 1600 by hydrogen implantation 1610 or other methods as previously described in at least the incorporated documents.

Figure 16C:
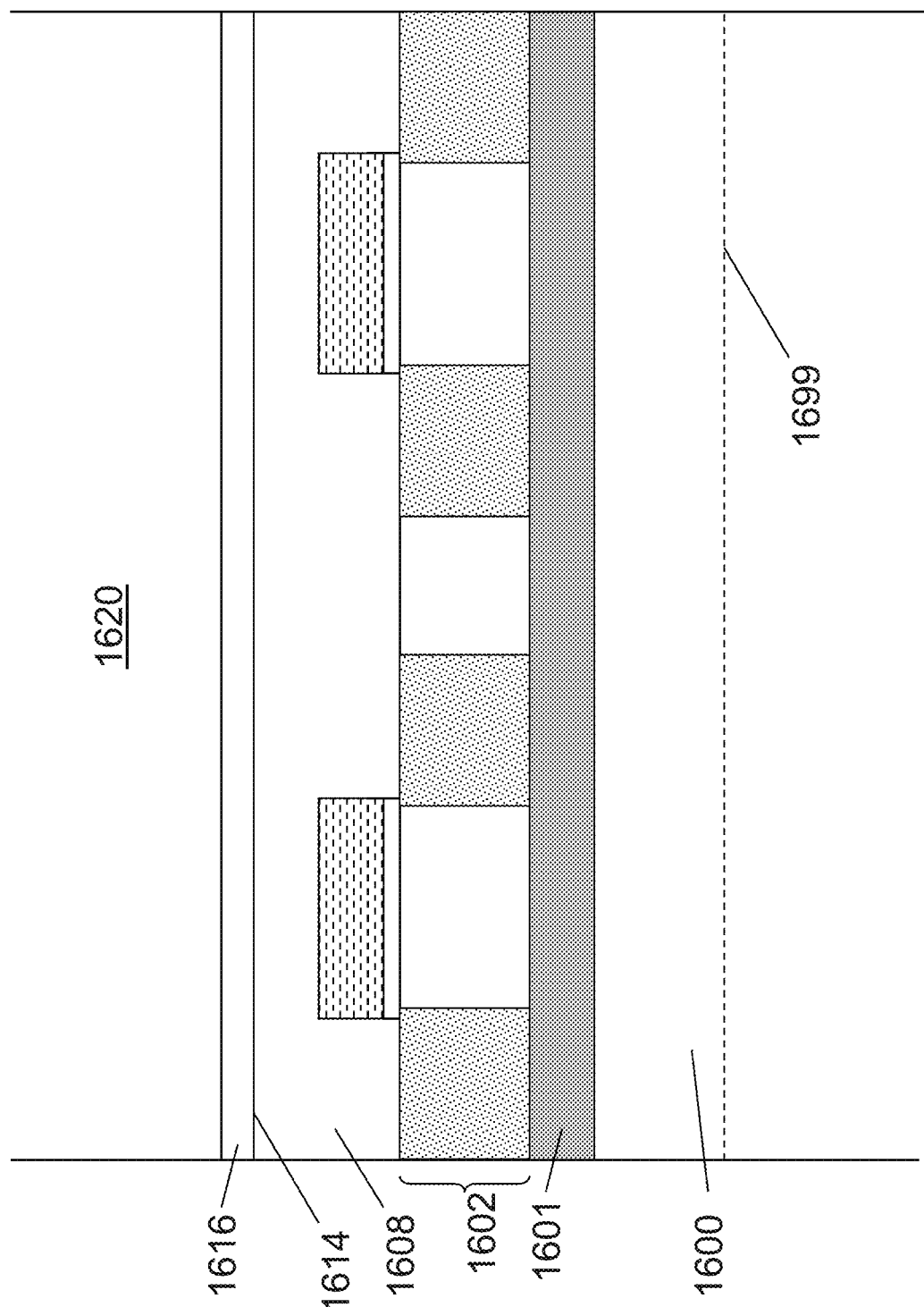

As illustrated in FIG. 16C, oxide 1616 may be deposited onto carrier or holder wafer 1620 and then both the SOI donor wafer substrate 1600 and carrier or holder wafer 1620 may be prepared for wafer bonding as previously described, and then may be oxide to oxide bonded together at interface 1614. Carrier or holder wafer 1620 may also be called a carrier or holder substrate, and may be composed of mono-crystalline silicon, or other materials.

As illustrated in FIG. 16D, the portion of the SOI donor wafer substrate 1600 that may be below the layer transfer demarcation plane 1699 may be removed by cleaving or other processes as previously described in at least the incorporated documents, such as, for example, ion-cut or other methods. The remaining donor wafer layer 1600' may be thinned by chemical mechanical polishing (CMP) and surface 1622 may be prepared for transistor formation. Damages from the ion-cut processing may be repaired by at least methods disclosed herein and in the incorporated documents; for example, short wavelength laser annealing.

Figure 16E:
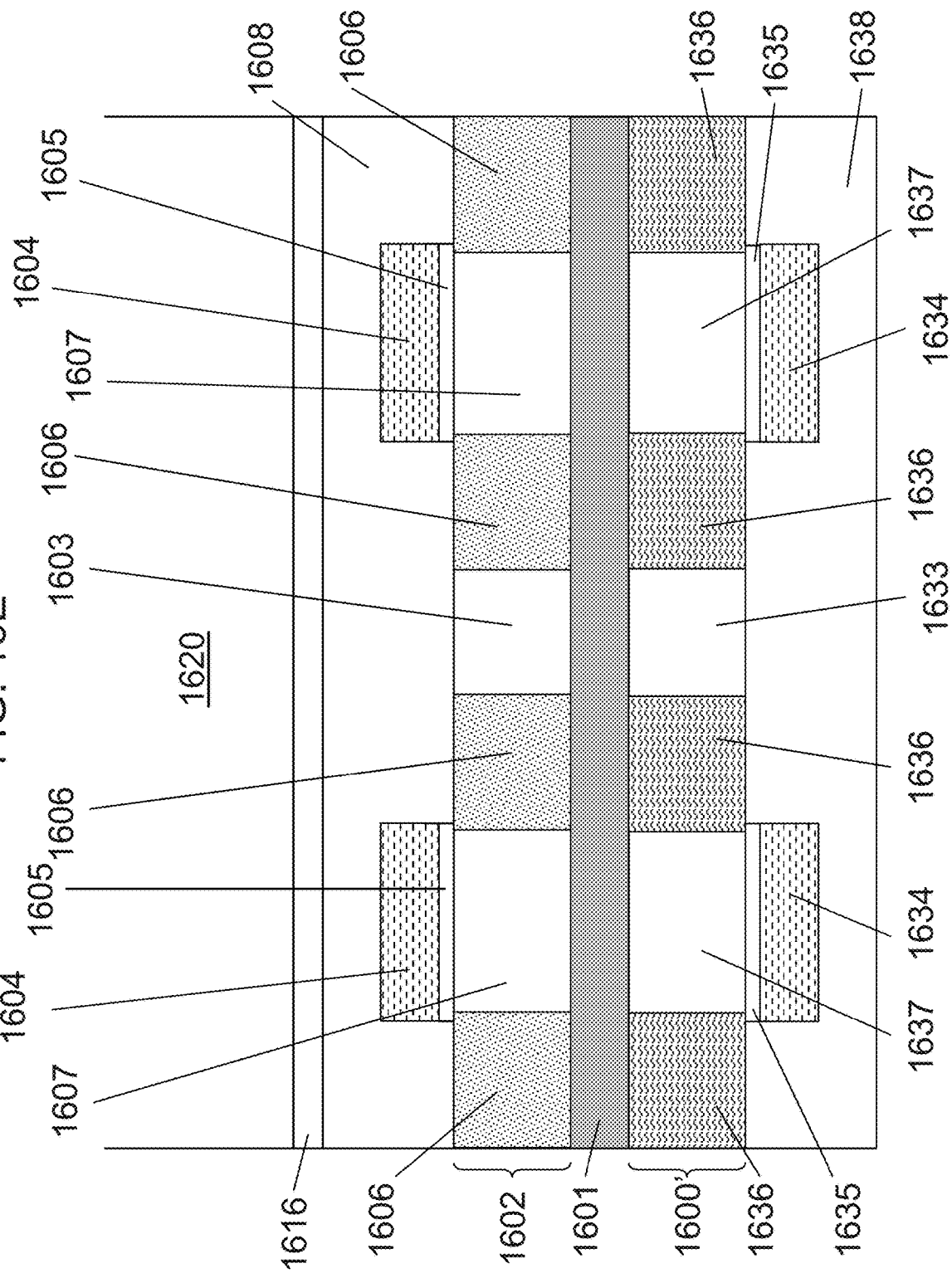

As illustrated in FIG. 16E, donor wafer layer 1600' at surface 1622 may be processed in the typical state of the art HKMG gate last processing manner up to the step prior to where CMP exposure of the poly-crystalline silicon dummy gates takes place to form the PMOS transistors with dummy gates. The PMOS transistors may be precisely aligned at state of the art tolerances to the NMOS transistors as a result of the shared substrate possessing the same alignment marks. Carrier or holder wafer 1620, oxide 1616, BOX 1601, the thin silicon layer 1602 of the SOI wafer, the shallow trench isolation (STI) 1603 among NMOS transistors, the poly-crystalline silicon 1604 and gate dielectric 1605 of the NMOS dummy gates, NMOS source and drains 1606, the NMOS transistor channels 1607, and the NMOS interlayer dielectric (ILD) 1608, donor wafer layer 1600', the shallow trench isolation (STI) 1633 among PMOS transistors, the poly-crystalline silicon 1634 and gate dielectric 1635 of the PMOS dummy gates, PMOS source and drains 1636, the PMOS transistor channels 1637, and the PMOS interlayer dielectric (ILD) 1638 are shown in the cross section illustration. A high temperature anneal may be performed to activate both the NMOS and the PMOS transistor dopants. These structures of FIG. 16E illustrate substantial completion of the first phase of PMOS transistor formation. The PMOS transistors may now be ready for typical state of the art gate-last transistor formation completion.

Figure 16F:
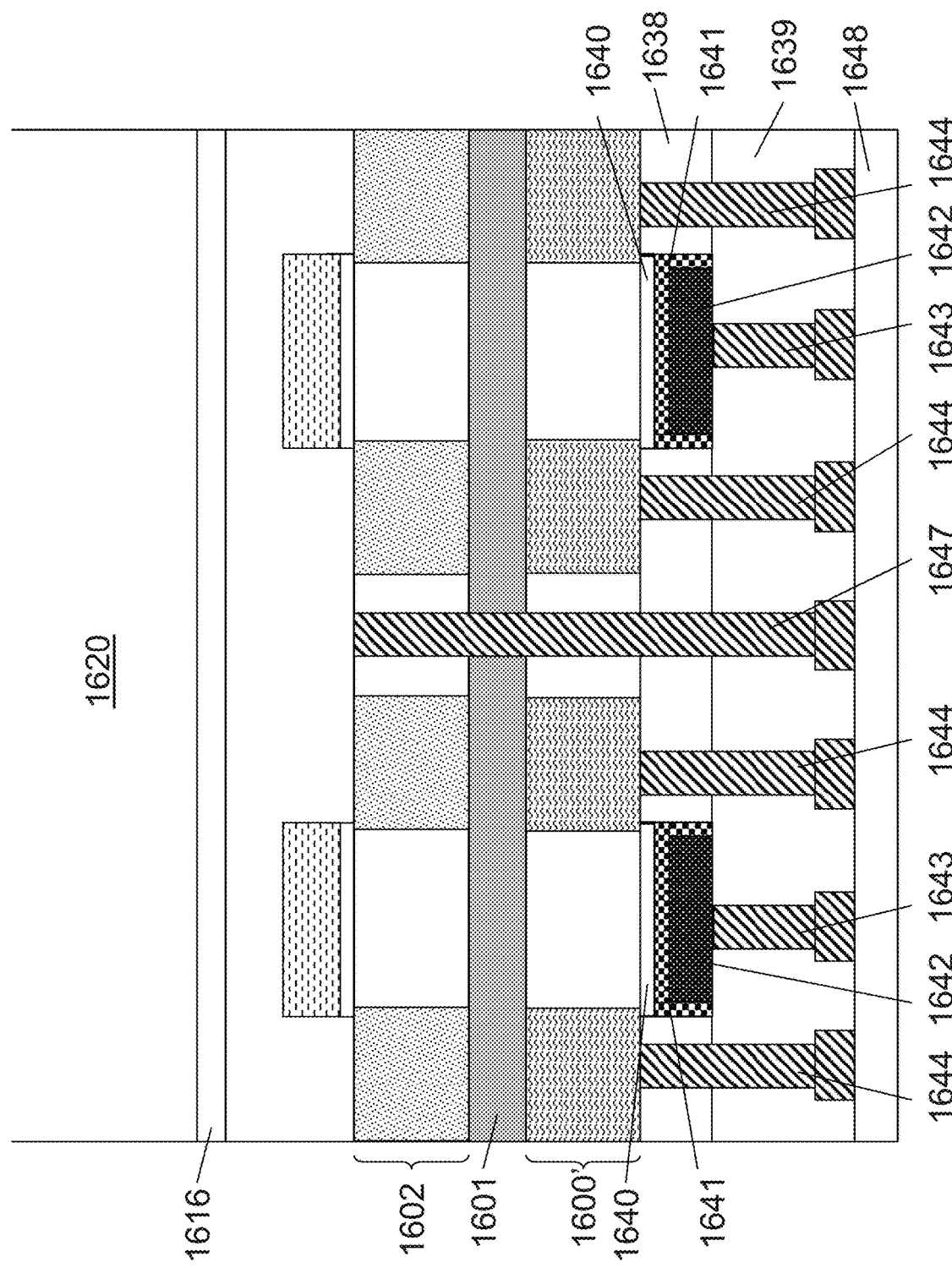

As illustrated in FIG. 16F, the PMOS ILD 1638 may be chemical mechanically polished to expose the top of the PMOS poly-crystalline silicon dummy gates, composed of poly-crystalline silicon 1634 and gate dielectric 1635, and the dummy gates may then be removed by etching. A hi-k gate dielectric 1640 and the PMOS specific work function metal gate 1641 may be deposited. An aluminum fill 1642 may be performed and the metal chemical mechanically polished. A low temperature dielectric layer 1639 may be deposited and the typical gate 1643 and source/drain 1644 contact formation and metallization may now be performed to connect to and among the PMOS transistors. Partially formed PMOS inter layer via (ILV) 1647 may be lithographically defined, plasma/RIE etched, and metallization formed. Oxide layer 1648 may be deposited to prepare for bonding. Furthermore, the gate dielectric on transistors may have different dielectric permittivities than silicon dioxide. The gate dielectric permittivity of the second layer transistors may be different than the gate dielectric permittivity of the first layer transistors.

Figure 16G:
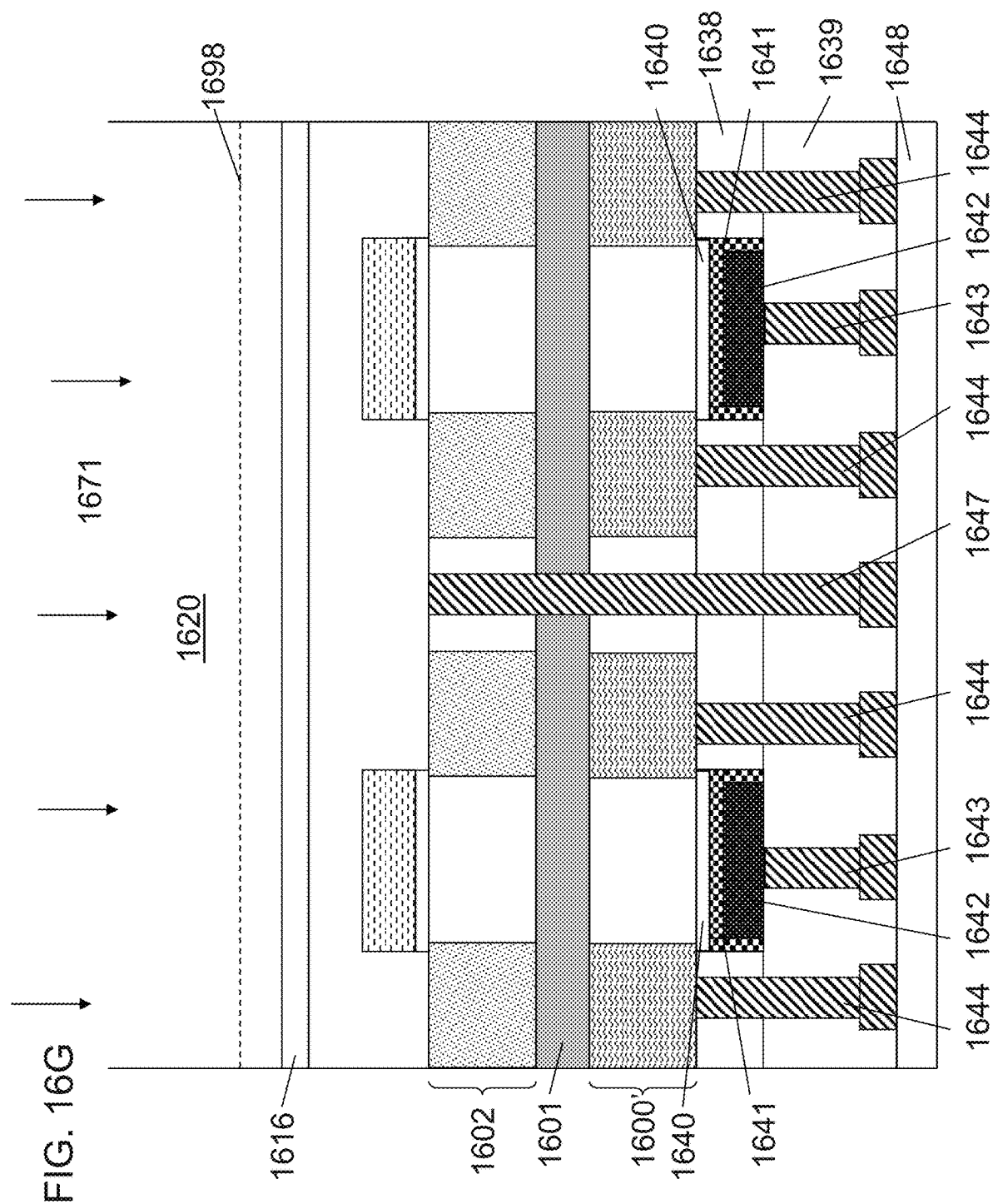

As illustrated in FIG. 16G, a damage plane or layer (shown as dashed line) 1698 may be formed in carrier or holder wafer 1620 by optical means 1671, for example a two-phonon exposure with lasers, wherein the depth of the two-phonon interaction may be controlled with optics. Silicon to silicon bonds may be broken in a 2-phonon interaction, forming a layer or plane of silicon vacancies and silicon interstitial atoms (sometimes called interstitial vacancy pairs). Optical means 1671 may be employed thru carrier or holder wafer 1620 to minimize 1-phonon interactions with doped regions and metal layers, or may be employed thru the processed layers (from 'below in the FIG. 16G context, not shown), or a combination of both.

As illustrated in FIG. 16H, the donor wafer surface at oxide layer 1648 and top oxide surface of acceptor or target substrate 1688 with acceptor wafer metal connect strip 1650 may be prepared for wafer bonding as previously described and then low temperature (less than approximately 300° C.) aligned and oxide to oxide bonded at interface 1651. The process temperature is preferred as low as possible to mitigate reconstitution of the interstitial vacancy pairs of damage plane or layer 1698. The acceptor metal strip and donor metal strip methodology, described in at least FIGS. 71, 72-80 and associated specification of incorporated U.S. Pat. No. 8,273,610, and may employ a machine such as the EV Group Gemini FB XT, which may provide alignment of thick substrates to within 200 nm. Small acceptor squares of maximum misalignment dimensions, may also be utilized, to connect the donor wafer metal TLV to the acceptor wafer metallization, such as described in at least FIG. 75 of the above patent.

Figure 16I:
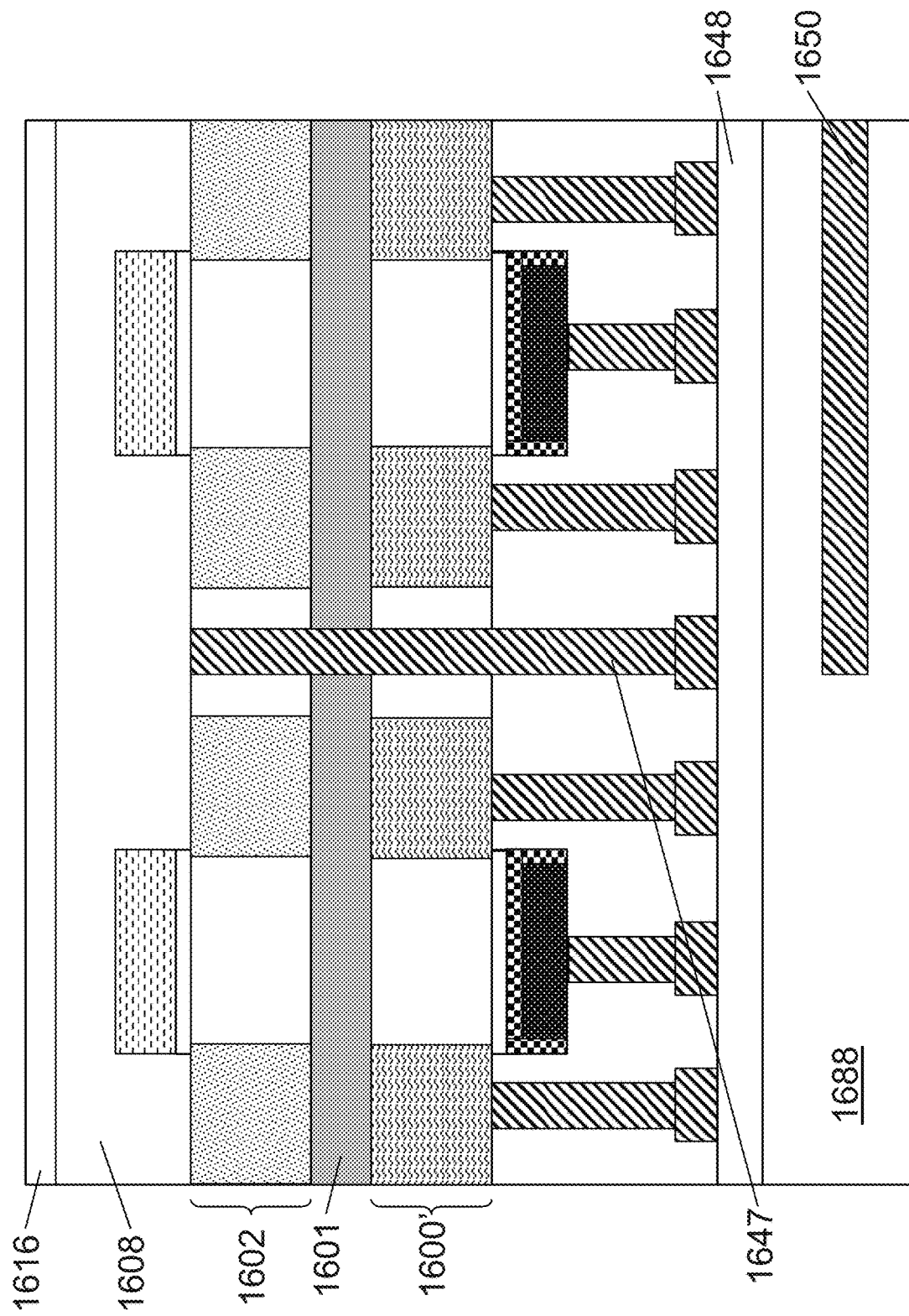

As illustrated in FIG. 16I, the portion of the carrier or holder wafer 1620 that may be above damage plane or layer 1698 may be removed by controlled stress methods. A polymer or co-polymer layer 1673 may be deposited on carrier or holder wafer 1620 (shown in FIG. 16H for clarity). Polymer or co-polymer layer 1673 may also be deposited on the backside acceptor or target substrate 1688 (not shown). The thickness(es) of polymer or co-polymer layer 1673 on either side of the entire structure may be tuned to provide the proper stress levels to cleave at damage plane or layer 1698 when exposed to a thermal stress. Polymer or co-polymer layer 1673 may incorporate a release layer to facilitate an easy release from whichever surface it was applied to. A thermal stress, for example, immersion or spray of LN2 (Liquid Nitrogen) may be used as a stress for cleaving. Details and demonstration of the polymer stress and optical vacancy creation cleaving methods for silicon wafering of an ingot may be found with Siltectra GmbH at www.siltectra.com and patent disclosures of Lukas Lichtensteiger, such as US Patent Application Publication 2011/0259936 and international publication WO2014005726. These stress techniques may be applied to other process flows within the incorporated references; for example, at least FIGS. 81 and 82 and associated specification of U.S. Pat. No. 8,273,610. The remaining layer of the carrier or holder wafer 1620 remaining on the structure attached to oxide layer 1616 may be removed by chemical mechanical polishing (CMP) to or into oxide layer 1616. With conventional sidewall and backside protection, chemical means may also be employed, for example, warm KOH, to remove remaining layer of the carrier or holder wafer 1620. The remaining bulk of carrier or holder wafer 1620 may be recycle or reclaimed for additional uses, such as reuse as a carrier wafer. The NMOS transistors may be now ready for typical state of the art gate-last transistor formation completion.

Figure 16J:
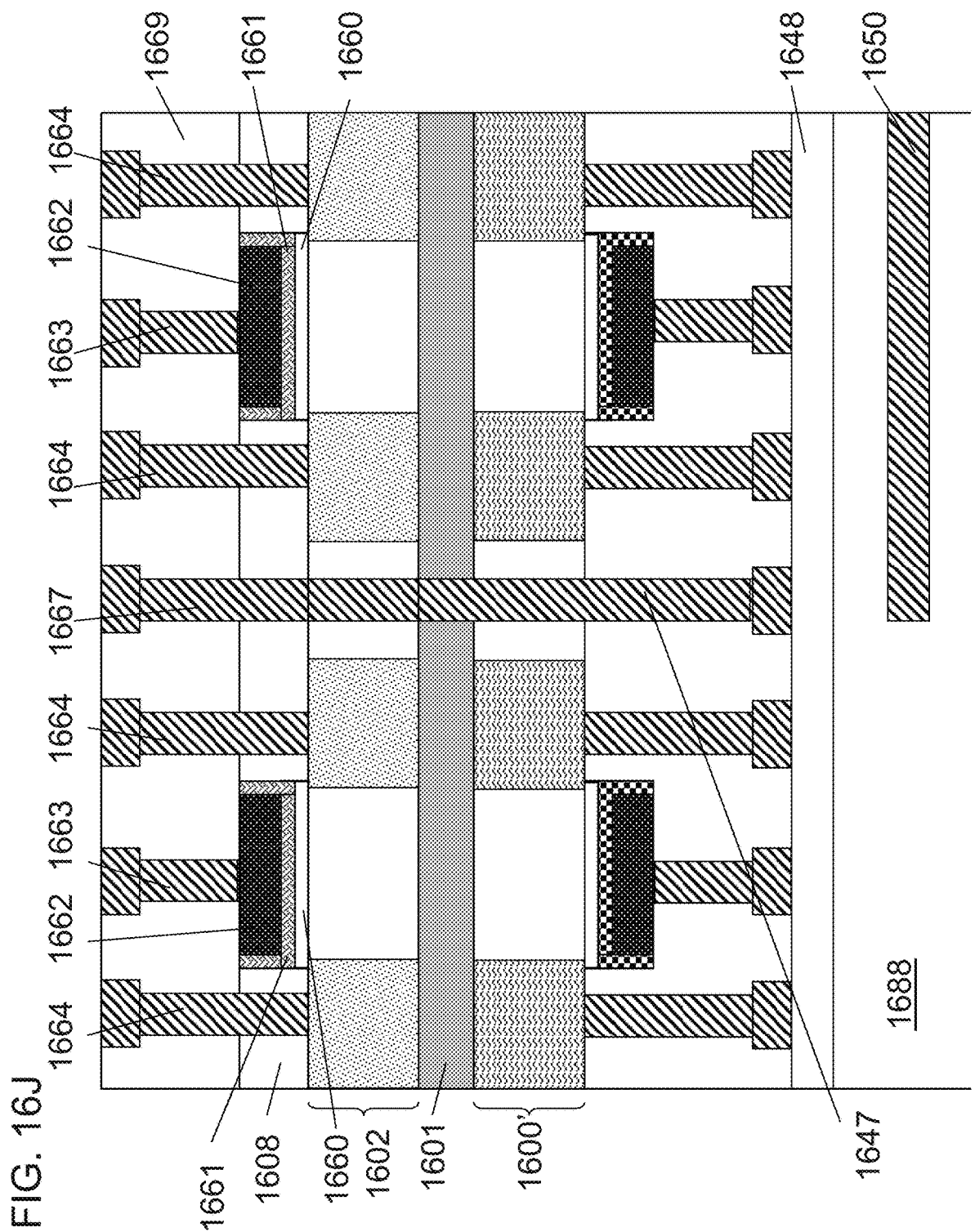

As illustrated in FIG. 16J, oxide 1616 and the NMOS ILD 1608 may be chemical mechanically polished to expose the top of the NMOS dummy gates composed of poly-crystalline silicon 1604 and gate dielectric 1605, and the dummy gates may then be removed by etching. A hi-k gate dielectric 1660 and an NMOS specific work function metal gate 1661 may be deposited. An aluminum fill 1662 may be performed and the metal chemical mechanically polished. A low temperature dielectric layer 1669 may be deposited and the typical gate 1663 and source/drain 1664 contact formation and metallization may now be performed to connect to and among the NMOS transistors. Partially formed NMOS inter layer via (ILV) 1667 may be lithographically defined, plasma/RIE etched, and metallization formed, thus electrically connecting NMOS ILV 1667 to PMOS ILV 1647.

Figure 16K:
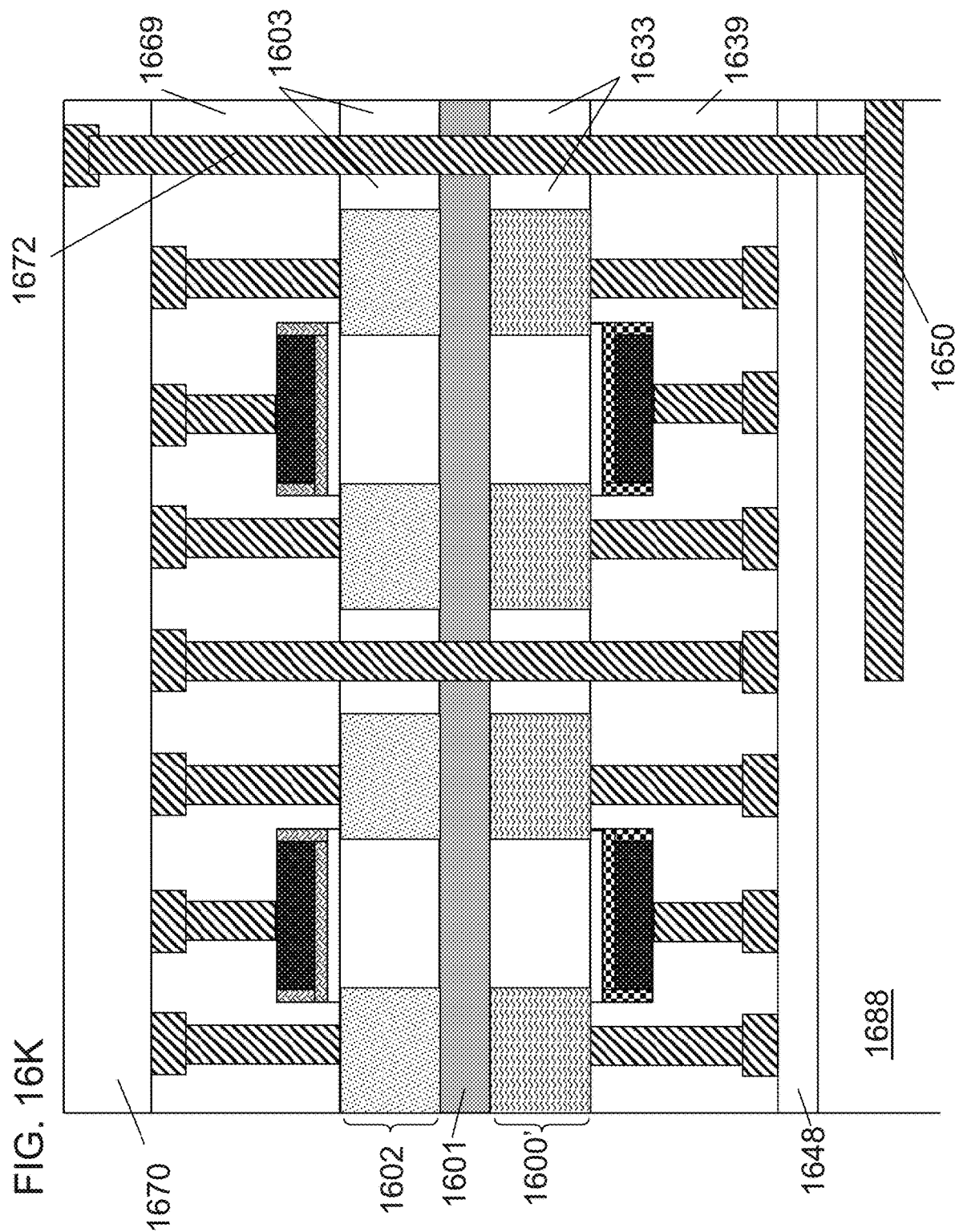

As illustrated in FIG. 16K, oxide 1670 may be deposited and planarized. Thru layer via (TLV) 1672 may be lithographically defined, plasma/RIE etched, and metallization formed. TLV 1672 electrically couples the NMOS transistor layer metallization to the acceptor or target substrate 1688 at acceptor wafer metal connect strip 1650. A topmost metal layer, at or above oxide 1670, of the layer stack illustrated may be formed to act as the acceptor wafer metal connect strips for a repeat of the above process flow to stack another preprocessed thin mono-crystalline silicon layer of NMOS on top of PMOS transistors.

Persons of ordinary skill in the art will appreciate that the illustrations in FIGS. 16A through 16K are exemplary only and are not drawn to scale. Such skilled persons will further appreciate that many variations are possible such as, for example, the transistor layers on each side of BOX 1601 may include full CMOS, or one side may be CMOS and the other n-type MOSFET transistors, or other combinations and types of semiconductor devices. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Moreover, that other transistor types may be possible, such as, for example, RCAT, FinFet, and junction-less. Further, the donor wafer layer 1600' in FIG. 16D may be formed from a bulk mono-crystalline silicon wafer with CMP to the NMOS junctions and oxide deposition in place of the SOI wafer discussed. Additionally, the SOI donor wafer substrate 1600 may start as a bulk silicon wafer and utilize an oxygen implantation and thermal anneal to form a buried oxide layer, such as, for example, the SIMOX process (i.e., separation by implantation of oxygen), or SOI donor wafer substrate 1600 may be a Germanium on Insulator (GeOI) wafer. The layer transfer of FIG. 16F-16I may be effected by forming a layer demarcation plane in carrier or holder wafer 1620 by hydrogen implantation. Stress layers, embedded & raised source/drains, and other conventional HKMG related techniques may be utilized in the exemplary process flow within the temperature constraints of each step. Many other modifications within the scope of the invention will suggest themselves to such skilled persons after reading this specification. Thus the scope of the invention is to be limited only by the appended claims.

An embodiment of the invention may include various modification of the process flows described in U.S. Pat. No. 8,273,610 in relation to at least FIGS. 70A-70F, 81A-81F, 82A-82G, 83A-83L. These flows may start with a donor wafer which may go through a normal process flow to form a circuit layer which we could call stratum-3. The described flow suggests the use of a 'gate-replacement' flow, also called 'gate-last' flow for transistor formation, although other structures/techniques may be utilized. The stratum-3 layer would be first transferred, for example, using ion-cut, to a carrier wafer/substrate and then transferred on top of a target wafer (also called base or acceptor wafer/substrate in some circumstances). Once on top of the target wafer the dummy oxide and the dummy gate could be replaced with the gate last gate stack of, for example, hafnium oxide and metal gate. This flow provides the advantage that any damage caused by the ion-cut would be removed by the replacement step. In an embodiment the replacement oxide and gate could be made with silicon oxide and poly gate which are in most cases cheaper and easier to process. So the repair of the ion-cut potential damage is not a condition of having high-K metal gate process. It should be noted that once stratum-3 is bonded on the target wafer the temperature limitation, generally restricted to less than 400° C., due to the underlying structure does exist. Therefore, a process should be used for the deposition of a high quality gate oxide at the metallization compatible temperatures. Furthermore, the dummy gate stack may be replaced after the ion-cut by other types of gate stacks; for example, such as a grown or deposited oxide/dielectric with a polysilicon/polycide electrode, or a grown or deposited oxide/dielectric with a tungsten electrode. Such processes have been presented in at least U.S. Pat. No. 8,273,610.

While ion-cut is a good option for cutting a less than a micron thick layer from the donor wafer transferring it to the carrier wafer, other layer transfer options do exist. It also should be noted that the transferred layer could had been fully processed first to include transistors and isolation, or alternatively the transferred layer might be just a monocrystal layer, giving up stratum-3 in the layer transfer.

In the following we outline few alternative process flows to ion-cut available for transferring a layer from a donor wafer to either a carrier wafer or to the final target wafer:

A. Use of donor wafer that has been pre-processed for a future cut/layer transfer such as:
1) Pre-cut by laser, as described in at least US patent application US 2014/0038392—this patent publication is hereby incorporated by reference in this application;
2) Use an SOI wafer or construct an SOI wafer;
3) Use an ELTRAN treated wafer with a porous layer before the top high quality layer, or construct an ELTRAN wafer;
4) Use a wafer with etch stop indicators pre-defined (LTDP-Layer Transfer Demarcation Plugs) as is been described in relation to FIG. 150 of incorporated U.S. Pat. No. 8,273,610.

B. Use a laser, as described in US patent application 2014/0038392, to cut the desired transfer layer off the donor wafer after high (over 400° C.) processes for stratum-3 are completed.

C. Use 'Cold Split' technology, for example, as developed and offered by commercial company called Siltectra (http://www.siltectra.com) and been described in at least US Patent Applications 2011/0259936—this patent publication is hereby incorporated by reference in this application.

Some of the above techniques are better used for a thicker layer of few microns, generally due to the variability of depth of the 'cut' of the transfer process. So after the transfer layer has been bonded to the carrier wafer or the target wafer and cut off the donor wafer, an additional process or processes could be used to thin the transferred layer further to about one of the following device thickness targets: about 20 nm, or about 50 nm, or about 100 nm, or about 200 nm or about 400 nm. Alternatives for such additional processing could include the following:

A. Etch, grind and Chemical Mechanical Polishing (CMP), which might include some sensing of depth control;
B. Etch, grind and Chemical Mechanical Polishing-CMP, which might include an stop indicator scheme, for example, such as described above with respect to LTDP;
C. Forming an etch stop or other types of a detach layer and then processing an epitaxial layer on which the donor transistors are constructed. For example, an ion implantation and anneal may be utilized to form an etch stop layer, either on the donor surface or buried, and then a device epitaxial layer may be formed on top. A diffusion process may be utilized to form a doped etch-stop layer, and then a device epitaxial layer may be formed on top. An etch-stop layer may include, for example, heavily doped p+ or doped n+ silicon, depending on the chemistries used for selectivity of the etch-stop etching. Etch stop layer may include a material such as SiGe. Furthermore, a single epitaxial process may start with a light doping, then switch to a heavy doping (or change type) and then back to a light or undoped epitaxial deposition, thus forming two or more layers of differing dopant concentration and/or type. An 'etch-stop' may mean a significant (usually greater than a 5-10× etch rate) slowing of the etch removal rate so that control of the endpoint layer and planarity with respect to the desired device surface may be achieved. Many etch stop techniques for layer transfer may be described in at least FIGS. 14, 139-140, and 230-232 of incorporated U.S. Pat. No. 8,273,610.

C. Use of a secondary ion-cut of the bonded layer to trim the transferred layer down to a precisely controlled thickness and thickness variation across the wafer/substrate. This does avoid the ion damage from the thin layer as the ion implant is done from the back of the transfer layer. Following the ion cut some etch or CMP should be used to further treat the surface.

In addition some anneal might also be used to further treat the transferred layer for future step.

It should be noted that in most of these alternatives the donor wafer could be treated after the layer transfer to repair the top layer surface and prepare the donor wafer for additional steps of layer transfer.

The secondary ion-cut could be tuned to overcome some limitation of the first cut techniques such as un-even thickness of the transferred layer. A measurement tool could be used to create a depth profile of the wafer surface. The depth profile could be then transfer to an ion implanter tool which will adjust the ion (H+) implant depth accordingly. Thus a precise and well controlled ion-cut damage layer, or layer transfer demarcation layer, may be formed in the transferred layer.

This combination of cut techniques could allow for high quality thin (20 nm-200 nm) layer transfer. This could be done to a layer that has gone through process of complete or partial front end process of stratum-3 without damaging the sensitive transistor formation of stratum-3.

To assist the layer depth measurement, the bonding layers could be specially engineered to enhance the accuracy of such depth profile measurement. An example for such could be layering silicon oxide and silicon nitride to form a reflective layer tuned to reflect a laser wavelength of the measurement tool. Or including a metal layer if the reflective layer is on the target wafer. In U.S. Pat. No. 4,827,325, incorporated here by reference, such reflective layering is presented.

The donor wafer/substrate with a detach and/or etchstop layer or structure may be processed in the manufacturing flow and facility of the device stack manufacturer, or may be constructed at a wafer supplier and bought by the wafer stack manufacturer as a 'pre-made' substrate. After use in the stack formation flow, the wafer stack manufacturer may perform reclaim or recycle processing on the used donor wafer/substrate or may deliver it back to the wafer supplier for reclaim and/or recycle—reprocessing may include a fresh detach and/or etchstop layer or structure in the donor wafer/substrate. For example, a wafer supplier, such as, for example, SunEdison, may process a prime silicon wafer with a porous detach layer covered on one side by an epitaxial layer of silicon made to order (thickness, doping, etc.) for the specific wafer stack flow and device desired by the wafer stack manufacturer. Thus forming a Si-dDS, a silicon topped detachable donor substrate. The wafer stack manufacturer, for example Intel or Samsung, utilizes the Si-dDS in a stack process flow with a detach step, and then returns the used Si-dDS to SunEdison for recycle or reclaim.

In U.S. Pat. No. 8,273,610, FIG. 81 (A to F) transferring a full process stratum-3 is described—7032, 7028, 7026, 7030, 7008, from a donor wafer 8100 to a target wafer 808.

In FIG. 82 of U.S. Pat. No. 8,273,610 transferring the stratum-3 layer—8202 off a donor wafer 8206A, first to a carrier wafer 8226 and then from the donor wafer using a second ion-cut 8218 to the target wafer 808, is described.

In U.S. Pat. No. 8,273,610, FIG. 83 (A to K) the transfer of a stratum-3 layer—8302+ from a donor wafer 8300A first to a carrier wafer 8320, then process stratum-2—8300+ on the other side of the transferred layer while it is on the carrier wafer 8320 is described.

And then from the carrier wafer the layer comprising stratum-2 and stratum-3 (as dual strata 400) is transferred on to the target wafer 808 using a second ion cut 8321.

The ion-cut may be associated with defects caused by the ion implant process. The defects may be repaired with high temperature processing, such as previously described at least herein and in incorporated references, for example, thermal treatments such as RTA, RTO, furnace annealing, laser annealing. Ion-cut damage to sensitive areas may be avoided by backside ion-cut, by screening the H+ (and any co-implant) from the sensitive device areas (gate, source rain junctions, etc.) such as described in at least FIG. 70B-1 of incorporated reference U.S. Pat. No. 8,273,610. The gate stack may be replaced after the ion-cut ion-implant, such as described herein and in incorporated references. For example, the dummy gate stack may be replaced by HKMG stack or by an oxide dielectric and poly/polycide gate electrode. The ion-cut ion implant may also be performed prior to the gate formation if the subsequent thermal cycles allow such, to avoid premature cleave/release.

Furthermore, alternative cut techniques presented before in respect for the transfer layer from the donor wafer could be used here as well.

Yet the transfer from the carrier wafer opens up more options since:

A. The carrier wafer is not the one contributing the device layer and therefore does not have to have a top layer of high quality to support transistor formation accordingly:

1) The carrier wafer may be built from low cost test wafers, which could be ground and/or etched away, or other alternatives in some flows (depending on for example thermal and/or sheer stresses of post attach processing), for example, glass substrates;

2) The carrier wafer may have a top layer which is designed for detach such as:
   a) Porous layer (variation of the ELTRAN technique), which may be buried by, for example, epitaxial silicon and oxide, thereby providing an ox-ox bond from carrier to transfer layer, and may include release ports in the transfer layer scribelanes and/or interior to each die;
   b) Other porous structures such as Aerogel materials, and may include release ports in the transfer layer scribelanes and/or interior to each die (may include aerogels and techniques described in U.S. patent application Ser. No. 14/298,917, incorporated by reference;
   c) Photo-resist;

3) The carrier wafer could be designed for layer release as described in U.S. Pat. No. 8,273,610 in relation to at least FIG. 184, and/or to FIGS. 185, 186, 187, 188, 189.

4) The carrier wafer may include a top layer which is designed for detach such as a buried layer of laser damaged silicon, for example, such as described in at least FIG. 5A of U.S. Patent Publication No. 2014/0038392 to Yonehera, et al., of Solexel Corporation.

Note: The carrier wafer could be covered with oxide to support good bonding to the transfer layer. Other bonding layers could also be used.

B. There is a natural barrier between the carrier wafer and the transferred layer carrying stratum-2 and stratum-3 (dual strata 400)—the bonding layer. The bonding layer could be an oxide and would provide an etch stop. Accordingly the whole carrier wafer could be ground or etched away to that oxide layer after the bonding to the target wafer. Alternatively if any of the other techniques is used to cut the transferred layer from the carrier wafer and if such might leave some portion still attached, then it could be easily etched away. For example, forming a thin buried etch-stop layer within the carrier wafer, either buried or at the surface (and then coat with oxide for an ox-ox bond) may be utilized. In most cases this will be cheaper than the use of a secondary ion-cut as presented before in respect to the flow with the donor wafer.

The release from the carrier wafer may depend on the choice of process and may include any of steps such as: anneal step, mechanical pulling or force application from top and/or mechanical side stress, water jet to form side stress, laser side stress, knife edge side stress, etching or cooling step (thermal shock or thermal exposure), perforated carrier and selective etchant release as described and referenced herein. The release procedure may include providing release ports in the transfer layer scribelanes and/or interior to each die. The release procedure may utilize a frontside release, may include providing frontside release ports in the transfer layer scribelanes and/or interior to each die. Release utilizing an oxide layer may include a wet HF, vapor-phase HF, a MEMS style Bosch DRIE etch (alternating $SF_6$ and $C_4F_4$ plasma etches). Silicon release etches on the porous silicon may include KOH, $XeF_2$ and/or EDP or TMAH. Substances such as supersaturated $CO_2$ may help with a stiction free release as well as precise design and spacing of the release etchant ports.

Furthermore, the carrier wafer/substrate may include etch stop indicators pre-defined (LTDP-Layer Transfer Demarcation Plugs) as is been described in relation to FIG. 150 of incorporated U.S. Pat. No. 8,273,610. This may be used in combination with other release techniques; for example, the Siltectra stress or Solexel laser damage layer. The LTDPs may assist a 'rough' cleave technique (such as the Solexel stress cleave) to have an endpoint that may form a precisely defined, flat and parallel to the device surface cleave or allow a cleanup CMP/etch after a 'rough' cleave to have the same.

The carrier wafer/substrate with a detach and/or etchstop layer or structure may be processed in the manufacturing flow and facility of the device stack manufacturer, or may be constructed at a wafer supplier and bought by the wafer stack manufacturer as a 'pre-made' substrate. After use in the stack formation flow, the wafer stack manufacturer may perform reclaim or recycle processing on the used carrier wafer/substrate or may deliver it back to the wafer supplier for reclaim and/or recycle—reprocessing may include a fresh detach and/or etchstop layer or structure in the carrier wafer/substrate. For example, a wafer supplier, such as, for example, SunEdison, may process a test or prime silicon wafer with a porous detach layer covered on one side by a thin epitaxial layer of silicon and a thick layer of oxide, ready for ox-ox bonding. Thus forming an Ox-dCS, an oxide topped detachable carrier substrate. The wafer stack manufacturer, for example Intel or Samsung, utilizes the Ox-dCS in a stack process flow with a detach step, and then may return the used Ox-dCS to SunEdison for recycle or reclaim.

The flow presented in U.S. Pat. No. 8,273,610, FIG. 83 (A to K) uses oxide as isolation between stratum-2 1710 and stratum-3 1712. For example, FIG. 17 includes isolation layer 8301 for vertical electrical isolation, as well as 1602 of FIG. 16K.

Alternative options exist for the formation of vertical isolation including the use of deep implant, and there are device options that might not require isolation at all. Next are some embodiments for these options.

An alternative embodiment is a memory structure such as disclosed in a U.S. Pat. No. 8,514,623, incorporated here by reference. In at least FIG. 1A of the patent is an exemplary illustration the basic bit-cell of the memory. The memory utilizes a back bias 12 to keep two stable memory states with one transistor bit cell. As illustrated in FIG. 18A, a back to back memory cells utilizing a unified back-bias are illustrated, this allows an efficient use of stratum-2 1710 and stratum-3 1712 when formed in dual strata 1700 configuration.

Figure 18B:
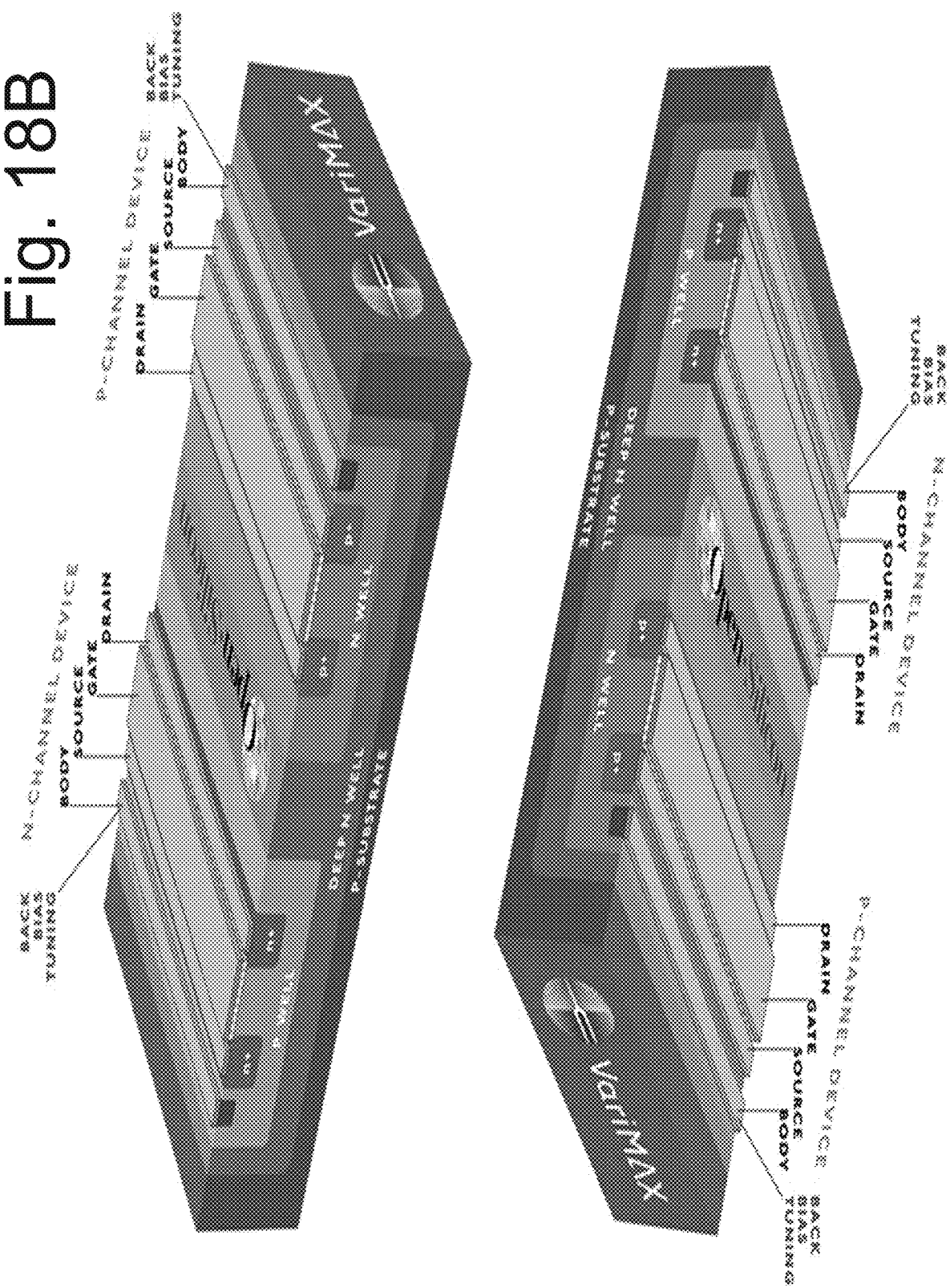
FIG. 18B is an exemplary illustration of N-channel and P-channel transistors each in a stratum-3 and a stratum-2 with its own back bias or a shared back-bias in a dual strata configuration.

Back bias is useful in many other circuits, such as, for example, Input/Output cells, linear circuits and sometimes to mitigate increasing process variability, as has been advocated by Open-Silicon with their VariMax IP. FIG. 18B provides an exemplary illustration of N-channel and P-channel transistors each with its own back bias and these could be on dual strata 1700 as each transistor is isolated with its own back bias while the deep N well and or the p-substrate could be shared.

Fin-Fet, also called Tri-Gate transistor, generally are designed to be fully depleted transistors. These transistors could be used on both stratum-2 1710 and stratum-3 1712 and may be formed as a dual strata 1700—see FIG. 18C, as their structure prevents any link to the substrate and accordingly they could share the substrate.

Figure 18D:
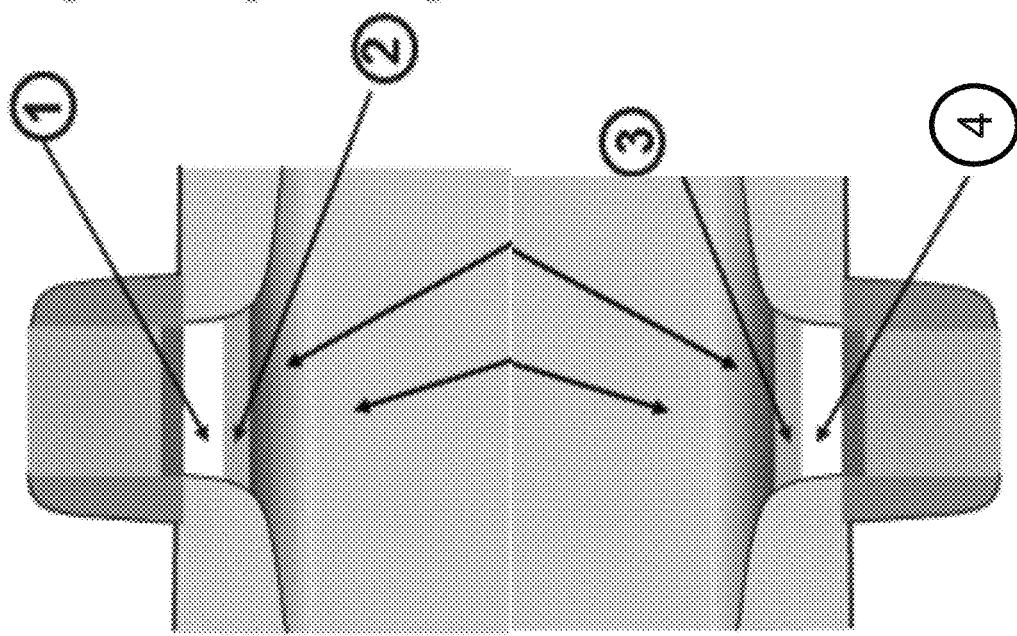
FIG. 18D is an exemplary illustration of four doping-layer transistor structures in a stratum-3 and a stratum-2 in a dual strata configuration.

SuVolta, a start-up corporation, proposes a four doping-layer transistor structure to reduce power with-out the use of Fin-Fet. By multi-layer of doping the transistor is designed to avoid leakage to the substrate. These transistors could be processed on both stratum-2 1710 and stratum-3 1712 and may be formed as a dual strata 1700—see FIG. 18D, as their structure prevents any link to the substrate and accordingly they could share the substrate.

There many design choices, including selection of process flow and circuit architectures to allow effective use of stratum-2 1710 and stratum-3 1712 and formed as a dual strata 1700, including displacement between functions that could interfere, use of back bias or other implant based active isolation schemes, and local or global isolation structures such as oxide or field shield regions or plates/layers.

Vertical isolation between Stratum-2 and Stratum-3 devices may be a matter of design, layout and process flow choices. An oxide layer and/or regions may provide some isolation between stratum-2 devices from stratum-3 devices, and may include process that may include, for example, an SOI donor wafer/substrate, the donor wafer/substrate may start as a bulk silicon wafer and utilize an oxygen implantation and thermal anneal to form a buried oxide layer, such as, for example, the SIMOX process (i.e., separation by implantation of oxygen) or an MLD-SIMOX (modified low dose SIMOX) approach such as DK Sandana, or a double layer transfer with oxide deposition in between to form dual strata layer. Furthermore, for example, a pn junction may be formed between the vertically stacked transistors and may be biased. Also, a silicon-on-replacement-insulator technique may be utilized for the first formed dummy transistors wherein a buried SiGe layer may be selectively etched out and refilled with oxide, thereby creating islands of electrically isolated silicon, similar to the 2D process known as SiON—'Silicon on Nothing'. Vertical isolation may be obtained somewhat naturally from a structure in one or more of a stratum-2 or stratum-3 device, for example, the buried back-bias layer/regions of a Zeno Semiconductor NVM cell, a deep implanted layer or region, biased or un-biased as required between stratum-2 and stratum-3. Vertical isolation may occur due to placement of stratum-2 and stratum-3 devices, for example, a layout rule could require no high speed logic over another high speed logic cell or region, but may allow a memory to be over the logic cell or region.

Additional embodiments are device structures that leverage this front and back layer processing to enable effective device structures including vertical device options. Vertical devices may include, for example, memory (V-NAND, V-RRAM, Bi-ristor) as well as devices such as Gate All Around transistors, vertical junction-less transistors, nanowire, CNT, vertical bipolar, and so on. Some vertical structures and devices may be found in at least incorporated reference U.S. Pat. No. 8,273,610.

Currently there are a few non-volatile memory architectures for 3D NAND utilizing poly silicon and floating gate or charge trap (nitride—SONOS) structure. Those could modified to be built utilizing monocrystalline channel and benefiting with process flows allowing access to both sides of the vertical structure, such as found in the use of stratum-2 1710 and stratum-3 1712 and formed as a dual strata 1700.

In some embodiments ion cut could be used for the layer transfer from the donor wafer. Accordingly there are device choices for stratum-3 1712 that would be less sensitive to the potential ion cut damage and potential exposure to Stratum-2 processing.

Such could be:
1. Circuits that use older technology node
2. Input Output circuit
3. Memory circuit such as presented in U.S. Pat. No. 8,514,623
4. Buffers, repeater and drivers
5. Resistive Random Access Memory (RRAM) select device
6. Image sensors
7. Clock and clock distribution networks, buffers
8. Non-volatile memory, for example, such as Zeno Semiconductor's non-volatile RAM cell and technology, found in at least U.S. Pat. Nos. 8,130,547 and 8,514,623.
9. Programming and/or select and/or load transistors and/or load devices for memory and/or programmable interconnect, for example, RRAM, anti-fuses, SRAM, flash.
10. Low Vt devices
11. Power devices
12. Low cost, older node devices,
13. Redundancy devices
14. Redundancy for yield improvement, which may include yield testing
15. Testing circuitry for example, scan chains and overhead such as JTAG
16. Optical drivers.

Recent release of a precision alignment Fusion Bonder machine from companies such as EV Group allows very accurate and precise aligned bonding of a transferred layer to the target wafer. In U.S. Pat. No. 8,273,610 the use of repeating structures has been suggested. These new bonders allow a better than 200 nm alignment accuracy and precision. In these cases there may be no need to use repeating structures, and stratum-2 1710 and stratum-3 1712 and/or formed as dual strata 1700 could be most any circuit design and layout choice.

Yet, connecting dual strata 1700 to the underlying circuit of the base wafer 880 could use the two connection strips (generally orthogonal) described and a via that is aligned in one direction according to the alignment mark in the underlying target wafer 880 and in the other direction according to the alignment mark of the transferred layer carrying dual strata 1700, as has been described in at least U.S. Pat. No. 8,273,610 in reference to at least FIG. 80. These alignment schemes using connection strips and an innovative via alignment scheme has been presented in U.S. Pat. No. 8,273,610 in reference to other figures such as FIG. 79, FIG. 77 and others.

This process flow for constructing dual strata 1700, and precise bonding onto a target wafer with innovative connection as been hereby described, opens up many circuit, device and business options. It opens up options to use multiple vendors, multiple manufacturing sites/locations (fabs), and multiple process nodes in constructing an end product device. It could allow mixing of custom-made strata with standard-made strata. It could also support mixing of different base materials and crystals in a monolithic end product device. All of these heterogeneous integrations may enjoy an extremely rich vertical connectivity.

This opens up opportunity to build structures, for example such as dual strata 1700, independently that per case which could be integrated with rich connectivity and low cost into a target wafer. For example, such as:

1. Debug structure. This structure would be used for development and yield ramp up of new designs. In these cases there might be a need to collect and test many device internal nodes while operating the device. These extra scan detect capture and analyze circuits need rich/dense connections to the target wafer and would only be needed at the early phase of product development and ramp up. It would be desired to have such extra circuits at this early phase but then remove it at the high volume production phase to keep the cost of the end device low. Such has been described in U.S. Pat. No. 8,273,610 in reference to at least FIG. 235 to FIG. 238.
2. Yield repair. A redundancy stratum could be built as has been described in U.S. Pat. No. 8,273,610 in reference to at least FIG. 119 to FIG. 125. These could be used, for example, for wafers that show low yield, for applications that need redundancy, or for transient random error mitigation.
3. Power reduction. There are known techniques to produce a circuit function performing the same function at lower power. A good example is replacing a processor based implementation with direct circuit implementations. Prof. Bob Brodersen of the U.C. Berkeley Wireless Research Center has published multiple papers on the subject. The target wafer in many cases would carry the processor based implantation to meet the time to market requirement. The direct implementation could be built on a stratum-2 1710 and/or a stratum-3 1712 (if both then a dual strata 1700) and bonded on the target wafer to provide device options with reduced power (due to the direct design implementation).
4. Extended memory options. In some devices there might be a value in offering options for extended memories. Those could be built on stratum-2 1710 and/or stratum-3 1712 (if both then a dual strata 1700) and connected to the base/target device to extend memory. A customizable embedded memory terrain may also be included.
5. Extended compute options. In some computer systems it might be desirable to offer alternatives with more cores or more synapses. Adding layers of stratum-2 1710 and/or stratum-3 1712 (if both then dual strata 1700) could be an effective in forming and offering scalable compute systems.
6. Add configurable logic terrain. Adding layers of stratum-2 1710 and/or stratum-3 1712 (if both then dual strata 1700) which comprise configurable logic could add flexibility to overcome some limitation of the underlying system or allow to add an enhancement including customized enhancement.
7. Add Inputs, Outputs and/or Memories to an underlying configurable device such as an FPGA or Gate Array as described in at least U.S. Pat. No. 8,273,610 in reference to at least FIG. 11 (A to F).
8. Add programmable interconnect above a target wafer that may include a continuous logic terrain to construct a 3D FPGA. Stratum-2 and stratum-3 may include programming, isolation, select switch devices and a memory storage such as RRAM, or stratum-2 and stratum-3 may include a direct switch programmable interconnect such as anti-fuses with programming and isolation transistors.
9. Add an image sensor with integrated pixel electronics, compression circuitry, fast memory, signal amplifier, and other processing/control circuits. The image sensor may include one or many wavelengths (for example, as disclosed in at least U.S. Pat. Nos. 8,283,215 and 8,163,581, incorporated herein by reference), and may be placed on stratum-3 with supporting circuitry on stratum-2 and in the target wafer.
10. Ultra-scale integration may be achieved by combining some of the above options. For example, a dual strata of redundant logic may be stacked with one or more dual strata of memory (may mix volatile dual strata with non-volatile dual strata), and may be combined with dual strata or stratum of sensors, analog, I/O (electrical and/or optical), and so forth.

This also opens up opportunity for testing and opportunities for repairing various components of the 3D stack. For example, as a matter of design and manufacturing choice, functional testing of the target wafer may be done before the target wafer is bonded to the dual strata. Furthermore, the dual strata layer may be tested (at least partially) prior to bonding to the target wafer, most easily the stratum-2 devices; however, by design and manufacturing choice, connections to stratum-3 devices (TDSC-Thru Dual Strata Connection) may be made at the time of stratum-2 interconnection, depending on the type of contact (direct to stratum-3 device junctions, type of stratum-3 device, and preexisting stratum-3 device interconnect (such as local interconnect, pre-made interconnect with hi-temp material, etc.). Thus, testing in the 3DIC stack flow may be performed at various stages within the flow, not just at the end, and may also test for different types or locations of defects at different points/steps in the overall flow. Defects may also be repaired at different points/steps in the overall flow.

After bonding of the dual strata to the target wafer, and TLVs are made connecting stratum-2 and stratum-3 devices to the interconnect of the target wafer, a connection test may be performed to find any connection faults, for example, dual-strata-to-target wafer connection faults. A special probe connection may be designed and formed, for example, on the stratum-3 interconnect or a stacked bond pad from the target wafer up thru the dual strata, or test wafer backside connections may be formed and utilized. These special connections may also provide power to one or more portions of the stack being tested. Wireless connections, such as inductive coupling or NFC, may also be employed. When connection faults are found, they can be location logged and then the stack may be returned to processing in a rework of the faulty connection(s). For example, e-Beam and/or laser etching and deposition may be employed to correct the connection faults.

There are additional options to bond and connect the transferred layer of dual strata 1700:

1. Bond oxide to oxide and etch via, which could be called through layer via (TLV) or through silicon via (TSV), through the transferred layer of stratum-2 1710 and/or stratum-3 1712 (if both then dual strata 1700) to land on a landing strip as described in at least U.S. Pat. No. 8,273,610 in reference to at least FIG. 80, then process at least one overlying interconnection layer which will include the strip to connect the via to the stratum-2 1710 and/or stratum-3 1712 (if both then dual strata 1700) circuits.

2. Bond metal to metal (or hybrid bonding) and have a connection path through the transferred layer of stratum-2 1710 and/or stratum-3 1712 (if both then dual strata 1700) to the top as described in at least U.S. Pat. No. 8,273,610 in reference to at least FIG. 94 (A-C). At the top proper alignment would then complete the connection to the stratum-2 1710 and/or stratum-3 1712 (if both then dual strata 1700) circuits.

3. Bond metal to metal (or hybrid bonding) and have a connection path through the transferred layer of stratum-2 1710 and/or stratum-3 1712 (if both then dual strata 1700) as described in at least U.S. Pat. No. 8,273,610 in reference to at least FIG. 155 (A-C).

The stratum-2 1710 and/or stratum-3 1712 (if both then dual strata 1700) circuits could comprise the additional support structures to help remove the internal accumulated heat. This could comprise the heat removal paths leveraging the copper connection providing power to the stratum-2 1710 and/or stratum-3 1712 (if both then dual strata 1700) circuits, an embedded heat spreader for the stratum-2 1710 and/or stratum-3 1712 (if both then dual strata 1700) circuits and thermal contacts that may be electrically non-conducting to transistors which may have a poor thermal path. These and other heat removal and spreading techniques have been described with more detail in U.S. Pat. No. 8,803,206 which is incorporated herein by reference.

This opens up opportunity to build structures, for example, that may be a combination of sequential and parallel 3DIC processing. For example, an exemplary stack may be constructed by the methods herein to have 2 dual strata formed on top and connected to a target wafer, thus forming Stack A. At the same manufacturing site as for Stack A, or a different one, a second exemplary stack may be constructed by the methods herein to have 2 dual strata formed on top and connected to a second target wafer, thus forming Stack B. Stack A and Stack B may have similar or differing compositions of functions and strata. At the same manufacturing site as for Stack A, or as for Stack B, or a different from A or B one, Stack A and Stack B may be connected to each other forming a super system. The connections between Stack A and Stack may be formed by back to back hybrid bonding, or other well-known methods such as TSV. They may be placed on an interposer and connected to each other and perhaps ancillary devices. They may be back-back bonded with no thru the backside electrical connections other than a common body (or not if ox-ox bonded) and wired bonded connections may be made between the stacks, such as an I/O of Stack B being connected to an I/O of Stack A. This approach may be useful for constructing memories and for redundancy (memory, logic, and system).

These inventions provide many benefits to all type of electronic based products. And especially for products that target mobility or need to allow high integration at small volume and low power. Some of these applications have been described in at least U.S. Pat. No. 8,273,610 in reference to at least FIG. 156 and FIG. 91.

FIGS. 19A to 19K describe an exemplary process flow utilizing a carrier wafer or a holder wafer or substrate wherein CMOS transistors may be processed on two sides of a donor wafer. PMOS and NMOS transistors may be formed on each of the two sides or NMOS on one side and PMOS on the other, and then the two sided structure (NMOS on top of PMOS or CMOS on top of CMOS, or a combination thereof) donor wafer may be transferred to an target or acceptor wafer/substrate with pre-processed circuitry. With reference to descriptions herein, this may be the formation of stratum-2 1710 and stratum-3 1712 devices (thus forming a dual strata 1700), which may be layer transferred and connected to a target wafer/substrate 808. Description of target wafer/substrate 808 may be found in at least referenced U.S. Pat. No. 8,273,610. State of the art CMOS transistors and compact 3D library cells may be constructed with methods that may be suitable for 3D IC manufacturing. The exemplary process flow of FIGS. 19A to 19K describes CMOS on one side and CMOS on the other, as well as the commonly employed gate-last HKMG approach, and depicts an oxide-based vertical isolation, for simplicity. In the example, ion-cut is utilized for the layer transfer out of a donor wafer/substrate and damage/stress splitting technique for layer transfer out of a carrier wafer/substrate. However, many types of devices as mentioned herein may be formed on one side or both sides of the donor wafer and many types of layer transfer techniques as mentioned herein may be applied, according to manufacturing and technical choices. Some similarities and other details with the processing flow now presented may be found herein and in referenced and incorporated documents; for example, in at least FIGS. 70-80 and associated specification of U.S. Pat. No. 8,273,610.

Figure 19A:
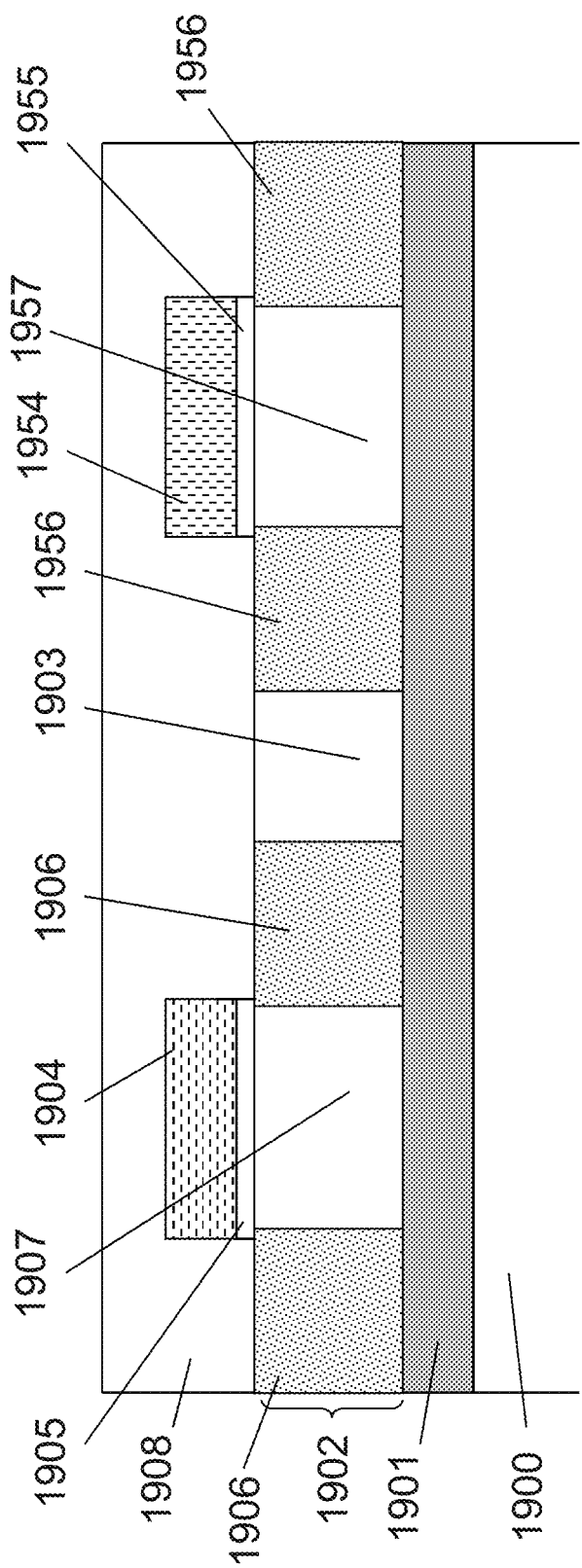

As illustrated in FIG. 19A, a Silicon On Oxide (SOI) donor wafer substrate 1900 may be processed in the typical state of the art CMOS HKMG gate-last manner up to the step prior to where CMP exposure of the poly-crystalline silicon dummy gates takes place. SOI donor wafer substrate 1900, the buried oxide (i.e., BOX) 1901, the thin silicon layer 1902 of the SOI wafer, the stratum-3 shallow trench isolation (STI) 1903 among stratum-3 CMOS transistors, the 'dummy' poly-crystalline silicon 1904 and gate dielectric 1905 of the stratum-3 NMOS dummy gates, stratum-3 NMOS source and drains 1906, stratum-3 NMOS transistor channel 1907, the 'dummy' poly-crystalline silicon 1954 and gate dielectric 1955 of the stratum-3 PMOS dummy gates, stratum-3 PMOS source and drains 1956, stratum-3 PMOS transistor channel 1957, and stratum-3 CMOS interlayer dielectric (ILD) 1908 are shown in the cross-section illustration. These structures of FIG. 19A illustrate the substantial completion of the first phase of stratum-3 CMOS transistor formation. The thermal cycles of the stratum-3 CMOS HKMG process up to this point in the flow may be adjusted to compensate for later thermal processing.

As illustrated in FIG. 19B, a layer transfer demarcation plane/layer (shown as dashed line) 1999 may be formed in SOI donor wafer substrate 1900 by hydrogen implantation 1910 or other methods as previously described (for example, porous layer or layers) in at least herein and the incorporated documents.

As illustrated in FIG. 19C, oxide 1916 may be deposited onto carrier wafer/substrate 1920 and then both the SOI donor wafer substrate 1900 and carrier wafer/substrate 1920 may be prepared for wafer bonding as previously described in incorporated references, and then may be oxide to oxide bonded together at interface 1914. Carrier wafer/substrate 1920 may also be called a carrier or holder substrate, and may be composed of mono-crystalline silicon, or other materials suitable for the thermal stresses and contamination requirements of the process flow.

Figure 19D:
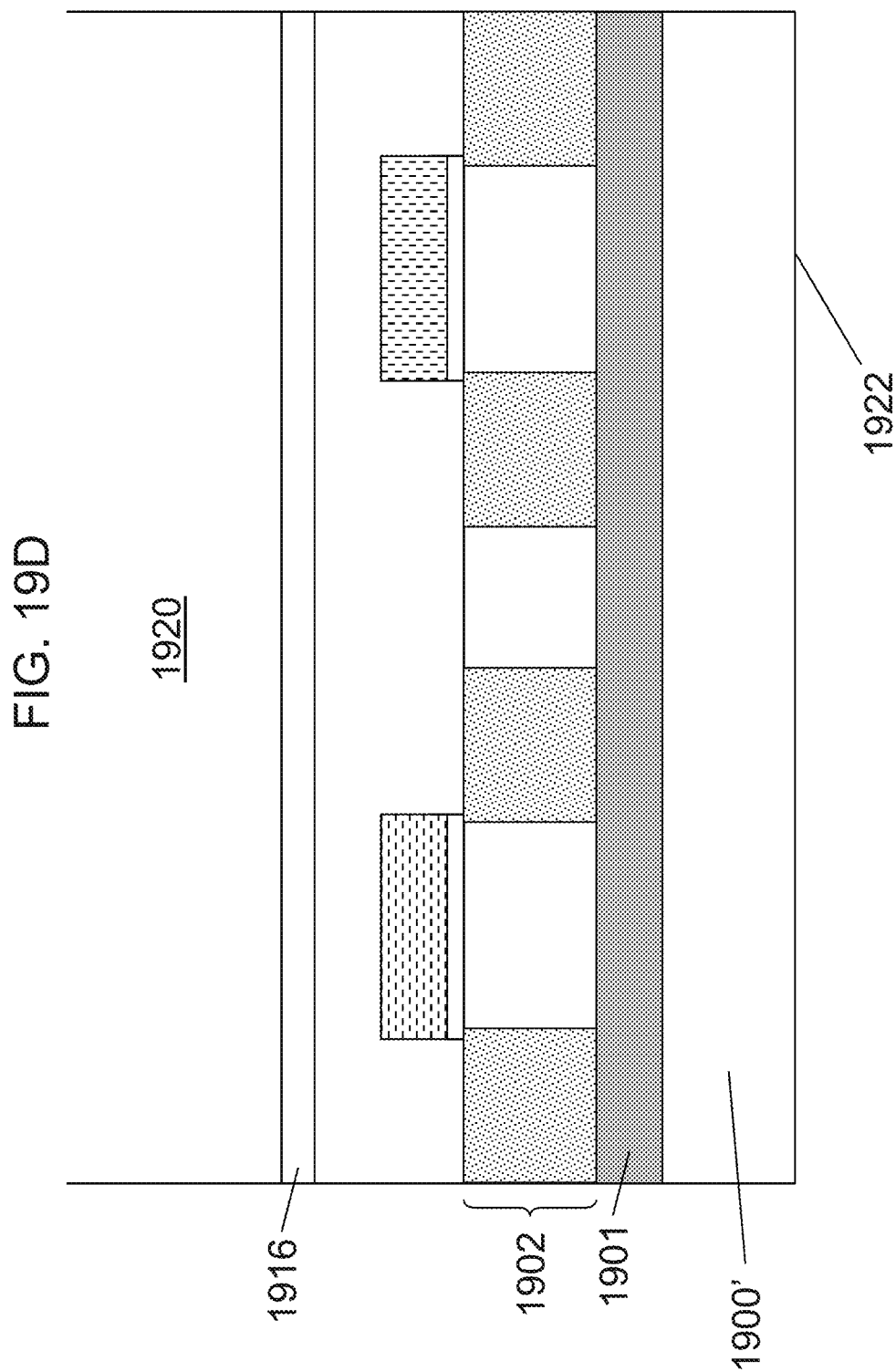

As illustrated in FIG. 19D, the portion of the SOI donor wafer substrate 1900 that may be below the layer transfer demarcation plane 1999 may be removed by cleaving or other processes as previously described herein and in at least the incorporated documents, such as, for example, ion-cut or other methods. The remaining donor wafer layer 1900' may be thinned by chemical mechanical polishing (CMP) and surface 1922 may be prepared for stratum-2 transistor formation. Damages from the ion-cut processing may be repaired by at least methods disclosed herein and in the incorporated documents; for example, laser annealing, thermal annealing, SiGen Corporation's epi-smoothing, etc., depending on the thermal budget of the thin silicon layer 1902 partially formed transistors and devices.

Figure 19E:
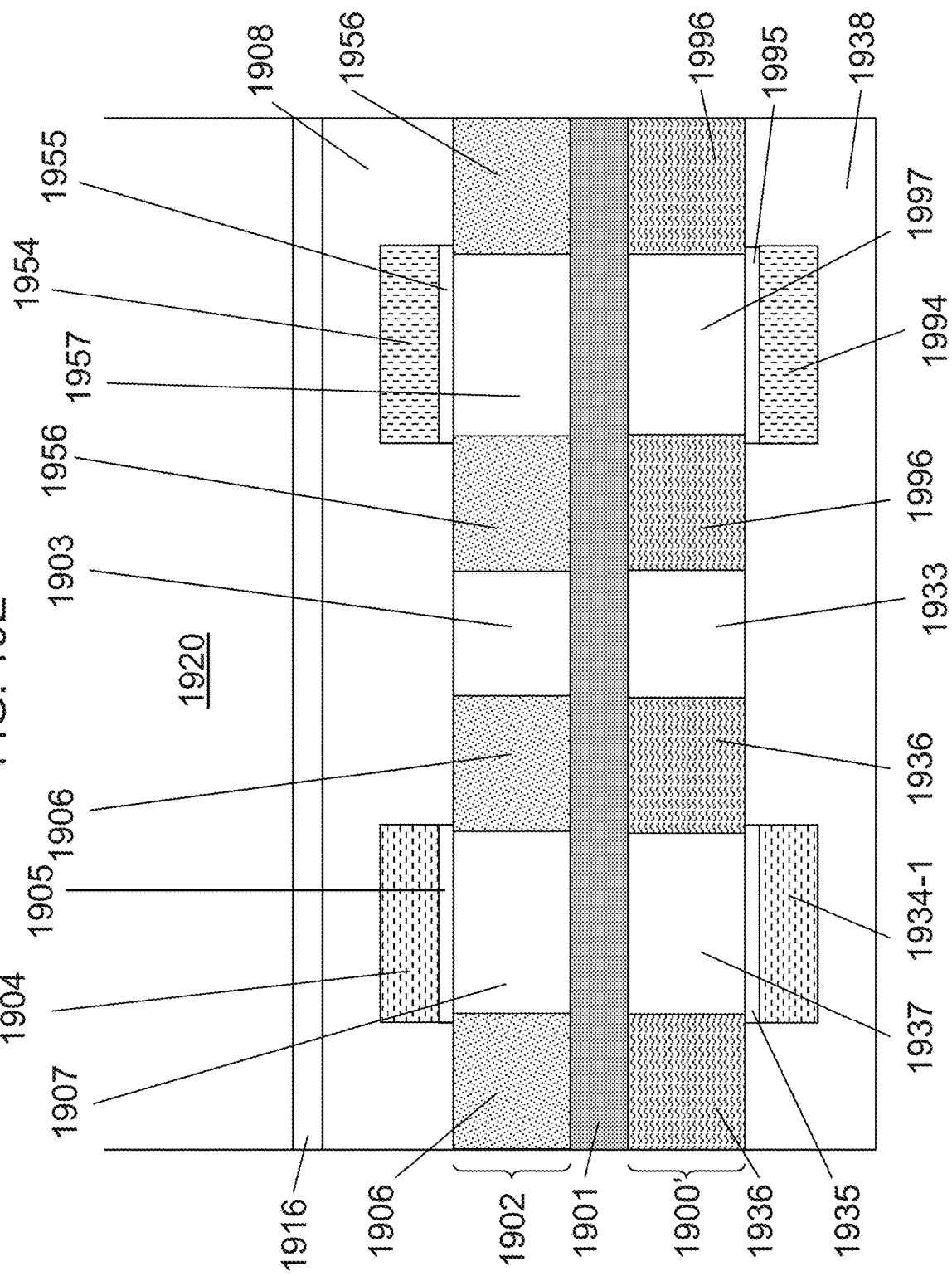

As illustrated in FIG. 19E, donor wafer layer 1900' may be processed in the typical state of the art CMOS HKMG gate last processing manner up to the step prior to where CMP exposure of the poly-crystalline silicon dummy gates takes place to form the stratum-2 CMOS transistors with dummy gates. The stratum-2 CMOS transistors may be precisely aligned at state of the art tolerances to the stratum-3 CMOS transistors as a result of the shared substrate possessing the same alignment marks. For example, an alignment error of less than about 40 nm, less than about 20 nm, less than about 10 nm, less than about 5 nm. Carrier wafer/substrate 1920, oxide 1916, BOX 1901, the thin silicon layer 1902 of the SOI wafer, the shallow trench isolation (STI) 1903 among stratum-3 CMOS transistors, the poly-crystalline silicon 1904 and gate dielectric 1905 of the stratum-3 NMOS dummy gates, stratum-3 NMOS source and drains 1906, the stratum-3 NMOS transistor channels 1907, the poly-crystalline silicon 1954 and gate dielectric 1955 of the stratum-3 PMOS dummy gates, stratum-3 PMOS source and drains 1956, the stratum-3 PMOS transistor channels 1957, and the stratum-3 CMOS interlayer dielectric (ILD) 1908, donor wafer layer 1900', the shallow trench isolation (STI) 1933 among stratum-2 CMOS transistors, the poly-crystalline silicon 1934 and gate dielectric 1935 of the stratum-2 NMOS dummy gates, stratum-2 NMOS source and drains 1936, the stratum-2 NMOS transistor channels 1937, the poly-crystalline silicon 1994 and gate dielectric 1995 of the stratum-2 PMOS dummy gates, stratum-2 PMOS source and drains 1996, the stratum-2 PMOS transistor channels 1997, and the stratum-2 CMOS interlayer dielectric (ILD) 1938 are shown in the exemplary cross section illustration. A high temperature anneal may be performed to activate both the stratum-2 and stratum 3 transistor dopants. These structures of FIG. 19E illustrate substantial completion of the first phase of stratum-2 CMOS transistor formation. The stratum-2 CMOS transistors may now be ready for typical state of the art gate-last transistor formation completion.

Figure 19F:
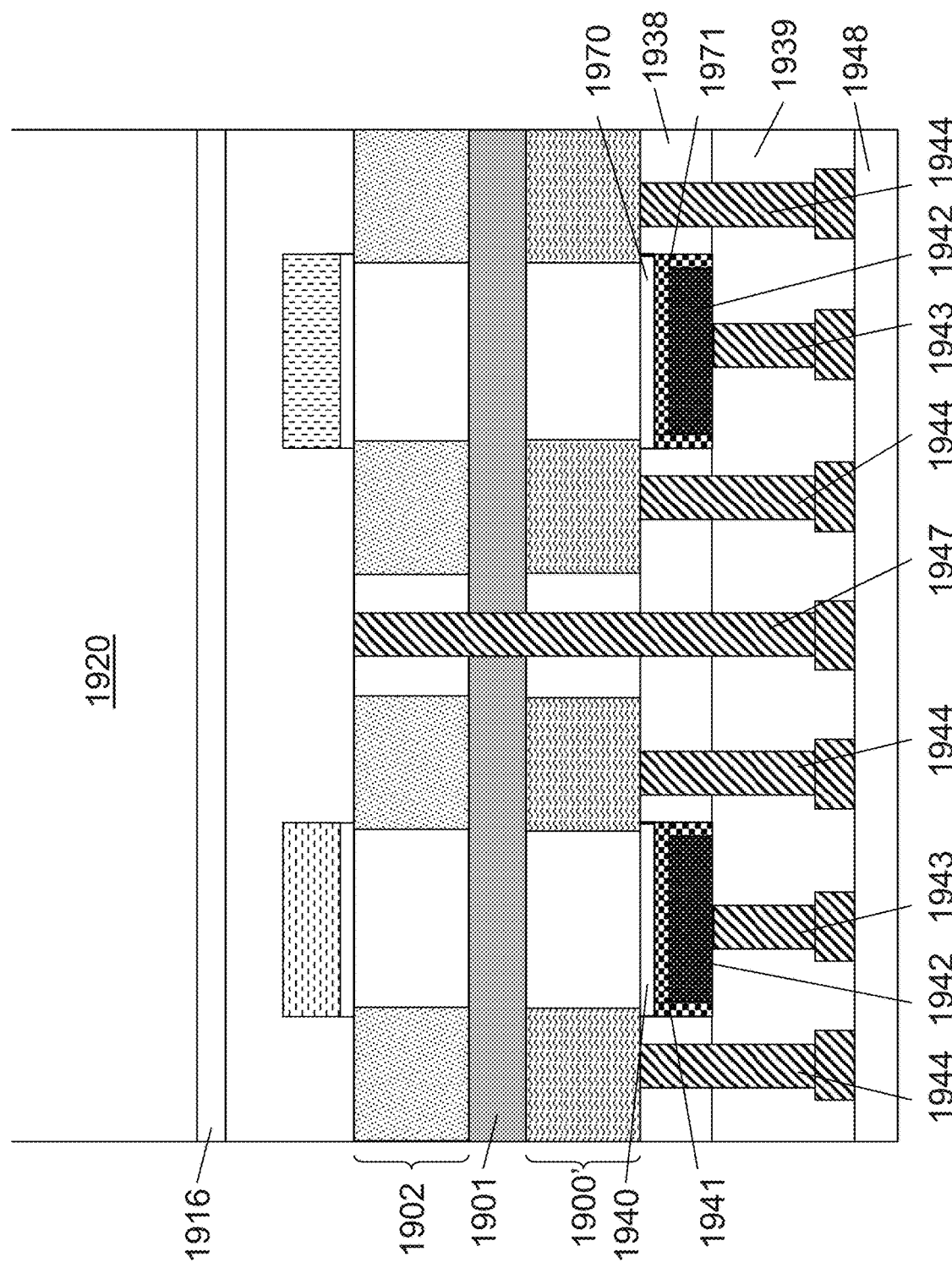

As illustrated in FIG. 19F, the stratum-2 CMOS ILD 1938 may be chemical mechanically polished to expose the top of the stratum-2 CMOS poly-crystalline silicon dummy gates, and the dummy gates may then be removed by etching. The stratum-2 PMOS devices may be hard masked-off and stratum-2 hi-k NMOS gate dielectric 1940 and the stratum-2 NMOS specific work function metal gate 1941 may be deposited. The stratum-2 NMOS devices may be hard masked off and stratum-2 hi-k PMOS gate dielectric 1970 and the stratum-2 PMOS specific work function metal gate 1971 may be deposited. An aluminum fill 1942 may be performed and the metal chemical mechanically polished. A low temperature stratum-2 dielectric layer 1939 may be deposited and the typical gate 1943 and source/drain 1944 contact formation and metallization may now be performed to connect to and among the stratum-2 CMOS transistors. Partially formed stratum-2 inter layer via (ILV) 1947 may be lithographically defined, plasma/RIE etched, and metallization formed. Oxide layer 1948 may be deposited to prepare for ox-ox bonding. Furthermore, the gate dielectric on transistors may have different dielectric permittivities than silicon dioxide. The gate dielectric permittivity of the second layer transistors, such as Stratum-2 and/or Stratum-3 transistors/devices, may be different than the gate dielectric permittivity of the first layer (base/substrate/or lower in the stack) transistors.

As illustrated in FIG. 19G, a damage plane or layer (shown as dashed line) 1998 may be formed in carrier wafer/substrate 1920 by optical means 1971, for example a two-phonon exposure with lasers, wherein the depth of the two-phonon interaction may be controlled with optics. Silicon to silicon bonds may be broken in a 2-phonon interaction, forming a layer or plane of silicon vacancies and silicon interstitial atoms (sometimes called interstitial vacancy pairs). Optical means 1971 may be employed thru carrier wafer/substrate 1920 to minimize 1-phonon interactions with doped regions and metal layers, or may be employed thru the processed layers (from 'below in the FIG. 19G context, not shown), or a combination of both. Other layer transfer techniques, such as the porous layer such as ELTRAN, etc. described at least herein, may be utilized for the carrier wafer/substrate 1920 and/or damage plane or layer 1998.

As illustrated in FIG. 19H, the donor wafer surface at oxide layer 1948 and top oxide surface of acceptor or target wafer/substrate 1988 with acceptor wafer metal connect strip 1950 may be prepared for wafer bonding as previously described and then low temperature (less than approximately 300° C.) aligned and oxide to oxide bonded at interface 1951. The process temperature is preferred as low as possible to mitigate reconstitution of the interstitial vacancy pairs of damage plane or layer 1998 If the 2-phonon method is utilized). The acceptor metal strip and donor metal strip methodology, described in at least FIGS. 71, 72-80 and associated specification of incorporated U.S. Pat. No. 8,273, 610, and may employ a machine such as the EV Group Gemini FB XT, which may provide alignment of thick substrates to within 200 nm. Small acceptor squares of maximum misalignment dimensions may also be utilized to connect the donor wafer/substrate metal TLV to the acceptor wafer metallization, such as described in at least FIG. 75 of the above patent.

Figure 19I:
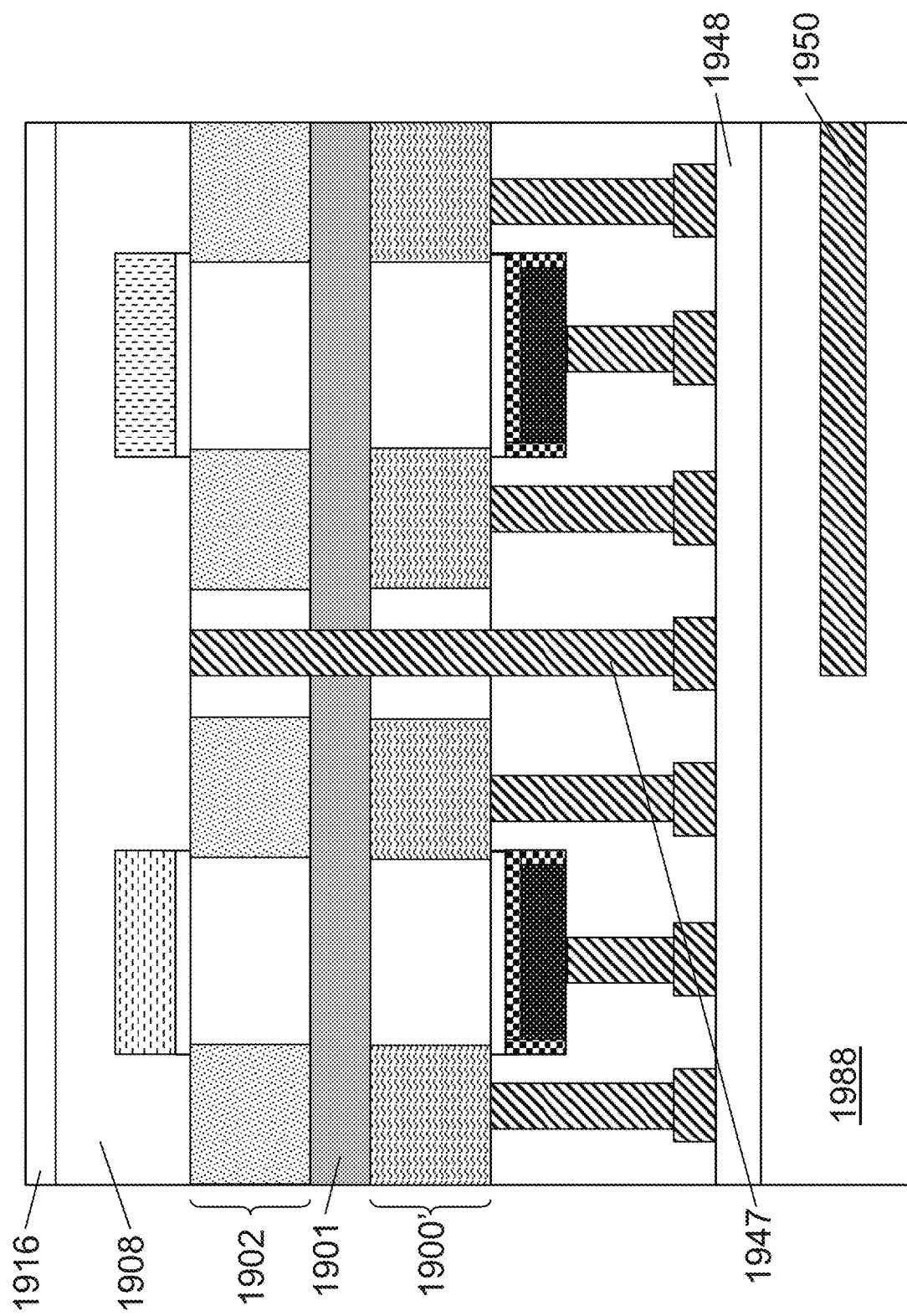

As illustrated in FIG. 19I, the portion of the carrier or holder wafer 1920 that may be above damage plane or layer 1998 may be removed by controlled stress methods. A polymer or co-polymer layer 1973 may be deposited on carrier or holder wafer 1920 (shown in FIG. 19H for clarity). Polymer or co-polymer layer 1973 may also be deposited on the backside acceptor or target substrate 1988 (not shown). The thickness(es) of polymer or co-polymer layer 1973 on either side of the entire structure may be tuned to provide the proper stress levels to cleave at damage plane or layer 1998 when exposed to a thermal stress. Polymer or co-polymer layer 1973 may incorporate a release layer to facilitate an easy release from whichever surface it was applied to. A thermal stress, for example, immersion or spray of LN2 (Liquid Nitrogen) may be used as a stress for cleaving. Details and demonstration of the polymer stress and optical vacancy creation cleaving methods for silicon wafering of an ingot may be found with Siltectra GmbH at www.siltectra.com and patent disclosures of Lukas Lichtensteiger, such as US Patent Application Publication 2011/0259936 and international publication WO2014005726. These stress techniques may be applied to other process flows within the incorporated references; for example, at least FIGS. 81 and 82 and associated specification of U.S. Pat. No. 8,273,610. The remaining layer of the carrier or holder wafer 1920 remaining on the structure attached to oxide layer 1916 may be removed by chemical mechanical polishing (CMP) to or into oxide layer 1916. With conventional sidewall and backside protection, chemical means may also be employed, for example, warm KOH, to remove remaining portions of the carrier wafer/substrate 1920. The remaining bulk of carrier wafer/substrate 1920 may be recycle or reclaimed for additional uses, such as reuse as a carrier wafer. The dual strata is transferred and bonded to the target wafer and the stratum-3 CMOS transistors may be now ready for typical state of the art gate-last transistor formation completion.

Figure 19J:
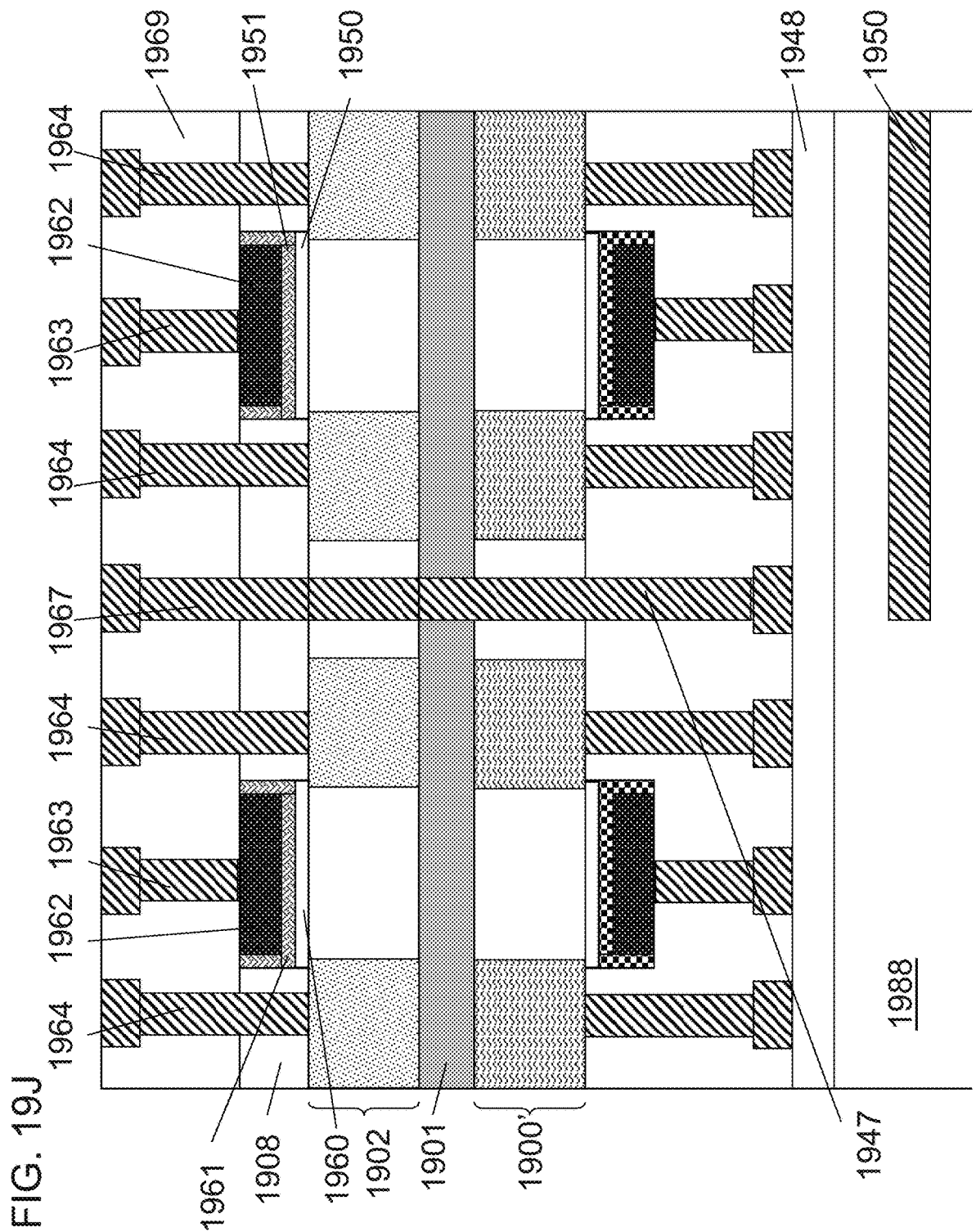

As illustrated in FIG. 19J, oxide 1916 and the stratum-3 CMOS ILD 1908 may be chemical mechanically polished to expose the top of the stratum-3 CMOS dummy gates. The stratum-3 PMOS areas may be hard masked off and the stratum-3 NMOS dummy gates may then be removed by etching. A stratum-3 hi-k gate dielectric 1960 and a stratum-3 NMOS specific work function metal gate 1961 may be deposited. The stratum-3 NMOS areas may then be hard masked off (after PMOS hard mask removed) and the stratum-3 PMOS dummy gates may then be removed by etching. A stratum-3 hi-k gate dielectric 1950 and a stratum-3 PMOS specific work function metal gate 1951 may be deposited. An aluminum fill 1962 may be performed and the metal chemical mechanically polished. A low temperature dielectric layer 1969 may be deposited and the typical gate 1963 and source/drain 1964 contact formation and metallization may now be performed to connect to and among the stratum-3 CMOS transistors. Partially formed stratum-3 CMOS inter layer via (ILV) 1967 may be lithographically defined, plasma/RIE etched, and metallization formed, thus electrically connecting stratum-3 CMOS ILV 1967 to stratum-2 CMOS ILV 1947.

As illustrated in FIG. 19K, dual strata oxide 1970 may be deposited and planarized. Thru layer via (TLV) 1972 may be lithographically defined, plasma/RIE etched, and metallization formed. Alignment of TLV 1972 may be based on both the target wafer alignment marks and the dual strata alignment marks (not shown). TLV 1972 electrically couples the NMOS transistor layer metallization to the acceptor or target substrate 1988 at acceptor wafer metal connect strip 1950. A topmost metal layer, at or above oxide 1970, of the layer stack illustrated may be formed to act as the acceptor wafer metal connect strips for a repeat of the above process flow to stack another preprocessed thin mono-crystalline silicon layer of CMOS on top of CMOS transistors.

Persons of ordinary skill in the art will appreciate that the illustrations in FIGS. 19A through 19K are exemplary only and are not drawn to scale. Such skilled persons will further appreciate that many variations are possible such as, for example, the transistor layers on each side of BOX 1901 may include many combinations and types of semiconductor devices. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Moreover, that other transistor types may be possible, such as, for example, RCAT, FinFet, and junction-less. Further, the donor wafer layer 1900' in FIG. 19D may be formed from a bulk mono-crystalline silicon wafer with CMP to the NMOS junctions and oxide deposition in place of the SOI wafer discussed. Additionally, the SOI donor wafer substrate 1900 may start as a bulk silicon wafer and utilize an oxygen implantation and thermal anneal to form a buried oxide layer, such as, for example, the SIMOX process (i.e., separation by implantation of oxygen), or SOI donor wafer substrate 1900 may be a Germanium on Insulator (GeOI) wafer. The layer transfer of FIG. 19F-19I may be effected by forming a layer demarcation plane in carrier or holder wafer 1920 by hydrogen implantation. Stress layers, embedded & raised source/drains, and other conventional HKMG related techniques may be utilized in the exemplary process flow within the temperature constraints of each step. Other schemes may be employed to create stratum-2 to stratum-3 connections, for example, a via may be etched during the stratum-3 interconnect formation (or TLV connection via etch, stopping on a stratum-2 landing pad for that case) that would traverse both stratum-3 and stratum-2 STI's and isolation layers to connect to a stratum-2 landing pad metal structure. Many other modifications within the scope of the invention will suggest themselves to such skilled persons after reading this specification. Thus the scope of the invention is to be limited only by the appended claims.

Figure 20:
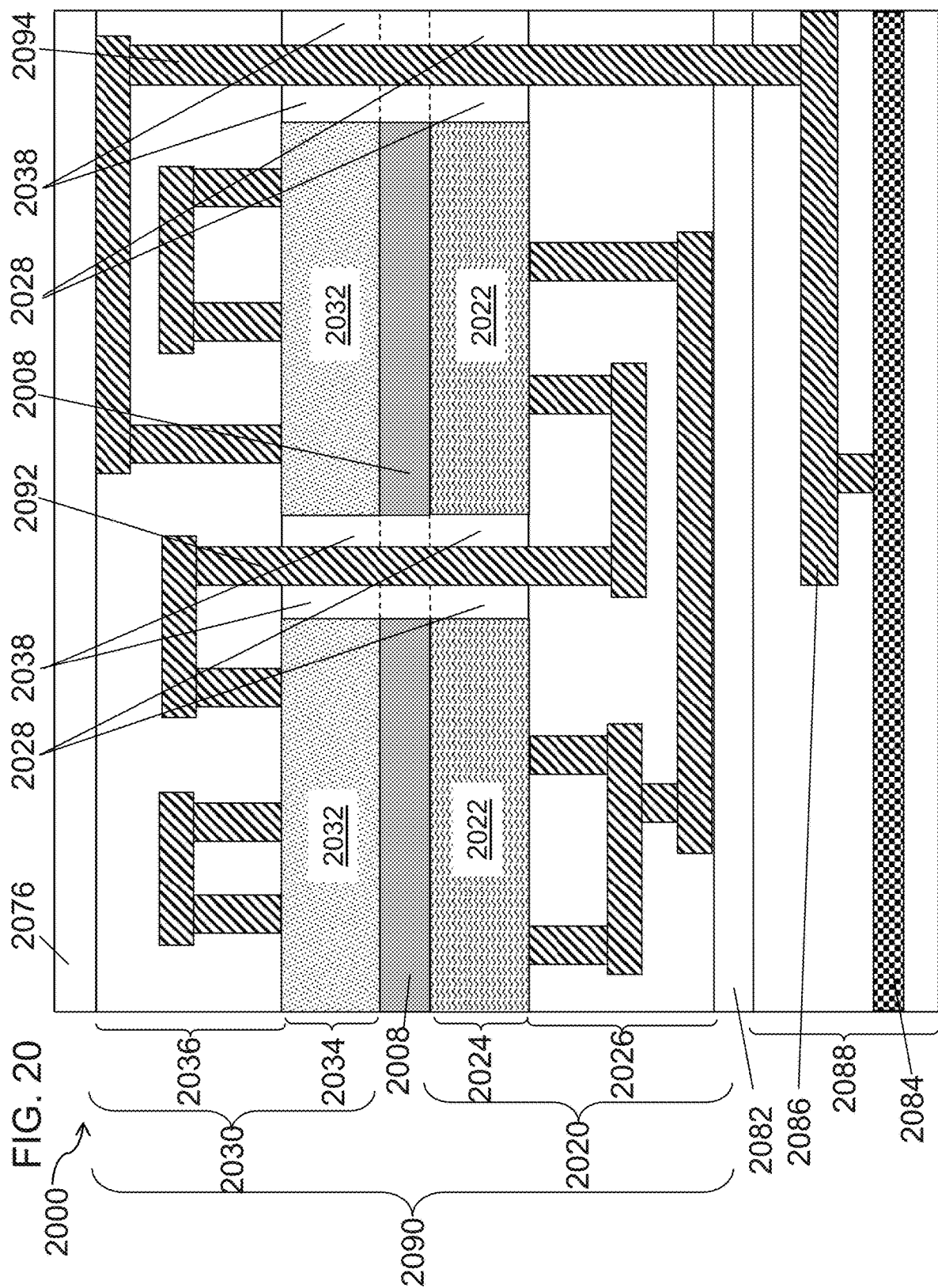
FIG. 20 is an exemplary illustration of a 3DIC device.

As illustrated in FIG. 20 (FIG. 20), exemplary 3DIC device 2000 may be constructed with many of the process flow options and sub-devices described at least herein and in the incorporated references. Exemplary 3DIC device 2000 may also be called a 3DIC system, or a 3D semiconductor device, or a 3D stacked device, or a monolithic 3D device. 3DIC device 2000 may include target wafer/substrate 2088, and at least one dual strata 2090, which may include target wafer to dual strata bond layer 2082 and 3DIC device protect layer 2076. Dual strata 2090 may overlay target wafer/substrate 2088. 3DIC device protect layer 2076 may include passivation materials to protect the device and may include bond pad openings (not shown) for connection to external devices. 3DIC device protect layer 2076 may include oxide or other bonding materials, in preparation for bonding with another layer or 3DIC device/stack or another dual strata or stratum. Target wafer/substrate 2088 may include device layer 2084 and metal interconnect layer or layers. Device layer 2084 may include devices such as transistors, diodes, junctions, and so on and may include the definitions with respect to acceptor or target or base wafer/substrate found herein and in the incorporated references. Device layer 2084 metal interconnect layer or layers may include target wafer landing strip 2086, which may be called acceptor wafer metal connect strip. Dual strata 2090 may include stratum-3 2030 and stratum-2 2020, and may include, depending on design, layout, device and manufacturing engineering choices, vertical isolation regions 2008. Vertical isolation regions 2008 may cover most of the area between stratum-3 2030 and stratum-2 2020 and as such, may be a called a layer. Stratum-2 2020 may include stratum-2 device layer 2024 and stratum-2 metal interconnect layer 2026. Stratum-2 device layer 2024 may include stratum-2 device regions 2022 and stratum-2 STI (Shallow Trench Isolation) regions 2028. Stratum-2 device regions 2022 may include transistors, such as CMOS MOSFETs or FinFets, and other device types as found herein and known by one of ordinary skill in the art. Stratum-2 2020 may contribute/share structure, connection, electrical bias/signals, and so on to vertical isolation regions 2008 as dictated by engineering and design choices. Stratum-2 metal interconnect layer 2026 may include multiple layers of metal interconnect, vias, and isolation dielectric regions. Stratum-3 2030 may include stratum-3 device layer 2034 and stratum-3 metal interconnect layer 2036. Stratum-3 device layer 2034 may include stratum-3 device regions 2032 and stratum-3 STI regions 2038. Stratum-3 device regions 2032 may include transistors, such as CMOS MOSFETs or FinFets, and other device types as found herein and known by one of ordinary skill in the art. Stratum-3 2030 may contribute/share structure, connection, electrical bias/signals, and so on to vertical isolation regions 2008 as dictated by engineering and design choices. Stratum-3 metal interconnect layer 2036 may include multiple layers of metal interconnect, vias, and isolation dielectric regions. Stratum-3 2030 devices, for example transistors, may be electrically and/or thermally connected to stratum-2 2020 devices, for example transistors, thru the respective stratum metal interconnect and dual strata inter layer via (ILV) 2092. Devices residing on or connected to dual strata 2090 may be electrically and/or thermally connected to target wafer/substrate 2088 devices, for example transistors, thru the respective stratum metal interconnect and thru layer via (TLV) 2094. Stratum-2 STI regions 2028 and stratum-3 STI regions 2038 may be designed to physically connect to provide a fully isolating vertical opening thru any conductive layers for conductive vertical connections such as ILV 2092 and TLV 2094. If vertical isolation regions 2008 are electrically isolating, this full connection may not be necessary.

Figure 21:
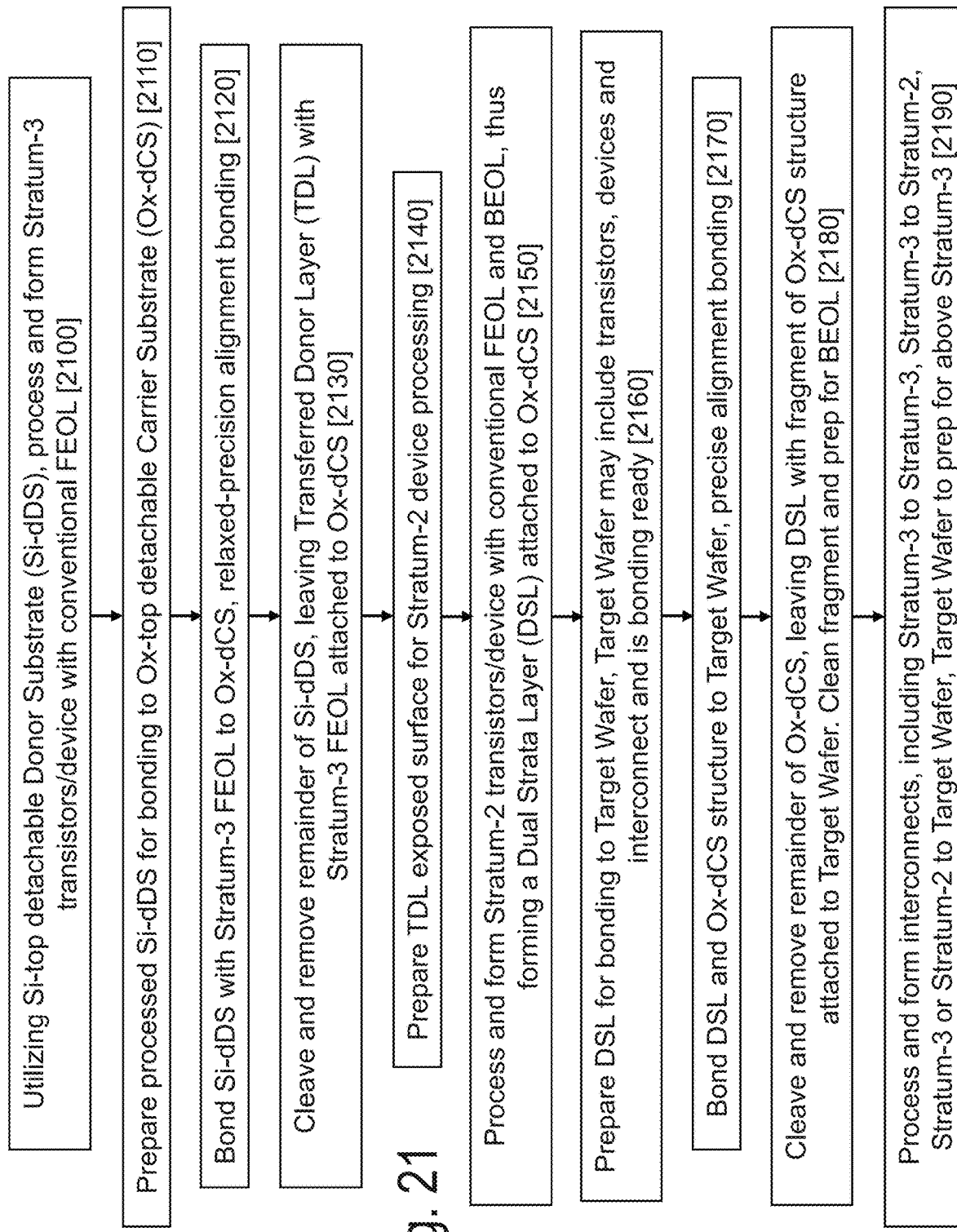
FIG. 21 is an exemplary illustration of a 3DIC device formation flow utilizing a detachable donor substrate and a detachable carrier substrate.

As illustrated in FIG. 21 (FIG. 21), a flowchart of the major steps in a 3DIC device formation flow utilizing a detachable donor substrate and a detachable carrier substrate is presented. 3DIC device 2000 of FIG. 20 herein, for example, may be formed with this process flow.

A Si-dDS, a silicon topped detachable donor substrate, is provided and stratum-3 devices such as transistors may be processed thru the FEOL (Front End Of Line) in a conventional manner (potentially with compensation for future thermal exposure during stratum-2 device processing) [step 2100]. A Si-dDS may be a prime silicon wafer with a porous detach layer covered on one side by an epitaxial layer of silicon as described herein.

The processed Si-dDS may be prepared for bonding and an Ox-dCS may be prepared for bonding, an oxide topped detachable carrier substrate. [step 2110]. An Ox-dCS may be a test or prime silicon wafer with a porous detach layer covered on one side by a thin epitaxial layer of silicon and a thick layer of oxide, ready for ox-ox bonding.

The processed and bonding prepared Si-dDS may be bonded to the bonding prepared an Ox-dCS. The alignment error between Si-dDS and the Ox-dCS may be about 2 microns or less [step 2120]. The bonding may be oxide to oxide, but must be a type of bond strong enough to reliably survive subsequent thermal processing and sheer forces, generally >1 J/cm$^2$.

The processed Si-dDS may be cleaved at or near the porous detach layer by methods described herein, and the remainder removed, thus leaving a transferred donor layer (TDL) attached to the Ox-dCS [step 2130]. The TDL may include the FEOL processed stratum-3 devices, a vertical isolation layer if required, and an additional portion of donor wafer material. Depending on the cleave process utilized, the Ox-dCS porous detach layer edge may be protected from the Si-dDS cleaving process (for example, wax coatings, etc. if water jet cleave action).

The exposed surface of the TDL may be prepared for stratum-2 device processing [step 2140]. Processing may include CMP, laser anneals, oxidation, epi-smoothing and other processing as described herein as dictated by the engineering and device constraints of the FEOL stratum-3 devices, and the needs of the desired stratum-2 devices.

Stratum-2 devices may be conventionally processed and formed, both FEOL and BEOL (Back End Of Line—contacts, metal interconnect, vias, and so on) thus forming a dual strata layer (DSL) attached to Ox-dCS [step 2150]. As a matter of design and engineering choices, stratum-2 to stratum-3 ILVs may be partially formed at this point, or formed later.

The DSL top surface (stratum-3 side of DSL) may be prepared for bonding and the target wafer may be prepared for bonding [step 2160]. Target wafer/substrate may include devices, transistors, metal interconnect, TLV landing strips or zones, and so on, as describe herein.

The DSL+ Ox-dCS structure (DSL prepped surface) may be permanently bonded to the target wafer utilizing precision wafer bonding technology [step 2170]. The DSL structure to target wafer/substrate structure alignment error may be less than about 200 nm, less than about 200 nm, less than about 500 nm. Smart alignment techniques, disclosed herein and in incorporated references, may be utilized.

The Ox-dCS may be cleaved at or near the porous detach layer by methods described herein, and the remainder removed, thus leaving the DSL attached to the target wafer. [step 2180]. The fragments of Ox-dCS remaining attached to the DSL may be removed, and the stratum-3 replacement gate FEOL steps, if required, may be processed and formed.

Process and form interconnects, including stratum-3 to stratum-3 (stratum-3 BEOL), stratum-3 to stratum-2 (ILV), stratum-3 or stratum-2 to target wafer (TLV), target wafer to prep for above Stratum-3 (for example, for bond pads or connect to another DSL or stack) [step 2190]. Thus a 3DIC device, for example, such as illustrated in FIG. 20 herein, may be formed.

An embodiment of the invention may include various modification of the process flows described in at least U.S. Pat. No. 8,273,610 in relation to at least FIGS. 70A-70F, 81A-81F, 82A-82G, 83A-83L. These flows may start with a donor wafer which may go through a normal process flow to form a circuit layer which we could call stratum-3. The described flow suggests the use of a 'gate-replacement' flow, also called 'gate-last' flow for transistor formation, although other structures/techniques may be utilized. The stratum-3 layer would be first transferred using ion-cut to a carrier wafer/substrate and then transferred on top of a target wafer (also called base or acceptor wafer/substrate in some circumstances). Once on top of the target wafer the dummy oxide and the dummy gate could be replaced with the gate last gate stack of, for example, hafnium oxide and metal gate. This flow provides the advantage that any damage caused by the ion-cut would be removed by the replacement step. In an embodiment the replacement oxide and gate could be made with silicon oxide and poly gate which are in most cases cheaper and easier to process. So the repair of the ion-cut potential damage is not a condition of having high-K metal gate process. It should be noted that once stratum-3 is bonded on the target wafer the temperature limitation, generally restricted to less than 400° C., due to the underlying structure does exist. Therefore, a special process should be used for the deposition of a high quality gate oxide. Furthermore, the dummy gate stack may be replaced after the ion-cut by other types of gate stacks; for example, such as a grown or deposited oxide/dielectric with a poly-silicon/polycide electrode, or a grown or deposited oxide/dielectric with a tungsten electrode. Such processes have been presented in at least U.S. Pat. No. 8,273,610.

The challenge of aligning preformed or partially preformed planar transistors to the underlying layers and substrates may be overcome by the use of repeating structures on the donor wafer or substrate and the use of metal connect landing strips either on the acceptor wafer only or on both the donor and acceptor wafers. The metal connect landing strips may be formed with metals, such as, for example, copper or aluminum, and may include barrier metals, such as, for example, TiN or WCo. Repeating patterns in one direction, for example, North to South repeats of preformed structures may be accomplished with the alignment scheme and metal landing strips as described previously with reference to the FIG. 33 of incorporated reference U.S. Pat. No. 8,273,610. The gate last HKMG process may be utilized to create a pre-processed donor wafer that builds not just one transistor type but both types by utilizing alternating parallel strips or rows that may be the die width plus maximum donor wafer to acceptor wafer misalignment in length.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3DIC technology described herein may be found at least in FIG. 156 of U.S. Pat. No. 8,273,610, the contents of which are incorporated by reference.

Furthermore, some embodiments of the invention may include alternative techniques to build systems based on integrated 3D devices including techniques and methods to construct 3D IC based systems that communicate with other 3DIC based systems. Some embodiments of the invention may enable system solutions with far less power consumption and intercommunication abilities at lower power than prior art. These systems may be called 'Internet of Things", or IoT, systems, wherein the system enabler is a 3DIC device which may provide at least three functions: a sensing capability, a digital and signal processing capability, and communication capability. For example, the sensing capability may include a region or regions, layer or layers within the 3DIC device which may include, for example, a MEMS accelerometer (single or multi-axis), gas sensor, electric or magnetic field sensor, microphone or sound sensing (air pressure changes), image sensor of one or many wavelengths (for example, as disclosed in at least U.S. Pat. Nos. 8,283,215 and 8,163,581, incorporated herein by reference), chemical sensing, gyroscopes, resonant structures, cantilever structures, ultrasonic transducers (capacitive & piezoelectric). Digital and signal processing capability may include a region or regions, layer or layers within the 3DIC device which may include, for example, a microprocessor, digital signal processor, micro-controller, FPGA, and other digital land/or analog logic circuits, devices, and subsystems. Communication capability, such as communication from at least one 3DIC of IoT system to another, or to a host controller/nexus node, may include a region or regions, layer or layers within the 3DIC device which may include, for example, an RF circuit and antenna or antennas for wireless communication which might utilize standard wireless communication protocols such as G4, WiFi or Bluetooth, I/O buffers and either mechanical bond pads/wires and/or optical devices/transistors for optical communication, transmitters, receivers, codecs, DACs, digital or analog filters, modulators.

Energy harvesting, device cooling and other capabilities may also be included in the system. The 3DIC inventions disclosed herein and in the incorporated referenced documents enable the IoT system to closely integrate different crystal devices, for example a layer or layers of devices/transistors formed on and/or within mono or poly crystalline silicon combined with a layer or layers of devices/transistors formed on and/or within Ge, or a layer of layers of GaAs, InP, differing silicon crystal orientations, and so on. For example, incorporating the 3D IC semiconductor devices according to some embodiments of the invention as or within the IoT systems and mobile systems could provide superior IoT or mobile systems that could operate much more efficiently and for a much longer time than with prior art technology. The 3D IC technology herein disclosed provides a most efficient path for heterogeneous integration with very effective integration reducing cost and operating power with the ability to support redundancy for long field life and other advantages which could make such an IoT System commercially successful.

Alignment is a basic step in semiconductor processing. For most cases it is part of the overall process flow that every successive layer is patterned when it is aligned to the layer below it. These alignments could all be done to one common alignment mark, or to some other alignment mark or marks that are embedded in a layer underneath. In today's equipment such alignment would be precise to below a few nanometers and better than 40 nm or better than 20 nm and even better than 10 nm. In general such alignment could be observed by comparing two devices processed using the same mask set. If two layers in one device maintain their relative relationship in both devices—to few nanometers—it is clear indication that these layers are one aligned each to the other. This could be achieved by either aligning to the same alignment mark (sometimes called a zero mark alignment scheme), or one layer is using an alignment mark embedded in the other layer (sometimes called a direct alignment), or using different alignment marks of layers that are aligned to each other (sometimes called an indirect alignment).

In this document, the connection made between layers of, generally single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate. Similarly, donor wafers herein may be substantially comprised of a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

While mono-crystalline silicon has been mentioned as a transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may not be stacked in a vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. First silicon layers or transistor channels and second silicon layers or transistor channels may be may be substantially absent of semiconductor dopants to form an undoped silicon region or layer, or doped, such as, for example, with elemental or compound species that form a p+, or p, or p−, or n+, or n, or n− silicon layer or region. A heat removal apparatus may include an external surface from which heat transfer may take place by methods such as air cooling, liquid cooling, or attachment to another heat sink or heat spreader structure. Furthermore, raised source and drain contact structures, such as etch and epi SiGe and SiC, and implanted S/Ds (such as C) may be utilized for strain on a transistor channel to enhance carrier mobility and may provide contact resistance improvements Damage from the processes may be optically annealed. Strain on a transistor channel to enhance carrier mobility may be accomplished by a stressor layer or layers as well.

In this specification the terms stratum, tier or layer might be used for the same structure and they may refer to transistors or other device structures (such as capacitors, resistors, inductors) that may lie substantially in a plane format and in most cases such stratum, tier or layer may include the interconnection layers used to interconnect the transistors on each. In a 3D device as herein described there may at least two such planes called tier, or stratum or layer.

In a 3DIC system stack, each layer/stratum may include a different operating voltage than other layers/stratum, for example, one stratum may have Vcc of 1.0 v and another may have a Vcc of 0.7 v. For example, one stratum may be designed for logic and have the appropriate Vcc for that process/device node, and another stratum in the stack may be designed for analog devices, and have a different Vcc, likely substantially higher in value—for example, greater than 3 volts, greater than 5 volts, greater than 8 volts, greater than 10 volts. In a 3DIC system stack, each layer/stratum may include a different gate dielectric thickness than other layers/stratum. For example, one stratum may include a gate dielectric thickness of 2 nm and another 10 nm. The definition of dielectric thickness may include both a physical definition of material thickness and an electrically 'effective' thickness of the material, given differing permittivity of the materials. In a 3DIC system stack, each layer/stratum may include different gate stack materials than other layers/stratum. For example, one stratum may include a HKMG (High k metal gate) stack and another stratum may include a polycide/silicon oxide gate stack. In a 3DIC system stack, each layer/stratum may include a different junction depth than other layers/stratum. For example, the depth of the junctions may include a FET transistor source or drain, bipolar emitter and contact junctions, vertical device junctions, resistor or capacitor junctions, and so on. For example, one stratum may include junctions of a fully depleted MOSFET, thus its junction depth may be defined by the thickness of the stratum device silicon to the vertical isolation, and the other stratum may also be fully depleted devices with a junction depth defined similarly, but one stratum has a thicker silicon layer than the other with respect to the respective edges of the vertical isolation. In a 3DIC system stack, each layer/stratum may include a different junction composition and/or structure than other layers/stratum. For example, one stratum may include raised source drains that may be constructed from an etch and epitaxial deposition processing, another stratum in the stack may have implanted and annealed junctions or may employ dopant segregation techniques, such as those utilized to form DSS Schottky transistors.

It should be noted that one of the design requirements for a monolithic 3D IC design may be that substantially all of the stacked layers and the base or substrate would have their respective dice lines (may be called scribelines) aligned. As the base wafer or substrate is processed and multiple circuits may be constructed on semiconductor layers that overlay each other, the overall device may be designed wherein each overlaying layer would have its respective dice lines overlying the dice lines of the layer underneath, thus at the end of processing the entire layer stacked wafer/substrate could be diced in a dicing step. There may be test structures in the streets between dice lines, which overall may be called scribelanes or dicelanes. These scribelanes or dicelanes may be 10 um wide, 20 um wide, 50 um wide 100 um wide, or greater than 100 um wide depending on design choice and die singulation process capability. The scribelanes or dicelanes may include guard-ring structures and/or other die border structures. In a monolithic 3D design each layer test structure could be connected through each of the overlying layers and then to the top surface to allow access to these 'buried' test structure before dicing the wafer. Accordingly the design may include these vertical connections and may offset the layer test structures to enable such connection. In many cases the die borders comprise a protection structure, such as, for example, a guard-ring structure, die seal structure, ESD structure, and others elements. Accordingly in a monolithic 3D device these structures, such as guard rings, would be designed to overlay each other and may be aligned to each other during the course of processing. The die edges may be sealed by a process and structure such as, for example, described in relation to FIG. 183C of incorporated U.S. Pat. No. 8,273,610, and may include aspects as described in relation to FIGS. 183A and 183B of same reference. One skilled in the art would recognize that the die seal can be passive or electrically active. On each 3D stack layer, or stratum, the electronic circuits within one die, that may be circumscribed by a dicelane, may not be connected to the electronic circuits of a second die on that same wafer, that second die also may be circumscribed by a dicelane. Further, the dicelane/scribelane of one stratum in the 3D stack may be aligned to the dicelane/scribelane of another stratum in the 3D stack, thus providing a direct die singulation vector for the 3D stack of stratums/layers.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, epitaxial regrow of source and drains may utilize processes such as liquid phase epitaxial regrowth or solid phase epitaxial regrowth, and may utilize flash or laser processes to freeze dopant profiles in place and may also permit non-equilibrium enhanced activation (superactivation). Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by the appended claims.

We claim:

1. A 3D semiconductor device, the device comprising:
a first level,
  wherein said first level comprises a first layer, said first layer comprising first transistors, and
  wherein said first level comprises a second layer, said second layer comprising first interconnections;
a second level overlaying said first level,
  wherein said second level comprises a third layer, said third layer comprising second transistors, and
  wherein said second level comprises a fourth layer, said fourth layer comprising second interconnections;
a plurality of connection paths,
  wherein said plurality of connection paths provide first connections from a plurality of said first transistors to a plurality of said second transistors,
  wherein said second level is bonded to said first level,
  wherein said bonded comprises oxide to oxide bond regions,
  wherein said bonded comprises metal to metal bond regions, and
  wherein said third layer comprises crystalline silicon; and
at least one temperature sensor.

2. The device according to claim 1, wherein said second level comprises at least one scan-chain to support circuit test.

3. The device according to claim 1, further comprising: a power control circuit connected to said at least one temperature sensor.

4. The device according to claim 1, wherein said second level comprises at least one charge trap circuit.

5. The device according to claim 1, wherein said second level comprises at least one power regulator circuit.

6. The device according to claim 1, wherein said second level comprises at least one memory array, wherein said first level comprises at least one control circuit, and wherein said at least one control circuit controls read operations of said at least one memory array.

7. The device according to claim 1, wherein said second level comprises at least one electro-static-discharge ("ESD") circuit.

8. A 3D semiconductor device, the device comprising:
a first level,
  wherein said first level comprises a first layer, said first layer comprising first transistors, and
  wherein said first level comprises a second layer, said second layer comprising first interconnections;
a second level overlaying said first level,
  wherein said second level comprises a third layer, said third layer comprising second transistors, and
  wherein said second level comprises a fourth layer, said fourth layer comprising second interconnections;
a plurality of connection paths,
  wherein said plurality of connection paths provide first connections from a plurality of said first transistors to a plurality of said second transistors,
  wherein said second level is bonded to said first level,
  wherein said bonded comprises oxide to oxide bond regions,
  wherein said bonded comprises metal to metal bond regions,
  wherein said third layer comprises crystalline silicon,
  wherein said second level comprises guard-rings, and
  wherein at least one of said guard-rings surrounds said second transistors and said second interconnections.

9. The device according to claim 8, wherein said second level comprises at least one array of memory cells, wherein said memory cells are volatile type memory cells.

10. The device according to claim 8, wherein said second level comprises at least one phase-lock-loop ("PLL") circuit.

11. The device according to claim 8, wherein said first level comprises a first computer bus, wherein said second level comprises a second computer bus, and wherein said at least one of said plurality of connection paths provides connection between said first bus and said second bus.

12. The device according to claim 8, wherein said first level comprises a first clock-tree, wherein said second level comprises a second clock-tree, and wherein said metal to metal bond regions comprise second connections between said first clock-tree and said second clock-tree.

13. The device according to claim 8, wherein said second level comprises at least one electro-static-discharge ("ESD") circuit.

14. The device according to claim 8, wherein at least one of said second transistors is a FinFET type transistor.

15. A 3D semiconductor device, the device comprising:
a first level,
  wherein said first level comprises a first layer, said first layer comprising first transistors, and wherein said first level comprises a second layer, said second layer comprising first interconnections;

a second level overlaying said first level,
   wherein said second level comprises a third layer, said third layer comprising second transistors, and
   wherein said second level comprises a fourth layer, said fourth layer comprising second interconnections; and a plurality of connection paths,
   wherein said plurality of connection paths provide first connections from a plurality of said first transistors to a plurality of said second transistors,
   wherein said second level is bonded to said first level,
   wherein said bonded comprises oxide to oxide bond regions,
   wherein said bonded comprises metal to metal bond regions,
   wherein said second level comprises at least one memory array,
   wherein said third layer comprises crystalline silicon,
   wherein said first level comprises a first computer bus,
   wherein said second level comprises a second computer bus, and
   wherein said at least one of said plurality of connection paths provides connection between said first bus and said second bus.

16. The device according to claim 15,
wherein said second level comprises an oscillator circuit.

17. The device according to claim 15,
wherein said second level comprises at least one SerDes circuit.

18. The device according to claim 15,
wherein said second level comprises guard-rings, and
wherein at least one of said guard-rings surrounds said second transistors and said second interconnections.

19. The device according to claim 15,
wherein said second level comprises at least one electro-static-discharge ("ESD") circuit.

20. The device according to claim 15,
wherein at least one of said second transistors is a FinFET type transistor.

* * * * *